US011705780B2

(12) United States Patent
Abramov

(10) Patent No.: US 11,705,780 B2
(45) Date of Patent: Jul. 18, 2023

(54) GENERALIZED JET-EFFECT AND GENERALIZED GENERATOR

(71) Applicant: SOLITON HOLDINGS CORPORATION, DELAWARE CORPORATION, New York, NY (US)

(72) Inventor: Yuri Abramov, Holon (IL)

(73) Assignee: SOLITON HOLDINGS CORPORATION, DELAWARE CORPORATION, New York, NY (US)

(*) Notice: Subject to any disclaimer, the term of this patent is extended or adjusted under 35 U.S.C. 154(b) by 1099 days.

(21) Appl. No.: 16/412,834

(22) Filed: May 15, 2019

(65) Prior Publication Data
US 2019/0280562 A1  Sep. 12, 2019

Related U.S. Application Data

(63) Continuation-in-part of application No. 15/982,585, filed on May 17, 2018, now Pat. No. 11,499,525, and
(Continued)

(30) Foreign Application Priority Data

Jan. 20, 2016 (GB) .................................. 1601094
Mar. 22, 2016 (GB) .................................. 1604802
(Continued)

(51) Int. Cl.
*H02K 7/18* (2006.01)
*F15D 1/12* (2006.01)
(Continued)

(52) U.S. Cl.
CPC ........... *H02K 7/183* (2013.01); *B01D 5/0003* (2013.01); *B01D 5/0021* (2013.01);
(Continued)

(58) Field of Classification Search
CPC .. H02K 7/183; F02K 3/04; F02K 7/12; F15D 1/0015; F15D 1/12; H01F 30/16; H01L 35/28
(Continued)

(56) References Cited

U.S. PATENT DOCUMENTS 4,134,707 A * 1/1979 Ewers ................... F03D 13/20
                                                        290/55
4,556,122 A    12/1985 Goode
(Continued)

FOREIGN PATENT DOCUMENTS

AU     2018200099 A1    1/2019
AU     2020201929 A1    4/2020
(Continued)

OTHER PUBLICATIONS

Co-Pending U.S. Appl. No. 16/412,805, filed May 15, 2019.
(Continued)

*Primary Examiner* — Iftekhar A Khan
(74) *Attorney, Agent, or Firm* — Momentum IP; Marc Van Dyke

(57) ABSTRACT

The invention provides a method for computational fluid dynamics and apparatuses making enable an efficient implementation and use of an enhanced jet-effect, either the Coanda-jet-effect, the hydrophobic jet-effect, or the waving-jet-effect, triggered by specifically shaped corpuses and tunnels. The method is based on the approaches of the kinetic theory of matter providing generalized equations of fluid motion and is generalized and translated into terms of electromagnetism. The method is applicable for slow-flowing as well as fast-flowing real compressible-extendable generalized fluids and enables optimal design of convergent-divergent nozzles, providing for the most efficient jet-thrust. The method can be applied to airfoil shape optimization for
(Continued)

bodies flying separately and in a multi-stage cascaded sequence. The method enables apparatuses for electricity harvesting from the fluid heat-energy, providing a positive net-efficiency. The method enables generators for practical-expedient power harvesting using constructive interference of waves due to the waving jet-effect.

8 Claims, 25 Drawing Sheets

Related U.S. Application Data a continuation-in-part of application No. 15/982,530, filed on May 17, 2018, now abandoned, said application No. 15/982,585 is a continuation-in-part of application No. 15/648,469, filed on Jul. 13, 2017, now abandoned, and a continuation-in-part of application No. 15/409,876, filed on Jan. 19, 2017, now abandoned, said application No. 15/982,530 is a continuation-in-part of application No. 15/648,469, filed on Jul. 13, 2017, now abandoned, and a continuation-in-part of application No. 15/409,876, filed on Jan. 19, 2017, now abandoned, said application No. 15/648,469 is a continuation-in-part of application No. 15/409,876, filed on Jan. 19, 2017, now abandoned, which is a continuation-in-part of application No. 15/175,260, filed on Jun. 7, 2016, now abandoned.

(60) Provisional application No. 62/689,851, filed on Jun. 26, 2018, provisional application No. 62/675,848, filed on May 24, 2018.

(30) Foreign Application Priority Data

Jul. 17, 2017 (AU) ............................... 2017206155
Jan. 5, 2018 (AU) ............................... 2018200099

(51) Int. Cl.

| | | |
|---|---|---|
| F15D 1/00 | (2006.01) | |
| H01L 35/28 | (2006.01) | |
| H01F 30/16 | (2006.01) | |
| F02K 7/12 | (2006.01) | |
| F01D 5/14 | (2006.01) | |
| F03D 1/06 | (2006.01) | |
| F02C 7/141 | (2006.01) | |
| B01D 5/00 | (2006.01) | |
| F02K 3/04 | (2006.01) | |

(52) U.S. Cl.
CPC ......... *B01D 5/0042* (2013.01); *B01D 5/0075* (2013.01); *F01D 5/141* (2013.01); *F02C 7/141* (2013.01); *F02K 3/04* (2013.01); *F02K 7/12* (2013.01); *F03D 1/0633* (2013.01); *F15D 1/0015* (2013.01); *F15D 1/12* (2013.01); *H01F 30/16* (2013.01); *H01L 35/28* (2013.01); *F05D 2220/32* (2013.01); *F05D 2260/81* (2013.01)

(58) Field of Classification Search
USPC .......................................................... 703/9
See application file for complete search history.

(56) References Cited

U.S. PATENT DOCUMENTS

| | | | | |
|---|---|---|---|---|
| 5,664,418 A * | 9/1997 | Walters | ................. | F03D 3/0427 |
| | | | | 416/85 |
| 6,981,366 B2 * | 1/2006 | Sharpe | ..................... | F02K 7/12 |
| | | | | 60/39.52 |
| 7,156,201 B2 | 1/2007 | Peshkovskiy et al. | | |
| 7,516,054 B2 | 4/2009 | Tanji et al. | | |
| 8,221,514 B2 * | 7/2012 | Abramov | .................. | F03D 9/32 |
| | | | | 416/223 R |
| 8,268,030 B2 * | 9/2012 | Abramov | .................. | F03D 1/00 |
| | | | | 416/223 R |
| 8,611,787 B2 * | 12/2013 | Shiraki | .............. | G03G 21/1821 |
| | | | | 399/113 |
| 9,724,241 B2 | 8/2017 | Ogura et al. | | |
| 9,781,520 B1 | 10/2017 | Huang | | |
| 2005/0027498 A1 * | 2/2005 | Tanji | ....................... | G06F 30/23 |
| | | | | 703/9 |
| 2008/0061559 A1 * | 3/2008 | Hirshberg | ................. | F03D 9/32 |
| | | | | 415/176 |
| 2008/0170941 A1 | 7/2008 | Ghosh et al. | | |
| 2009/0047131 A1 * | 2/2009 | Neumann | ............... | F03B 3/121 |
| | | | | 416/132 R |
| 2009/0134623 A1 * | 5/2009 | Krouse | ................... | F03B 13/08 |
| | | | | 415/4.1 |
| 2011/0083420 A1 * | 4/2011 | Clay | ......................... | F01D 1/32 |
| | | | | 138/42 |
| 2011/0237839 A1 * | 9/2011 | Waldstein | ............... | F03D 9/007 |
| | | | | 290/55 |
| 2013/0094939 A1 * | 4/2013 | Farb | ...................... | F03B 11/002 |
| | | | | 415/117 |
| 2013/0099496 A1 * | 4/2013 | Solheim | .................... | F03D 9/48 |
| | | | | 114/294 |
| 2014/0288906 A1 * | 9/2014 | Sakaguchi | .............. | G06F 30/20 |
| | | | | 703/2 |
| 2014/0341709 A1 * | 11/2014 | Yamodo | .................... | F03B 1/02 |
| | | | | 415/60 |
| 2015/0056061 A1 * | 2/2015 | Nakamura | ............ | F03B 11/025 |
| | | | | 415/6 |
| 2017/0113194 A1 * | 4/2017 | Katz | ....................... | B01F 25/41 |
| 2017/0206291 A1 | 7/2017 | Abramov | | |
| 2017/0316133 A1 | 11/2017 | Abramov | | |
| 2017/0332179 A1 | 11/2017 | Bright et al. | | |
| 2018/0266394 A1 | 9/2018 | Abramov | | |
| 2018/0266395 A1 | 9/2018 | Abramov | | |
| 2019/0280562 A1 * | 9/2019 | Abramov | ............. | F15D 1/0015 |

FOREIGN PATENT DOCUMENTS

| | | |
|---|---|---|
| AU | 2020201562 B2 | 10/2020 |
| AU | 2020281012 B1 | 6/2021 |
| AU | 2021205020 B1 | 12/2021 |
| EP | 0227180 A3 | 1/1989 |
| EP | 2275671 A1 | 1/2011 |
| GB | 894450 A | 4/1962 |
| GB | 2546570 A | 7/2017 |
| GB | 2546571 A | 7/2017 |
| GB | 2546834 A | 8/2017 |
| GB | 2546834 B | 8/2017 |
| GB | 2558814 A | 7/2018 |
| JP | 2012188957 A | 10/2012 |
| TW | I467087 B | 1/2015 |
| WO | 2009006360 A3 | 2/2009 |
| WO | 2010006033 A1 | 1/2010 |

OTHER PUBLICATIONS

Co-Pending U.S. Appl. No. 16/412,834, filed May 15, 2019.
Co-Pending U.S. Appl. No. 16/412,848, filed May 15, 2019.
William Robert Freed; An Investigation of a Variable Geometry Diffuser for FTU's Four Inch Supersonic Wind Tunnel; dated 1977.
William Bugden et. al.; Design and Construction of a Supersonic Wind Tunnel with Diagnostics JB3-SWT3; published Apr. 17, 2013.

(56) References Cited

OTHER PUBLICATIONS

Andrew Michael Carter; Nozzle Design for the Supersonic Wind Tunnel Ramjet Attachment; published Jun. 2013.
Avik Arora et. al.; Design of a Tri-sonic Wind Tunnel; published Oct. 2014 Journal of Basic and Applied Engineering Research Print ISSN: 2350-0077; Online ISSN: 2350-0255; vol. 1, No. 4; Oct. 2014 pp. 21-32.
JP2012188957A Machine Translation (from Google Patents)—published Oct. 4, 2012; IHI Corp.
TWI467087B Machine Translation (from Google Patents)—published Jan. 1, 2015 ; Clay and Hockaday.
AU2019200817, First Examination report, dated Mar. 20, 2019.
AU2019200817, Second Examination report, dated May 14, 2019.
AU2020201562, First Examination report, dated May 12, 2020.
AU2020201562, Second Examination report, dated Sep. 2, 2020.
AU2020201568, First Examination report, dated Apr. 14, 2020.
AU2020201929, First Examination report, dated Dec. 21, 2021.
AU2020201929, Second Examination report, dated Mar. 14, 2022.
AU2018204546, First Examination report, dated Jan. 11, 2019.
AU2018204546, Second Examination report, dated Mar. 20, 2019.
AU2018204546, Third Examination report, dated Jul. 31, 2019.
AU2018204546, Fourth Examination report, dated Oct. 4, 2019.
AU2018204546, Fifth Examination report, dated Nov. 29, 2019.
AU2021205020, Second Examination report, dated Oct. 22, 2021.
AU2018200099, First Examination report, dated Dec. 14, 2018.
AU2018200099, Second Examination report, dated Mar. 20, 2019.
GB1609906.1 , Combined search and examination report, sent.
GB1613335.7, examination report, dated Mar. 3, 2017.
GB1613335.7, examination report, dated Dec. 14, 2016.
GB1613335.7, Abbreviated examination report, dated Sep. 28, 2016.
GB1613336.5, Search report, dated Sep. 27, 2016.
AU2021205020, First Examination report, dated Aug. 31, 2021.
Requirement for Restriction/Election for co-pending U.S. Appl. No. 16/412,848, dated Dec. 16, 2021.
Notice of allowance for co-pending U.S. Appl. No. 15/982,585, dated Jun. 20, 2022.

* cited by examiner

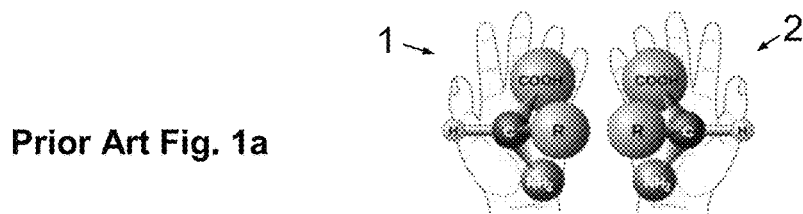
Prior Art Fig. 1a
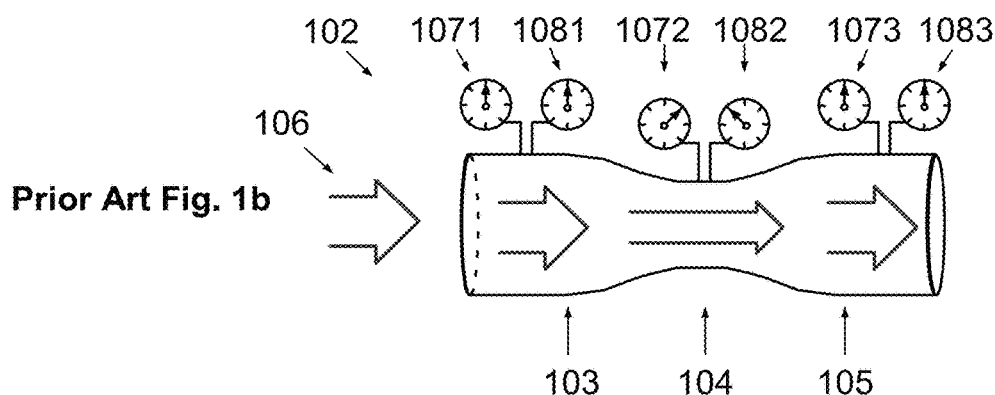
Prior Art Fig. 1b
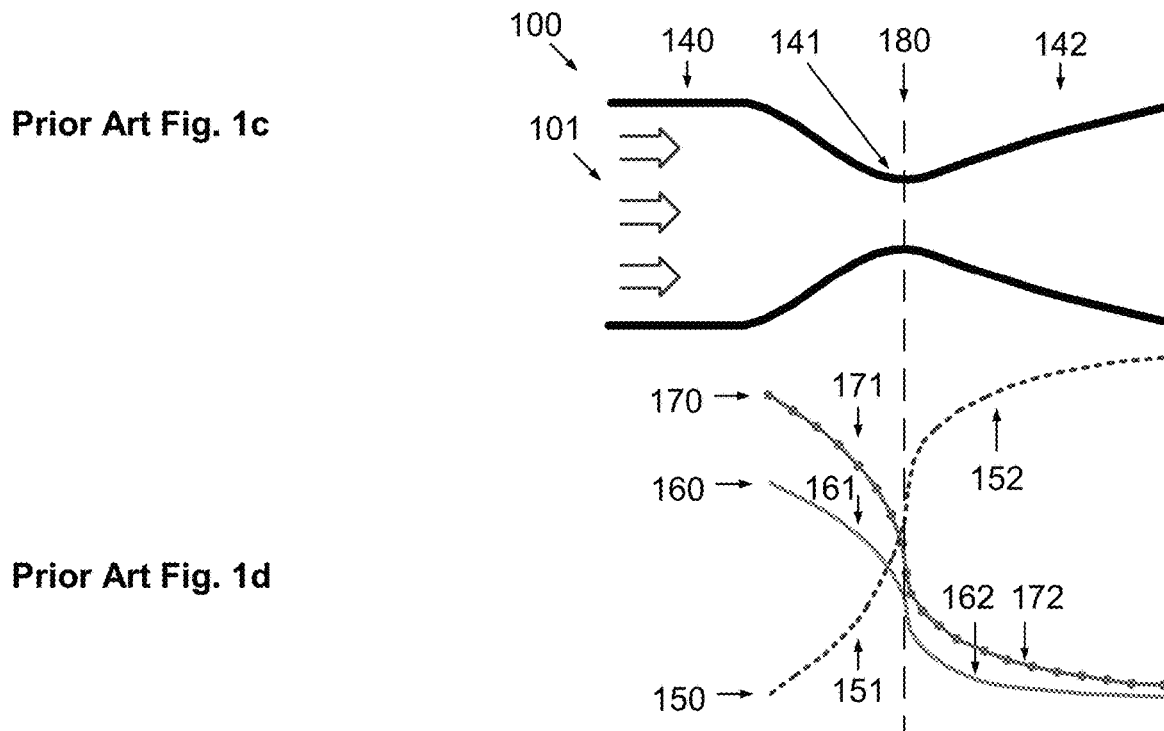
Prior Art Fig. 1c
Prior Art Fig. 1d

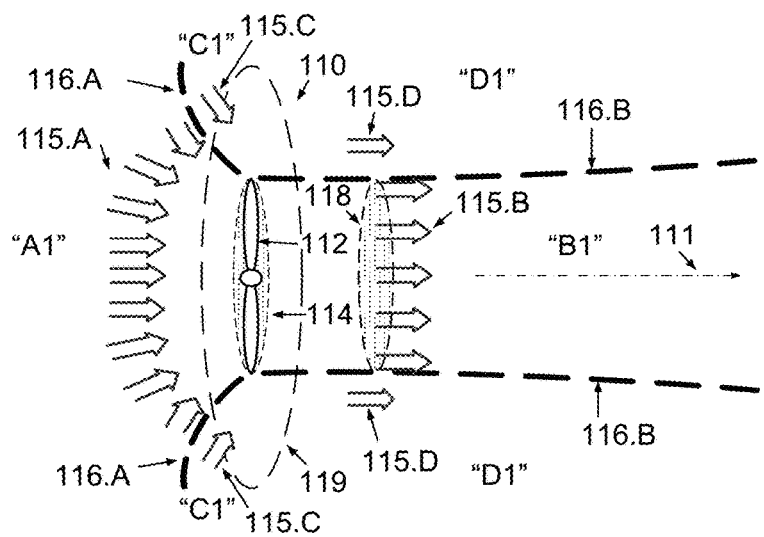
Prior Art Fig. 1e
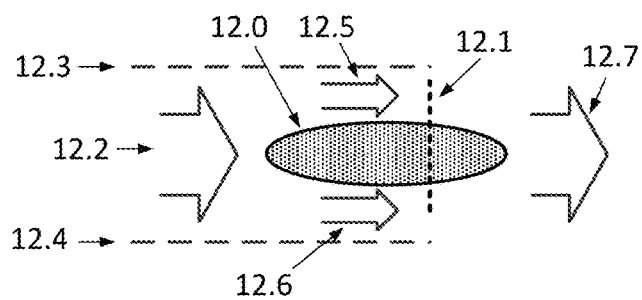
Prior Art Fig. 1f
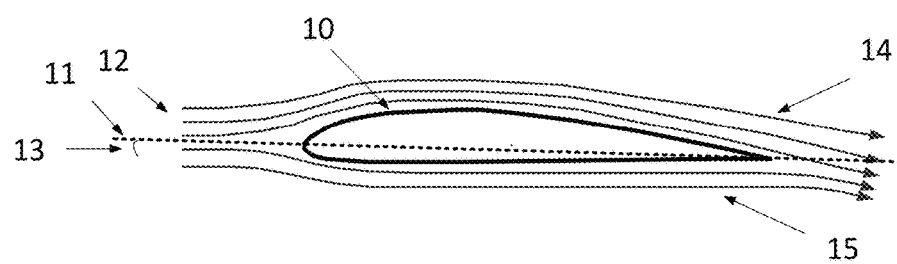
Prior Art Fig. 1g
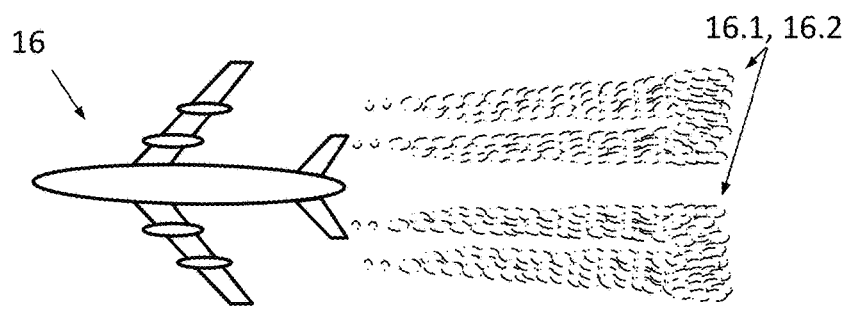
Prior Art Fig. 1h

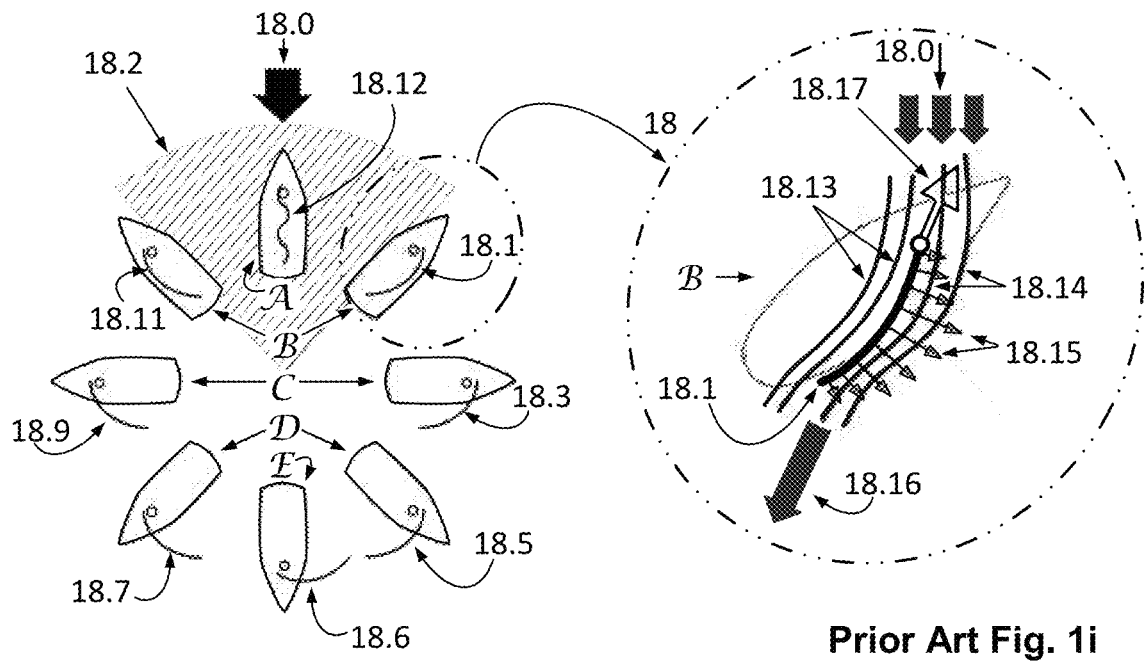
Prior Art Fig. 1i
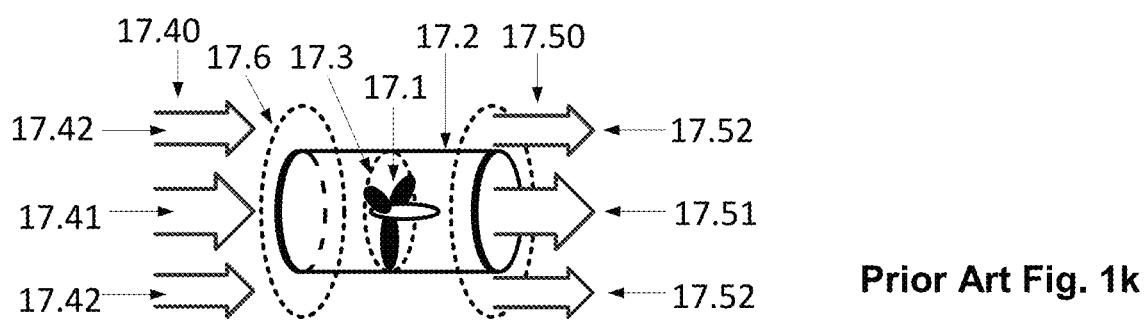
Prior Art Fig. 1k
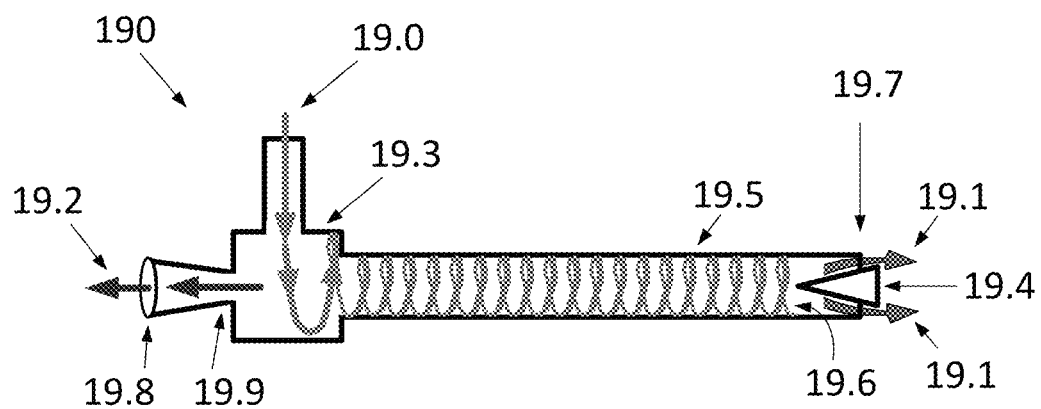
Prior Art Fig. 1l

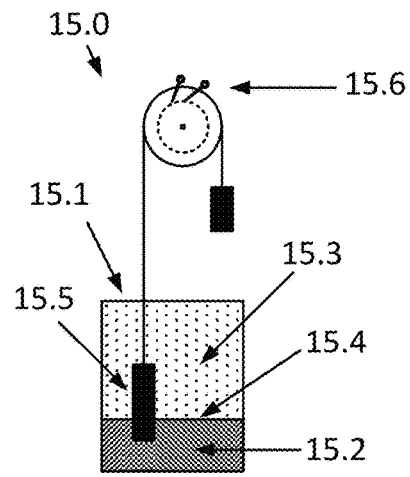
Prior Art Fig. 1m
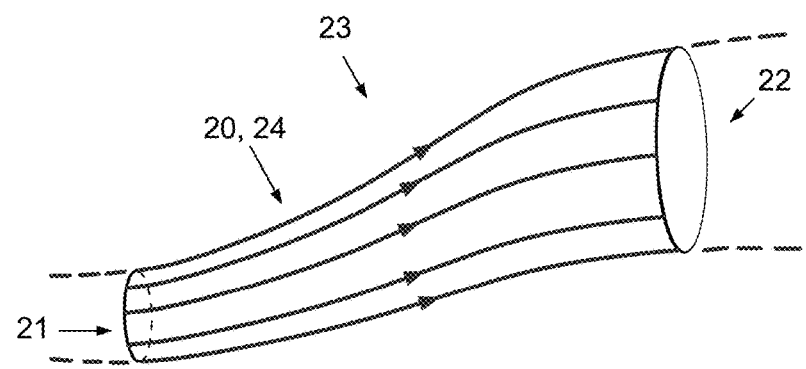
Prior Art Fig. 2
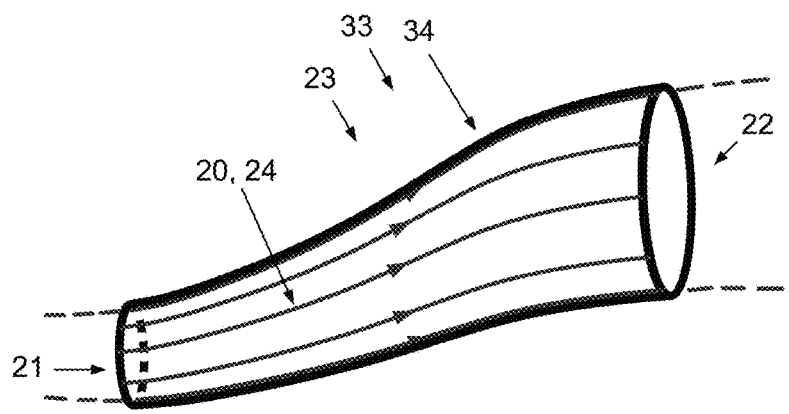
Prior Art Fig. 3

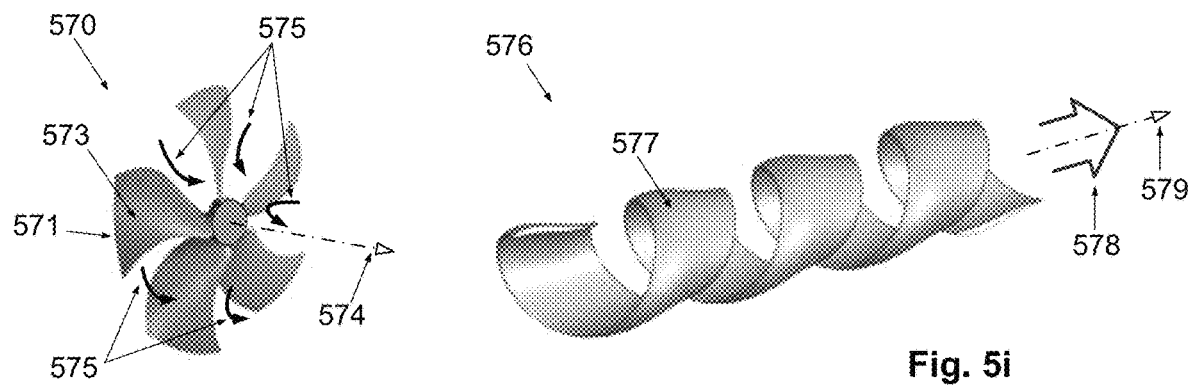
Fig. 5h
Fig. 5i
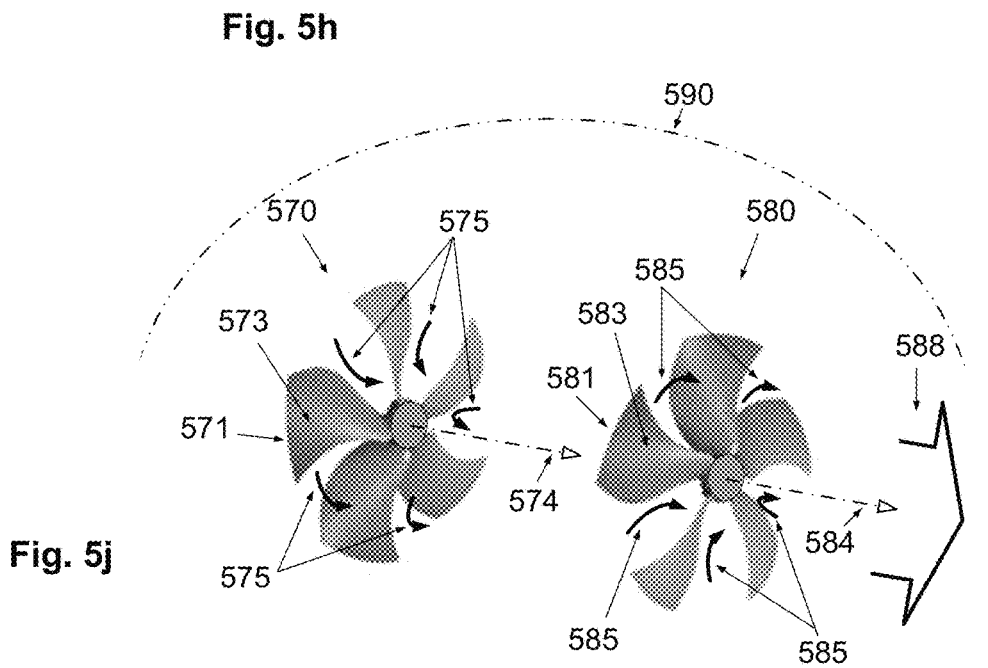
Fig. 5j
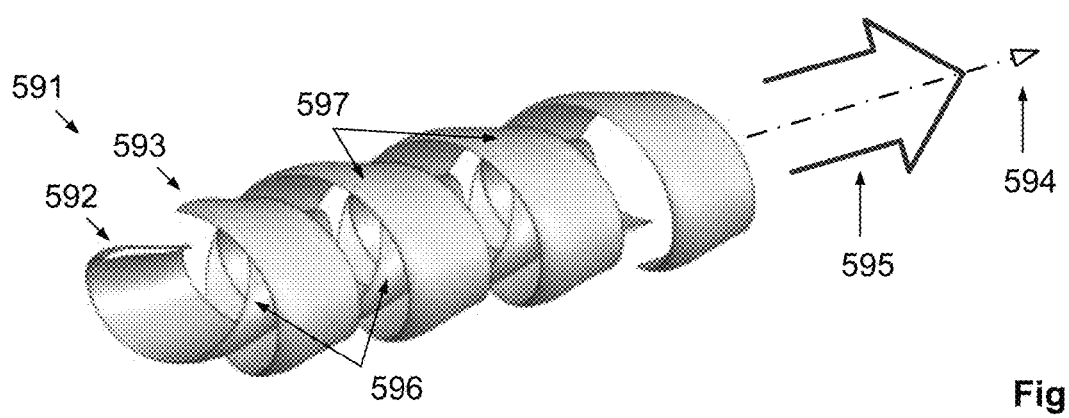
Fig. 5k

Pressure is linear

Fig. 6c

Temperature is linear

Fig. 6d

Density is linear

Fig. 6e

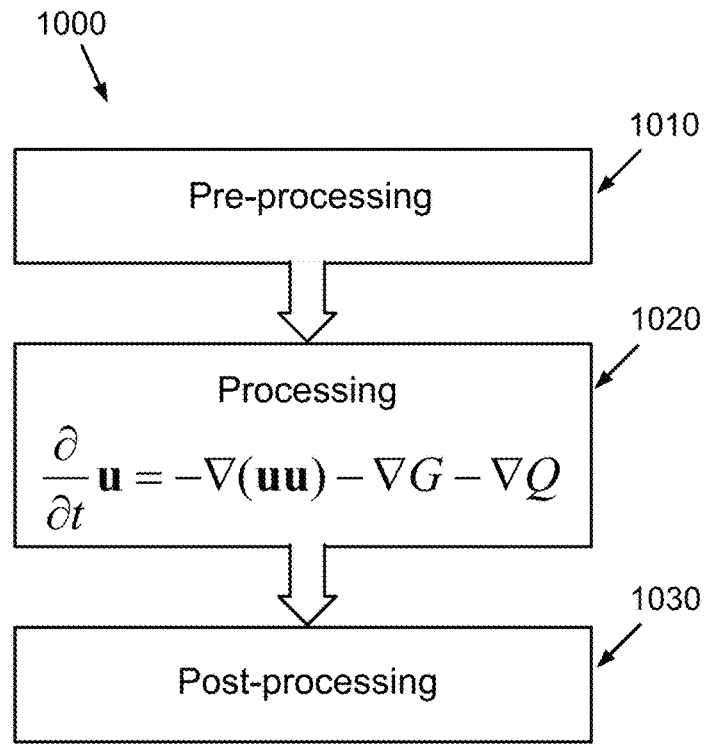

Fig. 10

Table-1                                                                Fig. 11

|  | Classic | Specified |
|---|---|---|
| Equation of fluid motion | $\frac{\partial}{\partial t}\mathbf{u} = -\nabla(\mathbf{uu}) - \frac{\nabla P}{\rho}$ | $\frac{\partial}{\partial t}\mathbf{u} = -\nabla(\mathbf{uu}) - \nabla Q$ |
| Adiabatic Compressibility Parameter | $j$ | $\gamma = 1 + r(j-1)$ |
| Equations of principle: Eq. (1) and Eq. (6.13) | $\frac{A}{A_*} = \frac{1}{M}\left[\frac{1+\frac{j-1}{2}M^2}{1+\frac{j-1}{2}}\right]^{\frac{j+1}{2(j-1)}}$ | $\frac{A}{A_*} = \frac{1}{M}\left(\frac{\gamma-1}{\gamma}\right)^{\frac{1}{2}}\left(\frac{2+\gamma M^2}{\gamma+1}\right)^{\frac{\gamma+1}{2(\gamma-1)}}$ |
| The specific M-velocity | $M_* = 1$ | $M_* = \sqrt{(\gamma-1)/\gamma}$ |

GENERALIZED JET-EFFECT AND GENERALIZED GENERATOR

CROSS-REFERENCE TO RELATED APPLICATIONS

This patent application is a continuation-in-part of U.S. patent application Ser. No. 15/409,876 filed on Jan. 19, 2017 and U.S. Pat. No. 15,648,469 filed on Jul. 13, 2017, which are incorporated herein by reference in its entirety. This patent application claims the benefit of U.S. provisional patent application 62/689,851 which was filed on 2018 Jun. 26 and is incorporated by herein reference in its entirety.

FIELD OF THE INVENTION

The invention relates generally to fluid dynamics and to use of jet-effect, applied to headway and oscillating motions in fluids, and, more particularly, to jet-effect modeling and use for either:
- design of an actually-airfoil profile of a birdlike wing, and/or
- design of an actually-airfoil convergent-divergent jet-nozzle, and/or
- an implementation of a hydrophobic jet-gear, and/or
- an implementation of a gravity-jet engine, and/or
- an implementation of a sequentially-arranged jet-boosters, and/or
- an implementation of constructive interference of acoustic waves in fluids, wherein the waving jet-effect is further translated in terms of electromagnetic waves.

The primary teachings of the present invention relate to methods and apparatuses, which are destined for the jet-effect triggering and thereby local acceleration of fluid portions and, in the final analysis, for conversion of the fluid portions warmth into the useful-beneficial power, either mechanical or electrical; wherein the local acceleration is self-revealing-and-manifesting as either:
- an accelerating headway motion of fluid portions, subjected to the Coanda-effect and/or the de Laval effect and/or the hydrophobic jet-effect; and/or
- an intensified oscillating motion of fluid portions, subjected to the waving jet-effect resulting in constructive interference of acoustic waves.

BACKGROUND OF THE INVENTION

The following issued patents and patent publications provide potentially relevant background material, and are all incorporated by reference in their entirety: U.S. Pat. No. 6,981,366 (Shame), US 2008/0061559 A1 (Hirshberg), U.S. Pat. No. 8,268,030 (Abramov), U.S. Pat. No. 8,221,514 (Abramov), U.S. Pat. No. 8,611,787 (Bulman), US2005/027498 A1 (CANON), US2014/288906 A1 (JAPAN), GB894450 A (GENERAL ELECTRIC), and US2011/083420 A1 (CLAY).

Preamble and Terminology

The well-known and widely-used jet-effect provides for the effect of gas extension and thereby acceleration. Accelerated flow is widely applied to propelling some kinds of vehicles having jet-engines usually supplied by either converging or convergent-divergent nozzles, to which the term "jet-nozzle" is also applied to emphasize the jet-effect importance. U.S. Pat. No. 6,981,366 by Sharpe overviews numerous modifications of the jet-effect implementation.

In US 2008/0061559 A1 patent application, Hirshberg points out that the jet-effect is accompanied by decreasing static pressure and temperature, and suggests applying the phenomenon as a trigger for vapor-to-water condensation.

In U.S. Pat. No. 8,268,030 "Wind Energy Use" and U.S. Pat. No. 8,221,514 "Ecologically Clean Method and Apparatus for Water Harvesting from Air", Abramov points out that a long cascade of streamlined nozzles provides a convergence of a wider front of fluid flow, and provides for an adaptation of the jet-effect use for big-scale devices.

In this invention, the equation of fluid motion is generalized to correspond to the kinetic theory of matter, wherein, in particular, it is shown that a consideration of a fluid, defined as composed of molecules in accordance with the kinetic theory of matter, provides for solving a series of confusing paradoxes, following from the definitions, restricted in the frames of the continuum mechanics.

One of the primary teachings of the present invention, in general, is a method for computational fluid dynamics and a modeling and optimal implementation of jet-effect, in particular, including the de Laval effect. Optimized jet-boosters, hydrophobic jet-gears, and gravity-jet engines are suggested.

As well, the inventor points out that an acoustic (elastic) wave is a particular case of the fluid local motion. The inventor takes note the well-known fact of the constructive and destructive interference of waves, when, correspondingly, in-phase and anti-phase portions of waves are joining. In particular, the joining of two anti-phase waves results in the destructive interference seeming as an annihilation of the waves; and the joining of two in-phase waves results in the constructive interference thereby forming a cumulative wave characterized by the double amplitude and fourfold power. The annihilation and fourfold power, both, if not to explain especially, contradict to The Energy Conservation Law.

Analogously, in relation to electromagnetic waves, a commonly known alternation of constructive and destructive interferences, observed as an alternation of excess and annihilation of the electromagnetic wave energy, correspondingly, i.e. a seemingly tunnel-like effect, if not to explain especially, contradicts to The Energy Conservation Law.

There is, therefore, a need in the art for a method and apparatus to provide a proper analysis and optimal design of a system, either elastic and/or electromagnetic, implementing controllable wave interference, appropriate for use in industry.

A generalized generator, capable of producing the electric power from the wave power increased due to constructive interference of elastic and/or electromagnetic waves, is suggested.

In physics, a wave is an oscillation accompanied by a transfer of energy that travels through a medium (space or mass). Waves consist of oscillations or vibrations (of a physical quantity), around almost fixed locations.

Wave motion transfers energy from one point to another, displacing particles of the transmission medium with little or no associated mass transport. The wave-front propagates in accordance with the Huygens-Fresnel principle saying that every point, which a wave-front disturbance reaches, becomes a source of a secondary spherical wave, wherein the interference superposition of these secondary waves determines the form of the wave at any subsequent time. The classical wave equation is defined as a particular case of the equation of medium motion, in turn, defined in frames of the continuum mechanics.

For the purposes of the present invention:
- a generalized acoustic wave equation is defined as a particular case of the equation of molecular fluid motion, generalized to correspond to the kinetic theory of matter; and
- generalized electromagnetic wave properties are defined by a translation of corresponding properties of elastic waves in the terms of the electrodynamics, basing on justified assumptions not contradicting to the modern scientific conventions, to satisfy Maxwell's equations for the electromagnetic field.

For the purposes of the present invention, the generalized term "universe background matter" should be understood in a broad sense, as a matter, which, in principle, presents in all points of space. Namely, the "universe background matter" is a generalized matter comprising at least a so-called dark matter and neutrino gas. As well, the inventor points out that the universe is filled with the background electromagnetic radiation characterized by the random spatial distribution of frequencies, amplitudes, phases, polarizations, and directions of propagation. Further, referring to the corpuscular theory of electromagnetic radiation, and so using the terminology of the kinetic theory of matter, for the purposes of the present invention, the term "electromagnetic gas" should be understood as the background electromagnetic radiation. [In quantum mechanics, the term "photon gas" is used.]

The inventor points out to the fact that the magnetic field, in principle, if not covered by an exotic hermetic and super-conductive shell, is spreading through any matter. The magnetic field can be locally compensated by (or strictly speaking, hidden due to) an opposite magnetic field.

For the purposes of the present invention, the generalized term "universe background energy" should be understood in a broad sense, as an energy, which presents in all points of space. Namely, the "universe background energy" is omnipresent generalized energy comprising at least:
- the so-called dark energy,
- the heat energy stored in the neutrino gas interpreted in terms of the kinetic theory of matter,
- the latent electromagnetic energy, hidden by the so-called destructive interference, to which the background electromagnetic radiation is subjected, i.e., in terms of the kinetic theory of matter, the latent electromagnetic energy is the internal heat-like energy stored in the "electromagnetic gas" (the inventor takes note that at least this portion of the universe background energy interacts with electromagnetic waves via constructive-destructive interference); and
- the potential energy stored in the gravitational field.

In relation to the molecular fluid, to analyze the equation of the molecular fluid motion and, in particular, the acoustic wave equation, for the purposes of the present invention, the term "jet-effect" is used in a wide sense as the effect of fluid flow portion convective acceleration at the expense of fluid portion internal heat energy. In particular, the jet-effect occurs when the fluid portion moves adjacent to configured walls and is subjected to the walls accelerating action, as seemingly "negative drag". For example, the fluid is gas and the walls are configured to form a converging or convergent-divergent nozzle. In particular, the term "jet-effect" is applied to the well-known and widely-used effect of convective acceleration of a wind-portion, which is flowing over a convex upper surface of an airplane wing and is thereby being subjected to the varying of flow front cross-section in an imaginary convergent-divergent nozzle. Another example is a case, wherein the fluid is water and the configured walls have a hydrophobic surface. Thus, the term "jet-effect", used here in a wide sense, assumes that the process of gas extension may be insignificant or latent.

The inventor takes note that, in frames of the classical kinetic theory of molecular gas, when considering a relatively weak jet-effect (when the temperature changes and so-called "black-body radiation" are negligible), one normally ignores the electromagnetic energy radiation originated by the randomly accelerating molecules of ideal gas, assuming that the radiation, being dominantly hidden due to the destructive interference, even though expected to be significant from the energetic point of view, is not subjected to the energy conversions substantially. The hidden electromagnetic energy is capable of a manifestation as well-known phenomena at least such as hydrophilicity, hydrophobicity, magnetism, piezo-electricity, photo-electricity, etc. One can estimate the hidden electromagnetic energy hypothetically capable of the manifestation. In particular, when considering a one-mole portion of a matter composed of Avogadro's number $N_A \approx 6 \times 10^{23}$ of molecules inherently having distributed electrical charges, wherein the Brownian motion of the molecules results in so-called thermal electromagnetic radiation caused by the random superposition of all elemental radiations thereby resulting in random constructive-destructive interference, the sum radiation power of the portion of matter can be estimated, for instance, either:
- as the radiation power being higher than the thermal electromagnetic radiation power by the factor $\sqrt{N_A}$, when considering a hypothetic assumption of ideally not-interfering electromagnetic rays of all the orthogonal radiations (for instance, that all the $N_A$ molecules are moving with regularized accelerations interrelating with effective velocities, cumulatively, corresponding to the portion of matter temperature, such that launching elemental radiations differing in frequency to result in orthogonal frequency modulation and so not interfering at least at one spatial point), or, alternatively,
- as the radiation power being higher than the thermal electromagnetic radiation power by the factor $N_A$, when considering a hypothetic assumption of ideally-constructive interference of all the elemental radiations (for instance, that all the $N_A$ molecules are moving in unison with a certain acceleration interrelating with the effective velocity, corresponding to the portion of matter temperature, and so are launching identical elemental radiations to result in constructive interference of all the originated identical elemental radiations at least at one spatial point).

For the purposes of the present invention, the term "imaginary wall", applied to flowing fluid streamlines, should be understood as a material (but not virtual) wall, formed by the fluid's matter, forcedly-bordering a portion of the flowing fluid. I.e. the material but optionally invisible by the human eye and thereby imaginary wall acts on adjoining fluid portions, enforcing the fluid portions to move along the streamlines, i.e. in alignment with the imaginary wall. When flowing plasma is subjected to an action of a magnetic field, "imaginary walls" are formed by the magnetic field's force-lines defining the streamlines of the flowing plasma. When considering the electromagnetic field, "imaginary walls" should be understood as formed by the electromagnetic field's force-lines.

The jet-effect is the nature of the well-known Coanda-effect, defined as a tendency of a fluid jetstream to be attracted to and aligned with a nearby airfoil surface, i.e. to be specifically accelerated at the expense of the fluid warmth. For the purposes of the present patent application, to emphasize the jet-effect nature of the Coanda-effect, the term "Coanda-jet-effect" is also applied as equivalent to the commonly known term "Coanda-effect". Looking ahead, the term "airfoil" will be specified as "actually-airfoil" in contrast to "seemingly-airfoil".

Looking ahead, in relation to the electromagnetic wave equation, for the purposes of the present invention, in contrast to the term "empty vacuum", the term "vacuum" should be understood in the modern sense as "filled" by the universe background matter and by the universe background energy, and the term "electromagnetic jet-effect" will be further introduced as having a further extended and specified sense to be applicable to the electromagnetic field in vacuum.

For the purposes of the present patent application:
The term "velocity of a flying body" should be understood as the body motion velocity relative to a stationary fluid; and vice-versa, the term "flow velocity" should be understood as the fluid flow velocity relative to the considered body submerged in the flowing fluid. These two terms are interrelated according to Galilean relativity;

The term "M-velocity" should be understood as the fluid velocity measured in Mach numbers, or identically, velocity normalized to the temperature dependent velocity of sound in the fluid;

The well-known terms "low-subsonic", "high-subsonic", "transonic", "supersonic", and "hypersonic" are used to specify the flow velocity ranges as the following:
  (a) the low-subsonic velocity range is defined as the M-velocity range comprising M-velocities lower than 0.3 Mach;
  (b) the high-subsonic velocity range is defined as the M-velocity range comprising M-velocities higher than 0.3 Mach and lower than 0.8 Mach;
  (c) the transonic velocity range is defined as the M-velocity range comprising M-velocities higher than 0.8 Mach and lower than 1.2 Mach;
  (d) the supersonic velocity range is defined as the M-velocity range comprising M-velocities higher than 1 Mach and lower than 5 Mach; and
  (e) the hypersonic velocity range is defined as the M-velocity range comprising M-velocities higher than 5 Mach.

Term "specific M-velocity" is introduced to separate the terms "low M-velocities", associated with M-velocities lower than the specific M-velocity indicated by $M_*$, and "high M-velocities", associated with M-velocities higher than the specific M-velocity $M_*$. The value of the specific M-velocity $M_*$ will be defined hereinbelow by a specific molecular structure of fluid. Furthermore, the term "essential M-velocity range" is defined as an M-velocity range comprising the specific M-velocity $M_*$; and The term "molecular fluid" should be understood as a fluid substance composed of randomly moving and interacting molecules, according to the kinetic theory of matter. Referring to the defined term "molecular fluid", the earlier defined term "flow velocity" is further specified as a measure of the molecular fluid molecules motion in a prevalent direction in addition to the random Brownian motion. For instance, air is considered as a molecular fluid, and wind is considered as a natural process, bringing fresh portions of air, storing at least both: the heat energy of molecules Brownian random motion and the kinetic energy of wind motion. Normally, in nature, when the wind is of 10 m/sec, the proportion is such that 99.96% is the heat energy [i.e. warmth] and only 0.04% is the kinetic energy. A phenomenon of a transformation of warmth into a hurricane power is well-known; however, the warmth of ambient natural air remains unused in the world industry. Possession of a technology to control the transformation of the surrounding air and/or water warmth into a directional motion of the fluid could provide a renewable cycle, comprising:
  transformation of the flowing fluid heat-power into acquired kinetic-power of an arisen jetstream (and/or into acquired wave power of an arisen wave);
  conversion of the jetstream kinetic-power into useful electric-power; and
  consumption of the electric-power, in the final analysis, inevitably dissipating back into the warmth of the surrounding matter.

There is, therefore, a need in the art for a method and apparatus to provide a proper analysis and optimal design of a system (mechanic and/or electromagnetic), implementing a controllable jet-effect (the Coanda-jet-effect and/or the electromagnetic jet-effect, correspondingly) appropriate for use in industry.

The Origin of Life

The term "chiral", applied to a body, has a sense that the body has an overall shape, asymmetric in such a way that the shape and its mirror image are not superimposable. Reference is now made to prior art FIG. 1a, showing schematically a so-called "left-handed" stereoisomer of an amino acid molecule, marked by numeral 1, being chiral, i.e. there is another so-called "right-handed" stereoisomer, marked by numeral 2, in reality or in potential, that is of identical composition, but which is arranged in a non-superimposable mirror image configuration.

The spatial chiral property defines a complementarity. For instance, a bolt and hex nut are complementary when the both have the same chiral screw. As well, for instance, it is well-known a helical antenna that is an antenna consisting of a conducting wire screwed in the form of a chiral helix. The chiral helix in the antenna can twist in two possible directions: right-handed or left-handed, as defined by the right-hand rule. In an axial-mode helical antenna, the direction of twist of the helix determines the polarization of radio waves: a chiral left-handed helix radiates chiral left-circularly-polarized radio waves, while a chiral right-handed helix radiates chiral right-circularly-polarized radio waves. When receiving circularly polarized signals, the chiral handedness of the receiving antenna must be the same as the transmitting antenna; chiral left-hand polarized antennas suffer a severe loss of gain when receiving chiral right-circularly-polarized signals, and vice versa.

A definition of life is neither simple nor unequivocal in the nowadays science. One qualifies a life as an existence of matter in a form of self-replicating protein molecules, or more fundamentally, of ribonucleic acid (RNA) molecules. However, the origin of life remains an extraordinary problem. The principal question about the origin of life is the following. What is the origin of the dominant presence of left-handed stereoisomers of amino acids in the live-nature on the Earth, even though their synthesis normally results in an equal mixture of the right- and left-handed molecular forms? Innumerable mechanisms have been proposed for the origin of left-chiral dominance in amino acids, and none has been proven.

There is, therefore, a need in the art for a method to provide a proper possible natural mechanism allowing for synthesis of long spiral-like molecules, composed of a certain kind of stereoisomers of amino acids only.

Venturi Effect

Reference is now made to prior art FIG. 1b. FIG. 1b is a schematic illustration of an airfoil-shaped convergent-divergent nozzle 102, pipe-section in a sagittal plane. The shape can be described as comprising an inlet part 103 constricting into a narrow throat 104, further followed by a divergent outlet part 105. When a fluid 106 flows slowly through convergent-divergent nozzle 102, a jet-effect is observed in an adiabatic process, i.e. velocity increases in narrow throat 104 at the expense of the static pressure in fluid 106. Speedometers 1071, 1072, 1073 and barometers 1081, 1082, 1083 illustrate the interrelated behavior of the velocity and static pressure. This jet-effect is known also as the Venturi effect. Thus, the Venturi acceleration effect is observed in the case of a slow and converging flow, and the Venturi retarding effect is observed in the case of slow and divergent flow.

The inventor points out and emphasizes that the phenomenon of the Venturi effect is the self-acceleration and self-retarding of an airflow portion, i.e. is the airflow velocity self-oscillation, at the expense of the air portion's warmth. I.e., in other words, the Venturi effect of the airflow velocity self-oscillation (as well as the Coanda-jet-effect) has the jet-effect nature.

When observing a freely falling water jetstream, one explains a conic constriction of the water jetstream by the Venturi effect, where the accelerated jetstream becomes accompanied by a decrease of the cross-sectional area.

Reference is now made again to prior art FIG. 1b, wherein now, all the shaped walls are made from a conductive material, for simplicity, from a hypothetic super-conductor. When an electric flux of the electric field 106 flows through convergent-divergent nozzle 102, comprising inlet part 103, narrow throat 104, and outlet part 105, a Venturi-like effect, applied to the electric field, is observed in an adiabatic process. Namely, the electric flux, indicated by $\Phi$, is defined as $\Phi=AE_A$, where A is the cross-sectional area and $E_A$ is the electric field, measured in the cross-sectional plane. The equation of continuity, applied to the electric flux, says that $\Phi_{103}=\Phi_{104}=\Phi_{105}$, i.e. $A_{103}E_{103}=A_{104}E_{104}=A_{105}E_{105}$, where indexes "103", "104", and "105" relate to inlet part 103, narrow throat 104, and outlet part 105, correspondingly. This means that the electric field $E_{104}$ in narrow throat 104, is higher than the electric field $E_{103}$ in inlet part 103 and higher than the electric field $E_{105}$ in outlet part 105. The energy $U_E$ of electric flux crossing the frontal area A is defined as $U_E=0.5A\varepsilon|E_A^2|=0.5\varepsilon E_A\Phi$, where $\varepsilon$ is dielectric constant. Comparing the electric field energy $U_{E103}=0.5A_{103}\varepsilon|E_{103}^2|$, $U_{E104}=0.5A_{104}\varepsilon|E_{104}^2|$, and $U_{E105}=0.5A_{105}\varepsilon|E_{105}^2|$, relating to inlet part 103, narrow throat 104, and outlet part 105, correspondingly, one confusingly discloses that the electric field energy is not constant, namely, the field energy $U_{E104}$ is higher than the field energies $U_{E103}$ and $U_{E105}$.

Looking ahead, the Venturi-like effect, applied to the electric and magnetic fields, will be explained and conceptually embodied in the present invention. It will be shown that the Venturi-like effect applied to an electric or magnetic field has a fundamental sense in electromagnetic waves propagation and interference.

De Laval Effect

Reference is now made to prior art FIGS. 1c and 1d. FIG. 1c shows schematically a pipe 100 referred to the de Laval nozzle that, in principle, is similar to pipe 102 shown in FIG. 1b, but now the incoming fluid-flow 101 is sufficiently fast such that fluid 101 becomes substantially compressible-expandable. In this case, in an adiabatic process, the de Laval effect is observed. This is the effect of extension of fluid 101 in the divergent outlet part 142 resulting in a further decrease of the static pressure and temperature and a correlated increase of the flow velocity.

FIG. 1d illustrates schematically graphics of distributions of the fluid-flow 101's (FIG. 1c) three parameters: velocity 150, static pressure 160, and temperature 170, each along the length of nozzle 100. A standard rocket convergent-divergent jet-nozzle 100 can be modeled as a cylinder 140 that leads to a constriction 141, known as the "throat", which leads into a widening "exhaust bell" 142 open at the end. The location of the narrowest cross-section of the throat is called as the "critical condition" point 180. High speed and therefore compressible-expandable hot fluid 101 flows through throat 141, where the velocity picks up 151 and the pressure and temperature fall, 161 and 171 correspondingly.

Hot fluid 101 exits throat 141 and enters the widening exhaust bell 142. It expands rapidly, and this expansion drives the velocity up 152, while the pressure and temperature continue to fall, 162 and 172 correspondingly. This jet-effect phenomenon of fluid 101 extra-acceleration at the expense of the fluid 101 heat energy, defined by the static pressure, temperature, and density, is applied to jet-engines, particularly to accelerate a rocket. A sharp slope of the static pressure, observed in throat 141, results in pressure waves, called Mach waves. An undesired influence of the Mach waves in the de Laval nozzle is described, for example, in U.S. Pat. No. 8,611,787 "Rocket nozzles for unconventional vehicles" by Bulman. Looking ahead, the enhanced jet-effects: the de Laval jet-effect and the de Laval retarding-effect, both will be conceptually embodied in the present invention.

Ordinary Blowing Ventilator

FIG. 1e is a prior art schematic drawing of ordinary blowing ventilator 110 operating in open air space. Ordinary blowing ventilator 110, defined by the main functionality to launch a jetstream characterized by the flow headway-motion kinetic-power, has an inherent engine [not shown here] consuming either a power of burned fuel or electric power. Ordinary blowing ventilator 110 comprises blades 112, having an asymmetrical shape such that, when forcedly rotating in frontal plane 119 and covering effective cross-section 114, suck air portions 115.A from space "A1" located upstream-afore effective cross-section 114 and convert air portions 115.A into an accelerated jetstream 115.6 entering space "B1" located downstream-behind effective cross-section 114. Space "A1", comprising air portions 115.A subjected to the sucking and motion through effective cross-section 114, is bordered by streamlines, forming imaginary contours 116.A. The imaginary contours 116.A separate space "A1" from space "C1", comprising air portions 115.C, drawn by moving air portions 115.A and flowing toward frontal plane 119 out of effective cross-section 114. Space "B1", comprising jetstream 115.6, is bordered by streamlines, forming imaginary contours 116.6. The imaginary contours 116.6 separate space "B1" from space "D1", comprising air portions 115.D, drawn by jetstream 115.6 and flowing downstream-behind frontal plane 119. A complicated motion of air portions 115.A, 115.6, 115.C, and 115.D comprises both: a headway-motion, i.e. a laminar component of motion aligned with the imaginary contours 116.A and 116.6 having a prevalent direction along imaginary sagittal axis 111, and a whirling-motion, i.e. a turbulent component of motion, dominantly, whirling around imaginary sagittal axis 111. For the purposes of the present patent application, the term "sagittal axis" is applied to an axis co-directed with a prevalent direction of a flow headway motion. The mentioned term "streamlines", applied to imaginary contours 116.A and 116.6, has a widened sense, spread to the streamlines projections on a plane comprising imaginary sagittal axis 111, for instance, either sagittal or transversal, meaning that there is no essential mass exchange between:
- air portions 115.A of space "A1" and air portions 115.0 of space "C1", and
- helically whirling jetstream 115.13 of space "B1" and air portions 115.D of space "D1".

The power, consumed by ordinary blowing ventilator 110 is expended for:
- the complicated motion of air portions 115.A, which then are transformed into helically whirling jetstream 115.6;
- the complicated motion of air portions 115.C, which then are transformed into moving air portions 115.D;
- the overcoming of air viscous-resistance; and
- the compensation of inner resistance of the inherent engine.

Wherein the part of the power consumption, expended for the overcoming of air viscous-resistance and compensation of inner resistance of the inherent engine, dissipates in the acquired warmth of outflowing air portions 115.6 and 115.D.

Streamlines 116.A and 116.6 constitute an imaginary convergent-divergent tunnel, where, in addition to the mentioned effect of flow complicated motion, powered by forcedly rotating blades 112, the Venturi effect, described above referring to FIG. 1b, occurring in an adiabatic process, is expected, thereby saving the power for the additionally acquired convective acceleration of jetstream 115.6. The velocity of jetstream 115.6 headway-motion is distributed on cross-section 118 non-uniformly. Shapes of forcedly rotating blades 112, on the one hand, define the shapes of imaginary contours 116.A and 116.6, and on the other hand, define the jetstream 115.6 headway-motion velocity distribution on cross-section 118. The resulting functionality net-efficiency of ordinary blowing ventilator 110 is defined by the ratio of the kinetic-power of launched jetstream 115.6 headway-motion to the power, consumed by the inherent engine of ordinary blowing ventilator 110. Taking into the account the mentioned Venturi effect, the resulting net-efficiency of ordinary blowing ventilator 110 interrelates with the Venturi effect efficiency.

The inventor points out and emphasizes that whereas the functionality net-efficiency of a blowing ventilator is provided, in particular, due to the Coanda-jet-effect, i.e. at the expense of ambient warmth, conditions, when the net-efficiency becomes higher than 100%, are not excluded. Looking ahead, in view of the description referring to FIGS. 7e and 7f of the invention, it will be evident to a person studied the invention, that such conditions are specified.

Phenomenon of Convective Self-Acceleration

FIG. 1f is a prior art schematic drawing of a body 12.0 blown by an initially laminar airflow having portion 12.2 enveloping body 12.0. It is assumed that a velocity of the airflow motion is much lower than 0.5 Mach, for instance, 1 m/sec. For simplicity and without loss of reasoning, consider a case when the body 12.0 corpus has at least partially airfoil shape providing for that ambient-adjoining sub-portions 12.5 and 12.6 of airflow portion 12.2 remain laminar at least upstream afore a frontal plane, crossing the body 12.0 corpus. Here,
- such a frontal plane is marked with the dotted line having numeral 12.1;
- dashed lines 12.3 and 12.4 are imaginary streamlines bordering airflow portion 12.2 as a whole and being sufficiently far from body 12.0 that allows to ignore the airflow streamlines minor curving when bordering ambient-adjoining sub-portions 12.5 and 12.6; and
- arrow 12.7 symbolizes a portion of downstream airflow, not obligatorily laminar.

When flowing around body 12.0, ambient-adjoining sub-portions 12.5 and 12.6 of airflow portion 12.2 become subjected to reshaping and can be considered as moving through an imaginary tunnel, which is characterized by varying cross-sectional area. According to the mass conservation law, called also the equation of continuity: $A\rho u =$ Const, where $\rho$ is the density of flux; u is the flux velocity, and A is the flux cross-sectional area, ambient-adjoining sub-portions 12.5 and 12.6 move faster than yet to be reshaped airflow portion 12.2 because the air density changes are minor at low airflow velocities and the sub-portions have the cumulative cross-sectional area smaller than the cross-sectional area of yet to be reshaped airflow portion 12.2. Therefore, the cumulative kinetic energy of ambient-adjoining sub-portions 12.5 and 12.6 is higher than the kinetic energy of oncoming airflow portion 12.2 yet to be subjected to the reshaping.

One of the key questions about the origin of flowing fluid portion acceleration is the following. At the expense of what kind of energy the sub-portions became accelerated, if the case is adiabatic? The answer to the question is the self-acceleration occurs at the expense of the internal heat energy of the flowing fluid portion itself, wherein the initial velocity of the flowing fluid portion plays a role of a "trigger-catalyst" defining an intensity of the self-acceleration, namely, a higher velocity results in a greater self-acceleration. The answer shows that the phenomenon of convective self-acceleration is inevitable for fluid flowing around a body with relatively low velocities in an adiabatic process, i.e. upon conditions usually provided in the actual practice.

The inventor points out and emphasizes that a portion of the flowing fluid may play the role of a body subjected to a blowing by another portion of the flowing fluid—this situation occurs, for instance, in acoustic waves.

Reference is now made again to prior art FIG. 1f, wherein now, the airfoil body 12.0 has a conductive shell, or, for simplicity, a shell made from a hypothetic super-conductor. When the electric flux $\Phi_{12.2}$, indicated by numeral 12.2, flows around body 12.0, a Venturi-like effect applied to the electric field is observed in an adiabatic process.

Namely, when flowing around body 12.0, ambient-adjoining sub-portions $\Phi_{12.5}$, indicated by numeral 12.5, and $\Phi_{12.6}$, indicated by numeral 12.6, of the electric flux $\Phi_{12.2}$ become subjected to reshaping and can be considered as flowing through an imaginary tunnel, which is characterized by varying cross-sectional area. According to the equation of continuity: $\Phi = AE_A =$ Const, where $\Phi$ is the electric flux, A is the cross-sectional area, and $E_A$ is the effective electric field, measured in the cross-sectional plane, the ambient-adjoining sub-portions $\Phi_{12.5}$ and $\Phi_{12.6}$ of electric flux $\Phi_{12.2}$ are characterized by electric fields $E_{12.5}$ and $E_{12.6}$, both (and hence, the weighted average effective electric field) being higher than the electric field $E_{12.2}$ of yet to be reshaped electric flux $\Phi_{12.2}$, i.e. $E_{12.5} > E_{12.2}$ and $E_{12.6} > E_{12.2}$, because the sub-portions have the cumulative cross-sectional area smaller than the cross-sectional area of yet to be reshaped flux $\Phi_{12.2}$. As the energy $U_E$ of electric flux crossing the frontal area A is defined as $U_E = 0.5 A \epsilon |E_A^2| = 0.5 \epsilon E_A \Phi$, where $\epsilon$ is dielectric constant, therefore, the electric energy of ambient-adjoining sub-portions 12.5 and 12.6 is higher than the electric energy of original flux 12.2 yet to be subjected to the reshaping.

Again, one of the key questions about the origin of the electric energy self-increase is the following. At the expense of what kind of energy the sub-portions became of higher energy if the case is adiabatic? The inevitable answer to the question is the self-increase occurs at the expense of the universe background energy (at least at the expense of the latent electromagnetic energy) stored in the space occupied by the electric flux itself, wherein the initial electric field of the flux plays the role of a "trigger-catalyst" defining an intensity of the self-increase, namely, a higher electric field results in a greater self-increase. The answer shows that the phenomenon of self-increase is inevitable for flux flowing around a conductive corpus in an adiabatic process, i.e. upon conditions usually provided in the actual practice.

Seeing the similarity of behaviors:
on the one hand, of fluid flow flowing around an airfoil body having a mechanical shell, and,
on the other hand, of electric flux flowing around an airfoil body having a conductive shell, for the purposes of the present invention, analogously to the Coanda-jet-effect, the term "electromagnetic jet-effect" is defined as a tendency of an electric field to be attracted to and aligned with a surface, capable of an interaction with the electric field, for instance, a conductive surface, wherein the tendency is accompanied by the electric field to be specifically increased at the expense of the universe background energy (at least at the expense of the latent electromagnetic energy).

Airfoil Wino

FIG. 1g is a prior art schematic drawing of a classic airfoil profile of an airplane wing 10 in a sagittal plane. The wing profile is recognizable by a rounded leading edge, a convex profile contour, having smoothly curved, elongated sides: more convex and lesser convex, and a sharp trailing end. A horizontal oncoming air stream 12 runs on the rounded leading edge and flows around wing 10, thereby being divided into two laminarly moving portions: upper air flux 14 and lower air flux 15, both stalling at the sharp trailing end. The axis 11 of wing 10 is defined as separating the upper and lower fluxes. Axis 11 of wing 10 and the horizontal direction of oncoming air stream 12 constitute a so-called "attack angle" 13. The more convex upper side provides a slippery surface, and the lesser convex lower side, exposed to oncoming air stream 12 with attack angle 13, and so subjected to an impact by lower air flux 15, has thereby more frictional-dragging surface. The Coanda-effect is defined as a tendency of a fluid jetstream to be attracted to and aligned with a nearby airfoil surface. The well-known lift-effect of an airplane wing 10 arises due to the non-symmetrical profile of wing 10 when the upper side is more convex. Firstly, a lift-force is defined by attack angle 13, which redirects the flowing wind. Secondly, when attack angle 13 is equal to zero, wing 10, having an ideally streamlined contour, provides that the sliding upper air flux 14 and the impacting lower air flux 15, both subjected to the Coanda-effect operation, meet behind wing 10. Sliding upper air flux 14 and impacting lower air flux 15, flowing around wing 10, incur changes in their cross-sectional areas and are accelerated convectively according to the mass conservation law. Considering relatively low velocities, the varying cross-sectional areas result in that the sliding upper air flux 14 runs faster than the impacting lower flux 15. According to Bernoulli's principle, this results in less so-called static pressure on wing 10 from sliding upper flux 14 than the static pressure from the impacting lower flux 15. If upper flux 14 and lower flux 15 flow around wing 10 laminarly, the difference of the static pressures is defined as $\Delta P = C_d \rho u^2/2$, where $\Delta P$ is the static pressure difference defining the lift-force, in particular, when attack angle 13 is equal to zero, $C_d$ is the coefficient, depending on wing 10's non-symmetrical profile, $\rho$ is the density of the air; and u is the velocity of the ambient airflow relative to wing 10. A wing, having an elaborated airfoil profile, provides for a gradual variation of the airflow static pressure along the profile's smoothly curved contour and, when flying with a certain velocity, results in a linear change of the airflow static pressure along the profile's smoothly curved contour, thereby satisfying a condition preventing an origination of turbulences. In practice, there are also turbulences and vortices of the fluxes, which are not shown here. The prevalent flows, turbulences and vortices result in a spatial distribution of the air static pressure, particularly, in a local static pressure reduction and local extensions of the flowing air. Consider an air portion flowing around wing 10, referring to the Clapeyron-Mendeleev law concerning a so-called hypothetical ideal gas state: $P = \rho R_0 T/\mu$, where P is the gas static pressure, $\rho$ is the gas density, T is the absolute temperature of the gas, $\mu$ is the gas molar mass, and $R_0$ is the universal gas constant. One could apply rough and more exact explanations for changes in the gas state parameters of the air portion flowing around wing 10.

Roughly, for the sake of estimation of a relatively slow wind tendency only, considering the flowing air as substantially incompressible gas, Gay-Lussac's law for an isochoric process interrelates the static pressure P and absolute temperature T by the equation $\Delta P/P = \Delta T/T$, i.e. the reducing static pressure is accompanied by the decreasing absolute temperature.

More exactly, for the wind at slow speeds as well as at higher speeds running, in general, at a non-zero attack angle 13, the air, being compressible-expandable as an ideal gas, flowing around wing 10, performs work W for the air portion volume extension, wherein the volume extension process is substantially adiabatic. The adiabatic extension results in a change of the portion of gas internal energy, accompanied by a static pressure reduction and temperature decrease. The work W performed by the wind portion of 1 mole flowing around wing 10 for the adiabatic process is defined as: $W = C_V \Delta T_a$, where $C_V$ is the molar heat capacity for an isochoric process, and $\Delta T_a$ is the adiabatic temperature decrease of the considered air portion. The value of the adiabatic temperature decrease $\Delta T_a = T_2 - T_1$ is bonded with static pressure reduction by the relation: $T_2/T_1 = (P_2/P_1)^{(j-1)/j}$, where $P_1$ and $P_2$ are the static pressures of the subject air portion before and after the adiabatic process correspondingly, and j is the adiabatic compressibility-constant, which is defined by the molecular structure of gas, wherein the value $j = 7/5$ is a good approximation for natural air as consisting dominantly of diatomic molecules. So, considering relatively low velocities, the Coanda-effect, occurring upon the convex side of wing 10, is accompanied by a kind of jet-effect, i.e. is accompanied by an observed acceleration of a wind portion and by the wind portion's static pressure and temperature decrease. Thus, the Coanda-effect and lift-effect are interrelated self-revealing-and-manifestations of the triggered jet-effect.

A well-known phenomenon of upper flux 14 adiabatic cooling at low-subsonic velocities is observed. Natural air is humid, and the local cooling, accompanied by the pressure reduction, acts, in particular, as a water condensation trigger. If the wind flows around a wing with an M-velocity equal to or higher than the Mach number (i.e. the speed of sound), a well-known phenomenon of shock sound-wave emission takes place. This shock sound-wave is not caused by wing vibration, but arises when myriad of acoustic waves become in-phase superposed thereby forming the resonance resulting in the shock sound-wave; moreover, it becomes evident that the shock sound-wave is originated at the expense of the internal heat energy of air and so is accompanied by the air temperature shock decrease, provoking the process of vapor condensation into water-aerosols.

FIG. 1h is a prior art schematic drawing of considerable amounts of water-vapor condense into water-aerosols 16.1 and sublimate into micro-flakes-of-snow 16.2, which are observed behind the high-speed aircraft's 16 wings' nozzles. One could note that the effect occurs at flow speeds substantially lower than the Mach number, i.e. it is not triggered by the mentioned phenomenon of shock sound-wave emission. This phenomenon explanation cannot be derived from the classical equations of fluid motion, predicting the extra-decrease of static pressure and temperature at transonic and supersonic velocities only. On the other hand, air-fluxes, which flow nearby around a body, become warmer and extra-warmed, when the body flies in air-environment with transonic, supersonic, and/or hypersonic velocities. A correct prediction of thermodynamic effects occurred in fluid flowing around a wing would provide an improved design of a wing shape to control and optimize the lift-effect. There is, therefore, a need in the art for a method and apparatus to provide a correct optimal design of the wing shape to reach the most efficient and controlled lift-effect.

Point of Sail

The term "point of sail" is used to describe a sailing boat orientation with respect to a prevalent direction of the ambient wind.

Prior art FIG. 1i is a schematic illustration of points of sail. A sailboat exposed to ambient wind 18.0 in positions and orientations: 18.1, 18.3, 18.5, 18.6, 18.7, 18.9, 18.11, and 18.12 with respect to the prevalent direction of ambient wind 18.0 is shown schematically. The positions and orientations of the sailboat, i.e. the points of sail, are classified by groups, indicated by symbols "A", "B", "C", "D", and "E". Group "A" is so-called "in irons" (into the wind) or "no-go zone", group "B" is so-called "close-hauled", group "C" is so-called "beam reach", group "D" is so-called "broad reach", and group "E" is so-called "running". The sailboat is a well-known example, showing that a passive sail, playing a role of a trivial nozzle, enables to move the sailboat at least partially in the upstream direction against ambient wind 18.0, for instance along a zigzag path. In other words, in fact, the passive sail exposed to ambient wind 18.0 produces "a net jet-thrust" against ambient wind 18.0. In simple words, in fact, the ambient wind 18.0 sucks the passive sail but not pushes it. Shaded sector 18.2 corresponds to the "no-go zone", where the single passive sail, being in position and orientation 18.12 belonging to point of sail group "A", does not provide a net jet-thrust in the upstream direction against ambient wind 18.0.

Point of sail "B", called also "B"-point of sail, having the sailboat position and orientation 18.1, is shown also in enlarged view 18. Streamlines 18.13 show a windward wind flow aligned with the concave side of sail; streamlines 18.14 show a leeward wind flow subjected to the Coanda-effect and so moving along a curved trajectory adjoining the convex side of elastic sail, self-adapted to pressures of the wind flows; a multiplicity of arrows 18.15 indicate "lift-forces", in this case, directed horizontally, caused by the difference between static pressures at the concave and convex sides of sail; and arrow 18.16 indicates a portion of wind accelerated convectively, i.e. at the expense of the internal heat energy of wind. The convectively accelerated wind portion 18.16 acts on the sailboat by reactive force 18.17 according to Newton's Third Law. Reactive force 18.17 is vectored in the upstream direction. While lift-forces 18.15 become compensated dominantly by a stabilizing reaction of the sailboat's keel, which is not shown here, the reactive force 18.17 defines the sailboat headway motion primarily.

The effect of net jet-thrust against ambient wind is a kind of jet-effect; i.e. it is the effect of convective acceleration of a wind portion flowing along a curved trajectory adjoining the convex side of passive sail in point of sail "B" due to the Coanda-jet-effect, and in turn, the accelerated wind portion causes the net jet-thrust, according to Newton's Third Law. To move against the wind, the sail, characterized by the point of sail "B" and orientation 18.1, must extract from the air the internal heat power, associated with the arisen reactive force 18.17, higher than the mechanical power of the oncoming wind 18.0 blowing the sail downstream away. In this case, one observes that the "drag-in-the-direct-sense", determined by the cumulative resistance of the sailboat to the oncoming airflow due to the sailboat non-zero frontal cross-sectional area and due to the effect of so-called skin-friction, is weaker than the seemingly "negative drag", determined by the jet-thrust.

The inventor takes note that, when tracing after a wind portion with respect to a system of coordinates linked with the wind portion yet to be accelerated due to the Coanda-jet-effect operation, one interprets the mentioned wind portion local acceleration as a peculiar shock-like wave propagating downstream, backward with respect to the headway motion of the sailboat.

For the purposes of the present invention, the introduced term "peculiar shock-like wave" or "peculiar wave" should be understood as a fluid reaction originated by a fluid portion local acceleration in a prevalent direction, in contrast to the term "forced wave" that should be understood as fluid oscillation originated and determined by an action of an external periodically-alternating force.

In view of the foregoing description referring to prior art FIG. 1i, it will be evident to a person skilled in the art that two sailboats, both being positioned in "B"-point of sail, wherein one of the sailboats has position and orientation 18.1 and the other sailboat has position and orientation 18.11, when connected and consolidated together and thereby aggregated as a whole, provide a condition for a resultant net jet-thrust applied to the aggregation, directed straight against ambient wind 18.0. In this case, the ambient wind 18.0 just sucks the passive pair of sailboats. The inventor points out and emphasizes that the phenomenon of net jet-thrust of sail in point of sail "B" occurs due to the self-acceleration of an airflow portion at the expense of the air portion's warmth. I.e., in other words, the net jet-thrust of sail in point of sail "B" occurs due to the Coanda-jet-effect. In spite of the fact that the effect of net jet-thrust against the ambient wind is widely used in cruising on water, the effect remains unused in the world industry. There is, therefore, a need in the art for a method and apparatus to provide a proper analysis and optimal design of a system, implementing the kind of jet-effect providing the net thrust in the upstream direction, for a controllable use in industry.

Flying Bird

For the purposes of the present patent application, the inventor points out to a flying bird, to take note that the jet-effect is not so exotic, to emphasize the jet-effect potential efficiency, and to make clear that the Coanda-jet-effect is one of the primary and quintessential aspects of the present patent application. The inventor points out that a flying bird makes waving motions rather than rowing or pushing off motions by its wings. The waving can be interpreted as a booster of the Coanda-jet-effect as well as a source of forced elastic waves. The inventor points out to a flying bird, the wings waving of which is not so frequent but nevertheless is enviably efficient. In particular for a pigeon, while the wings waving velocity with respect to the bird body is about 1 m/sec only, the bird flying-acceleration in a horizontal direction up to seemingly-paradoxical high velocities, higher than 10 m/sec (actually, higher than 30 m/sec and even 40 m/sec), becomes reachable; as well, a swift (Apodidae), being the fastest bird, waves not frequently at all; —it confirms that the primary mechanism of the flying-acceleration is at least not the pushing off in the direct sense.

For comparison, a flying relatively large bird, for instance, a golden-eagle, and a running cheetah, both overcome the air drag and support the upward and downward mobility (wherein the cheetah's vertical mobility is defined by a ground relief and small jumps of the cheetah's center of mass only). For simplicity of the comparison, ignore the sidelong (leftward and rightward) mobility. The flying golden-eagle, "pushing off" gaseous air (take note, the "pushing off" is not intensively-frequent), overcomes the air drag and supports the upward and downward mobility much easier and moves in the horizontal direction much faster, than the running cheetah pushing off a solid surface, wherein pushing off substantially more intensive-frequently providing for a velocity of paws with respect to cheetah's body being equal to the velocity of cheetah. At first glance, this fact looks like mystery and confusingly-paradoxical. However, it becomes easily-explainable, if not to ignore the triggered Coanda-jet-effect as for the lift-force as well as for the forward motion acceleration (analogously as the net jet-thrust in the aforementioned example with the sailboat in "B"-point of sail described with the reference to FIG. 1i). I.e. it becomes easily-explainable if the bird wing is interpreted as a sail oriented horizontally as "B"-point of sail to provide an upward-and-forward jet-thrust as seemingly "negative drag". In spite of the fact, that the efficiency of net jet-thrust of the flying bird is attractively high, the phenomenon remains unused in the world industry.

Further, a style of a flock of cranes flying is well-known. The style combines waving of wings, when the flying is accelerating, as well as wings gliding, when the flying is stabilized. This style prompts that:
  on the one hand, there are no turbulent vortices behind the gliding wings of the flying cranes and so the previous gliding crane does not hinder but even helps to the next gliding crane in lift and in jet-thrust; and
  on the other hand, there is an interference of omnidirectional waves generated by the waving wings of the cranes of flock, thus, it is self-suggested the assumption that the flying cranes use constructive interference thereby helping to each other in the waving-itself.

In spite of the fact that the cranes apply the cascaded multi-stage repeating and thereby reinforcing the Coanda-jet-effect for originating both: the lift-force and the net jet-thrust during a long time, this technique remains unused in the world industry.

There is, therefore, a need in the art for a method and apparatus to provide a proper analysis and optimal design of a system implementing the repeatedly reinforced Coanda-jet-effect of laminar moving fluid as well as the repeatedly reinforced constructive interference of waves in the fluid, both providing the scalable and controllable use of the acquired power in the industry.

In view of the foregoing description of subparagraph "Phenomenon of Convective Self-Acceleration" with the reference to prior art FIG. 1f, subparagraph "Airfoil Wing" with the reference to prior art FIG. 1g, and subparagraphs "Point of Sail" and "Flying Bird", both with the reference to prior art FIG. 1i, it will be evident to a person skilled in the art that:
  Regarding the well-known "ground-effect", in contrast to the well-known effect of proportional interrelation between the lift-force and drag-force predicted for alone classic wing flying in a free space, the "ground-effect", at the first glance characterized by a confusingly-paradoxical interrelation between the lift-force and drag-force, namely, by the increased lift-force and decreased aerodynamic drag (seemingly negative drag), becomes explainable if one takes into account that, when the classic wing is moving above and nearby a flat surface of ground, a boosting of the Coanda-jet-effect upon the convex upper surface of the wing is expected, and, as a result, the additional lift-force in the vertical direction and the additional net jet-thrust in the horizontal direction, both are acquired due to the Coanda-jet-effect boosting; wherein the seemingly aerodynamic drag reduction, actually, is the additional net jet-thrust acquired due to the boosted Coanda-jet-effect; and
  Regarding the well-known Gray's paradox in relation to a dolphin high-speed swimming, saying that, considering the water viscous resistance and the dolphin's potential muscle power, the dolphin swimming with the velocity ten times higher than expected is confusingly-paradoxical, the Gray's paradox becomes solvable if, in addition to the dolphin muscle power, one takes into account:
    the dolphin epidermis hydrophobicity, resulting in a reduction of the viscous skin-friction providing a so-called "free-slip" condition of motion, and especially,
    the dolphin body airfoil shape forming "B"-point of sail, resulting in the net jet-thrust interrelated with the water portions local acceleration (accompanied by the backward peculiar shock-like and forced waves) originated due to the Coanda-jet-effect (i.e. at the expense of the ambient water warmth) which becomes triggered when the dolphin headway motion is accompanied by the dolphin's body waving.

The inventor points out that the mentioned tenfold increase in velocity corresponds to the increase in power by the factor of 1000. This says that the combination of hydrophobicity, shaping of a body, and a waving motion may become the primary-decisive mechanism of motion that will be shown hereinafter in the description referring to FIGS. 5c, 5d, 5f, 5g, 5h, 5i, 5j, and 5k.

For the purpose of the present invention, a portion of kinetic power, acquired by a body due to the Coanda-jet-effect in an adiabatic process:
  which is manifested as a power, supporting an upward motion perpendicularly to the oncoming flow direction, is further called a lift-force power, and, alternatively,
  which is manifested as a power, supporting a forward motion against the oncoming flow direction, is further called a jet-thrust power.

Tornado as a Kind of Jet-Effect

The inventor points out to the fact that a source of the natural tornado is two meeting relatively slow winds, resulting in that an arisen weak vortex is gradually transforming into a strong tornado. As well, the inventor takes note that the tornado brings rain, i.e. it condenses airborne vapors into water-aerosols and further into drops of rain. I.e. the tornado reduces the temperature down to the dew-point temperature even on a warm day. In other terms, the tornado, as an open thermodynamic system, decreases its entropy as well. This is an additional example, wherein the temperature of air is transformed into the kinetic energy of airflow. Hence, the natural tornado self-acceleration is a kind of the jet-effect. In spite of the fact, that the efficiency of the tornado jet-effect is attractively high, the phenomenon remains unused in the world industry.

Further, the inventor points out that the well-known Great Red Spot of Jupiter is a stabilized tornado having portions of gas having the static pressure of about 100 kPa and rotating with the velocity of about 180 m/sec. Looking ahead, in view of the description referring to FIG. 9e of the invention, it will be evident to a person studied the invention, that an artificially or naturally created tornado becomes stabilized when the effective velocity of a certain portion of rotating gas is reaching the specific M-velocity, depending on the effective adiabatic compressibility parameter of the gas.

As well, the inventor points out that the well-known Saturn's Hexagon is a stabilized tornado having built-in stabilized specific spatial distribution of velocities in the form of a regular hexagon. Looking ahead, in view of the description referring to FIG. 9e of the invention, it will be evident to a person studied the invention, that an artificially or naturally created tornado becomes stabilized and specifically shaped when the effective velocity of a certain portion of rotating gas is reaching the specific M-velocity, depending on the effective adiabatic compressibility parameter of the gas. Further, the inventor points out that the stabilized cycling motion can be transformed into a stabilized oscillating motion generating peculiar waves interfering constructively.

There is, therefore, a need in the art for a method and apparatus to provide a proper analysis and optimal design of a system implementing the tornado jet-effect providing the scalable and controllable use of the acquired power in the industry.

Betz's Law Applicability and Confusing-Paradoxical Approach

Betz's law, derived in frames of the continuum mechanics, is declared as applicable to a hypothetical incompressible fluid stream undergoing an isothermal process and indicates the maximum power that can be extracted from wind, considered as such a fluid stream. The maximum power is independent of the design of a wind turbine in open flow. The law is derived from the principles of conservation of mass and momentum of the fluid stream flowing through an idealized "actuator disk", that can be imagined as effective cross-section covered by blades of the rotor, that extracts kinetic-power from the wind stream. According to Betz's law, no turbine can capture more than 16/27 (59.3%) of the kinetic-power in wind. The factor 16/27 (0.593) is known as Betz's coefficient. One explains the Betz approach as follows. Consider that if all of the kinetic energy coming from the wind moving through a turbine's effective cross-section was extracted as useful energy the wind speed afterward would drop to zero. If the wind stopped moving at the exit of the turbine's effective cross-section, then no more fresh wind could get in—it would be blocked. In order to keep the wind moving through the turbine's effective cross-section, there has to be some wind movement, however small, on the other side with a wind speed greater than zero. Betz's law shows that as the fluid flows through a certain area, and when it slows from losing the kinetic energy to extraction from a turbine, it must spread out to a wider area. The mass conservation law and the energy conservation law, both applied to the hypothetical case of incompressible fluid stream undergoing an isothermal process, limit any turbine efficiency to 59.3%. The Betz limit has no dependence on the geometry of the wind extraction system; therefore, the cross-sectional area of the rotor may take any form, providing that the flow travels from the entrance to the exit and wherein the control volume has uniform entry and exit velocities. Any extraneous effects can only decrease the performance of the system (usually a turbine) since this analysis was idealized to disregard friction. Any non-ideal effects would detract from the energy available in the incoming fluid, lowering the overall efficiency.

To analyze an applicability of the Betz law in practice, reference is now made to prior art FIG. 1k, a schematic illustration of a wind turbine 17.1 built-in into cylinder 17.2 having real sidewalls and open butt-ends. A constant cross-sectional area 17.3 is equal to the effective cross-sectional area covered by rotor's blades and equals $A_{41}$. Cylinder 17.2 is exposed to the ambient fluid stream, which, when yet to be subjected to the influence of cylinder 17.2 supplied by wind turbine 17.1, has a density $\rho_{40}$ and velocity $u_{40}$. When portion 17.40 of the fluid stream becomes subjected to a substantial influence of cylinder 17.2 supplied by wind turbine 17.1, it is considered as composed of sub-portions 17.41 and 17.42. Sub-portion 17.41 of the fluid stream enters cylinder 17.2 with a certain headway-motion velocity, indicated by $u_{41}$. Sub-portion 17.42 of the ambient fluid stream has a cross-sectional area, indicated by $A_{42}$, equal to the difference between cross-sectional area 17.6 and cross-sectional area 17.3, and flows outside cylinder 17.2 with headway-motion velocity, indicated by $u_{42}$. As the condition of mass conservation must be satisfied, then $\rho_{40}(A_{41}+A_{42})u_{40}=\rho_{41}A_{41}u_{41}+\rho_{42}A_{42}u_{42}$, where $\rho_{41}$ and $\rho_{42}$ are densities of sub-portions 17.41 and 17.42, correspondingly.

One expects that:
according to the mass conservation law, sub-portion 17.51 of the fluid stream outflows from cylinder 17.2 with the headway-motion velocity $u_{51}$, which is equal to the headway-motion velocity $u_{41}$ of entering sub-portion 17.41, while the fluid stream density change is negligible;
blades of wind turbine 17.1, being subjected to the stream action, are forcedly rotating and thereby generating an electric power; and moreover,
outflowing sub-portion 17.51 gets also a certain rotational component of motion. I.e. the resulting kinetic energy of the outflowing sub-portion 17.51 becomes increased with respect to the kinetic energy of entering sub-portion 17.41, wherein, the kinetic energy increase is defined by a value proportional to the second power of the acquired rotational component of velocity.

This intuitive expectation is paradoxical from the point of view of the Betz approach because one expects to harvest electric power and observe accelerated or at least not retarded outflowing sub-portion 17.51 of the fluid stream simultaneously.

Some inventors have made claims of exceeding the Betz limit by using nozzles and some examiners interpret it as misrepresenting the Betz limit by calculating only the area, covered by the rotor blades, and not the total input of air contributing to the wind energy extracted from the system. In other words, the idealized "actuator disk" is interpreted as wider than the cross-section, covered by the rotor blades; and the electric power, produced by wind turbine 17.1, is harvested at the expense of the kinetic-power of fluid stream portion 17.40 as a whole.

Again, referring to prior art FIG. 1k, consider a hypothetically ideal wind turbine 17.1 exposed to an ambient fluid stream, having oncoming portion 17.40, wherein now, in general, cylinder 17.2 is either real or imaginary, i.e. sub-portions 17.41 and 17.51 may differ in velocity. For simplicity and without loss of reasoning, assume that outflowing sub-portion 17.51 does not get a rotational component of motion in the ideal case. The kinetic-power of fluid stream portion 17.50 as a whole, which being subjected to the influence of wind turbine 17.1, equals $$(W_{51}+W_{52})=(1/2)\times(\rho_{51}A_{51}u_{51}^3+\rho_{52}A_{52}u_{22}^3)$$

where indexes "51" and "52" indicate sub-portions 17.51 and 17.52 correspondingly, $W_{51}$ and $W_{52}$ are kinetic-powers, $u_{51}$ and $u_{52}$ are effective velocities, $\rho_{51}$ and $\rho_{52}$ are effective densities, and $A_{51}$ and $A_{52}$ are cross-sectional areas. The kinetic-power of fluid stream portion 17.40 as a whole, which being uniform and yet to be subjected to the influence of wind turbine 17.1, indicated by $W_{40}$, equals $W_{40}=(1/2)\times\rho_{40}(A_{51}+A_{52})u_{40}^3$, wherein $u_{40}$ and $\rho_{40}$ are correspondingly velocity and density of portion 17.40 as a whole. The velocity $u_{40}$ can be expressed via the effective velocities $u_{51}$ and $u_{52}$ in accordance with the mass conservation law as:

$$u_{40} = \frac{\rho_{51}A_{51}u_{51} + \rho_{52}A_{52}u_{52}}{\rho_{40}(A_{51} + A_{52})}.$$

Comparing the kinetic-power of fluid stream portion 17.50 as a whole, equal to $(W_{51}+W_{52})$, with the kinetic-power of fluid stream portion 17.40 as a whole, equal to $W_{40}$, and, taking into account that the Betz approach assumes a hypothetically incompressible fluid i.e. $\rho_{40}=\rho_{51}=\rho_{52}'$ one can derive that the kinetic-power difference $(W_{51}+W_{52})-W_{40}$ is always a positive value. For instance, considering the case when the condition $A_{51}=A_{52}$ is satisfied, the difference is expressed as $(W_{51}+W_{52})-W_{40}=(3/8)\times\rho_{40}A_{51}(u_{51}+u_{52})(u_{51}-u_{52})^2$.

The positive value on the right side of the equation says that the kinetic-power of flow portion 17.50 subjected to the influence of wind turbine 17.1 is increased with respect to the kinetic-power of flow portion 17.40 yet to be subjected to the influence of wind turbine 17.1. This result is confusing-paradoxical from the point of view of the Betz approach, assuming that the electric power produced by wind turbine 17.1 is harvested from (i.e. by reducing) the kinetic-power of fluid stream portion 17.40 as a whole. Therefore, the Betz approach is not suitable to describe this case as well. Thereby, the approach, based on the interpretation of airflow or streaming water as a hypothetically incompressible fluid stream undergoing an isothermal process and wherein the control volume has uniform entry and exit velocities to apply Betz's law, is not adequate sufficiently and sometimes loses a practical sense.

There is therefore a need in the art for a method to provide a proper analysis of an aerodynamic system comprising a wind turbine, thereby allowing for an optimal design of an apparatus for stream energy use.

Vortex Tube

Prior art FIG. 1l is a schematic illustration of a well-known "vortex tube" also known as the Ranque-Hilsch vortex tube. It is a mechanical device 190 that separates a compressed gas 19.0 into hot 19.1 and cold 19.2 streams. It has no moving parts. Pressurized gas 19.0 is injected tangentially into a swirl chamber 19.3 and accelerates to a high rate of rotation. Due to a conical nozzle 19.4 at the end of the tube 19.5, only the outer shell of the rotated gas 316 is allowed to escape at the butt-end outlet 19.7. As a result, this portion 19.1 of the gas is found to have been heated. The remainder of gas 19.6, which performs an inner vortex of reduced diameter within the outer vortex, is forced to exit through another outlet 19.8. As a result, this portion 19.2 of the gas is found to have been cooled. In an exemplary application, if the entering air is compressed to 6.9 bars at 21° C., the hot stream may be of 76° C. and the cool stream may be of −34° C. There are different explanations for the effect and there is a debate on which explanation is best or correct. However, the absence of a strong theory of the phenomenon makes it difficult to design an optimal shape of the vortex tube to reach a substantially more effective use of the phenomenon.

There is, therefore, a need in the art for a method and apparatus to provide a correct optimal design of the vortex-tube inner shape to reach the most efficient cooling flows.

Phenomenon of Hydrophobicity and the Beverley Clock

Hydrophobicity is the physical property of a matter, frequently called a hydrophobic matter. The hydrophobic matter is composed of molecules which are seemingly repelled from a mass of water; and vice-versa, molecules of water are seemingly repelled from a mass of the hydrophobic matter.

The reason for hydrophobic interaction is the large energy of the hydrogen bond [attraction] between water molecules, superior the energy of the interaction between the water molecules and molecules of the hydrophobic matter. Strictly speaking, there is no repulsive force involved; it is a lack of attraction between the inter-contacting water and hydrophobic matter. (In contrast, molecules of a so-called hydrophilic matter are attracted to water.)

If the hydrophobic matter and water, both are in the liquid state, the inter-repelling results in separating the hydrophobic matter and water by a boundary. On the one hand, the boundary is a hydrophobic surface repelling the water, and, on the other hand, the boundary is a water surface repelling the hydrophobic matter.

Reference is now made to FIG. 1m, a prior art schematic illustration of construction 15.0 representing the core mechanism of the well-known Beverley Clock, which being situated in a conditioned room and located within a closed "locker" and so, at the first glance, seeming as a closed system from the point of view of thermodynamics, is seemingly-confusing running, in principle, non-stop since 1864, despite never having been manually wound up. Construction 15.0 comprises tank 15.1 filled with water 15.2 and liquid hydrophobic oil 15.3. Because construction 15.0 is in the gravitational field of Earth and the density of liquid hydrophobic oil 15.3 is lower than the density of water 15.2, separating boundary 15.4 is horizontal and liquid hydrophobic oil 15.3 is above the separating horizontal boundary 15.4. Sinker 15.5 is floating nearby separating boundary 15.4 between hydrophobic oil 15.3 and water 15.2. The inter-contacting water 15.2 and liquid hydrophobic oil 15.3 are inter-repelling, i.e. molecules of both: water 15.2 and liquid hydrophobic oil 15.3 become subjected to the repellent action of separating boundary 15.4. The action causes the molecules, adjacent to separating boundary 15.4, to have a tendency to vector their velocities, resulting in an asymmetrisation of degrees of freedom of the molecules Brownian motion that is observed as acceleration of the molecules in a prevalent direction: upwards for hydrophobic oil 15.3 and downwards for water 15.2, thereby compressing distant layers of the liquids. In turn, when the degrees of freedom of the molecules Brownian motion are destabilized and changed, other molecules, at the moment belonging to the distant layers of the liquids, get a tendency to refill the freed niche of the degrees of freedom, i.e. the other molecules get an opposite asymmetrisation of their degrees of freedom. Thus, the Brownian motion of molecules becomes partially transformed into a convective motion, i.e. the molecules convective motion occurs at the expense of the degrees of freedom of the Brownian motion, i.e. at the expense of the liquids warmth. Thereby, the originated convective motion, consuming caloric from the liquids warmth, can be interpreted as a kind of jet-effect. The convection (accompanied by cooling, and so by changes of densities of the water and oil, and by associated changes in the Archimedes forces) moves sinker 15.5. The upwards and downwards swinging motion of sinker 15.5 wounds up the clock-mechanism 15.6, i.e. set the Beverley clock going, while the consumed caloric is continuously refilled from the ambient air warmth.

Analogously (but without the obligatory presence of gravitation in a certain direction and without a sinker), two inter-contacting inter-repelling fluids are used in a modern well-known Atmos clock, which does not need to be wound up manually as well. Namely, construction of the Atmos clock core mechanism [not shown here] has a hermetic box comprising an easily-evaporating ethyl chloride, being in the mixed aggregate state: saturated-gaseous and liquid. The Van der Waals attraction forces, pre-determining inter-molecular stress for the liquid aggregate state, are stronger than the Van der Waals attraction forces between the liquid and saturated gas. This provides that the saturated-gaseous and liquid aggregate states of ethyl chloride play roles of the two inter-contacting inter-repelling fluids (the inter-repelling is due to a lack of attraction). The inter-repelling destabilizes the mixed state resulting in convection motion, dominantly, of the saturated gas. The convection motion occurs at the expense of the ethyl chloride warmth that is observed as self-cooling of the ethyl chloride. Again, the convective motion, consuming caloric from the fluids warmth, can be interpreted as a kind of jet-effect. The tendency to the convecting gas self-cooling is accompanied by a tendency to the convecting gas self-compression, according to the van der Waals law about the gas state. While the consumed caloric is continuously refilled from the ambient air warmth, the self-compression and decompression of gas set the Atmos clock going.

In view of the foregoing description of the Beverley Clock core mechanism (i.e. construction 15.0) referring to FIG. 1*m*, it will be evident to a person skilled in the art that the core mechanism comprises all the inherent attributes of a so-called heat-engine, open from the thermodynamics point of view, namely:
  the liquid hydrophobic oil and water (when considered as matters exposed to ambient warmth either substantially-constant or varying), both playing the role of an inherent absorber of warmth from the ambient air;
  the hydrophobic surface, repelling nearby molecules, i.e. triggering the jet-effect, i.e. triggering the convection motion, accompanied by cooling, and thereby, playing the role of an inherent so-called "cold sink";
  the moving sinker playing the role of an inherent so-called working body, wherein the sinkers motion is a result of the convective motion, accompanied by cooling, by changes of densities of water and oil, and by associated changes in the Archimedes forces; and
  in the final analysis, the clock-mechanism, playing the role of an outer object consuming power to perform useful work; wherein the energy acquired by the sinker (as a working body) is further divided between the sinker swinging and the clock-mechanism wounding up.

In view of the foregoing description of the Atmos Clock core mechanism, it will be evident to a person skilled in the art that the aforementioned hermetic box can be filled with any easily-evaporating matter being in the mixed aggregate state: liquid and gaseous. In principle, water, when being in the mixed aggregate state: liquid and vapor, can play the role of such a matter capable of a self-cooling. Namely, a hermetic container, partially filled with liquid-water and partially filled with a substantially dry gaseous air, both being under the atmospheric pressure and having the same temperature, is an exemplary seemingly closed but in reality open system from the point of view of the thermodynamics. In this case, water molecules, which are spontaneously broken away from the surface of the liquid-water, become hydrophobic by definition [i.e., formally, attraction forces between under-surface liquid-water molecules having collective hydrogen bonds are stronger than the attraction forces between the liquid-water and the vapor (i.e. the water molecules which are broken away)]. This results in that, statistically, the spontaneously broken away water molecules do not return to the liquid-water while and until the humidity of the substantially dry air is lower than normal for the current temperature and static pressure within the hermetic container. The self-evaporation process (i.e. the self-separation between the liquid-water and vapor) is accompanied by a self-decrease in temperature (it is well-known that the water evaporation is an endothermic process). The self-decrease in temperature is a symptom of openness of the thermodynamic system, wherein the openness is provided at least by the presence of the inter-contacting inter-repellent fractions: the liquid-water and vapor.

In spite of the fact that the effect of convection motion, in the final analysis, occurring at the expense of ambient warmth, is used for autosetting the clock going, the effect remains unused in an enlarged scale in the world industry.

There is, therefore, a need in the art for a method and apparatus to provide a proper analysis and optimal design of a system implementing the kind of jet-effect providing the motion due to the hydrophobicity for a scalable use in industry.

Diversity of Mechanisms of Fluid Repellence

Diamagnetism is the property of an object, which causes it to create a magnetic field in opposition of an externally applied magnetic field, thus causing a repulsive effect such that diamagnetic materials are repelled by a permanent magnet. Specifically, an external magnetic field alters the orbital velocity of electrons around their nuclei, thus changing the magnetic dipole moment in the direction opposing the external field. Diamagnetic materials are materials with a magnetic permeability $\mu$ being less than $\mu_0$ (i.e. a relative permeability $\mu/\mu_0$ being less than 1, or a susceptibility $\xi=1-\mu/\mu_0$ being negative). Thus, an applied magnetic field creates an induced magnetic field in the diamagnetic materials in the opposite direction, causing repulsive force acting on molecules of the diamagnetic material. Consequently, diamagnetism is a form of magnetism that a substance exhibits only in the presence of an externally applied magnetic field. In particular, liquid-water is a diamagnetic material, and, correspondingly, a permanent magnet is water-repellent. In other words, the permanent magnet originates the phobic-repulsive van der Waals forces, and so, in this sense, the permanent magnet is interpreted as hydrophobic. The induced diamagnetism is generally a quite weak effect in most materials (for instance, the susceptibility $\xi=1-\mu/\mu_0$ of liquid-water is of about $-7\times10^{-7}$), although superconductors exhibit a strong effect (with $\xi=-1$). From the energetic point of view, a diamagnetic material (for instance, liquid-water), when submerged in the magnetic field of the permanent magnet, "mobilizes" the internal heat energy (i.e. the energy of Brownian molecular motion) to induce the diamagnetic field directed against the magnetic field. In other words, the diamagnetic field energy is induced at the expense of the water warmth. [For comparison, paramagnetic and ferromagnetic materials are characterized by attraction to the permanent magnet. A ferromagnetic material submerged in the magnetic field of the permanent magnet "regularizes" domains thereby increasing the magnetic field, again, at the expense of the ferromagnetic material warmth, and, in the final analysis, at the expense of the ambient warmth.]

Archimedes' principle states that the upward buoyant force that is exerted on a body immersed in a fluid, whether fully or partially submerged, is equal to the weight of the fluid portion that the body displaces and acts in the upward direction at the center of mass of the displaced fluid portion. A portion of the fluid, identical to the displaced fluid portion, has a tendency to occupy the origin space that yet to be occupied by the body. In other words, the motions of the fluid molecules have a tendency to be distributed as the Brownian motion distorted, first, by the gravitational field, and second, by the immersed body. The distorted Brownian distribution of molecular motions is interpreted as distorted, and namely, reduced heat energy. Again, from the energetic point of view, the buoyant action is triggered by the gravitational field and occurs at the expense of the internal heat energy of the fluid submerged in the gravitational field. The fluid (for instance, water) repels the body and the immersed body is interpreted as fluid-repellent in this sense. In other words, the immersed body originates the phobic-repulsive van der Waals forces, and so, the immersed body is either hydrophobic, or oleophobic, or omniphobic.

Convective heat transfer, often referred to simply as convection, is the transfer of heat from one place to another by the movement of fluids. Convection is usually the dominant form of heat transfer in liquids and gases. Although often discussed as a distinct method of heat transfer, convective heat transfer involves the combined processes of unknown conduction (heat diffusion) and advection (heat transfer by bulk fluid flow). For example, thermal expansion of fluids may force the convection. In other cases, natural buoyancy forces alone are entirely responsible for fluid motion when the fluid is heated, and this process is called "natural convection". An example is a draft in a chimney or around any fire. In natural convection, an increase in temperature produces a reduction in density, which in turn causes fluid motion due to pressures and forces when fluids of different densities are affected by gravity. For example, when water is heated on a stove, hot water from the bottom of the pan rises, displacing the colder denser liquid, which falls. Thereby, a heating component submerged in water repels adjacent fluid portions, i.e. the heating component itself is interpreted as fluid-repellent: either hydrophobic, or oleophobic, or omniphobic. In other words, the heating component originates the phobic-repulsive van der Waals forces.

Again, the fluid repellency occurs at the expense of the heat energy, which, first, is acquired by the adjacent fluid portion, and then, become transformed into the kinetic energy of the convective motion.

Thus, all the mentioned kinds of fluid repellence are characterized by inserted spatial asymmetries of:
  degrees of freedom of molecular motions, and
  the phobic-repulsive van der Waals forces,
both causing a distortion of the Brownian distribution of the fluid molecular motions, wherein the energy of the distorted Brownian distribution is interpreted as composed of the reduced actually-Brownian motion energy and energy of the fluid molecular motion in a prevalent direction (for instance, convective motion). In other words, the mentioned motion in the prevalent direction occurs at the expense of the Brownian motion energy (i.e. the heat energy) yet to be distorted.

Model Simplifications in the Continuum Mechanics

In order to describe both the Venturi effect and the de Laval effect, the flowing fluid is modeled in the classical fluid dynamics theory as hypothetically consisting of many small volume portions. This approach is described the in book "The Feynman Lectures on Physics", volume 2, chapter 40 "Flow of Dry Water" by Richard P. Feynman, Robert B. Leighton, and Matthew Sands, where the term "dry water" is applied to stress the model simplifications, namely:
  first, the assumption that there are no viscous forces between the fluid small volume portions;
  second, the fluid small volume portions are connected spaces;
  third, the fluid being studied is a continuum, i.e. it is infinitely divisible and not composed of particles such as atoms or molecules;
  forth, the small volume portion boundaries are impermeable for the fluid matter and impenetrable for temperature; and
  fifth, the assumption that the static pressure, acting on the small volume portions' boundaries and being the only reason of mechanical forces, is an abstraction having no molecular nature, and wherein the small portions' boundaries are hypothetically inert to the fluid's intermolecular forces, i.e. are not phobic with repulsive forces and not sticking with attractive forces, as soon as the problem is formulated in frames of the continuum mechanics.

In other words, the simplifications are inherent assumptions in the classical continuum mechanics theory, ignoring the molecular structure of fluid and ignoring the static pressure as a thermodynamic parameter interrelated with the fluid density and temperature in accordance with the van der Waals law of the fluid state. In this approach, the classical equations of fluid motion are derived. In a particular case of hypothetically inviscid flow, the classical equations of fluid motion, known also as the Euler equations, are applied. For viscous flow, to overcome said first simplification, the Navier-Stokes equations are used. The Navier-Stokes equations are the Euler equations modified by involving into the consideration the viscous forces between the fluid small volume portions. Again, the viscous forces are introduced irrelative to the viscosity effect physical nature. In 2000, the problem of the Navier-Stokes equation solution existence and smoothness became one of the Millennium Goals formulated by the Clay Mathematics Institute. It is noted in the "The Feynman Lectures on Physics", volume 2, chapter 40, cited above, that even in the simplest case of no moving fluid, the equation of hydrostatics: $-\nabla P - \rho \nabla \phi = 0$, where $\nabla$ is vector differential operator, P is the fluid static pressure, $\rho$ is the fluid density, and $\phi$ is the stand for the potential-energyper-unit-mass (for gravity, for instance, φ is just gz, where g is the gravitational acceleration and z is the height above the Earth's ocean surface level), in general, has no solution, as soon as both: the pressure P and the density ρ are spatially dependent and not interrelated in the mentioned simplified approach of the continuum mechanics theory. To facilitate a numerical analysis in practice and to overcome said second simplification, the Navier-Stokes equation further modifications (for example, the Spalart-Allmares hypothetical model of turbulences), assuming that the chosen fluid portions could be dismembered into smaller connected spaces, are applied to computational fluid dynamics. However, the third, fourth and fifth simplifications remain inexact, making that the fluid model loses physical sense for thermodynamic and kinetic theory of matter and, as a result, the classical fluid model, on the one hand, has not exact solutions for compressible fluids, and on the other hand, leads to paradoxical solutions for incompressible and inviscid fluids. For example, the d'Alembert paradox, derived from the Euler equations, in particular, says that a body, moving in an incompressible fluid, does not experience a drag force as an impact effect. Describing this paradox, for example, "Encyclopedia of Fluid Mechanics" by J. D. Jacob, Department of Mechanical Engineering, University of Kentucky, Lexington, Ky. 40506-0108, comments that "in the 18th century, it was at odds with both observation and intuition of flow about a body in motion", and further defines the term "drag" as primarily related to a viscosity phenomenon, neglecting by the impact effect. The Navier-Stokes equation having introduced viscous forces makes the d'Alembert paradox as latent. To provide the principles of thermodynamics, one adds equations of gas laws to the Euler system of equations and further approximates the equations numerically.

There is, therefore, a need in the art for a method to provide a proper model of fluid motion to exclude paradoxical results and the paradoxical nonexistence of an exact solution relating thermodynamic parameters and velocity of fluid-flow.

One usually explains the Venturi effect by Bernoulli's principle, applied to a hypothetical incompressible fluid streaming within a pipe, having free-slip inner walls. In this case, Bernoulli's principle can be written in the following form:

$$\rho_c \frac{u_c^2}{2} + P_c + G_c = P_0 = Const, \quad \text{Eq. (1a)}$$

where, considering the fluid unit volume portion moving through a certain cross-section marked by index "c", $u_c$ is the fluid portion velocity that is inversely-proportional to the fluid portion's associated cross-sectional area $A_c$, $P_c$ is the static pressure on the fluid portion's boundaries, $\rho_c$ is the fluid portion density assumed to be identical for any cross-section, and $G_c$ is the fluid unit volume portion potential energy stored in the gravitational field of the Earth. The potential energy $G_c$ near the Earth ground can be well-approximated by $z_c \rho_c g$, where $z_c$ is the effective height of the fluid portion above the Earth's ocean surface level, g is the is the gravitational acceleration near the Earth's ocean surface level, and $P_0$ is the stagnation pressure. $P_0$ is also called either the total pressure or the flow head, and it remains constant along the fluid motion direction.

To describe the de Laval effect phenomenon, the Euler equations are used as references to derive the differential equation:

$$\frac{dA}{A} = (M^2 - 1)\frac{du}{u}, \quad \text{Eq. (1b)}$$

where A is the flow cross-section area, u is the flow velocity corresponding to the cross-section area, and M is the flow M-velocity, i.e. the velocity measured in Mach numbers. As the speed of sound in a fluid depends on the fluid temperature, so the value M is temperature dependent. Equation (1b) says that if the flow is relatively slow (i.e. M<1), then the narrowing of the flow cross-section (i.e. negative dA) corresponds to acceleration of the flow (i.e. positive du); and if the flow is relatively fast (i.e. M>1), then the widening of the flow cross-section (i.e. positive dA) corresponds to acceleration of the flow (i.e. positive du). Computational fluid dynamics using the classical Euler equations provide numerical solutions for spatial distributions of the fluid velocity, static pressure, and temperature within the de Laval nozzle. The distributions are illustrated schematically in FIG. 1c. In FIG. 1c the fluid flow M-velocity 150 at the critical condition point 180 is given by M=1. On the one hand, equation (1b) says that utilizing a pipe having no a divergent part, the flow cannot be accelerated up to velocities higher than the velocity of sound, i.e. up to M>1. On the other hand, equation (1b) allows for the acceleration of the fluid flow in a converging nozzle up to the velocity of sound, i.e. M≤1.

In practice, firstly, the de Laval effect occurs on M-velocities substantially lower than M=1; and secondly, utilizing a pipe having no a divergent part, airflow cannot be accelerated up to velocities higher than approximately only half of the velocity of sound in the air. Thus, the two mentioned equations (1a) and (1b), derived from the mentioned approach, which assumes that the fluid consists of many small volume portions having neither permeable boundaries nor molecular structure, have certain restrictions of applicability.

To design the shape of a convergent-divergent jet-nozzle one applies the following equation:

$$\frac{A}{A_*} = \left[\frac{1 + \frac{j-1}{2}M^2}{1 + \frac{j-1}{2}}\right]^{\frac{j+1}{2(j-1)}}, \quad \text{Eq. (1)}$$

derived basing on equation (1b), where $A_*$ is the minimal cross-sectional area at the critical condition point 180, and j is the gas adiabatic compressibility-constant.

To design a rocket jet-nozzle for fluid portion acceleration from slow speeds to high-subsonic speeds, and even up to speeds higher than the speed of sound, some designers use modern software for computational fluid dynamics analysis where the two equations: (1a) for the slow flow and (1b) for the fast flow, are programmed accordingly. The fact, that the two equations have restrictions of applicability at least because the equations allow for different ranges of the flow velocity, makes the analysis inappropriate to simulate the expected jet-effect properly. As a result, sometimes users are not satisfied by calculated solutions because the algorithm "may experience robustness problems for slightly compressible fluids", as commented in the software help document:

"CFX_PRE" Release 14.5—214 of ANSYS, Inc. and its subsidiaries and affiliates, Page 215, Lines 6-7.

Moreover, for a case of "slightly compressible" slow-flowing gas, the software help document recommends using "the Incompressible option" ("CFX_PRE", Page 215, Line 7). However, use of the Incompressible option for a slow-flowing gas, for which the static pressure re-distribution is allowed, is paradoxical, because an adiabatic process is described by the equation $P_v^j$=Const, where P is the gas portion's static pressure, v is the gas portion volume, and j is the gas adiabatic compressibility-constant, and so a relative change of the gas portion volume is of the same order of value as a relative change of the static pressure, namely, $$\frac{dv}{v} = -\frac{1}{j}\frac{dP}{P}.$$

There is, therefore, a need in the art for a method and apparatus to provide a proper analysis and optimal design of the convergent-divergent jet-nozzle shape to reach the most efficient jet-effect.

To formalize the viscous forces influence, the Navier-Stokes equation of fluid motion is expressed via a tensor of viscosity coefficients characterizing the fluid. This formalization of fluid flowing around a body using such a tensor of viscosity coefficients is not completely adequate at least because:

- the viscous forces influence is dependent on material of the body submerged in the flowing fluid (for instance, a hydrophobic or hydrophilic body submerged in moving water); and
- the viscosity coefficients should be functions of the spatially distributed temperature of flow as the flow temperature is interrelated with the spatially distributed static pressure of flow, which, in turn, is interrelated with the spatially distributed velocity of flow.

There is, therefore, a need in the art for a proper equation of fluid motion, generalized in the frames of the kinetic theory of matter, taking into account kinds of the jet-effect (for instance, the Coanda-jet-effect and the phenomenon of hydrophobicity), and so adequately applicable to any flowing fluid and any material of a body submerged in the flowing fluid, for instance, to moving water flowing around a hydrophobic body.

Wave Equation in Frames of the Continuum Mechanics

The wave equation is an important second-order linear partial differential equation for the description of waves—as they occur in physics—such as sound waves, light waves and water waves. It arises in fields like acoustics, electromagnetics, and fluid dynamics. In 1746, d'Alembert discovered the one-dimensional wave equation, and within ten years Euler discovered the three-dimensional wave equation. The wave equation is a hyperbolic partial differential equation. It typically concerns a time variable t, one or more spatial variables $x_1, x_2, \ldots, x_n$, and a scalar function $x=x(x_1, x_2, \ldots, x_n, t)$, whose values could model, for example, the mechanical displacement of a wave. The wave equation for x is:

$$\frac{\partial^2 x}{\partial t^2} = c^2 \nabla^2 x, \qquad \text{Eq. (2a)}$$

where $\nabla^2$ is the spatial Laplacian and c is a fixed constant.

Solutions of this equation describe the propagation of disturbances out from the region at a fixed speed in one or in all spatial directions, as do physical waves from a plane or localized sources; the constant c is identified with the propagation speed of the wave. This equation is linear. Therefore, the sum of any two solutions is again a solution: in physics, this property is called the superposition principle. The principle of superposition is one of the most general laws in many sections of physics. In the simplest formulation, the principle of superposition is:

The effect of a few external forces on a particle is the vector sum of the effects of these forces; and Any complex motion can be divided into two or more simple ones.

The wave equation alone does not specify a physical solution; a unique solution is usually obtained by setting a problem with further conditions, such as initial conditions, which prescribe the amplitude and phase of the wave. Another important class of problems occurs in enclosed spaces specified by boundary conditions, for which the solutions represent standing waves, or harmonics, analogous to the harmonics of musical instruments.

The elastic wave equation in three dimensions describes the propagation of waves in a stationary isotropic homogeneous elastic medium, wherein in the case of an electromagnetic field, the medium is a portion of the universe characterized by the universe background matter and the universe background energy. While linear, this equation has a more complex form than the equations given above, as it must account for both longitudinal and transverse motion:

$$\rho\ddot{x} = f + (\lambda + 2\mu)\nabla(\nabla \cdot x) - \mu\nabla \times (\nabla \times x) \qquad \text{Eq. (2b),}$$

where:

λ and μ are the so-called Lame parameters describing the elastic properties of the medium, where μ is the shear viscosity coefficient and λ is the dilatational viscosity coefficient;

ρ is the density, f is the source function (driving force), and x is the displacement vector with respect to the stationary medium.

Note that in this equation, the force and the displacement, both are vector quantities. Thus, this equation is sometimes known as the vector wave equation. Taking note that the wave equation formulation remains in frames of the continuum mechanics, the medium characteristics defining the wave, namely, the velocity of sound, the density, and the coefficients Lame, the all are as kinds of normalizing constants only, and so do not provide a description of an energetic interaction between the wave and medium. This, in particular, is a reason of at least the following confusing paradoxes:

considering a wave as a process transmitting energy from a wave-source to a point of observation with the velocity of sound, a map of superposed two waves has points of destructive and constructive interference, wherein an observer confusingly discloses that the seemingly energy local annihilation occurs in the destructive interference points and the seeming energy local excess arises in the constructive interference point, i.e. the wave energy as though is not constant more and a seeming "tunnel effect", that brings to mind something that defined in the quantum mechanics, takes place;

if to implement a superposition of two identical but anti-phase waves along a wave-guide, a complete-like annihilation becomes expected;

if to implement a superposition of two (or several) identical in-phase waves along a wave-guide, an excessive-like cumulative power becomes expected, because the wave power is proportional to the second power of the wave amplitude, so N in-phase superposed amplitudes correspond to the cumulative power increase by the factor $N^2$ (as, for instance, shown in the book "The Feynman Lectures on Physics", volume 1, chapter 30 "Diffraction" by Richard P. Feynman, Robert B. Leighton, and Matthew Sands), moreover, the wave equation (2a) and/or (2b), when assuming, on the one hand, variations of displacement and, on the one hand, a constant density of the medium, inevitably runs on a violation of the law of continuity;

it is assumed that, for fluids, the shear viscosity coefficient Lame μ equals zero, however, as the wave processing in the fluids assumes local accelerating motions of the fluid portions, which [the accelerating motion] is inevitably interrelating with varying of the fluid portions cross-sectional area, in addition, the phenomenon of an adiabatic convective self-acceleration due to the Coanda-jet-effect is inevitable as well, as described hereinbefore referring to FIGS. 1b and 1f, in turn, the inevitably varying cross-sectional area is interpreted as an inherent local shear motion, hence, in order to formalize the inherent shear motion in frames of the continuum mechanics, one must use the non-zero shear viscosity coefficient Lame μ; and in a well-known so-called "thermo-acoustic heat engine", an acoustic resonator plays the role of a "cold sink" that doesn't follow from the wave equations (2a) and (2b).

Moreover, the legendary story about mystery experiments with Tesla's mechanical oscillator claimed as Tesla's earthquake machine, if not explained especially, remain unbelievable.

There is, therefore, a need in the art for a proper approach to the wave equation, generalized in the frames of the kinetic theory of matter, and thereby providing for the physical sense; as well, there is, therefore, a need in the art for a proper analysis of resonating waves to provide for efficient and controllable practical use of elastic waves constructive interference in industry.

In relation to electromagnetic oscillators, Tesla coils are unique in the fact that they create extremely powerful electrical fields. A seemingly significant power disbalance between input and output in the famous experiments with Tesla coil, if not explained especially, remains confusingly-paradoxical. Today, the main use of the Tesla coil is for entertainment and educational displays, and small coils are still used today as leak detectors for high vacuum systems only.

There is, therefore, a need in the art for a proper understanding of resonating waves to provide for efficient and controllable practical use of constructive interference of electromagnetic waves and/or electric signals in industry.

Radiation Pressure

In electrodynamics, radiation pressure is the pressure exerted upon any surface exposed to electromagnetic radiation. The radiation pressure implies an interaction between electromagnetic radiation and bodies of various types, including clouds of particles or gases. The electromagnetic radiation pressure is determined in Maxwell's theory by the so-called Poynting vector or, strictly speaking, the time-averaged Poynting vector. Considering an electromagnetic wave, the Poynting vector is proportional to the vector multiplication of the electrical field by the magnetic field of the electromagnetic wave, so the time-averaged Poynting vector is oriented to the direction of electromagnetic wave propagation and the magnitude of the time-averaged Poynting vector is proportional to the time-averaged intensity of the electromagnetic wave. The forces generated by the radiation pressure are generally too small to be detected under everyday circumstances; however, they do play a crucial role in some settings, such as astronomy and astrodynamics; furthermore, for example, a so-called solar sail of spacecraft is based on the effects of the Sun's radiation pressure.

In acoustics, acoustic radiation pressure, called also sound radiation pressure, or, briefly, sound pressure, is the time-average excess pressure on an obstacle exposed to the sound. The acoustic radiation pressure is determined by the pulse wave transmitted per unit time per unit area of obstruction and determined by the so-called Umov-Poynting vector, as the Poynting vector, but generalized for the case of acoustic waves propagating in a homogeneous elastic fluid medium. A redirection of the Umov-Poynting vector results in the acoustic radiation pressure, in particular:

The acoustic radiation pressure generated by the acoustic beam:
having a confined front area of a plane wave,
propagating in an infinite undisturbed environment, and
being incident on a fully reflecting flat surface at the right angle,
(i.e. when the Umov-Poynting vector is subjected to redirection on 180°) is called Langevin radiation pressure; and At normal incidence on a flat surface fully reflecting a portion of an omnidirectional sound (i.e. when the Umov-Poynting vector is subjected to omnidirectional scattering, caused by non-linearity of the medium, resulting in the effective redirection of the scattered Umov-Poynting vector on 180°), the acoustic radiation pressure is called Rayleigh radiation pressure.

The pressure of sound radiation is the effect of the second order; so, in zero gravity, one can design an acoustic pusher for stabilizing objects in indoor space and for pumping of fluids.

Bernoulli Theorem

In contrast to a popular description of Bernoulli's principle as a simplification of the Euler equation of momentum conservation originally allowed for an inviscid flow and further applied to an exclusively-incompressible fluid, as made, for example, in the "Encyclopedia of Fluid Mechanics" by J. D. Jacob cited above, "The Feynman Lectures on Physics", volume 2, chapter 40, also cited above, demonstrates the Bernoulli theorem proof basing on general assumptions thereby showing the Bernoulli theorem widened sense.

For the purposes of the present patent application, in contrast to the term "Bernoulli's principle", applied to describe a hypothetical particular case of the Euler equations, the term "Bernoulli theorem" is applied to the proven interrelation of flow characteristics.

Prior art FIG. 2 is a schematic illustration of stationary fluid flow streamlines 20 forming walls 24 of an imaginary pipe. Consider a fragment 23 of the imaginary pipe that has open ends: inlet 21 and outlet 22. The imaginary pipe walls 24 by definition are impermeable, as soon as they are formed by streamlines 20; and the shape of walls 24 is not restricted regarding constriction or stretching. The fluid may be compressible-expandable and viscous as a real fluid; and, one assumes for simplicity that the fluid matter is subjected to neither chemical reactions nor phase changes within the pipe fragment 23. Inlet 21 area is $A_1$, where the fluid has inner-static-pressure $P_1$, density $\rho_1$, and velocity $u_1$. The area of outlet 22 is $A_2$, where the fluid has inner-static-pressure $P_2$, density $\rho_2$, and velocity $u_2$. After a short-time interval $\tau$, a portion of the fluid entering inlet 21 has mass $m_1$ calculated as $m_1=\rho_1 A_1 u_1 \rho$. A mass $m_2$ leaves the pipe fragment 23 through outlet 22, i.e. $m_2=\rho_2 A_2 u_2 \tau$.

The law of flow mass conservation requires that $m_1=m_2=m$, thereby, $$m=\rho_1 A_1 u_1 \tau = \rho_2 A_2 u_2 \tau \qquad \text{Eq. (3a)}.$$

The equation of continuity, namely: $\rho_1 A_1 u_1 = \rho_2 A_2 u_2$, follows from (3a).

Note that the entering mass has the gravitational potential energy, that near the ground of the Earth can be well-approximated by $G_1=z_1 mg$; while this mass leaving the pipe fragment 23 has the gravitational potential energy $G_2=z_2 mg$, where $z_1$ and $z_2$ are correspondingly inlet 21 and outlet 22 cross-sections' effective heights above the Earth's ocean surface level.

One can calculate work, done by the fluid flow static pressure. The work at inlet 21 equals $dW_1=P_1 A_1 u_1 \tau$, meaning that the flow mass acquires the energy portion $dW_1$; and the work at outlet 22 equals $dW_2=P_2 A_2 u_2 \tau$, meaning that the flow mass losses the energy portion $dW_2$.

Add the work $dW_1$ to the potential and kinetic energies of the mass portion at inlet 21 in order to define the total energy of the entered mass portion, namely:

$$U_1 = dW_1 + G_1 + \frac{mu_1^2}{2} = P_1 A_1 u_1 \tau + z_1 mg + \frac{mu_1^2}{2}$$

Analogously, add the work $dW_2$ to the potential and kinetic energies of the mass portion at outlet 22 in order to define the total energy of the mass leaving portion, namely:

$$U_2 = dW_2 + G_2 + \frac{mu_2^2}{2} = P_2 A_2 u_2 \tau + z_2 mg + \frac{mu_2^2}{2}$$

Considering an adiabatic process, i.e. conservation of the total energy in the pipe fragment 23, one applies the energy conservation law requiring that the entering energy $U_1$ must be equal to the leaving energy $U_2$, i.e.

$$P_1 A_1 u_1 \tau + z_1 mg + \frac{mu_1^2}{2} = P_2 A_2 u_2 \tau + z_2 mg + \frac{mu_2^2}{2} \qquad \text{Eq. (3b)}$$

Dividing the components of the equation (3b) on the value of mass m defined in equation (3a), one obtains the following equation:

$$\frac{P_1}{\rho_1} + z_1 g + \frac{u_1^2}{2} = \frac{P_2}{\rho_2} + z_2 g + \frac{u_2^2}{2}, \qquad \text{Eq. (3c)}$$

from which the well-known Bernoulli theorem formulation follows, namely: the value $P_i/\rho_i + z_i g + u_i^2/2$ is constant along any streamline of a fluid flow, i.e.

$$\frac{P_i}{\rho_i} + z_i g + \frac{u_i^2}{2} = Const \qquad \text{Eq. (3)}$$

The constant Const on the right side of equation (3) performs the total energy of the fluid portion unit mass moving along a streamline, wherein the items: $P_i/\rho_i$, $z_i g$, and $u_i^2/2$ define kinds of energy-per-unit-mass of the fluid portion, namely: $P_i/\rho_i$ interrelates with the internal heat energy stored in molecular Brownian random motion and interactions, wherein, according to the kinetic theory of ideal gas, the ratio $P_i/\rho_i$ is defined as proportional to the gas temperature, $z_i g$ defines the potential-energy-per-unit-mass stored in the Earth's gravitational field, and $u_i^2/2$ defines the kinetic-energy-per-unit-mass. In hydrodynamics, one normally assumes that the liquid density $\rho$ is not varying. In this hypothetical particular case, equation (3) can be rewritten in terms of pressure as: $P_i + \rho z_i g + \rho u_i^2/2 = P_0$, where $P_0$ is the total pressure or the flow head being constant along any streamline of the incompressible liquid, $\rho u_i^2/2$ is the partial dynamic pressure, $P_i$ is the partial inner-static-pressure provided by the fluids molecules [note that the classical continuum mechanics theory, and in particular, the hydrodynamics does not refer to a molecular structure of matter], and $\rho z_i g$ is the partial potential-static-pressure provided by the Earth's gravitational field.

Considering the ratio $P_i/\rho_i$ as a measure of fluid's internal energy, the Bernoulli theorem proof is based on the laws of the energy conservation and matter continuity and has not especial demands on viscosity and compressibility-expandability of the considered fluid. The Bernoulli theorem proof is general and does not conflict with the thermodynamic and kinetic theory of fluid. Thus, the Bernoulli theorem, as a form of the energy conservation law, is applicable for any fluid that may be compressible-expandable and viscous as a real fluid. An important feature of the proof is the assumption that imaginary fragment 23 is a flow portion, but not a real pipe.

Prior art FIG. 3 shows a fragment of pipe 33, having real walls 34. When one ignores turbulences caused by walls 34 and the heat exchange between the walls and fluid, without loss of generality, fragment 23 of the imaginary pipe (FIG. 2) is built-in into real pipe 33. Nonetheless, real walls 34 being sticking for the fluid's molecules, causing, in general, an origination of turbulence and the heat exchange between the walls and fluid, such that the energy conservation, written as equation (3), becomes not perfectly exact; the Bernoulli theorem may play a role of a criterion of adequacy for the equation of fluid motion applied, in particular, to convergent-divergent jet-nozzle design and analysis as well as for a computational fluid dynamics numerical solution.

Equation (1a) is a particular case of the Bernoulli theorem applied to a hypothetical incompressible fluid flow. Also, only the particular case of the Bernoulli theorem applied to a hypothetical incompressible fluid flow can be derived from the Euler equations. In fact, the mentioned simplifications of continuum mechanics render the Euler and Navier-Stokes equations as having no exact solutions; and the Euler and Navier-Stokes equations numerical approximation, in the general case, conflicts with the Bernoulli theorem. Thus, the Euler and Navier-Stokes equations may be applicable to an ideal case, for which the effects of molecular interactions, at least such as diffusion and/or heat exchange between the fluid portions and/or the viscous fluid motion inherently accompanied by the diffusion, are negligible.

For the purposes of the present patent application, the term "Bernoulli theorem" is applied as more correct, to stress the proven interrelation expressed as equation (3), than the term "Bernoulli's principle", assuming a hypothetical particular case of the Euler equations and expressed in the form of approximated equation (1a).

There is, therefore, a need in the art for a method and apparatus, corresponding to strictly proved criteria, applicable to slow as well as to fast flowing real compressible-expandable fluids, and providing a correct optimal design of the convergent-divergent jet-nozzle in order to reach the most efficient jet-effect.

SUMMARY OF THE INVENTION

Unity and Novelty of the Invention Generally, the unity and novelty of the invention are in a method providing for a specific actually-airfoil shaping and covering of a body submerged in a forcedly or naturally moving fluid, wherein the specific shaping and covering allows to harvest a useful-beneficial power from the ambient medium heat using an enhanced jet-effect, in particular, the Coanda-jet-effect reinforced repeatedly and the waving jet-effect reinforced by constructive interference, wherein the logic to reinforce wave power of elastic waves is spread also to electromagnetic waves.

More particularly, the unity and novelty of the invention provide for the following.

The methodological unity of the present invention is in use of a novel method for computational fluid dynamics applied to a flowing fluid, composed of moving and interacting molecules, wherein, in contrast to the continuum mechanics approach, the fluid static pressure, temperature, density, and flow velocity are defined in terms of the kinetic theory of matter. The method provides for a numerical estimation of spatially distributed parameters: the three components of the velocity-vector, the temperature, the density, and the static pressure of the moving fluid; wherein, taking into the consideration a molecular structure of the fluid matter, the method allows for a designing of elaborated airfoil and, in particular, hydrophobic corpuses and corpuses comprising specifically shaped actually-airfoil tunnels.

The phenomenological unity and novelty of the present invention is in a use of an enhanced jet-effect that is specified as an efficient transformation of the fluid internal heat energy, performed as kinetic energy of the molecules Brownian random motion, into the fluid jetstream kinetic energy, performed as kinetic energy of the molecules motion in a prevalent direction. The transformation is caused by the Coanda-jet-effect operation. In particular, when the molecular motion in the prevalent direction is an oscillating motion, the Coanda-jet-effect operation performs the waving jet-effect resulting in elastic waves propagation.

The implementation unity of the present invention is in the novel specific actually-airfoil shaping of bodies submerged in the flowing fluid. Wherein, on the one hand, the mentioned properties of fluid matter contacting with the bodies' surfaces, and, on the other hand, the bodies' specific actually-airfoil shapes defined and calculated according to the novel method, altogether are resulting in an enhanced jet-effect, observed as an effect of increased acceleration of a fluid portion at the expense of the fluid matter warmth. Namely, the specific actually-airfoil shaping is such that the bodies' surfaces act on the flowing fluid portion according to the Coanda-jet-effect operation causing transformation of the fluid portion's internal heat energy into the fluid portion's additional acquired kinetic energy. In other words, the Coanda-effect operation transforms a part of the kinetic energy of the fluid molecules Brownian random motion [i.e. the heat energy], into the kinetic energy of the molecular motion in a prevalent direction [i.e. into either the acquired kinetic energy of a jetstream and/or the acquired wave power of an acoustic wave]. In a more general case, when the fluid flow is turbulent, comprising whirling groups of molecules, the Coanda-effect operation results in partial aligning also of the turbulent motion of the whirling groups of molecules with the body's surfaces, that is observed as an increase of the effective velocity of the flow portion, accompanied by the portion's inner turbulence decrease, as the fluid portion passes nearby the body. Thus, this results in an increase of the fluid portion's kinetic energy also at the expense of the fluid portion's inner turbulent energy. Thereby:

in a case, wherein the fluid is water and the body's surface is hydrophobic, the water portions are subjected to an acceleration that can be utilized at least to reduce a skin-friction resistance to provide a free-slip condition of motion;

in a case, wherein the fluid is a substantially compressible-expandable gas, such as air at high velocities, the specific shaping results in a convergent-divergent flowing, accompanied by an enhanced jet-effect, that can be utilized at least for an efficient harvesting of electricity using either a wind turbine, capable to transform mechanical motion of flow into electricity, and/or a Peltier element, capable to operate as a thermoelectric generator producing electricity from the temperature difference caused by the jet-effect; and in a case, wherein the originated motion of fluid is an oscillating motion inherently accompanied by propagating waves accompanied by the waving jet-effect, the waving jet-effect reinforced repeatedly by constructive interference of the waves can be utilized at least for an efficient harvesting of electricity using a detector of waves as a power converter; wherein the logic is spread also to electromagnetic waves.

Primary Basic Features of the Present Invention

One of the primary features of the present invention is that, in contrast to the classical approach of continuum mechanics, the terms "fluid", "flow velocity", "temperature", "static pressure", and "density" are defined taking into the consideration a molecular structure of a substance according to the kinetic theory of matter. Namely, the term "fluid" is defined as a substance composed of moving and interacting molecules, the term "flow velocity" relates to a prevalent motion of molecules, the term "temperature" is defined by the molecules random motion as a measure proportional to the average molecular kinetic energy of the molecules Brownian random motion, the term "static pressure" is defined as a measure of the randomly moving molecules cumulative impact, and the term "density" is defined as a measure of the molecules concentration and mass, equal to said molecular fluid mass per unit volume.

Another primary feature of the present invention is that the specific M-velocity is defined as a characteristic of the molecular composition of the fluid.

Yet other one primary feature of the present invention is that an apparatus, shaped specifically, is defined as inherently submerged in a flowing fluid, having at least a specific so-called adiabatic compressibility parameter, and the definition of the specific actually-airfoil shape of the apparatus's corpus is accompanied by the definition of the specific properties of the molecular fluid, altogether, allowing for an optimized implementation, in general, of the Coanda-effect, and, in particular, of the de Laval effect. Wherein the de Laval effect should be understood in a widened sense as comprising both: the de Laval jet-effect, defined as an effect of flow extra-acceleration, and the de Laval retarding-effect, defined as an effect of flow extra-slowing.

A further feature of the present invention is that, in contrast to the classical approach of continuum mechanics, the terms "drag", "skin-fiction", "osmotic-like effect", and "viscosity" are defined, referring to the kinetic theory of matter. Namely:

the drag is an effect of asymmetrical, disbalanced impact of molecules, observed when a shape of a fluid portion, flowing around a body corpus, is subjected to a deformation, such that the drag-effect is defined as a cumulative effect comprising stagnation-effects and the Coanda-effect;

the skin-friction is an effect of fluid molecules sticking to a nearby wall, resulting in a specific spatial distribution of moving-small-portions velocities, when the moving-small-portions flow in a boundary layer adjacent to the nearby wall;

the osmotic-like effect is defined as an effect of exchange of molecular matter and heat between moving-small-portions; and the effect of viscosity is defined as a cumulative effect comprising the skin-friction effect and the osmotic-like effect;

An additional feature of the present invention is that, in contrast to the classical approach of electrodynamics, the term "vacuum" is redefined as "filled" at least by the latent electromagnetic energy, hidden by the so-called destructive interference, to which the background electromagnetic radiation is subjected.

Principal Objects

Accordingly, it is a principal object of the present invention:

to overcome the limitations of existing methods and apparatuses:
  for designing actually-airfoil profiles of birdlike wings;
  for designing actually-airfoil convergent-divergent jet-nozzles, providing the enhanced jet-effect;
  or designing in-line arranged sequences of elemental jet-boosters, providing the Coanda-jet-effect reinforced repeatedly and thereby resulting in jet-thrust reinforced repeatedly, correspondingly; and
  for designing in-line arranged sequences of elemental jet-boosters, destined for triggering the waving jet-effect reinforced repeatedly by constructive interference of forced in-phase acoustic waves; and to provide improved methods and apparatus for efficient use of the desired jet-effect, namely, the Coanda-jet-effect, and/or the Venturi effect, and/or the de Laval jet-effect, and/or the waving jet-effect for either:
  increasing efficiency of vehicle jet-engines, and/or
  harvesting electric energy from fluid warmth, and/or
  increasing efficiency of cooling flows, and/or
  water harvesting from air, and/or
  implementing a magnetizing compressor.

It is an object of the present invention to provide methods and apparatus for:

an enhanced jet-effect implementation at high-subsonic velocities avoiding the unwanted phenomenon of the Mach waves emission;

jet-effect use at high-subsonic velocities avoiding the phenomenon of shock sound-wave emission;

jet-effect use in jet-boosters and rocket nozzles at low-subsonic, high-subsonic, transonic, supersonic, and hypersonic velocities;

design of an actually-airfoil wing, improved by jet-effect efficiency;

design of a vortex tube, improved by cooling efficiency;

design of actually-airfoil convergent-divergent jet-nozzles providing for a jet-effect applied to electricity producing from a fluid warmth using classic at least one of a wind-turbine, a hydro-generator, a turbo-generator, and a Peltier element [i.e. a thermoelectric generator] as well as using a modified improved wind-turbine, constructed according to the principles of the present invention to operate under a fast airflow;

design of hydrophobic jet-gears applied to electricity producing from water warmth using at least one of a hydro-generator and a Peltier element;

design of an enhanced transformer of alternating voltage and current;

design of convergent-divergent jet-nozzles applied to water harvesting from the air;

design of a vehicle jet-engine, having an improved net-efficiency;

multi-stage cascading the Coanda-effect using sequential cascading of airfoil bodies; and multi-stage enforcing the waving jet-effect operation by implementing constructive interference of waves, either elastic and/or electromagnetic.

In one exemplary embodiment, a method is disclosed for computational fluid dynamics; wherein the method is based on generalized equations of fluid motion derived from conservation laws, and laws of thermodynamics and the kinetic theory of matter. The generalized equations of fluid motion have an exact solution, the adequacy of which is confirmed by both: the Bernoulli theorem and the van der Waals law of gas state. The method is proper for numerical simulations:

of fluid headway flows at low-subsonic, high-subsonic, transonic, supersonic, and hypersonic velocities, as well as of fluid oscillations accompanied by acoustic waves, and applicable to almost incompressible fluids as real liquids as well as to compressible-expandable fluids as real gases.

In another exemplary embodiment, a fluid-repellent jet-gear submerged in a fluid is disclosed. The fluid-repellent jet-gear has an asymmetrically shaped corpus comprising an outer layer contacting with the fluid, wherein the outer layer is made from a fluid-repellent material, triggering a phobic-repulsing jet-effect, thereby enabling motion at the expense of the internal heat energy of the fluid.

In one further exemplary embodiment, a convergent-divergent jet-nozzle is disclosed. The convergent-divergent jet-nozzle has a specifically shaped inner tunnel, providing linearly increasing the gas M-velocity along the line of gas motion; wherein the improved linearity at least in an essential M-velocity range comprising the specific M-velocity is a criterion of the convergent-divergent jet-nozzle tunnel shape optimization according to the principles of the present invention.

In yet one exemplary embodiment, a two-humped airfoil wing design is disclosed. The two-humped airfoil wing provides increased lift-effect at high-subsonic transonic, supersonic, and hypersonic velocities.

In one other exemplary embodiment, a flying capsule is disclosed, having a specifically shaped inner tunnel and airfoil outer profile; wherein when fast-flying, the spatially varying cross-sectional area of the tunnel results in an enhanced jet-effect.

In still another exemplary embodiment, an aggregation of circumferentially arranged elemental jet-boosters is disclosed, representing a vortex generator providing acceleration of sub-portions of circulating ambient-adjoining convergent-divergent jetstreams in a positive feedback loop, thereby resulting in that the sub-portions of circulating ambient-adjoining convergent-divergent jetstreams become moving with de Laval M-velocities triggering alternating both: the de Laval-like jet-effect and the de Laval-like retarding-effect, thereby stabilizing an effective M-velocity alternating above and below the specific M-velocity. The disclosed aggregation of circumferentially arranged elemental jet-boosters as vortex generator is further used as a principal component of the following disclosed derivative applications: an electricity generator of high efficiency, a humidity condenser of high intensity, as well as a flying-saucer of high mobility. Furthermore, the circulating sub-portions of ambient-adjoining convergent-divergent jetstreams become oscillating resulting in extra-intensive acoustic waves (which, when the circumferential arrangement is regularly equidistant, become in-phase superposed thereby causing constructive interference) accompanied by the extra-enforced waving jet-effect, wherein the extra-increased wave power is further used for electricity producing.

In a further one exemplary embodiment, an aggregation of a laminar flow maker, a pipe having an enhanced convergent-divergent jet-nozzle tunnel, and an improved wind-turbine is disclosed, representing a jet-transformer converging the heat power into the electric power.

There has thus been outlined, rather broadly, the most important features of the invention in order that the detailed description thereof that follows hereinafter may be better understood. Additional details and advantages of the invention will be set forth in the detailed description, and in part will be appreciated from the description, or may be learned by practice of the invention.

BRIEF DESCRIPTION OF THE DRAWINGS

In order to understand the invention and to see how it may be carried out in practice, a preferred embodiment will now be described, by way of a non-limiting example only, with reference to the accompanying drawings, in the drawings:

FIG. 1a is a prior art schematic drawing of chiral molecules;

FIG. 1b is a prior art schematic drawing of the convergent-divergent Venturi tube;

FIG. 1c is a prior art schematic view of the convergent-divergent de Laval nozzle;

FIG. 1d is a prior art schematic illustration graphics of gas velocity, static pressure, and temperature distributions within the de Laval convergent-divergent jet-nozzle;

FIG. 1e is a schematic drawing of a prior art ordinary blowing ventilator;

FIG. 1f is a prior art schematic drawing of a body blown by an airflow portion;

FIG. 1g is a schematic drawing of a classical prior art profile of an airplane wing;

FIG. 1h is a schematic drawing of considerable amounts of water-aerosols and micro-flakes-of-snow, which are observed behind the high-speed aircraft's wings;

FIG. 1i is a prior art schematic illustration of points of sail;

FIG. 1k is a prior art schematic illustration of a wind turbine, built-in into a cylinder;

FIG. 1l is a prior art schematic illustration of the Ranque-Hilsch vortex tube;

FIG. 1m is a prior art schematic illustration of the Beverley Clock;

FIG. 2 is a prior art schematic illustration of fluid motion in an imaginary flow tube;

FIG. 3 is a prior art schematic illustration of fluid motion in a real pipe;

FIG. 5h is a schematic isometry of a hydrophobic-propeller submerged in water;

FIG. 5i is a schematic illustration of a hydrophobic-spiral;

FIG. 5j is a schematic isometry of a pair of hydrophobic-propellers operating as hydrophobic-engine;

FIG. 5k is a schematic illustration of a pair of unbroken spirals;

FIG. 6c is a schematic illustration of an exemplary profile of an optimized tunnel;

FIG. 6d is a schematic illustration of an exemplary profile of an optimized tunnel;

FIG. 6e is a schematic illustration of an exemplary profile of an optimized tunnel;

FIG. 10 is a schematic illustration of a block-diagram of the suggested method according to the principles of the present invention; and FIG. 11 is a table showing several equations.

All the above and other characteristics and advantages of the invention will be further understood through the following illustrative and non-limitative description of preferred embodiments thereof.

DETAILED DESCRIPTION OF PREFERRED EMBODIMENTS

The principles and operation of a method and an apparatus according to the present invention may be better understood with reference to the drawings and the accompanying description, it being understood that these drawings are given for illustrative purposes only and are not meant to be limiting. The detailed description of the preferred embodiments is divided between two paragraphs: "Generalized Equations of Molecular Fluid Motion" and "Jet-Effect Embodiments", each having sub-paragraphs.

Generalized Equations of Molecular Fluid Motion

Figure 4:
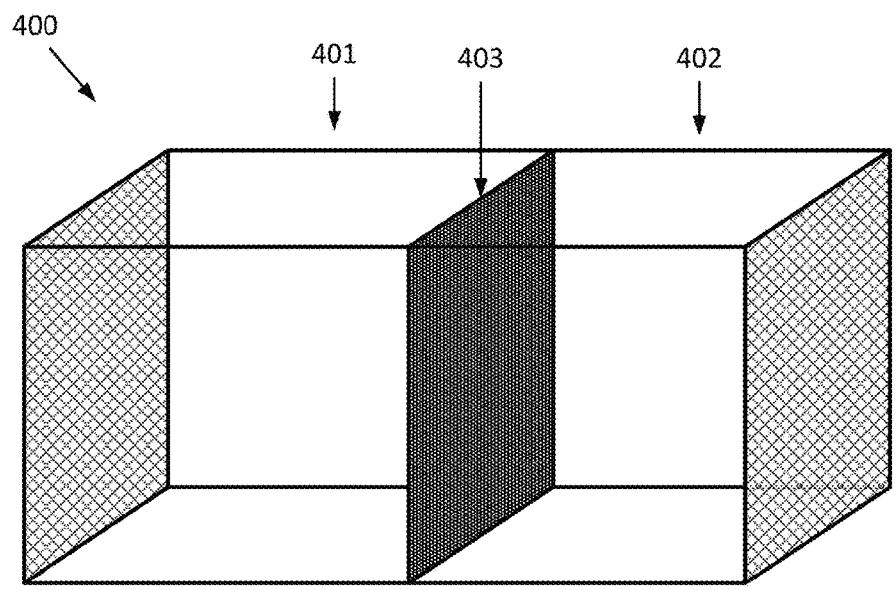
FIG. 4 is a schematic illustration of a box having two modules.

FIG. 4 is a schematic illustration of an ideal thermo-isolated box 400, having two modules 401 and 402, separated by an ideal wall 403 having no weight, being freely-movable and easily-deformable. Thus, wall 403 may freely change the shapes and volume proportions of modules 401 and 402. Modules 401 and 402 are filled with portions of the same gas, having the same static pressure $P_{401}=P_{402}$, but different densities $\rho_{401}>\rho_{402}$ and absolute temperatures $T_{401}<T_{402}$, such that satisfying the condition $\rho_{401}T_{401}=\rho_{402}T_{402}$. It is expected that separating wall 403 will not move and will be not deformed because the static pressures $P_{401}$ and $P_{402}$ on both sides of wall 403 are identical. However, if wall 403 is withdrawn, then diffusion will start. This imaginary experiment says that the presence or absence of isolating wall 403 changes the situation, and the two neighboring portions of gas could accelerate each other by osmotic-like pressures if the portions have the same static pressure and differ in density and temperature. Modelling a molecular fluid as aggregated from many stationary and moving small-portions, the described hereinbelow interpretation of the molecular fluid portions' boundaries as sensitive to the temperature and density of surroundings as soon as the boundaries consist of the same molecular matter as the considered fluid, is one of the primary teachings of the present invention.

Figure 5A:
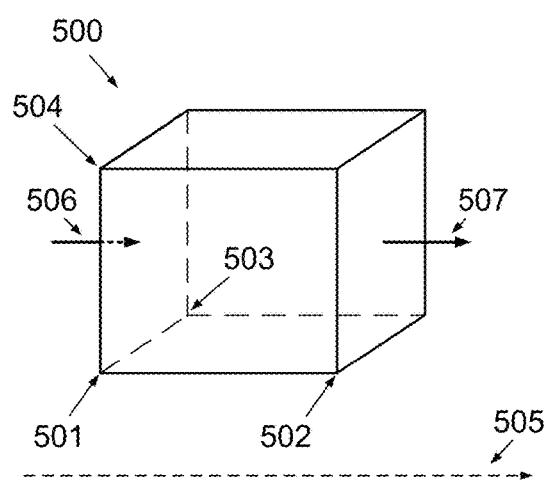
FIG. 5a is a schematic illustration of a small portion of fluid.

FIG. 5a is a schematic illustration of a small portion of molecular fluid, for simplicity, having the shape of a cubic portion 500. Cubic portion 500 occupies the space defined by point coordinates 501(x, y, z), 502(x+Δx, y, z), 503(x, y+Δy, z), and 504(x, y, z+Δz), where Δx, Δy, and Δz are the distances between points 501 and 502, 501 and 503, and 501 and 504 correspondingly. Small portion 500 is composed of molecules moving randomly and in a prevalent direction, i.e. portion 500 is sufficiently small, such that having no a group of molecules whirling and making a complete rotating cycle within portion 500. Consider the cumulative force acting on portion 500. In the absence of gravitational forces, the fluid inner-static-pressure at any point of the fluid is the same in any direction; and the cumulative force on cubic portion 500, is defined by the fluid inner-static-pressure change from point to point. For simplicity, let the pressure change in the direction of the x-axis 505 only. The pressure on the left face, having points 501(x, y, z), 503(x, y+Δy, z), and 504(x, y, z+Δz), makes the force 506 equal to $P_{in}\Delta y\Delta z$, where $P_{in}$ is the fluid inner-static-pressure at the left face from outside of cubic portion 500; and the fluid inner-static-pressure on the opposite right face makes the force 507 equal to $-[P_{in}+(\partial P_{in}/\partial x)\Delta x]\Delta y\Delta z$. Therefore, the resulting force is $-(\partial P_{in}/\partial x)\Delta x\Delta y\Delta z$. If one also assumes that the fluid inner-static-pressure changes in the two remaining orthogonal directions, one can see that the pressure cumulative force per unit volume is $-\nabla P_{in}$, where $\nabla$ is the vector differential operator. The spatial change of the molecular fluid inner-static-pressure $P_{in}$ must be considered as interrelated with the molecular fluid density ρ and absolute temperature T variations in accordance with the thermodynamic and kinetic theory of matter.

A generalized method for modeling an equation of fluid motion, wherein the fluid molecular structure is taken into the account, is a subject of the present invention.

Inner Pressure and Momentum Conservation

Considering fluid portion 500, occupying a certain volume V, the Newton Second Law or the conservation of momentum says that the cumulative force acting on portion 500, i.e. the variation of the momentum in the volume, must be due to the inflow or outflow of momentum through the closed surface S of portion 500 plus the forces acting on portion 500 by the fluid surrounding:

$$\frac{\partial}{\partial t}\int \rho u dV = -\oint_S \rho u u \cdot n dS - \oint_S PndS, \quad \text{Eq. (5.1)}$$

where dS is the surface differential, n is the unit vector normal to surface differential dS, and ρ, u, and P are functions of spatial coordinates; wherein ρ is the fluid portion 500 density, u is the fluid portion 500 velocity-vector having absolute value u and being a measure of the molecular fluid molecules motion in a prevalent direction in addition to the random Brownian motion, and P is the cumulative-inner-static-pressure acting on the boundaries of portion 500; wherein in contrast to the classic approach of continuum mechanics, the fluid portion 500's boundaries have a molecular structure, and P is as a thermodynamic parameter interrelated with the fluid temperature, density, and gravity. The kinetic theory of ideal gases defines this relation for a stationary case in the absence of gravity as $P_{ideal} = NkT_s/V_s$, where $P_{ideal}$ is the static pressure of an ideal gas, $v_s$ is the considered volume, N is the number of molecules in considered portion 500 of the ideal gas, k is the Boltzmann constant, and $T_s$ is the absolute temperature of the stationary ideal gas. The interrelation between thermodynamic parameters in the case of a hypothetical ideal gas can also be represented by the Clapeyron-Mendeleev gas law: $P_{ideal} = \rho_s R_0 T_s/\mu$, where $\rho_s$ is the stationary ideal gas density, $R_0$ is the universal gas constant, and μ is the molar mass of the gas. Considering a real gas, the van der Waals approach bonds the static pressure of real gas $P_{Waals}$ acting on a stationary wall with the static pressure $P_{ideal}$ defined in the kinetic theory of ideal gas, namely:

$$P_{ideal} = \left(P_{Waals} + \frac{a}{V_s^2}\right)\frac{V_s - b}{V_s}, \quad \text{Eq. (5.2a)}$$

where $_{Waals}$ is the van der Waals static pressure of real gas, acting on a stationary wall; constant b has the physical sense of excluded volume because of the presence of the particles in the volume; and constant a defines the attraction forces between the real gas molecules. So, the van der Waals equation of state for real gas is written as:

$$\left(P_{Waals} + \frac{a}{V_s^2}\right)\frac{V_s - b}{V_s} = \frac{\rho_s R_0 T_s}{\mu}, \quad \text{Eq. (5.2b)}$$

The general enough theory of molecular fluid by van der Waals is qualitatively reasonable for the liquids as well. For the purposes of the present patent application, the van der Waals equation (5.2b) should be understood in a wider sense, allowing for the van der Waals parameters a and b to be variable, thereby making the equation (5.2b) appropriate for rigorous quantitative calculations applied to both: real gases and liquids, and thereby, generalizing the van der Waals equation of state for a molecular fluid.

In contrast to the defined pressure $P_{Waals}$ acting on a stationary wall, being hypothetically inert to the fluid's molecules forces, i.e. being not phobic with repulsive forces and not sticking with attractive forces, the cumulative-inner-static-pressure P in equation (5.1) is acting on the fluid portion 500's boundaries, which, on the one hand, have the same inter-molecular attraction properties as the surrounding matter, and, on the other hand, may be not stationary, but be subjected to deformations and acceleration.

In the absence of gravitational forces, when portion 500 is sufficiently far from a body having real walls, when portion 500, as stationary-small-portion, is not subjected to any acceleration and is affected by a stationary-effect only, the static pressure in equation (5.1) has the meaning of the inner-stationary-static-pressure defined for the static case. This pressure, indicated by $P_s$, as a measure of the fluid molecules cumulative stationary-impact on imaginary boundaries of stationary-small-portion 500, is expressed as the following stationary equation:

$$P_s = P_{Waals} + \frac{a}{V_s^2}. \quad \text{Eq. (5.2c)}$$

Taking into the account equation (5.2c), the van der Waals equation (5.2b), written in the form expressing the inner-stationary-static-pressure, takes the following form:

$$P_s = \frac{\rho_s r_s R_0 T_s}{\mu}, \quad \text{Eq. (5.2d)}$$

where $r_s$ is the compression ratio $V_s/(V_s - b)$, which represents how much the real fluid is compressed in comparison with a hypothetical ideal gas. For example, the assumption that the parameter b, quantifying the excluded volume, equals $v_s$ leads to the infinite compression ratio $r_s$ that corresponds to a hypothetical absolutely incompressible liquid. Equation (5.2d) allows considering the real fluid's inner-stationary-static-pressure $P_s$ as the static pressure of the ideal-like gas having specific fluid constant $R_s$ defined as $R_s = r_s R_0/\mu$.

Taking into the consideration the definitions of the inner-stationary-static-pressure $P_s$, compression ratio $r_s$, and real molecular fluid as the ideal-like gas having specific fluid constant $R_s$, the van der Waals equation of state for a molecular fluid, written in the form expressing the inner-stationary-static-pressure, gets the form, similar to the Clapeyron-Mendeleev gas law, namely:

$$P_s = \rho_s R_s T_s \quad \text{Eq. (5.2e).}$$

In the case of an ideal gas, the sense of stationary equation (5.2e) becomes identical with the Clapeyron-Mendeleev gas law.

The value $R_s T_s$ has the physical sense of the characteristic heat portion per unit mass, indicated by $Q_s$, stored in fluid stationary-small-portion 500's molecular Brownian random motion, related to degrees of freedom causing the fluid molecules cumulative stationary-impact defining the inner-stationary-static-pressure $P_s$, and satisfying equation (5.2e), namely: $Q_s = R_s T_s = P_s/\rho_s$, and $P_s = \rho_s Q_s$. The defined pressure $P_s$ can be decomposed into the following three components: the static pressure $P_{ideal}$ defined in the kinetic theory of ideal gas, and two additive partial components defining the molecular fluid compression depending on the van der Waals parameters a and b. The two additive partial components are: compression pressure-a, indicated by $P_a$, and compression pressure-b, indicated by $P_b$. The indexes a and b are associated with the van der Waals parameters a and b correspondingly. I.e. pressure $P_s$ is expressed as:

$$P_s = P_{ideal} + P_a + P_b \quad \text{Eq. (5.20.}$$

The partial compression pressure-b $P_b$ is defined as a measure of a compression-impact-effect, caused because of increased density of the molecular fluid, sufficient to take into account the compression ratio $r_s=V_s/(V_s-b)$. This is a pressure deforming the shape of fluid portion 500.

The partial compression pressure-a $P_a$ is defined as a measure of a further deep-compression-effect, arisen because of increased density of the molecular fluid, sufficient to have to take into account the inter-molecular forces defined by the van der Waals parameter a, defining the potential energy of the inter-molecular attraction. The partial compression pressure-a $P_a$ interrelates with the potential energy of the inter-molecular attraction as:

$$U = \frac{P_a}{\rho_s}, \quad \text{Eq. (5.2g)}$$

where U is the internal inter-molecular potential-energy-per-unit-mass. Thereby:
while the molecular fluid is as an ideal gas, both: the partial compression pressure-a and the partial compression pressure-b equal zero: $P_a=0$ and $P_b=0$;
if the molecular fluid is as a solid-gas with the compression ratio $r_s$ noticeably greater than 1 and with a minor influence of the inter-molecular attractive forces, the partial compression pressure-a is marginal: $P_a=0$; and
if the molecular fluid is as a liquid, the partial compression pressure-a decisively defines potential energy of the inter-molecular attraction.

The fluid's density, on the one hand, has the sense of a measure of concentration and mass of the fluid molecules and, on the one hand, has the gravitational sense. The potential gravitational energy stored in the fluid portion unit mass in the Earth's gravitational field is G=zg, where z is the effective height of the fluid's portion above the Earth's ocean surface level. The partial potential-static-pressure $P_z$ distributed on height and provided by the Earth's gravitational field is added, namely:

$$P_z = z\mu g = \rho G \quad \text{Eq. (5.2)},$$

where ρ is the fluid density that in the stationary case is $\rho_s$ satisfying stationary equation (5.2e).

Figure 5B:
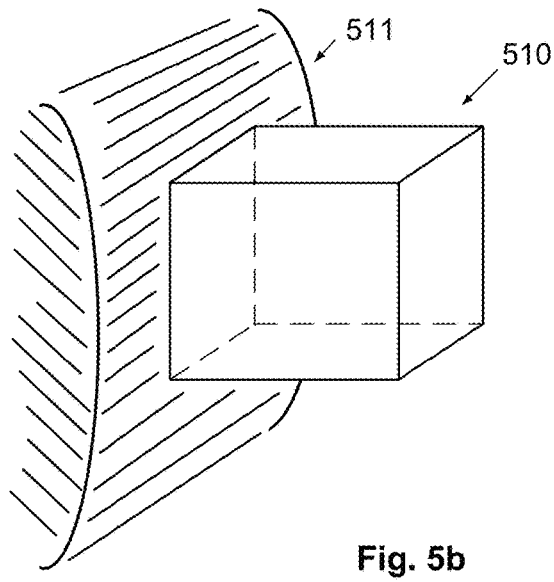
FIG. 5b is a schematic illustration of a fluid small portion adjacent to a body.

Reference is now made to FIG. 5b, a schematic illustration of a fluid portion 510 as a generalized case of fluid portion 500 of FIG. 5a such that having boundaries adjacent to the stationary walls of body 511. The approach described referring to FIG. 5a can be further adapted to an imaginary boundary layer, comprising fluid portion 510, moving near the real walls of body 511 and being subjected to deformations and acceleration.

The adaptation involves a definition of the inner-static-pressure $P_{in}$ provided by the fluid molecules interactions as comprising two items: $P_{in}=P_s+P_{boundary}$,' where $P_{boundary}$ is the partial inner-boundary-layer-static-pressure. On the one hand, the partial inner-boundary-layer-static-pressure $P_{boundary}$ enforces the movement to be in alignment with the adjacent stationary walls of body 511, i.e. acting as a drag, and on the other hand, it results in the fluid's specific velocity distribution in an imaginary boundary layer, i.e. acting as a partial pressure relating to a viscous skin-friction effect. This is formalized as $$P_{boundary} = P_{drag} + P_{viscous} \quad \text{Eq. (5.3a),}$$

where $P_{drag}$ is the partial drag-static-pressure acting on moving-small-portion 510, defined as the partial pressure, which arises when fluid portion 510 gets a convective acceleration redirecting moving-small-portion 510, sliding in alignment with the curvature of the real walls; and $P_{viscous}$ is the partial viscous-static-pressure acting on moving-small-portion 510, defined as the partial pressure, which results in that the velocity of moving-small-portion 510 is subjected to a specific spatial distribution in the imaginary boundary layer adjacent to the real walls of body 511. Here and further on, it is assumed that the interaction between the walls and fluid occurs without the heat energy exchange between the walls and fluid, so moving-small-portion 510 is undergoing a reversible adiabatic process.

The partial drag-static-pressure $P_{drag}$ represents either phobic, i.e. fluid-repellent pressure, interrelated with phobic-repulsive forces directed inward fluid portion 510, or sticking pressure, related with attractive forces directed outward fluid portion 510, when the motion trajectory of fluid portion 510 is aligned with the wall's curvature or, more generally, with the trajectory of the adjusted portions of the moving fluid. The partial drag-static-pressure $P_{drag}$ defines the arisen boundary level effect arising due to the curvature of the walls. The partial drag-static-pressure $P_{drag}$ relates to the two mechanisms of fluid portion 510 acceleration: on the one hand, the partial drag-static-pressure $P_{drag}$ acts as a compressor-expander stagnating fluid portion 510; and on the other hand, the partial drag-static-pressure $P_{drag}$ acts to change the cross-sectional area of moving-small-portion 510.

The effect of fluid portion 510 stagnating is formalized by the sum of the partial stagnation pressures: stagnation pressure-b, indicated by $\delta P_b$, and of the deep-stagnation pressure-a, indicated by $\delta P_a$. The indexes a and bare associated with relative variations of the van der Waals parameters a and b correspondingly.

The partial stagnation pressure-b $\delta P_b$ is defined as a measure of a stagnation-impact-effect, i.e. of an effect of a cumulative stagnation-impact of the fluid molecules on the imaginary boundaries of fluid portion 510. This is a pressure deforming the shape of fluid portion 510. The partial stagnation pressure-b $\delta P_b$ is interrelated with a change of the moving-small-portion 510's volume V and, thereby, of the compression ratio r defined as V/(V−b), while retaining the same inter-molecular forces defined by van der Waals parameter a. The value r, now differing from the value $r_s$ defined for a stationary case, specifies the partial stagnation pressure-b $\delta P_b$.

The partial deep-stagnation pressure-a $\delta P_a$ is defined as a measure of a further deep-stagnation-effect, observed as further deformation of the shape of fluid portion 510, such that resulting in quantitative changes of the inter-molecular forces defined by the van der Waals parameter a, allowed to be variable. If the van der Waals parameter a is associated with the stationary-small-portion 500, subjected to the deep-compression-effect and yet to be subjected to the deep-stagnation-effect, then, considering the moving-small-portion 510, the variation, indicated by δa, is added, such that the van der Waals parameter a+δa corresponds to the moving-small-portion, subjected to the deep-stagnation-effect.

For example, while the molecular fluid is as an ideal gas, both: the partial deep-stagnation pressure-a and the partial stagnation pressure-b equal zero: $\delta P_a=0$ and $\delta P_b=0$; if the molecular fluid is as a solid-gas with the variable compression ratio r and with minor variations of the inter-molecular attractive forces, the partial deep-stagnation pressure-a is marginal: $\delta P_a=0$; and by contrast, if the molecular fluid is liquid, the partial stagnation pressure-b is negligible: $\delta P_b=0$.

The aspect of the partial drag-static-pressure $P_{drag}$, associated with the change of the cross-sectional area of moving-small-portion 510 thereby providing fluid portion 510's sliding motion in alignment with the stationary walls curvature, is formalized as the partial pressure-c indicated by $\delta P_c$. The partial pressure-c $\delta P_c$ interrelates with the Coanda-effect and is a measure of the cumulative aligning-impact of the fluid molecules on the imaginary boundaries of fluid portion 510 moving in the imaginary boundary layer adjacent to stationary walls of body 511.

Thus, a drag-effect is the cumulative effect comprising:
the stagnation-impact-effect providing the partial stagnation pressure-b,
the deep-stagnation-effect providing the partial stagnation pressure-a, and
the Coanda-effect providing the partial pressure-c;
such that the partial drag-static-pressure $\delta P_{drag}$ is quantified as equal to the sum, comprising three items, as expressed by:

$$\delta P_{drag} = \delta P_a + \delta P_b + \delta P_c \qquad \text{Eq. (5.3b)}.$$

The mentioned mechanisms, related to the partial pressures b and c, provide reversible adiabatic conversion of the kinetic energy of the fluid's molecules Brownian random motion into the kinetic energy of fluid portion 510's aligned motion, and vice-versa.

The mentioned mechanism, related to the partial deep-stagnation pressure-a, changes the internal inter-molecular potential-energy-per-unit-mass by a value equal to $$\delta U = \frac{\delta P_a}{\rho_s} \qquad \text{Eq. (5.3)}$$

distributed in space.

The partial viscous-static-pressure $P_{viscous}$ relates to the two mechanisms of fluid portion 510 acceleration: on the one hand, it is a skin-friction effect observed as an effect of the moving fluid's molecules sticking to the real walls; and on the other hand, it is an osmotic-like effect, which arises between the fluid's adjacent portions differing in either density or temperature.

The partial skin-friction static-pressure $P_{skin}$ is a measure, how much the walls are sticky for the molecular fluid motion. This can be formalized as $$P_{skin} = \frac{a_w - a - \delta a}{V^2} \times F_{skin}(u, a + \delta a, y_w), \qquad \text{Eq. (5.4a)}$$

where $\delta a$ is the van der Waals parameter variation relative to the van der Waals parameter a associated with the stationary-small-portion yet to be subjected to the deep-stagnation-effect, V is the volume of moving-small-portion 510, $a_w$ is the parameter similar to the van der Waals parameter a, but describing inter-attraction forces between the walls and molecules of the fluid, i.e. the wall-fluid molecular interaction forces; $y_w$ is the distance between moving-small-portion 510 and the walls; and $F_{skin}(u, a+\delta a, y_w)$ is a function of u, $a+\delta a$, and $y_w$. If the distance $y_w$ is sufficiently big, the viscosity influence of the walls becomes negligible. The difference $(a_w - a - \delta a)$ defines the effect of viscosity. When the attractive forces between the walls and molecules of the fluid are stronger than the fluid's inter-molecular forces, i.e. $(a_w - a - \delta a) > 0$, the fluid's molecules are "sticking" to the walls, and the fluid develops viscous properties causing the wall-fluid molecular interaction forces cumulative action against fluid portion 510's motion direction accompanied by a dissipation of the kinetic energy of fluid portion 510 into the fluid portion 510's heat energy; and when the attractive forces between the walls and molecules of the fluid are weaker than the fluid's inter-molecular forces, i.e. $(a_w - a - \delta a) < 0$, the walls develop phobic repellent properties. A so-called "free-slip" motion condition, corresponds to the case, when the attractive forces between the walls and molecules of the fluid compensate the fluid's inter-molecular forces, i.e. $(a_w - a - \delta a) = 0$.

The partial osmotic-like static-pressure $P_{osmotic}$ defines the osmotic-like effect triggered by the gradients of density and temperature. This can be formalized as $$P_{osmotic} = F_{osmotic}(a + \delta a, \nabla \rho, \nabla T) \qquad \text{Eq. (5.4b)},$$

where $F_{osmotic}(a+\delta a, \nabla \rho, \nabla T)$ is a function of the van der Waals parameter a allowed to be varied and of the gradients $\nabla \rho$ and $\nabla T$. The gradients $\nabla \rho$ and $\nabla T$ depend on the gradient of the velocity-vector $\nabla u$. If all the gradients equal zero, the osmotic-like effect becomes as the diffusion caused by the Brownian random motion of the fluid's molecules.

So, the partial viscous-static-pressure $P_{viscous}$ is represented as the sum of two items, namely:

$$P_{viscous} = P_{skin} + P_{osmotic} \qquad \text{Eq. (5.4c)}.$$

Considering the general case of fluid portion 510 of FIG. 5b that may move either within or out of the imaginary boundary layer, the cumulative-inner-static-pressure P is interpreted as comprising the mentioned items:

$$P = P_{in} + P_z = P_s + P_{drag} + P_{viscous} + P_z \qquad \text{Eq. (5.4d)},$$

which can be further decomposed as the following:

$$P = P_s + (\delta P_a + \delta P_b + \delta P_c) + (P_{skin} + P_{osmotic}) + P_z \qquad \text{Eq. (5.4e)}$$

The characteristic heat portion per unit mass, indicated by Q, stored in fluid moving-small-portion 510's molecular Brownian random motion, related to degrees of freedom causing the fluid molecules cumulative impact defining the inner-static-pressure $P_{in}$, equals $$Q = RT = \frac{P_{in}}{\rho}, \qquad \text{Eq. (5.4)}$$

where T is the fluid moving-small-portion 510 absolute temperature that, in general, differs from the temperature $T_s$ of the stationary case satisfying the stationary equation (5.2e), and the generalized specific fluid constant R is defined for moving-small-portion 510 as $R = rR_0/\mu$, where $r = V/(V-b)$. Combining equations (5.2), (5.3) and (5.4), one can derive that $$Q + G = \frac{P}{\rho}, \qquad \text{Eq. (5.5)}$$

when an adiabatic case is considered. In a particular case, when the effect of the gravitational influence is negligible, the cumulative-inner-static-pressure P is identical with the inner-static-pressure $P_{in}$, and the equation of a moving molecular fluid state is derived from the equation (5.5) as:

$$P = P_{in} = \rho Q = \rho RT, \text{ if } P_z = 0 \qquad \text{Eq. (5.5a)}.$$

Taking into account equation (5.5), one can rewrite integral equation (5.1) as:

$$\frac{\partial}{\partial t}\int \rho u dV = \oint_S \rho u u \cdot n dS - \oint_S \rho(Q+G) n dS. \qquad \text{Eq. (5.6a)}$$

Applying Gauss's theorem to the integrals of the right part, one can specify this as:

$$\frac{\partial}{\partial t}\int \rho u dV = -\int \nabla \rho u u dV = -\int \nabla \rho(Q+G) dV, \qquad \text{Eq. (5.6b)}$$

or, in differential form:

$$\frac{\partial}{\partial t} u = -\nabla(uu) - \nabla(Q+G), \qquad \text{Eq. (5.6)}$$

where $\nabla$ is the vector differential operator.

The term "$\nabla Q$" of the equation has the sense of a force per mass unit interrelated with a change in fluid thermodynamic state, the term "$\nabla(uu)$" has the sense of an inherent convective self-acceleration of fluid portion 510, and the term "$\nabla G$" has the sense of a gravitational force.

The momentum conservation equation in form (5.6) is applicable to viscous fluid flow being either almost incompressible as liquid or compressible-expandable as gas. Noticing that the inner-static-pressure, in the general case, equals+$P_{in}$, $P_{in}$=$P_s$+$P_{drag}$+$P_{viscous}$, the exact solution of (5.6) for a steady-state flow is the Bernoulli theorem: ($P_{in}/\rho$)+($zg$)+($u^2/2$)=Const that confirms adequateness of equation (5.6).

Mass Conservation or Equation of Continuity

The conservation of mass says that the variation of the mass in a volume must be entirely due to the inflow or outflow of mass through a closed surface S of that volume, namely:

$$\frac{\partial}{\partial t}\int \rho dV = -\oint_S \rho u \cdot n dS. \qquad \text{Eq. (5.7a)}$$

Using Gauss's theorem, one can specify this as:

$$\frac{\partial}{\partial t}\int \rho dV = -\int \nabla \cdot (\rho u) \cdot dV, \qquad \text{Eq. (5.7b)}$$

and so in differential form:

$$\frac{\partial}{\partial t}\rho + \nabla \cdot (\rho u) = 0. \qquad \text{Eq. (5.7)}$$

The solution of (5.7) for a stationary case can be written as the equation of continuity: A$\rho u$=
Const, where A is the fluid flow cross-section area.

Generalized Adiabatic Compressibility Parameter

The mathematical equation for a hypothetical ideal gas undergoing a reversible adiabatic process is $$P_{ideal}V^j = Const \qquad \text{Eq. (5.8a),}$$

where j is the adiabatic compressibility-constant, defined for the hypothetical ideal gas as j=1+$R_0/C_v$=1+2/f, where $C_v$ is the specific heat capacity for constant volume, and f is the number of degrees of freedom per molecule of gas wherein f depends on a configuration of the hypothetical ideal gas molecules.

One can spread the logic of the kinetic theory of gas to define a so-called adiabatic compressibility parameter y, now generalized for a real fluid, specifying factors reducing the degrees of freedom of the fluid's molecules. These are the compression ratio r=V/(V−b) and an involved function $\phi(a)$ of the van der Waals parameter a+δa. The involved function $\phi(a+\delta a)$ has a sense of an influence of the internal inter-molecular potential-energy-per-unit-mass on the degrees of freedom of the fluid's molecules and is expressed as:

$$\phi(a+\delta a) = \frac{P_{in}}{P_{in} - P_a - \delta P_a} = \frac{\rho RT}{\rho RT - U - \delta U}. \qquad \text{Eq. (5.8b)}$$

Therefore, one can define the generalized adiabatic compressibility parameter γ as $$\gamma = 1 + r\phi(a+\delta a)R_0/C_v = 1 + 2r\phi(a+\delta a)/f, \text{ i.e. } \gamma = 1 + r\phi(a+\delta a)(1-j) \qquad \text{Eq. (5.8c),}$$

where j now has the sense of the adiabatic compressibility parameter, defined for the real fluid, but imagined as a hypothetical ideal gas composed of the same molecules in the assumption that the conditions a+δa=0 and b=0 are satisfied and are interrelated to the conditions $\phi(a+\delta a)$=1 and r=1, correspondingly. The condition y>>1 is satisfied for liquids and ionized gases (i.e. plasma), so the following simplified equation becomes relevant:

$$\begin{cases} \gamma = j & \text{for hypothetical ideal gases} \\ \gamma = 1 + r(j-1) & \text{for real gases} \\ \gamma \gg 1 & \text{for real liquids and plasma} \\ \gamma \to \infty & \text{for hypothetical incompressible liquids} \end{cases} \qquad \text{Eq. (5.8d)}$$

The definition of the generalized adiabatic compressibility parameter y allows to derive an equation for the real fluid undergoing a reversible adiabatic process as:

$$P_{in}V^\gamma = Const \qquad \text{Eq. (5.8).}$$

In a particular case, when the effect of the gravitational influence is negligible, the cumulative-inner-static-pressure P becomes identical with the inner-static-pressure $P_{in}$, and the equation (5.8) for the real fluid undergoing a reversible adiabatic process can be specified as:

$$PV^\gamma = P_{in}V^\gamma = Const, \text{ if } P_z = 0 \qquad \text{Eq. (5.8e).}$$

For a hypothetical ideal gas, the conditions r=1 and $\phi(a)$=1 are satisfied, and equations (5.8) and (5.8e) revert to equation (5.8a).

Energy Conservation

The conservation of energy says that the variation of the energy in a volume must be entirely due to the inflow or outflow of energy through a closed surface S of that volume. Energy exists in many forms. In the case, wherein portion 510 is small sufficient to have no whirling groups of molecules, making a complete rotating cycle within portion 510 (i.e. to have no inner turbulent motions), considering a unit mass of fluid portion 510, one can take into account the following forms of the energy:

kinetic energy $K=u^2/2$, defined by cumulative kinetic-energy-per-unit-mass of fluid molecules motion in a prevalent direction;

potential gravitational energy $G=zg$, stored in the unit mass in the gravitational field of the Earth;

total heat $Q_{tot}$ as the cumulative kinetic energy per unit mass stored in a fluid molecular Brownian random motion that for a van der Waals gas is defined as $Q_{tot}=RT\times(r(j-1))$, where $R=rR_0/\mu$. To define the total internal energy per unit mass, indicated by $U_{in}$, the change in degrees of freedom of the fluid's molecules caused because of the internal inter-molecular potential-energy-per-unit-mass $U+\delta U$ is taken into the consideration via the definition of generalized adiabatic compressibility parameter $\gamma$, such that the total internal energy per unit mass, indicated by $U_{in}$, is quantified as $U_{in}=Q_{tot}+U+\delta U=RT\times(\gamma-1)=Q\times(\gamma-1)$, wherein the only characteristic heat portion per unit mass $Q=RT$, stored in a fluid molecular Brownian random motion, is related to degrees of freedom causing the fluid molecules cumulative impact on the boundary surfaces of moving-small-portion 510.

Thereby, the total cumulative energy applicable to the fluid motion is the volume integral of $\rho(K+G+Q)$, and wherein the advection of energy through the control volume surface is the surface integral of $\rho(K+G+Q)u\cdot n$. Thus, the conservation equation of energy is:

$$\frac{\partial}{\partial t}\int_V \rho(K+G+Q)dV = -\oint_S \rho(K+G+Q)u\cdot n\, dS. \quad \text{Eq. (5.9a)}$$

Using Gauss theorem one gets:

$$\frac{\partial}{\partial t}\int \rho(K+G+Q)dV = -\int \nabla[\rho(K+G+Q)u]dV. \quad \text{Eq. (5.9b)}$$

Since this must be valid for all control volumes V, one gets the differential form of the energy conservation equation:

$$\frac{\partial}{\partial t}\rho(K+G+Q) + \nabla[\rho(K+G+Q)u] = 0, \quad \text{Eq. (5.9c)}$$

or, substituting the defined expressions for the kinds of energy, it can be written as:

$$\frac{\partial}{\partial t}\rho\left(\frac{u^2}{2}+zg+RT\right) = -\nabla\left[(\rho u)\left(\frac{u^2}{2}+zg+RT\right)\right]. \quad \text{Eq. (5.9)}$$

In a stationary case, equation (5.9) can be simplified as:

$$\nabla\left[(\rho u)\left(\frac{u^2}{2}+zg+RT\right)\right] = 0. \quad \text{Eq. (5.10a)}$$

Comparing (5.10a) with mass conservation equation (5.7), one can conclude that $$\frac{u^2}{2}+zg+RT = Const \quad \text{Eq. (5.10b)}$$

Taking into the account that $=RT=P_{in}/\rho$, one obtains the Bernoulli theorem for stationary flow:

$$\frac{u^2}{2}+zg+\frac{P_{in}}{\rho} = Const, \quad \text{Eq. (5.10)}$$

as was predicted.

The set of specified equations (5.2), (5.3), (5.4), (5.5), (5.6), (5.7), (5.8), and (5.9) represents the generalized equations of molecular fluid motion, the adequacy of which is confirmed by the Bernoulli theorem, equation (5.10). A method for computational fluid dynamics comprising the momentum conservation equation (5.6) expressed via the gradient of the characteristic heat portion $\nabla Q$ is a subject of the present invention.

In view of the foregoing description with reference to FIG. 5b, it will be evident to a person skilled in the art that, in contrast to the continuum mechanics approach based on the introduction of viscosity constants, the description of the drag and viscosity effects by molecular interactions defined in frames of the kinetic theory of matter is one of the primary principles of the present invention.

In view of the foregoing description with reference to FIG. 5b, it will be evident to a person skilled in the art that the described approach, being adapted to fluid portion 510 moving near real walls of body 511, excludes the d'Alembert paradox formulated in frames of the classical continuum mechanics, because of either repellent or sticking properties of the arisen partial drag-static-pressure $P_{drag}$ depending on a direction of the motion velocity of fluid portion 510 and the walls' curvatures. This follows also from the kinetic theory of gas, where the term "pressure" is defined as a measure of the random moving molecules' impact effect acting on a wall. So, considering a moving body, for simplicity, having a spherical shape, the relative mean velocity-vector of the impacting molecules random motion depends on the body's velocity value and direction, according to Galilean relativity. Thus, the difference between the impact effects, acting on the forward and rear sides of the moving body, defines the non-zero cumulative partial drag-static-pressure $P_{drag}$. Furthermore, considering a moving body, having an airfoil wing-like shape triggering the Coanda-effect, the partial pressure-c $\delta P_c$, as a component of the partial drag-static-pressure $P_{drag}$, provides a jet-effect and, in a certain condition, triggers the de Laval effect as described below with reference to FIG. 7c as well as with references to FIGS. 8a, 8b, 8c, 8d, 9a, 9b, 9c, 9d, 9e, and 9f.

In view of the foregoing description with reference to FIG. 5b, it will be evident to a person skilled in the art that the partial viscous-static-pressure $P_{viscous}$, comprising the partial skin-fiction static-pressure $P_{skin}$ and osmotic-like static-pressure $P_{osmotic}$, depends on the fluid temperature. In particular, for gases, higher temperature results in a dominant increase of the partial osmotic-like static-pressure $P_{osmotic}$; and for liquids, higher temperature results in a decrease of the van der Waals parameter a accompanied by the skin-friction static-pressure $P_{skin}$ decrease, primary defining the partial viscous-static-pressure $P_{viscous}$ decrease.

In view of the foregoing description with reference to FIG. 5a, it will be evident to a person skilled in the art that, considering a molecular fluid in frames of the van der Waals approach, without loss of generality, one can apply a modification of the van der Waals equation of state for a molecular fluid. It may be either the Redlich-Kwong equation, and/or the Berthelot model, and/or the Dieterici model, and/or the Clausius model, and/or the Virial equation, and/or the Peng-Robinson equation of state, and/or the Wohl equation, and/or the Beattie-Bridgman model, and/or Benedict-Webb-Rubin equation as well as further generalizing modifications.

In view of the foregoing description with reference to FIGS. 5a and 5b, it will be evident to a person skilled in the art that, applying a certain resolution size of fluid portion 510 to a discrete approximation in the computational fluid dynamics, some whirling groups of molecules, i.e. some turbulent motions of fluid, become hidden within the resolution. In other words, considering a sufficiently large fluid portion 510 as a cell of the discrete approximation in the computational fluid dynamics, the hidden turbulent motion of the groups of molecules, whirling within the fluid portion 510, is interpreted as the molecules Brownian random motion. This means that the temperature of fluid portion 510, involved into equation (5.9), should be understood in a widened sense as a measure proportional to the average molecular kinetic energy of both: the molecules Brownian random motion and the hidden turbulent motion of the whirling groups of molecules.

Waves in Fluid

The acoustic (elastic) wave propagating in a molecular fluid medium is defined as a periodically oscillating motion of a molecular fluid portion relative to a stationary point, wherein the periodically oscillating portion is subjected to an external energetic forced action resulting in the acoustic wave process. The inventor points out that the acoustic wave process is a particular case of the molecular fluid motion in accordance with the set of equations (5.6), (5.7), and (5.9), where the fluid density is given by a periodically oscillating function, wherein the wavenumber is interrelated with the cycle frequency and the velocity of sound. Namely, $\rho(t, z) = \rho_0 + \delta\rho \times \cos(\omega t - \kappa z)$, where:

$\rho_0$ is the effective mass density of the fluid matter, $\delta\rho$ is the oscillation amplitude of the mass density of the fluid matter, t is current time, z is distance from a certain spatial point, $\omega$ is cycle frequency of the oscillation, and $\kappa$ is wavenumber of the acoustic wave, associated with the periodically-oscillated mass density, wherein $\kappa = \omega/u_{sound}$, where $U_{sound}$ is velocity of sound in the molecular fluid.

The total internal energy per unit mass $U_{in}$, comprises the portion of energy, indicated by $\delta U_{in}$, which is defined as acquired from the external energetic forced steady-state oscillating action. The acquired portion, $\delta U_{in}$, per unit mass is permanently refreshing locally and is traveling along the direction of the acoustic wave propagation such that the total internal energy per unit mass, $U_{in}$, remains constant. The inventor points out that the energy traveling (i.e. work) occurs in an adiabatic process, i.e. occurs at the expense of the internal heat energy of the molecular fluid itself. For simplicity, ignore the non-zero partial viscous-static-pressure $P_{viscous}$ causing the irretrievable dissipation of the acoustic wave energy into the warmth of the molecular fluid medium. The set of equations (5.6), (5.7), and (5.9), in particular, says that the wave process is a process of the energy transformation from one kind of the energy into another kind of the energy. Namely, the kinetic energy of oscillating motion is transforming into the potential energy interrelated with the partial drag-static-pressure $P_{drag}$ defined by equation (5.3b) as composed of three varying additive components: $P_{drag} = \delta P_a + \delta P_b + \delta P_c$ and accompanied by a change of the molecular fluid density and temperature and so interrelated with a change of the molecular fluid state in a revertible adiabatic process and, vice versa, the molecular fluid portion potential energy, interrelated with the partial drag-static-pressure $P_{drag}$, becomes contributed to the convectively acquired kinetic energy of the oscillating motion. The change in fluid state interrelated with the oscillating motion in an adiabatic process corresponds to a certain change in the internal heat energy of the molecular fluid, namely, $\Delta Q_a = R \Delta T_a$, where $\Delta Q_a$ is the change of characteristic heat portion per unit mass, wherein the value of the adiabatic temperature change $\Delta T_a = T_2 - T_1$ is bonded with the varying partial drag-static-pressure $P_{drag}$ by the relation: $T_2/T_1 = (P_2/P_1)^{(\gamma-1)/\gamma}$, where $P_1$ and $P_2$ are the partial drag-static-pressures $P_{drag}$ of the subject fluid portion in two opposite states of the oscillating portion of fluid in the adiabatic process, correspondingly, and $\gamma$ is the generalized adiabatic compressibility parameter as defined by equation (5.8c), wherein the value $\gamma = 7/5$ is a good approximation for natural air as consisting dominantly of diatomic molecules.

The inventor points out that the mechanism of the adiabatic transformation between the internal heat energy and the convectively acquired kinetic energy of the oscillating motion is determined by the Coanda-jet-effect quantified by the partial pressure-c $\delta P_c$. The adiabatic transformation between the internal heat energy and the convectively acquired kinetic energy of the oscillating motion is in conformance with the set of equations (5.6), (5.7), and (5.9), and so the exact solution for acoustic wave, propagating in a prevalent direction, as a particular case of the molecular fluid steady-state oscillating motion, is the Bernoulli theorem saying that the value $(P_{in}/\rho) + (u^2/2)$ is constant along the prevalent direction. The inventor points out that the external energy of the forced action:

on the one hand, is a source of the wave process; as well as, on the other hand, is a trigger providing for the periodically oscillating mutual transformation of the molecular fluid portions energy between the oscillating motion and the molecular fluid portions internal heat energy defined by the varying partial drag-static-pressure $P_{drag}$, wherein the triggered energy transformation occurs adiabatically.

This, in particular, says that the energy, brought by an acoustic wave, is composed of the external energy of the forced action and a positive portion of energy, which is self-extracted from the internal heat energy of the molecular fluid due to the Coanda-jet-effect quantified by the partial pressure-c $\delta P_c$. Thus, the inventor points out that the wave process is accompanied by the Coanda-jet-effect, i.e. by a triggered effect of the molecular fluid portions convective self-acceleration, occurring adiabatically at the expense of the internal heat energy of the ambient fluid medium.

For the purposes of the present invention, to emphasize the inherent jet-effect of the propagating acoustic wave, the term "waving jet-effect" should be understood as a kind of the Coanda-jet-effect specified as being applied to inner portions of a molecular fluid, as a tendency of an oscillatory moving-small-portion to be attracted to and aligned with a curvature of a nearby fragment of an imaginary boundary of a neighbor inner portion;

For the purposes of the present invention, to emphasize the jet-effect nature of the acoustic radiation pressure described hereinabove in the BACKGROUND OF THE INVENTION, subparagraph "Radiation Pressure", the term "radiation jet-effect" should be understood as a kind of jet-effect specified as a tendency of propagating acoustic wave to push an obstacle exposed to the propagating acoustic wave; wherein the tendency, observed as the excessive radiation pressure by the propagating acoustic wave, is interrelated with the tendency of the acoustic wave propagation in a prevalent direction.

The inventor takes note that the terms "radiation jet-effect" and "waving jet-effect" are of interrelated senses. In other words, the inventor interprets the radiation jet-effect as a self-revealing-and-manifestation of the triggered waving jet-effect that, in turn, is a self-revealing-and-manifestation of the triggered Coanda-jet-effect. Further, the inventor points out that, when the external energetic source of an acoustic wave acts as a localized oscillator only, the acoustic wave is characterized by propagation in a prevalent direction, and, if to ignore the acoustic wave dissipation, the acoustic wave propagation, as the wave energy traveling, occurs adiabatically. The inventor takes note the adiabatic character of the acoustic wave propagation allowing for a conveying the acoustic wave energy from the localized external energetic source of the acoustic wave to an acoustic wave detector placed far from the localized external energetic source.

Interference of Acoustic Waves

The principle of superposition of waves states that when two or more propagating waves of the same type inter-join at a point, the resultant amplitude at that point is equal to the vector sum of the amplitudes of the individual waves. If a crest of a wave meets a crest of another wave of the same frequency at the same point, then the amplitude is the sum of the individual amplitudes—this is constructive interference. If a crest of one wave meets a trough of another wave, then the amplitude is equal to the difference in the individual amplitudes—this is known as destructive interference.

The inventor points out that as the acoustic waves are characterized by dominant longitudinal oscillations inherently accompanied by minor cross-sectional oscillations of a molecular fluid portion, i.e. are characterized by a specific field of velocities, then, considering the acoustic waves superposition, one expects the following specific self-revealing-and-manifestations of the interference, namely,
- when the two in-phase acoustic waves are joining substantially collinear, one expects the origination of the constructive interference;
- when the two anti-phase acoustic waves are joining substantially collinear, one expects the origination of the destructive interference;
- when the two identical acoustic waves are joining when propagating in the opposite directions, one expects the origination of a so-called standing wave as a result of the constructive-destructive interference; and
- when the two acoustic waves (as dominantly longitudinal waves) are meeting when propagating in the inter-perpendicular directions, one expects the origination of a specific kind of interference, for the purposes of the present invention, called an "orthogonal interference".

In Relation to a Single Wave in a not Disturbed Molecular Fluid

When a portion of fluid is disturbed by the single acoustic wave, propagating in a prevalent direction and characterized by a certain wavelength,
the fluid portion is composed of molecules:
- moving randomly in all the directions with the Brownian distribution of velocities, wherein the mean squared velocity of the Brownian motion of the molecules, equal to $u_{B1}$, corresponding to the velocity of the single acoustic wave propagation in the prevalent direction in the case, and, in addition,
- dominantly-longitudinally oscillating along the prevalent direction, collinear to the wave propagation, with the velocity u oscillating between the minimal value $-u_1$ and the maximal value $+u_1$ relative to a stationary point;

the density $\rho$ of the portion is oscillating as interrelated with the oscillating velocity in accordance with the equation of continuity; wherein the inner-static-pressure and temperature of the portion are oscillating as well as interrelated with the oscillating density in accordance with the Van der Waals law of the fluid state applied to an adiabatic process;

the wave energy $U_1$ per wavelength, brought by the single acoustic wave, is equal to $U_1 = 0.5\rho_1 u_1^2$, where $\rho_1$ is the density of a small sub-portion of the molecular fluid, wherein the small sub-portion having the linear size along the prevalent direction being much lesser than a quarter of the wavelength and moving with the maximal velocity $u_1$; and the cross-sectional area A of any portion of fluid is oscillating as well, according to the equation of continuity $A\rho u = Const$, i.e. the dominant longitudinal oscillations of a molecular fluid portion are inherently accompanied by cross-sectional oscillations.

In Relation to the Constructive Interference

When a portion of fluid is disturbed by two collinear in-phase acoustic waves, both characterized by the same wavelength,
- at the first glance, the constructive interference is observed as a seemingly usable energy excess when one uses a classic detector of the usable wave energy, reacting on the fluid molecules oscillating impact, i.e. reacting on the oscillation of locally-excessing pressure; and
- in a more detailed analysis, seeing that the two in-phase waves are disturbing the fluid portions by oscillations in unison,
  - thereby superposing the fields of velocities and thereby repeatedly reinforcing the waving jet-effect, the resulting oscillation velocity reaches the maximal value $u_+$ equal to $u_+ = u_1 + u_2$, where indexes "1" and "2" correspond to the two in-phase waves propagating separately, and index "+" corresponds to the case when the two in-phase waves join to result in the constructive interference;
  - thereby causing the specifically-asymmetrical redistribution of molecules motions degrees of freedom, the disturbed fluid portion becomes composed by molecules, moving randomly in all the directions with the Brownian distribution of velocities and, in addition, oscillating in the prevalent direction, collinear to the two in-phase waves propagations; wherein the oscillating velocity reaches the maximal value $u_+$ relative to a stationary point;

the relative velocity increase up to $u_+=u_1+u_2$ is higher than a hypothetic increase of velocity up to $\sqrt{u_1^2+u_2^2}$, which would be reached if considered as limited by the cumulative energies brought by the two in-phase waves only; wherein actually, the relative velocity increase up to $u_+=u_1+u_2$ occurs also at the expense of the internal heat energy and the corresponding established mean squared velocity of the Brownian motion of the molecules equals $u_{B+}$, such that the condition $u_{B+}<u_{B1}$ must be satisfied in the case. Corresponding varying partial drag-static-pressure $P_{drag}$ interrelates with the velocity of oscillation; and the cumulative usable wave energy $U_+$ per wavelength, brought by the two superposed collinear and in-phase acoustic waves, is equal to $U_+=0.5\rho_+u_+^2$, where $\rho_+$ is the density of a small sub-portion of the molecular fluid, wherein the small sub-portion having the linear size along the prevalent direction being much lesser than a quarter of the wavelength and moving with the maximal velocity $u_+$, i.e. $U_+=0.5\rho_+(u_1+u_2)^2$. For simplicity, $\rho_+\rho_1 \approx \rho_2$. In the case when $u_1=u_2$, the cumulative usable wave energy $U_+$ per wavelength, brought by the two superposed collinear and in-phase acoustic waves, is equal to fourfold usable wave energy $U_1$ per wavelength, brought by a single wave, i.e. $U_+=4U_1$.

The inventor points out that the increase of the maximal value $u_+$ of the oscillating velocity relative to a stationary point occurs at the expense of the mean squared velocity of the Brownian motion of the molecules $u_{B1}$ (i.e. $u_+<u_{B1}$). This, in particular, explains why, in a thermo-acoustic heat engine, an acoustic resonator plays the role of a "cold sink", and says that the maximal value $u_+$ is restricted by the origin mean squared velocity of the Brownian motion $u_{B1}$. Looking ahead, in view of the description of subparagraph "Convergent-Divergent Jet-Nozzle" referring to FIG. 6a of the invention, it will become evident to a person studied the present invention that the relative velocity $u_+$, which can be reached in an adiabatic waving process, is characterized by M-velocity being lower than the specific M-velocity, indicated by $M_*$, specified in equation (6.9) and, for air, estimated as of about $M_* \approx 0.5345$. I.e. the condition $u_+<u_{B+}\times M_*$ must be satisfied. This condition restricts the adiabatic increase of wave power brought by a classic waving acoustic wave, while a shock wave may bring higher power.

For the purposes of the present invention, the term "usable wave energy per wavelength" should be understood as partial wave energy being proportional to the second power of the resulting amplitude of the wave, and hence being detectable by a classic detector of waves, reacting on the resulting amplitude of wave; and the term "enhanced waving jet-effect" should be understood as the waving jet-effect, which is reinforced repeatedly applying constructive interference.

In Relation to the Destructive Interference

When a portion of fluid is disturbed by two collinear anti-phase acoustic waves, both characterized by the same wavelength, and the same amplitude, wherein the oscillating velocities of molecules for each acoustic wave are between $\pm u_1$ and $\pm u_2$, correspondingly, relative to a stationary point and are always contra-directed, i.e. providing the zero cumulative impact, at the first glance, the destructive interference is observed as a seeming energy annihilation when one uses a classic detector of wave energy, reacting on the fluid molecules oscillating impact, i.e. reacting on the oscillation of locally-excess pressure; and in a more detailed analysis, taking note that the principle of superposition, essentially says that any complex motion can be divided into two or more simple ones, the superposition of two fields of the two anti-phase oscillating velocities associated with the two anti-phase acoustic waves, correspondingly, results in a complex field of the oscillating velocities, wherein the complex field of the oscillating velocities hides the two basic fields of the anti-phase oscillating velocities;

seeing that the two anti-phase waves are disturbing the fluid portions by oscillations in anti-unison thereby superposing the fields of velocities and thereby causing the specifically-asymmetrical redistribution of molecules motions degrees of freedom:

(a) the disturbed fluid portion becomes composed of molecules moving randomly in all the directions with the Brownian distribution of velocities and, in addition, oscillating in the prevalent direction, collinear to the common direction of the two anti-phase waves propagations; wherein the velocities of molecules oscillations are vectored in the opposite directions simultaneously within each small volume having the linear size along the prevalent direction being much lesser than a quarter of the wavelength;

(b) the specific asymmetry of such a distribution of velocities with respect to the directions is characterized by hidden relative velocities in the direction of the two anti-phase acoustic waves propagation, wherein the hidden maximal relative velocity of anti-unison oscillating molecules, equals $u^-=u_1+u_2$, according to Galilean relativity;

(c) the hidden relative velocity increase interrelates with the corresponding varying partial drag-static-pressure $P_{drag}$ and defines the acquired latent energy of the superposed acoustic waves where the latent kinetic energy is periodically transforming into the corresponding latent potential energy stored in the hidden stagnations; wherein the hidden relative velocity increase up to $u_-=u_1+u_2$ is higher than a hypothetic increase of velocity up to $\sqrt{u_1^2+u_2^2}$, which would be reached if considered as limited by the cumulative energies brought by the two anti-phase waves only; wherein actually, the hidden relative velocity increase up to $u^-=u_1+u_2$ occurs at the expense of the molecular fluid internal heat energy, and the corresponding established mean squared velocity of the Brownian motion of the molecules equals $u_{B-}$, wherein the condition $u_{B-}<u_{B1}$ must be satisfied in the case;

(d) it is expected that a temperature detector, reacting on the local thermal radiation in a prevalent direction, perpendicular to the common direction of the two anti-phase waves propagations, can be used for the detection of the hidden relatively increased velocity oscillation;

(e) it is expected that because the velocities of molecules oscillations being vectored in the opposite directions, the molecules motions suffer added impedance, thus, (e.1) while ignoring the added so-called wave-impedance, the latent cumulative wave energy $U_-$ per wavelength, brought by the two superposed substantially collinear and anti-phase acoustic waves, is equal to $U_-=0.5\rho_- u_-^2$, where $\rho_-$ is the density of a small sub-portion of the molecular fluid, wherein the small sub-portion having the linear size along the prevalent direction being much lesser than a quarter of the wavelength and comprising the contra-directed oscillating motions with the hidden relative maximal velocity $u_-$, i.e. $U_-=0.5\rho_-(u_1+u_2)^2$. For simplicity, $\rho_-\approx\rho_1\approx\rho_2$. In the case when $u_1=u_2$, the latent cumulative wave energy $U_-$ per wavelength, brought by the two superposed substantially collinear and anti-phase acoustic waves, is equal fourfold wave energy $U_1$ per wavelength, brought by a single wave, i.e. $U_-=4U_1$; and thereby, the latent cumulative wave energy of superposed anti-phase acoustic waves is equal to the cumulative usable wave energy of superposed in-phase acoustic waves, i.e. $U_-=U_+=4U_1$ and hence, in the both cases, the established mean squared velocities of the Brownian motion of the molecules are equal, i.e. $u_{B-}=u_{B+}$, in the accordance with The Energy Conservation Law; and (e.2) when taking into account the added wave-impedance, that provides for a higher adequateness of the destructive interference modeling, the increased wave-impedance, in turn, causes a partial reflection of the pairs of inter-superposed originally anti-phased waves in the back direction.

For the purposes of the present invention, the term "latent wave energy" should be understood as a form of energy that:

is undetectable by a classic detector of acoustic waves, reacting on the fluid molecules oscillating impact, i.e. reacting on the oscillation of locally-excessing dynamic pressure; and is detectable by a thermal detector, reacting on the local thermal radiation, wherein, in the case of the acoustic wave in fluid (as a dominantly longitudinal wave), the thermal radiation is dominant in a prevalent direction, perpendicular to the common direction of the two anti-phase waves propagations.

In Relation to the Constructive-Destructive Interference as Standing Wave

When a portion of fluid is disturbed by two collinearly meeting acoustic waves, both characterized by the same wavelength, and the same amplitude, wherein the oscillating velocities of molecules for each acoustic wave are between $\pm u_1$ relative to a stationary point and are locally contra-directed, providing for a completely hidden oscillating motion with the inter-opposite velocities, and locally co-directed, providing for the resulting oscillating motion wherein the oscillating velocities of molecules for the resulting acoustic wave are between $\pm 2u_1$, correspondingly, the constructive-destructive interference is observed as a standing wave comprising an alternation of a seemingly energy annihilation at points, which are frequently called nodes, and a seemingly energy maximal excess at points, which are frequently called anti-nodes.

The inventor points out that, in view of the foregoing description of the constructive and destructive interferences of two substantially collinear acoustic waves, the cumulative wave energy of the two meeting waves is fourfold higher than the wave energy of a single wave, wherein the wave energy is observed as usable in the anti-nodes and becomes latent in the nodes, and wherein the acquired wave energy excess is extracted from the fluid internal heat energy due to the enhanced waving jet-effect and so, is accompanied by the reduced established mean squared velocity of the Brownian motion of the molecules.

In Relation to the Orthogonal Interference

When a portion of fluid is disturbed by two orthogonally meeting acoustic waves, wherein the oscillating velocities of molecules for each acoustic wave are between $\pm u_1$ and $\pm u_2$, correspondingly, relative to a stationary point and always are vectored inter-orthogonally, i.e. providing a specific superposition of velocities oscillation, and so for the orthogonal interference, observed as a complex acoustic wave composed of oscillating molecules having elliptic trajectory with the oscillating velocity of $\sqrt{u_1^2+u_2^2}$, the cumulative wave energy, indicated by $U_0$, which is brought by the complex acoustic wave, is specified as $U_0=0.5\rho_0(u_1^2+u_2^2)$, where $\rho_0$ is the density of a small sub-portion of the molecular fluid (for simplicity, $P_0\approx\rho_1\approx\rho_2$), wherein the small sub-portion having the linear size being much lesser than a quarter of the wavelength and comprising the orthogonally-directed oscillating motions with the relative velocity $\sqrt{u_1^2+u_2^2}$;

in the case when $u_1=u_2$, the cumulative wave energy $U_0$ per wavelength, brought by the two superposed orthogonally directed acoustic waves, is equal double wave energy $U_1$ per wavelength, brought by a single wave, i.e. $U_0=2U_1$.

The inventor points out that the complex acoustic wave is propagating in two orthogonal directions and is characterized by two commensurate oscillations: longitudinal and transversal.

In relation to constructive and destructive interferences, the inventor emphasizes that, in the case of two identical, substantially collinear acoustic waves propagating in a molecular fluid, the constructive interference as well as destructive interference, each resulting in a complex wave bringing the wave energy being fourfold higher than the wave energy of alone acoustic wave, wherein the energetic excess is acquired at the expense of the internal heat energy of the molecular fluid due to the enhanced waving jet-effect, and wherein the latent wave energy of the resulting destructive interference is hidden when one uses a detector, reacting on the fluid molecules oscillating impact, i.e. reacting on the oscillation of locally-excessing pressure.

The inventor further points out that the constructive interference composed of N collinear in-phase acoustic waves, each bringing wave energy $U_1$, performs the resulting acoustic wave bringing the cumulative usable wave energy $U_N$, equal to $U_N=N^2U_1$ (of cause, while the condition $u_+ < u_{B+} \times M_*$ is satisfied), wherein the energetic excess of $\Delta U_N = N(N-1)U_1$ is acquired at the expense of the internal heat energy of the molecular fluid due to the enhanced waving jet-effect.

The inventor points out that, according to the reciprocity theorem, if a parent acoustic wave, bringing the usable wave energy $U_N$ per wavelength, is subjected to a splitting thereby forming N coherent daughter acoustic waves, each daughter acoustic wave brings the usable wave energy $U_1$ per wavelength that is lower than the parent usable wave energy $U_N$ per wavelength by the factor $N^2$, wherein the lack of the wave energy, equal to $\Delta U_N = N(N-1)U_1$, becomes dissipated in the molecular fluid.

Modelling an acoustic wave propagating in a molecular fluid, wherein the acoustic wave is interpreted as composed of complex motions, including the Brownian motion and the oscillating motion of molecules, and wherein the two kinds of the motion storing the two kinds of energy: internal heat and wave energy, correspondingly, which are inter-transferring due to the waving jet-effect, is one of the primary teachings of the present invention.

Hypothetic Electromagnetic Analogue

In relation to electromagnetic waves, according to Maxwell's equations, the electromagnetic wave energy is defined by the intensity of the oscillating electromagnetic field where the electrical and magnetic fields are oscillating in orthogonal planes and with the 90° phase shift thereby providing constant electromagnetic wave energy along the electromagnetic wave propagation path.

The inventor points out that the mentioned teaching related to acoustic waves, saying that the energy inter-transferring between the acoustic wave and the molecular fluid, is hypothetically applicable to the electromagnetic waves to solve the seemingly confusing paradoxes of the constructive and destructive interference of the electromagnetic waves by assuming that the electromagnetic wave interacts adiabatically with the medium as a part of the universe, which is inherently "filled" by the universe background matter and universe background energy (in particular, comprising the latent energy of "electromagnetic gas"), analogously as the acoustic wave interacts with the molecular fluid.

Seeing the similarity of behaviors:
on the one hand, of propagation and interference of acoustic waves, and,
on the other hand, of propagation and interference of electromagnetic waves, for the purposes of the present invention, the terms "waving jet-effect" and "radiation jet-effect", introduced hereinabove in subparagraph "Waves in Fluid", further should be understood in a broad sense applicable also to the electromagnetic waves. Namely, in relation to the electromagnetic waves:
the term "waving jet-effect" or "electromagnetic waving jet-effect" should be understood as a kind of the electromagnetic jet-effect specified as a tendency of an electric field to be attracted to and aligned with a nearby surface interacting with the electric field, wherein the mentioned nearby surface is either a real conductive wall and/or an imaginary wall formed by force-lines of the electric field itself (i.e. it includes the interaction between nearby portions of an oscillating electric field); and
the term "radiation jet-effect" should be understood as a well-known phenomenon of electromagnetic radiation pressure, defined in Maxwell's theory by the Poynting vector and observed as "pushing" a conductive obstacle exposed to the propagating electromagnetic wave, as described hereinabove in subparagraph "Radiation Pressure", wherein the waving jet-effect and the radiation jet-effect, both occur in an adiabatic process accompanied by the energy inter-conversion between the electromagnetic wave and the universe background energy.

For the purposes of the present invention, the term "latent electromagnetic wave energy" or "latent electromagnetic radiation energy" should be understood as a form of the electromagnetic energy that:
is undetectable by a classic detector of electromagnetic radiation, reacting on the electric field oscillation, i.e. reacting on the oscillation of locally-excessing electric and/or magnetic field, and;
is detectable by a thermal detector, reacting on the local thermal radiation, i.e. reacting on the latent electromagnetic radiation which, when penetrating into a dense molecular body, becomes perceptual as warmth.

The inventor notes that, while the thermal radiation is a measure of the energetic aspect of the latent electromagnetic wave, it is self-suggested the conjecture that the perception as the aroma is specified by the spectral aspect of the latent radiation.

In view of the foregoing understanding of the theoretical aspect of the molecular fluid motion, as headway as well as oscillating, hereinafter, several exemplary embodiments, constructed in accordance with the principles of the present invention and drown quintessentially-schematically, are given for illustrative purposes only and are not meant to be limiting, wherein the logic of applications using acoustic waves is applicable to applications using electromagnetic waves.

Jet-Effect Embodiments

Fluid-Repellent Structured Surface

For the purposes of the present patent application, the term "corpus", specified as a space-portion, bordered by a closed solid shell contacting with ambient fluid, should be understood as a configurational aspect of a body submerged in the fluid.

For the purposes of the present patent application, the introduced term "fluid-repellent" should be understood in a wide sense as a property of a material to repel the fluid. In particular, a fluid-repellent material is either:
hydrophobic, i.e. water-repellent; or
oleophobic, i.e. oil-repellent; or
so-called "omniphobic", i.e. repelling all known liquids such as water-based, oil-based, and alcohol-based [in particular, a hotter surface is omniphobic]; or
ion-repellent, i.e. having a charged surface repulsing an ionized gas or liquid.

The inventor points out that the term "fluid-repellent" assumes a diversity of mechanisms providing the phenomenon of hydrophobicity, for examples:
the liquid water is diamagnetic, and so a magnet, for instance, a permanent magnet, is interpreted as hydrophobic;
the phenomenon of the Archimedes extrusive force pushing up a body floating on the surface of liquid water is interpreted as a kind of hydrophobicity having gravitational nature; and
a body rotating around an own axis of rotation, for instance, a cylinder rotating around its axis of symmetry, results in centrifugal forces at its rotating surface, and so the rotating surface is interpreted as omniphobic.

In view of the foregoing description with reference to FIG. 5b, it will be evident to a person skilled in the art that the partial skin-friction static-pressure $P_{skin}$ and, hence, the partial viscous-static-pressure $P_{viscous}$ can be controlled by choosing the body walls' material and constructing the walls porosity, sponginess, and structure providing a reduced difference ($a_w$–a–δa). For example, a bird's body is covered by fibrous feathers and fuzz. The fibrous feathers and fuzz, making an outer surface layer constructed substantially from the air, provide that, on the one hand, the fibrous structure improves an airflow streamlining and, on the other hand, the outer surface layer has the effective parameter $a_w$ close to the van der Waals parameter a of air (normally, the air is associated with the condition for ideal gas a+δa=0). The minimized difference ($a_w$–a–δa) minimizes the viscosity effect of an imaginary boundary layer, and therefore, an improved aerodynamic property of the bird's body is expected. Furthermore, the feathers and fuzz are hydrophobic, thereby preventing the porosity from filling by water condensed from the natural humid air. Thereby, to weaken an undesired skin-friction effect, one can use a natural or artificial hydrophobic material, having a fibrous and porous structure comprising many small concavities similar to feathers and fuzz or sponge, covering a surface, contacting with humid airflow. Another example is that the greased feathers of a duck are water-repellent, i.e. hydrophobic, providing a free-slip condition for swimming.

Figure 5C:
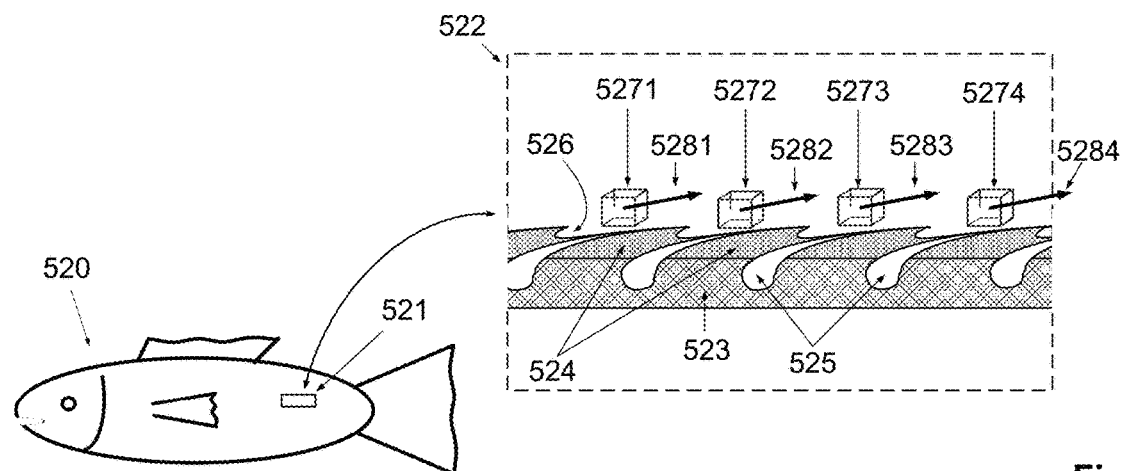
FIG. 5c is a schematic illustration of a fish's squama surface fragment hypothetical interpretation, in accordance with the principles of the present invention.

FIG. 5c is a schematic illustration of yet another example of a constructive solution, hypothetically interpreted in accordance with the principles of the present invention, providing compensation of skin-friction resistance. A squama surface fragment 521 of fish 520 is shown also as an enlarged sectional view 522. Fish 520's skin 523 secretes hydrophobic mucus 524 retained by fish-scales 525, having a sectional profile of curved cogs. First, hydrophobic mucus 524 covers the surfaces of fish-scales 525, forming a hydrophobic outer layer as an inherent attribute of the fish body 520's hydrodynamic-surface, wherein the condition ($a_w$–a–δa)<0 provides for a free-slip motion. Moreover, protruding fish-scales 525 are configured and arranged such that hydrophobic mucus 524 repels a surrounding water portions 5271, 5272, 5273, and 5274 with repulsive forces 5281, 5282, 5283, and 5284, correspondingly, wherein repulsive forces 5281, 5282, 5283, and 5284 act cumulatively in unison along an airfoil orientation providing for a "negative drag". This cumulative action, dominantly, in the backward downstream direction provides a repulsing tendency as a kind of jet-effect.

For the purposes of the present patent application, the terms "phobic-repulsing jet-effect", "fluid-repellent jet-effect", and, in particular, the term "hydrophobic jet-effect" should be understood as the described kind of jet-effect. A parabolic profile of mucus 524's surface fragment 526 provides for an enhanced hydrophobic jet-effect. Thus, both the hydrophobic outer layer and the scaly structure provide the improved hydrodynamic property of fish 520's body.

Figure 5D:
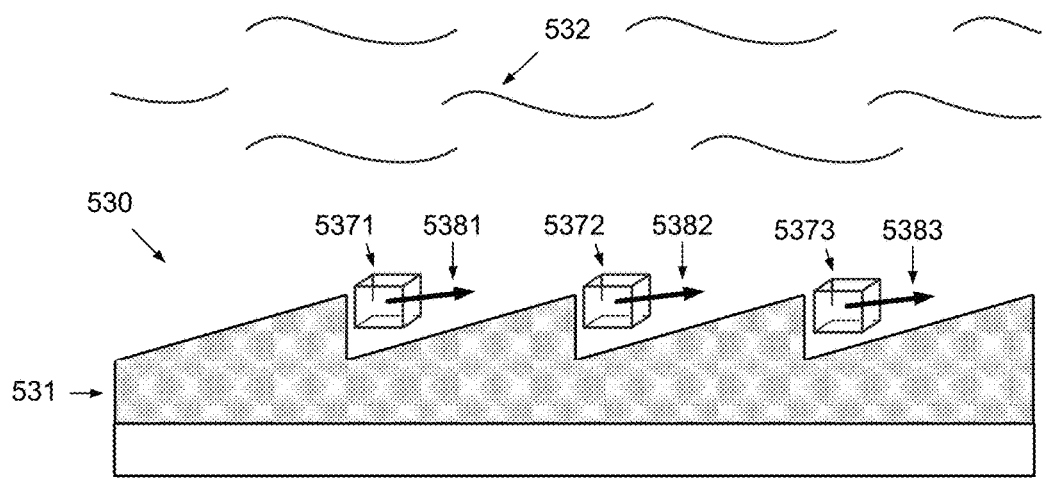
FIG. 5d is an illustration of a shaped body made from a hydrophobic material and submerged in water.

Reference is now made to FIG. 5d, showing schematically a sectional view of a shaped wall 530, without loss of generality, oriented horizontally. Shaped wall 530 comprises a relief-structured outer layer 531, contacting with ambient water 532. Layer 531, made from a hydrophobic material, has a form of a bar with a series of teeth-like sharp and asymmetrical protrusions, thereby constituting a saw-like relief.

In view of the foregoing description with reference to FIG. 5c, it will be evident to a person skilled in the art that relief-structured outer layer 531 repels adjacent portions 5371, 5372, and 5373 of surrounding water 532 with forces 5381, 5382, and 5383 correspondingly, wherein forces 5381, 5382, and 5383 are directed dominantly horizontally. This provides a hydrophobic jet-effect that can be useful for motion in the water surrounding. In the case, wherein wall 530 is stationary, the motion of nearby portions 5371, 5372, and 5373 in the prevalent direction [in the case, dominantly horizontal], arises at the expense of the repulsing interactions between the hydrophobic material and the adjacent water portions. This means that, in the final analysis, the water portions motion in the prevalent direction occurs at the expense of the internal heat energy [warmth] of the nearby water portions.

In practice, a shape of relief-structured outer layer 531, contacting with surrounding water and having an asymmetrically saw-like configured relief, can be used for transportation of water portions 5371, 5372, and 5373 along the asymmetrically saw-like configured relief, for example, the water transportation along relief-structured inner walls within a capillary tube, where originating a useful hydrophobic jet-effect in addition to so-called "capillarity effect".

Figure 5E:
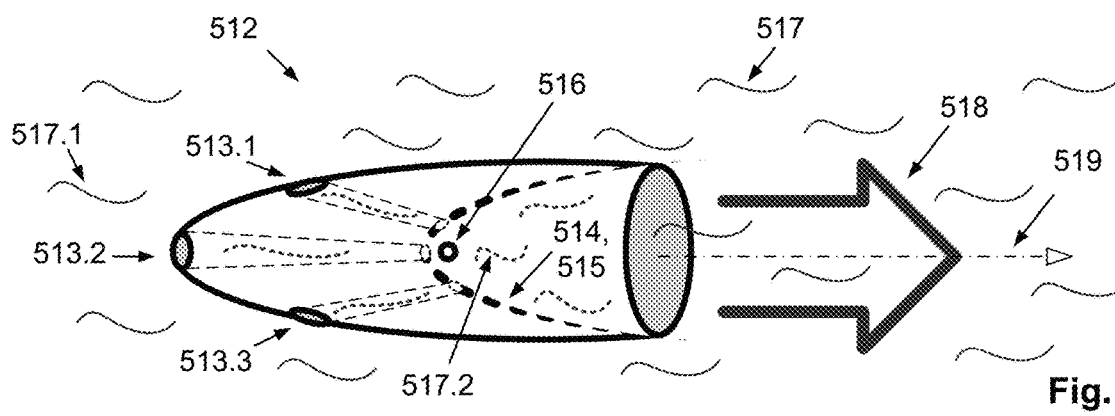
FIG. 5e is a schematic illustration of a convex-concave corpus.

FIG. 5e is a schematic illustration of a transparent-like body having convex-concave corpus 512. Convex-concave corpus 512 has a rounded airfoil outer convex side, and concave side 514, both contacting with ambient fluid 517. A multiplicity of holes [three shown] 513.1, 513.2, and 513.3 links together both: outside portions 517.1 of the ambient fluid 517 and the ambient fluid 517's portions 517.2 contacting with concave side 514. The concavity of side 514 has a parabolic profile with focal point 516. Focal point 516 comprises a heating element [not shown here], powered at the expense of either burned fuel or electricity. Thereby, hotter focal point 516 becomes omniphobic, repelling nearby ambient fluid portions 517.2 by omniphobic-repulsive van der Waals forces. The ambient fluid molecules, subjected to the omniphobic-repulsive van der Waals forces action, acquire a prevalent component of motion directed radially from the heating element at focal point 516 toward concave parabolic side 514. When concave parabolic side 514 reflects the prevalent radial component of the molecular motion, the molecular prevalent motion component becomes collimated collinearly with sagittal axis 519, thereby forming outflowing jetstream 518. The headway motion of outflowing jetstream 518 provides for a jet-thrust. Furthermore, preferably, concave side 514 has outer layer 515 contacting with ambient fluid 517.2. The layer 515 is either heated and/or implemented from a fluid-repellent material. The parabolic profile 514 of fluid-repellent outer layer 515, further acting on the fluid molecules by phobic-repulsive van der Waals forces, partially converts the Brownian random component of the fluid molecular motion into a motion of the molecules in a prevalent direction toward sagittal axis 519, thereby, focusing [i.e. converging] and more accelerating outflowing jetstream 518, in addition to the aforementioned motion collimation.

In particular, it will be evident to a person skilled in the art that the body having convex-concave corpus 512, supplied with a heating element arranged at focal point 516, when submerged in water 517, operates as a motionless hydrophobic-engine or hydrophobic jet-gear or heating-jet engine (having a heating compressor), providing a jet-thrust, wherein one can control the jet-thrust by the heating intensity. A net-efficiency of such a hydrophobic-engine, having a configured convex-concave corpus 512, is defined by the ratio of power consumed by the heating element to the useful kinetic power of outflowing jetstream 518 headway motion. The net-efficiency may come close to 100% if a dominant headway motion of outflowing jetstream 518 is obtained by convex-concave corpus 512 shape optimization. Moreover, water portions 517.2, yet to be accumulated into outflowing jetstream 518, are also subjected to a hydrophobic jet-effect, originated by parabolic fluid-repellent layer 515, resulting in an increase of the outflowing jetstream 518 headway motion kinetic power at the expense of the water warms and thereby, in principle, allowing for the net-efficiency to become even higher than 100%. Furthermore, outflowing jetstream 518 can be further subjected to convergence by a convergent funnel [not shown here], and thereby, become further accelerated and cooled. Thus, again, the net efficiency can exceed 100% at the expense of the water warmth.

Figure 5F:
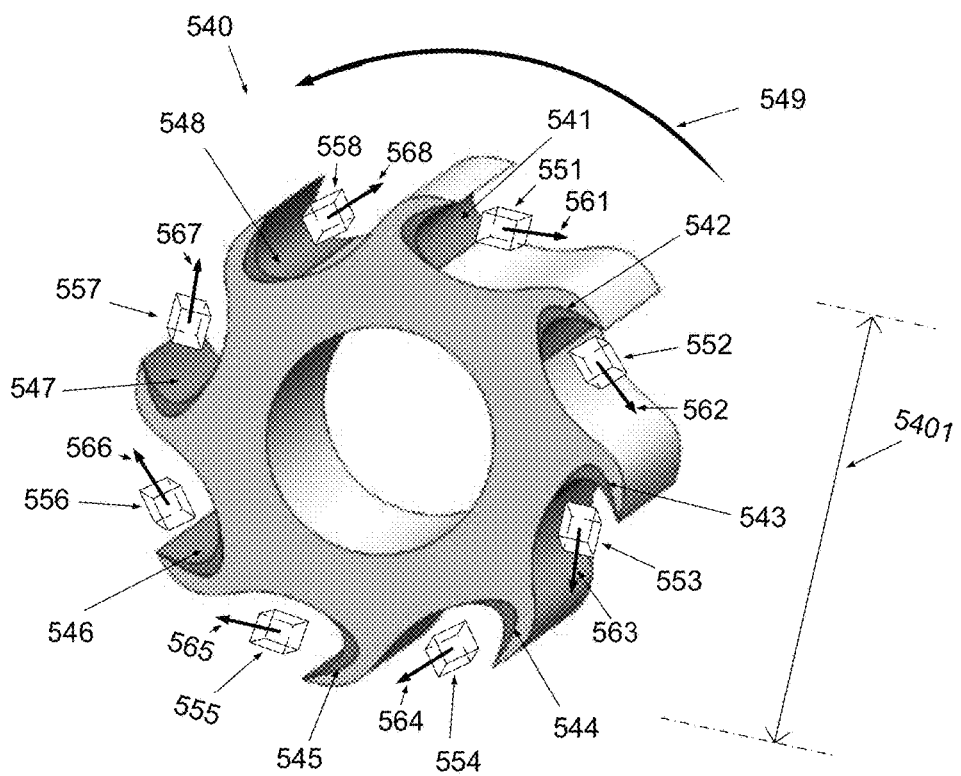
FIG. 5f is a schematic illustration of a wheel-gear-like configured overall shape, having a sectional profile similar to a circle-saw, comprising fragments made from a hydrophobic material.

FIG. 5*f* is a schematic isometry of a body 540 having a wheel-gear-like configured corpus with overall shape, having a sectional profile similar to a circle-saw, constructed in accordance with an exemplary embodiment of the present invention. Body 540 is submerged in a fluid. The configured corpus of body 540 comprises asymmetrical teeth or teeth-like fins having concave sides, which have outer layers 541, 542, 543, 544, 545, 546, 547 and 548, made from a fluid-repellent material. For simplicity, the fluid is water, and the material is hydrophobic. The hydrophobic sides 541, 542, 543, 544, 545, 546, 547 and 548 of teeth repel the water portions 551, 552, 553, 554, 555, 556, 557 and 558 with phobic-repulsive van der Waals forces 561, 562, 563, 564, 565, 566, 567 and 568 correspondingly, wherein phobic-repulsive van der Waals forces 561, 562, 563, 564, 565, 566, 567 and 568 are directed clockwise, along a substantially-airfoil orientation of wheel-gear-like configured corpus 540. If a hydrophobicity of the teeth sides' material is sufficiently strong, a phobic-repulsing jet-effect, caused by phobic-repulsive van der Waals forces repelling the fluid portions, is observed. The phobic-repulsing jet-effect provides a self-rotation of body 540 in the water surrounding in the inverse-clockwise direction 549 at the expense of the ambient water warmth. Thus, configured corpus 540 provides a hydrophobic jet-effect, accompanied by cooling of the ambient water. Moreover, if the effective diameter 5401 of wheel-gear-like configured corpus 540 is big sufficient, the momentum of the rotating forces becomes perceptible, according to the Archimedes' theory of lever.

For the purposes of the present patent application, the term "fluid-repellent jet-gear", having a widened sense, is introduced as relating to a body submerged in a fluid, wherein the body corpus has an asymmetrically configured relief having an airfoil orientation and a layer contacting with the ambient fluid, wherein the layer is either made from a fluid-repellent material and/or comprising a heating element making the layer omniphobic, and wherein the configured relief of the "fluid-repellent jet-gear" corpus comprises asymmetrical protrusions, for example, teeth-like fins, or humps, or screwed blades, or convex-concave elements. The asymmetrical corpus is oriented such that the protrusions' fluid-repellent sides repel the fluid portions in a prevalent direction along the corpus airfoil orientation. In a particular case, the fluid is water, the fluid-repellent material is hydrophobic, and the term "hydrophobic jet-gear" or "hydrophobic-engine" is used.

In view of the foregoing description with reference to FIGS. 5*c*, 5*d*, 5*e*, and 5*f*, it will be evident to a person skilled in the art that the described specifically constructed outer layer of a fluid-repellent jet-gear corpus, contacting with the ambient fluid, is characterized by the following principal features: the outer layer comprises at least one fragment, being fluid-repellent, and that the fluid-repellent fragment's shape is asymmetrical relative to the direction of fluid motion, such that the fluid-repellent fragment repels the fluid portions in a prevalent direction along an airfoil orientation of the corpus. In the case wherein the prevalent direction is dominantly the same as the direction of the fluid motion, such a constructive solution compensates a skin-friction resistance. As well, it will be evident to a person skilled in the art that the described phobic-repulsing jet-effect is more powerful, if either the repulsive forces of the fluid-repellent material are stronger, and/or the fluid-repellent fragments of the fluid-repellent jet-gear's outer layer occupy a bigger area contacting with the ambient fluid, and/or the fluid-repellent fragment shapes are optimized to enhance the prevalent directivity of the phobic repelling. Thereby, constructive solutions, providing developed surface of fluid-repellent fragments resulting in an increased phobic-repulsing jet-effect, can provide that the increased phobic-repulsing jet-effect becomes stronger than a skin-friction resistance effect and, thereby, enables the fluid-repellent jet-gear motion at the expense of the nearby surrounding fluid matter warmth only, i.e. in an adiabatic process, the fluid portions, adjacent to the fluid-repellent jet-gear, become colder than the fluid portions, yet to be subjected to the phobic-repulsing jet-effect.

In view of the foregoing description with reference to FIG. 5*f*, it will be evident to a person skilled in the art that:

a so-called Peltier-element can be adapted to operate as a thermoelectric generator producing electricity at the expense of the temperature difference between water portions subjected and not-subjected to the described hydrophobic jet-effect; and if the ambient fluid is plasma, i.e. an ionized gas or liquid, then an electrically charged surface, repulsing ions of the ionized fluid by electrostatic forces, functions as a fluid-repellent material. In another example, a surface, being hotter than ambient fluid, functions as a fluid-repellent material.

Figure 5G:
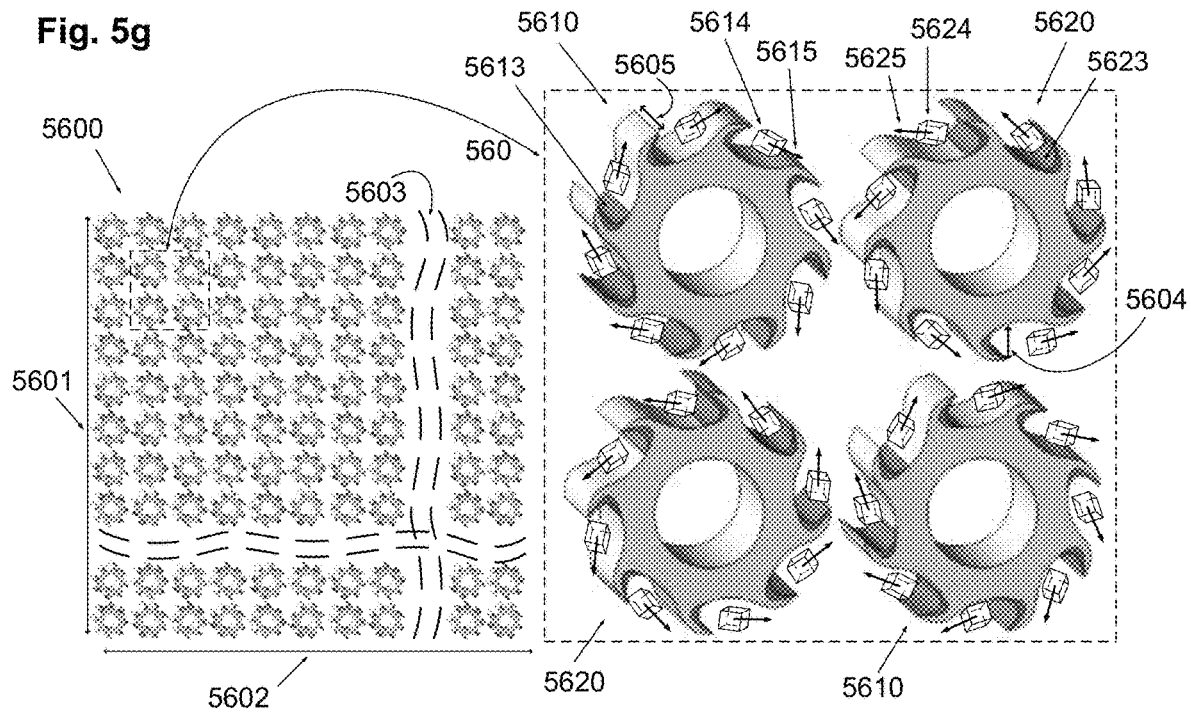
FIG. 5g is an illustration of an exemplary aggregation comprising a set of many hydrophobic jet-gears.

FIG. 5*g* is a schematic top view of an exemplary aggregation 5600 comprising a set of many hydrophobic jet-gears submerged in water. The hydrophobic jet-gears, similar to body 540, described hereinbefore with reference to FIG. 5*f*, arranged in-lines and in-columns, without loss of generality, in a horizontal plane. In a more general case, also, aggregation 5600 comprises several such horizontal layers, one above the other, that are not shown here. Aggregation 5600, occupying length 5601 and width 5602, for simplicity, each equal to L, and height, equal to H and comprising several horizontal layers. Dashed curves 5603 symbolize that a number of the lines and columns is substantially greater than shown. A fragment of aggregation 5600 is shown also as an enlarged view 560, where neighbor opposite hydrophobic jet-gears 5610 and 5620 differ in directivity of corpuses' overall airfoil orientation and, in particular, in directivity of asymmetrical teeth having hydrophobic outer layers 5613 and 5623 correspondingly. Hydrophobic jet-gears 5610 repel water portions 5614 with forces 5615, directed clockwise, and hydrophobic jet-gears 5620 repel water portions 5624 with forces 5625, directed inverse-clockwise. Thereby, the neighbor opposite hydrophobic jet-gears 5610 and 5620 repel adjacent portions of surrounding water in unison. Aggregation 5600, comprising the multiplicity of relatively small hydrophobic jet-gears 5610 and 5620, provides an increased cumulative area of hydrophobic outer layers 5613 and 5623 contacting with water. Thereby, the hydrophobic jet-gears 5610 and 5620 of aggregation 5600 are subjected to a cumulative phobic-repulsing jet-effect that can be estimated for the exemplary arrangement as the following. An exemplary hydrophobicity of a hydrophobic material is characterized by a hydrophobic pressure of $P_h=0.5$ Pa. Imaging a practically implementable hydrophobic jet-gears 5610 and 5620 having an effective diameter of D=1 cm, and comprising 8 teeth, each of gap 5604 d=1.25 mm, and thickness 5605 equal to h=2 mm, one estimates that the hydrophobic-repulsive force per one hydrophobic jet-gear 5610 or 5620 equals $F_h=P_h \times 8 \times d \times h=0.5 \times 8 \times 1.25 \times 10^{-3} \times 2 \times 10^{-3}=10^{-5}$ N. On the other hand, one defines the fluid resistance force, indicated by $F_{drag}*$, in the frames of continuum mechanics as $F_{drag}*=(6\pi\eta \times r)u_t$, where r is so-called Stokes's radius, $u_t$ is the velocity of a body relative to the considered viscous fluid, and $\eta$ is the dynamic viscosity of fluid. The dynamic viscosity of water at 20° C. is approximately of $\eta=10^{-3}$ Pa×sec. In the case of rotating hydrophobic jet-gears 5610 and 5620, the value r is estimated approximately, as r≈h/2, thus, the fluid resistance force $F_{drag}*$ per one hydrophobic jet-gear 5610 or 5620 is estimated as $F_{drag}* \approx 2 \times 10^{-5}$ $u_t$, wherein the velocity $u_t$ means the effective tangential velocity of rotating teeth 5613 and 5623. The condition $F_h=F_{drag}*$ defines the reachable effective tangential velocity $u_t$ for the case of no-loaded rotation. So, the hydrophobic-repulsive force $F_h=10^{-5}$N can provide a relatively fast no-load rotation of hydrophobic jet-gears 5610 and 5620 corresponding to the effective tangential velocity of teeth 5613 and 5623, equal to $u_t=F_h/(2\times 10^{-5})\approx 0.5$ m/sec.

Consider an electricity generator producing useful electricity from the surrounding water warmth, wherein either a subset, composed of hydrophobic jet-gears 5610, and/or a subset, composed of hydrophobic jet-gears 5620, powers a rotor of the electricity generator. If the rotation of hydrophobic jet-gears 5610 and/or 5620 is loaded by the electricity generator resulting in the loaded rotation corresponding to the effective tangential velocity of teeth 5613 and/or 5623 equal to $u_h=0.1$ m/sec, then the rotation power $W_h$, produced by the hydrophobic-repulsive force $F_h$, is of about $W_h=(F_h-F_{drag}) \times u_h \approx 10^{-6}$ W.

A parallelepiped having the horizontal area L×L of 32×32=1000 m², and the vertical height of H=1000×h=2 m, can comprise about n=$10^{10}$ hydrophobic jet-gears 5610 and 5620 producing the cumulative hydrophobic power of about n×$W_h$=10 kW. Thereby, such an aggregation occupying a volume of 2000 m³ can produce an industrial amount of electricity from permanently refreshed warm water. Furthermore, taking into account that the heat of fusion coefficient for water is 335 kJ/kg, the cumulative hydrophobic power of 10 kW, when reduced from water warmth in favor of electric power, at the same time, allows for crystallization of ice from seawater (i.e. allows for operation as an ice-maker) and thereby enables harvesting of desalinated water, wherein providing an industrial amount of potable water of about 100 kg/hour.

In view of the foregoing description with reference to FIG. 5g, it will be evident to a person skilled in the art that:
  a hydrophobic surface submerged in water operates as a cooler (analogously as the "cold sink" in the aforementioned example with the Beverley Clock described hereinabove in subparagraph "Phenomenon of Hydrophobicity and the Beverley Clock" with the reference to FIG. 1m);
  one could implement an electricity generator comprising an aggregation of fluid-repellent jet-gears and Peltier-elements operating as thermoelectric generators producing electricity at the expense of the temperature differences caused by the phobic-repulsing jet-effect; and
  an electricity generator, turbo-electric or thermoelectric, comprising an aggregation of hydrophobic jet-gears could operate efficiently if the surrounding warm water is permanently either refreshed and/or consuming caloric; as well,
  aggregation 5600 of equidistantly arranged hydrophobic jet-gears, provides for constructive interference of many in-phase superposed acoustic waves.

FIG. 5h is a schematic isometry of a fluid-repellent propeller 570 submerged in the fluid. For simplicity and without loss of generality, describe fluid-repellent propeller 570 submerged in the fluid as hydrophobic-propeller 570 submerged in water surroundings. Hydrophobic-propeller 570 has asymmetrically screwed and oriented airfoil blades 571. For simplicity, consider a case, when asymmetrical airfoil blades 571 forcedly remain stationary. One of the primary features of hydrophobic-propeller 570 is that asymmetrically screwed and oriented airfoil blades 571, constructed in accordance with an exemplary embodiment of the present invention, have at least one side, without loss of generality, frontal side 573, having a layer, made from a strongly-hydrophobic material. As described hereinabove referring to FIGS. 5c, 5d, and 5f, this feature triggers a hydrophobic jet-effect and, thereby, originates a motion of the water sub-portions forming sub-streams 575 having the motion headway component, co-directed with sagittal axis 574, and a whirling component, caused by airfoil blades 571 asymmetries. To reduce distortions and micro-turbulences of sub-streams 575, another side of asymmetrical airfoil blades 571, hidden in FIG. 5h, is made from a weakly-hydrophobic material and/or has a fibrous and porous layer, making the layer as composed of micro-portions of water held in the pores, thereby, minimizing the difference $(a_w-a-\delta a)$ and, hence, reducing the skin-friction resistance. Assuming an exemplary hydrophobicity of the strongly-hydrophobic material, characterized by a hydrophobic pressure of $P_{hp}$=0.5 Pa, and considering an implementable small size of hydrophobic-propeller 570, namely, the effective diameter $D_{hp}$=1 cm, one can estimate approximately that:
  on the one hand, the hydrophobic-repulsive force per one hydrophobic-propeller 570, indicated by $F_{hp}$, equals $F_{hp}=P_{hp} \times 0.25\pi \times D_{hp}^2 = 1.25\pi \times 10^{-5}$ N; and
  on the other hand, the fluid resistance force per one hydrophobic-propeller 570, indicated by $F_{drag}$, is estimated in frames of the classical hydrodynamics as $F_{drag}=(6\pi\eta \times r_{hp})u_{hp}$, where $r_{hp}$ is so-called Stokes's radius, chosen for the case as $r_{hp}=D_{hp}/2$, $u_{hp}$ is the effective local tangential velocity of sub-streams 575 relative to blades 571, and $\eta$ is the dynamic viscosity of fluid. The dynamic viscosity of water at 20° C. is approximately of $\eta=10^{-3}$ Pa×sec.

The condition $F_{hp}=F_{drag}**$ defines the reachable effective velocity $u_{hp}$. So, the hydrophobic-repulsive force $F_{hp}$ can provide a relatively fast motion of sub-streams 575 with the effective local tangential velocity $u_{hp}$, equal to $u_{hp}=F_{hp}/(\delta\pi\eta \times r_{hp})\approx 0.42$ m/sec. One can translate the effective local tangential velocity $u_{hp}$, into the effective velocity $u_{574}$ of sub-streams 575 headway motion along sagittal axis 574. The translation depends on the effective angle $\beta_{hp}$ of asymmetrically screwed and oriented blades 571 slope relative to sagittal axis 574. The interrelation is $U_{574}=u_{hp}\cos(\beta_{hp})$. For instance, $u_{574}\approx 5$ cm/sec for $\beta_{hp}$=83°. The headway motion velocity $u_{574}$ defines the hydrobic headway repelling power per one small hydrophobic-propeller 570 as $W_{hp}=F_{hp}u_{574}$, estimated approximately as $W_{hp} \approx 2 \times 10^{-4}$ W.

In view of the foregoing description with reference to FIG. 5h, it will be evident to a person skilled in the art that:
  the hydrophobic pressure pushes a water portion, which further is subjected to elastic reaction by the ambient water, and so, in addition to the directional jet-thrust, the action generates also a peculiar shock-like acoustic wave propagating in the water medium and being characterized by a peculiar frequency and peculiar wavelength. In particular, an acoustic wave having a chiral circumferential polarization is expected in the case, and hydrophobic-propeller 570 can be interpreted as a source of the peculiar shock-like acoustic wave; and the described logic, applied to hydrophobic-propeller 570 submerged in water and thereby launching water sub-streams 575, is applicable to a propeller, similar to hydrophobic-propeller 570, but having frontal surfaces 573 comprising an outer layer, being electrically charged instead of hydrophobic, and being submerged in an ionized gas, and thereby functioning making sub-streams 575 of the ionized gas.

FIG. 5i is a schematic illustration of a stationary spiral 576 submerged in a fluid. Spiral 576 has helically coiled elaborated airfoil-profiled walls, constructed in accordance with an exemplary embodiment of the present invention. The outer surface 577 of spiral 576, is covered by a fluid-repellent material. Without loss of generality, the fluid is water and the material, covering outer surface 577, is hydrophobic, and so, spiral 576 is hydrophobic as well. Such a configuration, acting on the water surroundings by phobic-repulsive van der Waals forces, creates a helically outflowing water jetstream 578, i.e. having two components of motion, namely: headway along sagittal axis 579 and whirling. The motion occurs at the expense of the internal heat energy of water. The stationary hydrophobic spiral 576 can be interpreted as a hydrophobic-engine lunching jetstream 578.

Exemplary implementation of Constructive Interference

The inventor points out that each ring of spiral 576 acts as a source of a peculiar shock-like acoustic wave, while each pair of the neighbor rings acts as a source of a forced elemental acoustic wave. Furthermore, the sequential in-line arranged pairs of the neighbor rings of spiral 576, acting as an array of sources, generating a multiplicity of the forced elemental acoustic waves, which form a spatial interference with respect to the system of coordinates linked to moving flow 578. Wherein, when, in general, a varying pitch of spiral 576 is especially adapted to the acceleration of water portions, the multiplicity of the forced elemental acoustic waves provides constructive interference where all the forced elemental acoustic waves become superposed in-phase along axis 579. For the sake of clarity, there are N rings in spiral 576 originating N forced elemental acoustic waves, correspondingly. The resulting acoustic wave, formed by the superposition of the N forced in-phase elemental acoustic waves, brings the resulting wave power proportional to the second power of the resulting wave amplitude. Hence, the cumulative usable wave power of the resulting acoustic wave is higher than the sum of powers of the elemental acoustic waves by the factor of $N^2$, wherein the self-acquired portion of the resulting wave power is self-extracted from the internal heat energy of the ambient water due to the multi-stage repeated waving jet-effect as described hereinabove in subparagraph "Interference of Acoustic Waves".

It will be evident to a person skilled in the art that a long screw, similar to stationary hydrophobic spiral 576, can be interpreted as a hydrophobic-oscillator launching acoustic beam 578. As well, the mentioned aggregation 5600 (FIG. 5g) of equidistantly arranged hydrophobic jet-gears, provides for constructive interference of many in-phase superposed acoustic waves.

The inventor points out to the legendary story about Tesla's mechanical oscillator, claimed extra-powerful acoustic wave generation of which becomes believable in view of the foregoing description. In contrast to the resonance scheme by Tesla, the proposed superposition of N in-phase acoustic waves (wherein N is a specified number), to provide for the desired constructive interference bringing usable wave power, is easily controllable.

It will be evident to a person skilled in the art that the long screw supplied with an acoustic wave power detector as a power converter is capable of operating as an electricity generator producing electricity from the water warmth due to the hydrophobic jet-effect and the enhanced waving jet-effect.

In view of the foregoing description with reference to FIGS. 5c, 5d, 5f, 5g, 5h, and 5i, it will be evident to a person skilled in the art that:

hydrophobic-propeller 570 and hydrophobic spiral 576 can be interpreted as kinds of a fluid-repellent jet-gear, where asymmetrically screwed and oriented airfoil blades are used instead of primitive teeth-like fins; and one can implement fluid-repellent jet-gears of various configurations, for example, having an overall shape in a form of either a saw, or a circle-saw, or a spiral staircase, or a propeller, or a screw of Archimedes.

Rational Explanation of Origin of Life

In view of the foregoing description with reference to FIG. 5i, where an asymmetrical spiral, having a form of the Archimedean screw and having a hydrophobic surface, originates a helical motion of fluid, one expects that, contrariwise, if the asymmetrical spiral, having a hydrophobic surface, is decomposed into many separate chiral particles having a hydrophobic side and being submerged in water, where being arranged and oriented randomly, like a suspended matter, then the water, forcedly and certainly helically-flowing around the separate chiral particles, has a predominance to organize the chiral particles into the mentioned asymmetrical spiral in the form of the Archimedean screw, while other particles, geometries of which are not in a conformance with the water motion, remain not organized into a spiral. Thus, in accordance with the principles of the present invention, a mechanism, providing a regularized aggregation of separate left-handed stereoisomers of amino acids into a coiled sequence thereby forming a ribonucleic acid (RNA) molecule, hypothetically, can be specified and implemented artificially. Furthermore, a certain, forced spatial distribution of water flow velocities can provide for that right-handed stereoisomers of amino acids become aggregated in an orderly manner into a nonexistent inversely-screwed right-chiral molecule, which is mirror-symmetrical to a natural RNA.

Reference is now made to FIG. 5j, a schematic illustration of a pair of hydrophobic-propellers: 570 and 580. Hydrophobic-propeller 570 is the same as shown and described hereinabove referring to FIG. 5h. All reference numerals 571, 573, 574, and 575 are the same as described referring to FIG. 5h. Hydrophobic-propeller 580 has stationary airfoil blades 581, asymmetrically screwed and oriented relative to sagittal axis 584. An imaginary compound of blades 571 and sagittal axis 574 is mirror-symmetrical to an imaginary compound of blades 581 and sagittal axis 584. The chiral compounds are arranged sequentially such that sagittal axes 574 and 584 are collinear. Analogous to the case of blades 571, frontal side 583 of blades 581 is covered with a layer, made from a strongly-hydrophobic material; while, to reduce distortions and micro-turbulences of sub-streams 585, another side of asymmetrical airfoil blades 581, hidden in FIG. 5h, is made from a weakly-hydrophobic material and/or has a fibrous and porous layer, making the layer, contacting with ambient water, as composed of micro-portions of water held in the pores, thereby, minimizing the difference ($a_w$–a–δa) and, hence, reducing the skin-friction resistance. Airfoil blades 581, triggering the hydrophobic jet-effect, accelerate the water sub-portions forming sub-streams 585 having the motion headway component, co-directed with sagittal axis 584, and a whirling component. As asymmetrical blades 571 and 581 are mirror-symmetrical, the whirls of sub-portions 575 and 585 are in mutually-opposite directions; and as sub-streams 585 are the downstream-continuations of sub-streams 575, the whirls of sub-streams 575 and 585 become mutually-suppressed. Thus, the chiral compounds, being mutually complemental and pushing water forward, create resulting jetstream 588, having dominant headway motion originated by the blades frontal sides hydrophobicity and at the expense of the water warmth. The pair of chiral hydrophobic-propellers 570 and 580 can be considered as a whole and be interpreted as hydrophobic-device 590 lunching jetstream 588. Wherein the power, indicated by $W_{588}$, of jetstream 588, launched by small hydrophobic-device 590, having the effective diameter D=1 cm, is higher than $2W_{hp}$, because the mutually-suppressed and therefore reduced power of sub-streams 575 and 585 whirls is at least partially transformed into the power of jetstream 588 headway motion.

The inventor points out that the pair of chiral hydrophobic-propellers: 570 and 580 generates a forced elemental acoustic wave with the wavelength equal to the distance between the chiral hydrophobic-propellers: 570 and 580 along sagittal axis 574. It will be evident to a person skilled in the art that a multiplicity of in-line cascaded pairs of chiral hydrophobic-propellers: 570 and 580 causes as an accelerated jetstream as well as interference of the forced elemental acoustic waves, and using an adapted pitch between and within the pairs, a controlled interference: either constructive and/or destructive, becomes applicable.

FIG. 5k is a schematic illustration of a stationary pair of unbroken chiral spirals having shapes of the Archimedean screws, briefly, screws 592 and 593 having helically coiled airfoil-profiled walls, constructed in accordance with an exemplary embodiment of the present invention. Screws 592 and 593 have a common sagittal axis 594 and differ in direction of coiling: clockwise and inverse-clockwise from a frontal point of view. Chiral screws 592 and 593 are submerged in a fluid. The outer surfaces 596 and 597 of chiral screws 592 and 593, correspondingly, are covered by a fluid-repellent material. Without loss of generality, the fluid is water and the material, covering outer surfaces 596 and 597, is hydrophobic. Such a configuration, acting on the water surroundings by phobic-repulsive van der Waals forces, creates an outflowing water jetstream 595 moving dominantly along sagittal axis 594, wherein the whirling component of the motion is suppressed. Again, the motion occurs at the expense of the water warmth. The stationary pair of chiral screws: 592 and 593, can be considered as a whole and be interpreted as a hydrophobic-device 591 lunching jetstream 595.

In view of the foregoing description with reference to FIGS. 5h, 5i, 5j, and 5k, it will be evident to a person skilled in the art that hydrophobic-device 590 and/or 591 can be supplied with a Peltier element, capable of operating as a thermoelectric generator producing electricity from the temperature difference caused by the hydrophobic jet-effect. As well, if asymmetrical airfoil blades 571 and/or 581 and/or 592 and/or 593 are capable of rotation, then the hydrophobic-repulsive force $F_{hp}$ results in rotations of the asymmetrical airfoil blades, and hydrophobic-propellers 570 and 580, as well as hydrophobic-devices 590 and/or 591 can be applied to electricity generation using a turbine-generator.

In view of the foregoing description with reference to FIGS. 5e, 5h, 5i, 5j, and 5k, it will be evident to a person skilled in the art that hydrophobic-devices 512 and/or 590 and/or 591 can be cascaded sequentially and in-parallel, and a big submarine can be supplied with an aggregated jet-device, composed of many small hydrophobic-devices 512 and/or 590 and/or 591 and thereby providing a substantial cumulative jet-thrust.

The pair of chiral screws: 592 and 593 generates a forced resulting acoustic wave propagating along sagittal axis 594. The forced resulting acoustic wave is composed of elemental acoustic waves originated by each ring of the screws.

The inventor points out that a long screw, either alone as screw 576 shown in FIG. 5i, or combined as the pair of screws: 592 and 593, constructed to provide an in-phase superposition of a big number N of generated elemental acoustic waves, results in the constructive interference forming a combined acoustic wave, bringing the usable wave power that higher than the usable power of one elemental acoustic wave by the factor of $N^2$.

Aerodynamic and Hydrodynamic Effects

In view of the foregoing description with reference to FIGS. 4, 5a, 5b, 5c, 5d, 5e, 5h, 5i, 5j, and 5k, it will be evident to a person skilled in the art that, considering flow as moving molecular fluid, when a flow portion is flowing around a body, the flow portion and body become subjected to the following main aerodynamic and hydrodynamic effects, differing in mechanism of originating:

- stagnation of the flow portion impacting the body resulting in drag of the body;
- sticking of the flow portion to the body resulting in skin-friction;
- attracting and thereby redirecting of the flow portion to a smoothly curved body surface, i.e. the Coanda-effect as a kind of jet-effect, resulting in a lift-force acting on the body;
- convective (i.e. jet-effect) self-acceleration, resulting in jet-thrust acting on the body, wherein the jet-thrust is vectored against the flow portion acceleration and hence, against the flow portion headway motion;
- an adiabatic compression and/or extension acting on the body by the static pressure and temperature variations, both changing adiabatically;
- the turbulence of the flow portion, swirling and vibrating the body and ambient surroundings;
- diffusion, interrelated with the osmotic-like partial pressure, resulting in penetrating the flow portion into the ambient molecular fluid and, vice-versa, in entrapping the ambient molecular fluid by the flow portion (this effect is also frequently called the Coanda-effect);
- hydrophobicity of the body, resulting in repelling the flow portion and thereby originating the hydrophobic jet-effect; and
- peculiar and forced oscillation of fluid portions, both being interrelated with the waving jet-effect and resulting in peculiar and forced acoustic waves, correspondingly.

All the effects contribute in the cumulative-inner-static-pressure acting on the boundaries of the flow portion. As the effects differ in mechanism of originating, the proportion of the mentioned effects action intensity may vary, depending on both: geometry of the body and velocity of the flow. In a certain situation, when the body has an airfoil shape, the component of jet-thrust may exceed the drag and skin-friction, thereby providing a positive net jet-thrust against the flow, as it occurs, for example, with a sailboat, when a point of sail belongs to the "close-hauled" group "B", as described hereinabove with reference to FIG. 1i. As well, the generated as peculiar as well as forced acoustic waves, when superposed, constitute interference, the resulting wave power of which is acquired from the fluid warmth due to the waving jet-effect.

Electromagnetic Accompanying

Reference is now made again to FIG. 5i, wherein now, the ambient fluid is a water-based electrolyte.

The inventor points out that, in this case, each ring of spiral 576, acting as a source of a peculiar acoustic wave, generates also as a peculiar electromagnetic wave, as well, each pair of the neighbor rings acts as a source of a forced elemental electromagnetic wave. Furthermore, the sequential in-line arranged pairs of the neighbor rings of spiral 576 acts as an array of sources, generating a multiplicity of the forced elemental electromagnetic waves, which form spatial interference. For the sake of clarity, there are N rings in spiral 576 originating N forced elemental electromagnetic waves, correspondingly. Considering the elemental electromagnetic waves propagating along axis 579 only, when a pitch of spiral 576 is equidistant and thereby providing a certain time-delay interrelated with a phase-shift between the forced elemental electromagnetic waves, the multiplicity of the N forced elemental electromagnetic waves forms a constructive interference along the axis 579, where all the N forced elemental electromagnetic waves become superposed in-phase.

The resulting electromagnetic wave, formed by the superposition of the forced in-phase elemental electromagnetic waves, brings the resulting usable wave power proportional to the second power of the resulting amplitude of the oscillating electric field. Hence, the cumulative usable wave power of the resulting electromagnetic wave is higher than the usable wave power of one elemental electromagnetic wave by the factor of $N^2$ and is higher than the sum of usable wave powers of all the N elemental electromagnetic waves by the factor of N, wherein the self-acquired portion of the resulting electromagnetic wave power is self-extracted from the universe background energy (at least from the electromagnetic gas heat-like energy) stored in the space due to the electromagnetic waving jet-effect as described hereinabove:
in relation to an electric flux, with the reference to prior art FIG. 1f, and
in relation to an electromagnetic wave, in subparagraph "Hypothetic Electromagnetic Analogue".

The inventor points out that a specifically arranged sequence of sources of acoustic waves in an electrolyte that, in the final analysis, is the specifically arranged sequence of sources of elemental electromagnetic waves (for instance, similar to spiral 576 representing a helical antenna launching chiral circularly-polarized radio waves), when supplied with a detector of the resulting electromagnetic wave power as a power converter which is capable of transformation of the electromagnetic wave power into electric power, becomes capable of operating as a generator of electricity, producing the electric power from the universe background energy stored in the space occupied by the electrolyte due to the electromagnetic waving jet-effect.

Constructive-Interference-Generator of Useful-Beneficial Power

For the purpose of the present patent application, the term "useful-beneficial power" should be understood as either a jet-thrust power or electric power, which being useful and beneficial when used in industry.

Figure 5L:
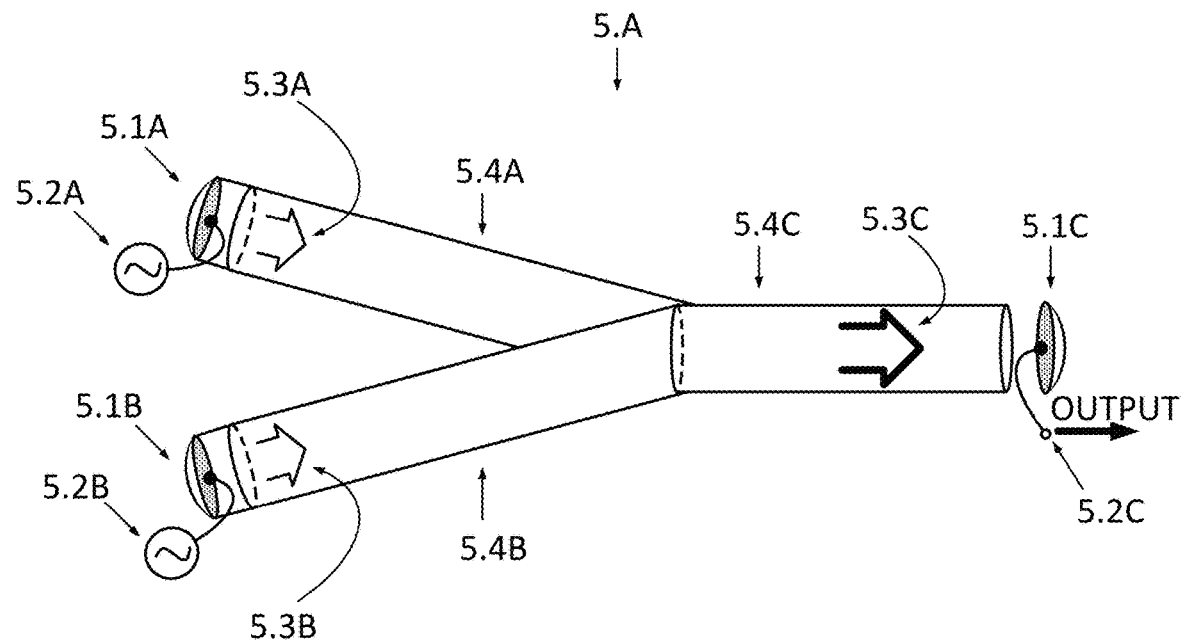
FIG. 5l illustrates an exemplary embodiment of constructive interference of electromagnetic waves.

FIG. 5l is a schematic illustration of a generic portion 5.A of a constructive-interface-generator capable to produce a useful-beneficial power as an exemplary embodiment of constructive interference of two mutually synchronized electromagnetic waves. The generic portion 5.A comprises a two-arm converging waveguide conveying two waves into a common antenna to receive an in-phase superposition of the two waves. Namely, the generic portion 5.A comprises:

Two identical energetically inter-independent feeders: 5.2A and 5.2B, powering two identical transmitting antennas: 5.1A and 5.1B, correspondingly, wherein:
on the one hand, the two identical transmitting antennas: 5.1A and 5.1B, are energetically inter-independent; and
on the other hand, the two identical transmitting antennas: 5.1A and 5.1B, are mutually synchronized to launch electromagnetic waves: 5.3A and 5.3B, each bringing the wave power $W_1$, along identical primary waveguides 54.A and 5.4B, correspondingly, wherein the electromagnetic waves: 5.3A and 5.3B, both, for simplicity, being characterized by the same carrier frequency f and amplitude $A_1$;

A pair of the primary waveguides 5.4A and 5.4B being gradually joint into a single secondary waveguide 5.4C (thereby, forming the two-arm converging waveguide) such that the electromagnetic waves: 5.3A and 5.3B, becoming superposed providing for constructive interference forming the resulting electromagnetic wave 5.3C of amplitude A equal to the sum of two amplitudes $A_1$, i.e. $A=2A_1$; wherein, as the wave power is proportional to the second power of amplitude, the cumulative wave power W of the resulting electromagnetic wave 5.3C, being proportional to $A^2$, is equal to $W=4W_1$; and The receiving antenna 5.1C, receiving the resulting electromagnetic wave 5.3C, being conveyed by the secondary waveguide 5.4C and bringing the cumulative wave power $W=4W_1$; wherein the receiving antenna 5.1C being capable of transformation of the wave power W into the electric power equal to $(4W_1)$ (if, hypothetically, to ignore effects of electric power dissipation into the warmth due to resistivity of conductive materials), released from the feeder output 5.2C.

In view of the foregoing description referring to FIG. 5l, it will be evident to a person skilled in the art that the generic portion 5.A can be further developed to comprise an N-arm converging waveguide, instead of the two-arm converging waveguide, and so one can implement the constructive-interface-generator of useful-beneficial power by:
combining a big number N of the energetically inter-independent feeders to power N transmitting antennas launching N elemental electromagnetic waves, correspondingly, each of which [the N elemental electromagnetic waves] bringing an elemental wave power portion of at least $W_1$;
controlling the mutual synchronization of the N transmitting antennas; and thereby
using a set of waveguides to convey and combine the N mutually synchronized elemental electromagnetic waves, thereby, forming the resulting electromagnetic wave as constructive interference of the N elemental electromagnetic waves, thereby, bringing the cumulative wave power being higher than the elemental power portion $W_1$ by the factor $N^2$, wherein the harvested power portion, equal to $\Delta W_N = N(N-1)W_1$, in the final analysis, being acquired at the expense of the ambient warmth.

Figure 5M:
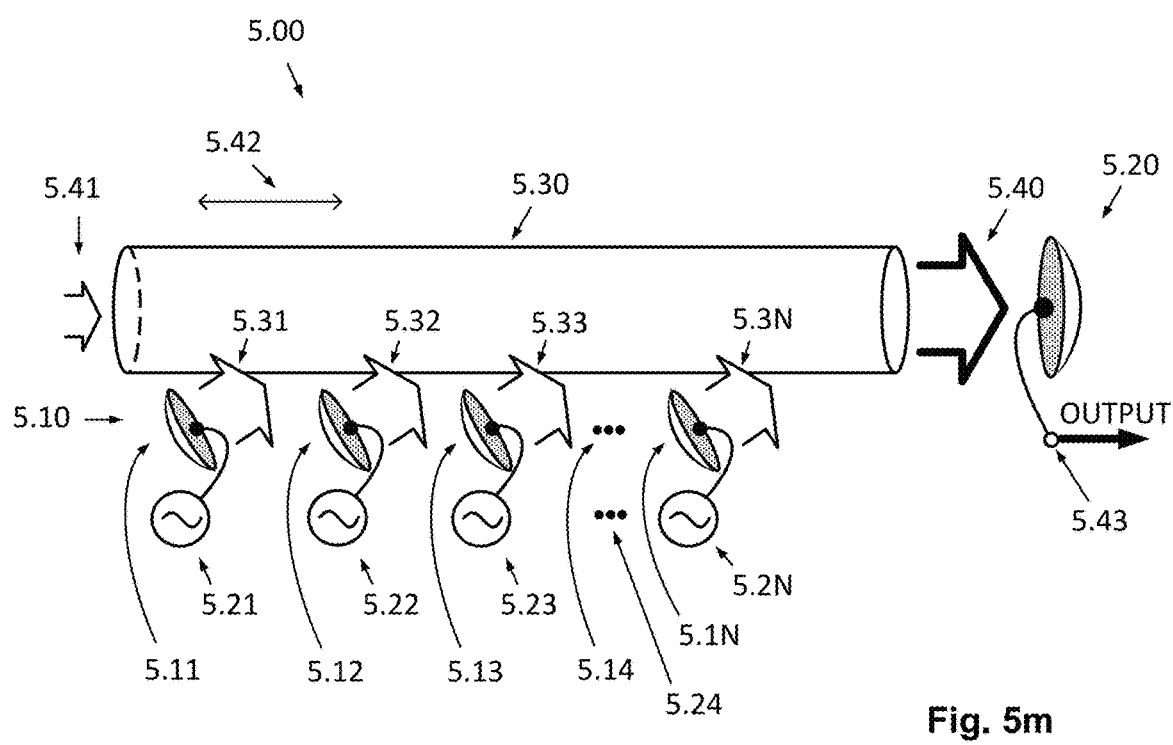
FIG. 5m is a schematic illustration of a generalized generator.

FIG. 5m is a schematic illustration of constructive-interference-generator 5.00 for producing the useful-beneficial power, constructed in accordance with the principles of the present invention. The constructive-interference-generator 5.00, in principle, similar to the constructive-interference-generator 5.A developed to have the N-arm converging waveguide described hereinabove referring to FIG. 5l, but now the embodiment 5.00 comprises an unclad waveguide 5.30 having a transparent shell. Namely, the constructive-interference-generator 5.00 comprises the following components:

A set of N elemental feeders 5.21, 5.22, 5.23, . . . , 5.2N, being energetically inter-independently powered by a starter power; wherein to implement the set one can use either:
- a set of N internal combustion engines, as each of which being powered by burning a separate portion of fuel; and/or
- a set of N wind-turbines, as each of which being powered by a separate portion of the ambient wind; and/or
- a set of N solar radiation collectors (each of which being at least one of a solar thermal collector and a photovoltaic cell), as each of the N solar radiation collectors being powered by a separate portion of the Sun radiation; and/or
- a set of N whatever devices being powered by the starter power energetically inter-independently;

A classic waveguide 5.30 of waves, for instance:
- the waves are electromagnetic waves characterized by the carrier frequency and wavelength, phase, amplitude, polarization, time-delay, and direction of propagation and,
- the classic waveguide 5.30 is an unclad dielectric pipe having a dielectric constant higher than the dielectric constant of ambient matter (for instance, ambient air);
  - it will be evident to a person skilled in the art that the dielectric matter of pipe, being characterized by a relatively big dielectric constant, is inherently characterized by a big so-called refractive index thereby making the unclad dielectric pipe as a good waveguide for electromagnetic waves;

A classic mutually specifically synchronized set 5.10 of N transmitting antennas 5.11, 5.12, 5.13, . . . , 5.1N, launching N elemental electromagnetic wave-power portions, 5.31, 5.32, 5.33, . . . , 5.3N, correspondingly (for simplicity, of the same wave-power $W_1$); wherein:
- the unclad shell of the classic waveguide 5.30 is transparent for the waves 5.31, 5.32, 5.33, . . . , 5.3N; and
- the classic specifically mutually synchronized antennas 5.11, 5.12, 5.13, . . . , 5.1N are arranged and oriented to enter the electromagnetic wave-power portions (simply saying, waves) 5.31, 5.32, 5.33, . . . , 5.3N, into the waveguide 5.30 at a sharp angle to the shell (i.e. almost the right angle of incidence), wherein the arrangement is such that certain intervals 5.42 between the antennas 5.11, 5.12, 5.13, . . . , 5.1N, providing for that, when the waves propagating within the waveguide 5.30, the waves 5.31, 5.32, 5.33, . . . , 5.3N become in-phase superposed thereby resulting in constructive interference; it will be evident to a person skilled in the art that the waves 5.31, 5.32, 5.33, . . . , 5.3N propagate within the waveguide 3.30 along a zig-zag way due to the waveguide effect and that, inside the waveguide 5.30, the inside angle of incidence of the waves on the waveguide 5.30's shell is equal to the angle of inside reflection and each inside reflection is accompanied by the phase-shift of the wave on 90°, and so the distance 5.42 is easily calculated to provide zig-zag pathway differences between the propagating waves 5.31, 5.32, 5.33, . . . , 5.3N equal to integer number of the carrier wavelengths, thereby, to provide the desired in-phase superposition of the waves 5.31, 5.32, 5.33, . . . , 5.3N propagating within the waveguide 5.30; and A classic receiving antenna 5.20, receiving the cumulatively-resulting wave 5.40, characterized by the amplitude greater than the amplitude of the single wave 5.31 by the factor N and characterized by the wave-power $W_N$ equal to $W_N = N^2 (e_1 W_1)$, where $e_1$ is energetic net-efficiency of antenna 5.11 and $(e_1 W_1)$ is the wave power of the single wave 5.31; thus, the classic receiving antenna 5.20 releases the resulting power $(e_2 W_N)$, where $e_2$ is energetic net-efficiency of power releasing from the receiving antenna 5.20 via the feeder output 5.43.

Thereby, it will be evident to a person studied the present patent application that:
- one enables to construct and embody an exemplary constructive-interference-generator, consuming the starter power $W_{N1}$, equal to $W_{N1} = N \times W_1$, with the net-efficiency of the consumption $e_1$ to launch and enter the wave power of $N \times e_1 W_1$ into the waveguide 5.30 and releasing the useful-beneficial power $W_{N2}$ equal to $W_{N2} = e_2 N^2 e_1 W_1$;
- the exemplary constructive-interference-generator has a practical use, for instance, to harvest the acquired power portion equal to $W_{N2} - W_{N1} = N(e_1 e_2 N - 1) W_1$, wherein $W_{N1} = N \times W_1$ is the consumed power, the power of $N \times e_1 W_1$ is the wave power launched by the set of N antennas 5.10, $W_{N2} = e_1 e_2 N^2 \times W_1$ is the power released from the feeder output 5.43, and the big number N provides for a positive difference $W_{N2} - W_{N1}$; and
- in the final analysis, the harvested portion of power is acquired at the expense of the ambient warmth.

Generalized Generator of Useful-Beneficial Power

The foregoing description, expound hereinabove in sub-paragraphs:
- "Exemplary Implementation of Constructive Interference" referring to FIG. 5i, proposing a generator of electricity capable of producing the electric power from the ambient warmth due to the acoustic waving jet-effect;
- "Electromagnetic Accompanying" referring to FIG. 5i, proposing a generator of electricity capable of producing the electric power from the universe background energy due to the electromagnetic waving jet-effect; and
- "Constructive-Interference-Generator of Useful-Beneficial Power" referring to FIGS. 5l and 5m, proposing a constructive-interference-generator of electricity capable of producing the electric power acquired at the expense of the universe background energy due to the electromagnetic waving jet-effect;

is further summarized hereinbelow as a description of a generalized generator for producing a useful-beneficial power, constructed according to the principles of the present invention to harvest the useful-beneficial power from at least one of:
   the ambient warmth, in relation to the mechanic power of a moving molecular fluid and acoustic waves; and
   the universe background energy, in relation to the electromagnetic power of electromagnetic waves.

The term "generalized", accompanying the term "generator" as well as accompanying terms characterizing components of the generalized generator, is used to emphasize that the term "generalized generator" and the terms specifying the mentioned components of the generalized generator have a wide sense assuming a diversity of implementations and triggered jet-effects.

Reference is now made again to FIG. 5m, wherein now, it is a schematic illustration of the generalized generator 5.00 for producing the useful-beneficial power, constructed in accordance with the principles of the present invention.

Figure 6A:
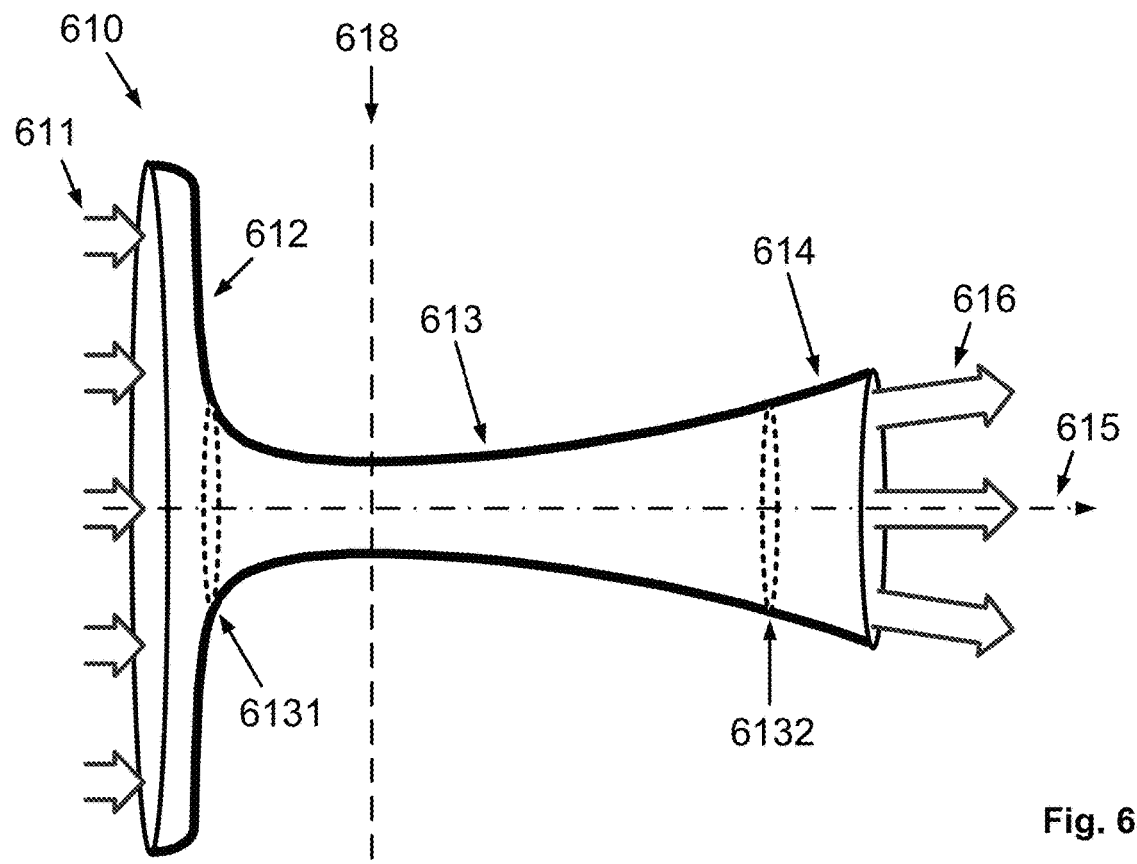
FIG. 6a is a schematic illustration of an optimized convergent-divergent jet-nozzle, constructed according to the principles of the present invention.

For the purposes of the generalization, a set of interrelated terms are defined as follows:

(a) peculiar shock-like wave is defined as a reaction originated by a local acceleration of a fluid portion in a prevalent direction and as a peculiar wave, propagating in the accelerated headway-moving portion of fluid;

(b) an elemental wave is defined as at least one of an acoustic wave and an electromagnetic wave; said elemental wave being at least one of said peculiar shock-like wave and a forced wave;

(c) wave is defined as a complex wave being composed of elemental waves, wherein said wave being characterized by resulting amplitude defined as the vector sum of amplitudes of said elemental waves;

(d) radiation jet-effect is defined as a phenomenon comprising two interrelated manifestations:
   of radiation pressure of wave, wherein the radiation pressure is at least one of acoustic and electromagnetic, and
   of wave energy traveling in a prevalent direction, wherein the wave energy is at least one of acoustic and electromagnetic;

(e) acoustic waving jet-effect is defined as a kind of the Coanda-jet-effect, being applied to inner portions of fluid, as a tendency of an oscillatory moving-small-portion to be attracted to and aligned with a curvature of a nearby fragment of an imaginary boundary of said inner portion;

(f) electromagnetic waving jet-effect is defined as a tendency of a certain spatial portion of an ambient electric field to be attracted to and aligned with a nearby surface interacting with the certain spatial portion of the ambient electric field, wherein said nearby surface is at least one of a real conductive wall and an imaginary wall formed by force-lines of the ambient electric field bordering the certain spatial portion;

(g) waving jet-effect is defined as at least one of the acoustic waving jet-effect and the electromagnetic waving jet-effect;

(h) phobic-repulsing jet-effect is defined as a kind of jet-effect, occurring in a fluid near to a surface made from a fluid-repellent material;

(i) generalized jet-effect is defined as an effect of fluid portion convective acceleration at the expense of fluid portion internal heat energy that is inherently characterized by a decrease in original temperature of said fluid portion in an adiabatic process, wherein the generalized jet-effect is at least one of the Venturi effect, the Coanda-jet-effect, the acoustic waving jet-effect, the electromagnetic waving jet-effect, the radiation jet-effect, and the phobic-repulsing jet-effect;

(j) a usable wave power is defined as a partial wave power of a complex wave being composed of elemental waves, being superposed and thereby resulting in partially constructive interference and partially destructive interference, wherein said partial wave power being proportional to the second power of the resulting amplitude of said wave, and hence being detectable by a classic detector of waves, reacting on the resulting amplitude of wave (i.e. being detectable by a classic receiving antenna);

(k) a latent wave power is defined as a partial wave power of a complex wave being composed of elemental waves, being superposed and thereby resulting in partially constructive interference and partially destructive interference, wherein said partial wave power being undetectable by a classic detector of waves, reacting on the resulting amplitude of wave, and being detectable by a thermal detector (i.e. a thermometer and/or a thermographic camera), reacting on the local thermal radiation;

(l) warmth of a molecular fluid is defined as a storage of the kinetic power of the fluid molecules;

(m) the universe background energy is defined as a latent energy stored in space, wherein the universe background energy being composed of at least the latent electromagnetic energy;

(n) fluid flow is defined as a molecular fluid, bringing the warmth and origin kinetic power of motion in a prevalent direction;

(o) the specific M-velocity, indicated by $M^*$, related to said fluid flow, is defined as equal to $\sqrt{(\gamma-1)/\gamma}$, where $\gamma$ is so-called adiabatic compressibility parameter of said molecular fluid;

(p) the specific kinetic power, indicated by $W_*$, is defined as kinetic power of fluid flow moving with the specific M-velocity $M_*$;

(q) raw power is defined as a power yet to be in a usable form;

(r) a generalized stock of said raw power is defined as at least one of:
   the warmth of ambient fluid, storing the kinetic power of molecules, and
   the universe background energy, storing the latent electromagnetic energy;

(s) a starter power, indicated by $W_{external}$, is defined as at least one of:
   thermal power harvested from a burned fuel,
   external electric power,
   kinetic power of fluid flow,
   internal heat power of fluid flow, frequently called warmth of ambient fluid, and
   electromagnetic power brought by sunlight;

(t) a generalized trigger of jet-effect is defined as a component of a system, said component being characterized by a field, being spread in ambient fluid medium and thereby making said system to be open from the thermodynamics point of view, wherein said component is at least one of:
   a fluid flow 5.41, to trigger at least one of the Venturi effect, the Coanda-jet-effect, and the waving jet-effect; wherein the mentioned field is a field of flow velocities; wherein, looking ahead in view of the description of subparagraph "Convergent-Divergent Jet-Nozzle" referring to FIG. 6a of the invention, it will become evident to a person studied the present invention that the relatively slow fluid flow 5.41, which yet can be accelerated by the Coanda-jet-effect, is characterized by M-velocity being lower than the specific M-velocity, indicated by $M_*$, specified in equation (6.9);
a fluid-repellent surface (for instance, similar to outer surface 577 of spiral 576 shown in FIG. 5*i*), to trigger the phobic-repulsing jet-effect, wherein the mentioned field is a field of repulsing forces; and
an electromagnetic field, to trigger the electromagnetic waving jet-effect;

(u) an airfoil convexity of a corpus exposed to said fluid flow is defined as a convexity being "embraced" by two edges in the direction of said fluid flow motion, namely:
by a rounded leading edge, upstream of said fluid flow motion; and
by a sharp trailing end, downstream of said fluid flow motion;
thereby, providing airfoil properties of said corpus and hence providing that said airfoil convexity, when interacting with said fluid flow portion, causing a conversion of a portion of said fluid warmth into a portion of kinetic power acquired by said fluid flow portion due to the Coanda-jet-effect in an adiabatic process; said portion of kinetic power acquired by said fluid flow portion due to the Coanda-jet-effect in an adiabatic process:
when manifested as a power, supporting an upward motion, is further called a lift-force power, and
when manifested as a power, supporting an forward motion, s further called a jet-thrust power;

(v) a generalized elemental source launching an elemental usable power portion of at least $W_1$ is defined as a device transforming an elemental pre-usable power portion, into said elemental usable power portion of at least $W_1$; wherein the generalized elemental source is at least one of:
an airfoil convexity of a corpus exposed to a fluid flow portion moving nearby said airfoil convexity (for instance, similar to outer surface 577 of spiral 576 shown in FIG. 5*i*),
wherein said elemental pre-usable power portion is composed of an original internal heat power of fluid flow and original kinetic power of fluid flow; and
wherein said elemental usable power portion, equal to at least $W_1$, is specified as the kinetic power of fluid flow composed of the original kinetic power of fluid flow and an additional portion of kinetic power acquired in an adiabatic process due to at least one of the Venturi effect and the Coanda-jet-effect;
an antenna of acoustic waves, capable of a receiving said elemental pre-usable power portion, equal to at least $W_1$ and a launching an acoustic wave bringing said elemental usable power portion of at least $W_1$; and
an antenna of electromagnetic waves, capable of a receiving said elemental pre-usable power portion, equal to at least $W_1$ and a launching an electromagnetic wave bringing said elemental usable power portion of at least $W_1$;

(w) a generalized elemental feeder is defined as an interface of power between said generalized stock and said generalized elemental source, wherein said interface consuming said starter power $W_{external}$ and being capable of conversion said raw power, extracted from said generalized stock, into said elemental pre-usable power portion and supplying the elemental pre-usable power portion to said generalized elemental source launching said elemental usable power portion of at least $W_1$, wherein said generalized elemental feeder being at least one of:
said airfoil convexity of the corpus exposed to a portion of fluid flow 5.41 moving nearby said airfoil convexity (note, the airfoil convexity plays the role of both said elemental source and said elemental feeder) exposed to said fluid flow 5.41;
thereby, causing that:
(i) a portion of origin kinetic power, indicated by $W_0$, brought by said fluid flow portion yet to be subjected to the Coanda-jet-effect, being lower than the specific kinetic power $W_*$, and coming to said airfoil convexity, and
(ii) the kinetic power, indicated by $\delta W_1$, of said fluid flow portion, acquired due to the Coanda-jet-effect in an adiabatic process,
both constitute said elemental pre-usable power portion, indicated by $W_1 = W_0 + \delta W_1$, remaining lower than the specific kinetic power $W_*$ and being higher than $W_0$ at least by factor $F_1$ to satisfy the condition: $F_1 W_0 = W_1 < W_*$;
a generalized engine providing powering an antenna of acoustic waves by said elemental pre-usable power portion of at least $W_1$; and
a generalized engine providing powering an antenna of electromagnetic waves by said elemental pre-usable power portion of at least $W_1$;

(x) a generalized jet-converter of power is defined as an aggregation comprising a conductor 5.30 of traveling power and a gathering of N said generalized elemental sources (marked by set 5.10 of numerals: 5.11, 5.12, 5.13, ..., 5.1N) launching corresponding N said elemental usable power portions (marked by numerals 5.31, 5.32, 5.33, ..., 5.3N), wherein said aggregation (5.30 and 5.10) providing an operation of said N generalized elemental sources 5.10 (5.11, 5.12, 5.13, ..., 5.1N) in unison, thereby making said generalized jet-converter of power being capable of a transformation said raw power into said useful power 5.40, wherein said transformation is implemented using a multi-stage repeating of said generalized jet-effect provided by said generalized trigger of jet-effect; said aggregation is at least one of:
an aggregation of a conductor 5.30 of flow and N said airfoil convexities, sequentially arranged to be exposed to said fluid flow portion, moving along said conductor of flow and coming to said N airfoil convexities and flowing around said N airfoil convexities sequentially, thereby, said aggregation providing a sequential multi-stage repeated action of said N airfoil convexities on said fluid flow portion resulting in a corresponding multi-stage repeating of the Coanda-jet-effect operation applied to said transformation of said raw power into said useful power, indicated by $W_N$, in the form of kinetic power of a resulting jetstream; thus, while said useful power remaining substantially lower than the specific kinetic power $W_*$, said useful power $W_N$ 5.40 of said resulting jetstream is higher than said portion of origin kinetic power, indicated by $W_0$, brought by said fluid flow portion 5.41 yet to be subjected to the Coanda-jet-effect, by the factor of at least $F_1^N$;
an aggregation of a waveguide 5.30 and N said antennas of waves, specifically arranged and mutually synchronized to launch N in-phase waves, correspondingly, and thereby to provide constructive interference of said N in-phase waves within said waveguide, wherein each of said N waves bringing said elemental usable power portion of at least $W_1$ thereby providing that said constructive interference of N said waves thereby subjected to the waving jet-effect, in-phase reinforced repeatedly N times, thereby forming a resulting wave bringing said useful power 5.40 in form of wave power of at least $W_N$ being higher than the elemental usable power portion $W_1$ by the factor of $N^2$; and wherein, without loss of generality but for the sake of concretization, the mutual synchronization of the N sources 5.11, 5.12, 5.13, ..., 5.1N of waves 5.31, 5.32, 5.33, ..., 5.3N, correspondingly, is implemented applying certain delays, for instance, using a certain intervals 5.42 between the sources 5.11, 5.12, 5.13, ..., 5.1N, thereby providing for that, when propagating within waveguide 5.30, the waves 5.31, 5.32, 5.33, ..., 5.3N become in-phase superposed thereby resulting in constructive interference; and (y) a generalized power converter 5.20 is defined as an engine providing a mechanism for a reincarnation of said useful power 5.40 into said useful-beneficial power, wherein said engine is at least one of:

open space, thereby providing conditions for reincarnation of said useful power $W_N$ of said resulting jetstream into said jet-thrust power, according to Newton's Third Law;

a turbo-generator (shown schematically as a generalized antenna 5.20), capable of transformation said useful power $W_N$ of said resulting jetstream 5.40 into the electric power released from the feeder output 5.43;

a Peltier element operating as a thermoelectric generator, primary producing electricity from the temperature difference caused by said generalized jet-effect; and a generalized receiving antenna 5.20 having the feeder output 5.43, wherein said generalized receiving antenna 5.20 being capable of conversion said useful power $W_N$ 5.40 of said resulting wave 5.40 into the electric power 5.43, and wherein said feeder output 5.43 providing the electric power release.

The generalized generator 5.00 comprises the following generalized constituent elements:

a generalized starter, being composed of:
said ambient fluid medium;
N generalized elemental feeders, enumerated by 5.21, 5.22, 5.23, ..., 5.2N, being energetically inter-independently powered; and
a generalized stock of raw power, storing the power yet to be in a usable form;

said generalized trigger of the generalized jet-effect;

said generalized jet-converter of power, comprising an aggregation of a conductor 5.30 of traveling power and a gathering 5.10 of N generalized elemental sources, enumerated by 5.11, 5.12, 5.13, ..., 5.1N, launching N elemental usable power portions, enumerated by 5.31, 5.32, 5.33, ..., 5.3N, correspondingly; wherein the triple-dots, having numerals 5.14 and 5.24:

symbolize the conformance between the N generalized energetically inter-independent feeders and the N generalized elemental sources of the N elemental usable power portions correspondingly, as well as
say that, preferably, N is a certain big number, wherein the big integer number N having the claimed sense is at least 10;
and said generalized power converter 5.20 transforming said useful power into said useful-beneficial power.

In relation to electromagnetic waves, without loss of generality but for the sake of concretization only, the waveguide 5.30 is characterized by a high dielectric constant, higher than the dielectric constant of the ambient medium, wherein the high dielectric constant provides for the condition of the so-called total internal reflection of the electromagnetic waves, i.e. providing for a hypothetically ideal lossless waveguide effect.

In relation to both: the acoustic waves and the electromagnetic waves, each of the N sources 5.11, 5.12, 5.13, ..., 5.1N of waves 5.31, 5.32, 5.33, ..., 5.3N, correspondingly, consumes the power $W_0$ and launches a wave (one of 5.31, 5.32, 5.33, ..., 5.3N, correspondingly) bringing the wave power $W_1$. Speaking strictly, as it follows from the description expound hereinabove in subparagraphs "Interference of Acoustic Waves" and "Hypothetic Electromagnetic Analogue", the consumed power $W_0$ differs from the wave power $W_1$ brought by the wave, wherein the difference $(W_1-W_0)$, on the one hand, is defined by a positive power portion acquired due to the waving jet-effect and radiation jet-effect and, on the other hand, is defined also by a negative power portion lost due to wave power dissipation in the ambient medium. When ignoring the negative power portion, one usually interprets that $W_1=W_0$, just ignoring the work for the wave energy travelling itself that must be supported by a certain power according to The Energy Conservation Law. The mentioned positive power portion, harvested due to the waving jet-effect, goes for the wave energy travelling. Normally, the consideration of the wave power without the power consumption for the wave energy traveling itself is justified when one estimates a useful-beneficial power only.

The inventor emphasizes that sources 5.11, 5.12, 5.13, ..., 5.1N of waves 5.31, 5.32, 5.33, ..., 5.3N, correspondingly, are fed energetically inter-independently. For example, each of the sources consumes the power from a separate generalized generator of electrical signals to feed the corresponding wave. Alternatively, a feeding, using different periods of a wave, is also interpreted as energetically inter-independent; but in contrast, a "multi-source" feeding, implemented by means of a splitting of high power, cannot be interpreted as an inter-independent feeding.

The inventor points out that the importance of the energetic inter-independence of the sources 5.11, 5.12, 5.13, ..., 5.1N is predetermined by the reciprocity theorem, which, when applied to the case, saying that, when a parent wave, bringing the usable wave energy $U_N$ per wavelength, is subjected to a decomposition thereby forming N coherent daughter waves, each daughter wave brings the usable wave energy $U_1$ per wavelength that is lower than the parent usable wave energy $U_N$ per wavelength by the factor $N^2$, but not by the factor N, wherein the lack of the wave energy, equal to $\Delta U_N = N(N-1)U_1$, becomes transformed into the latent energy of the ambient medium (in the case of electromagnetic waves, the ambient medium is the vacuum filled by the universe background energy, comprising the latent energy of "electromagnetic gas").

Thus, considering actually energetically inter-independent sources 5.11, 5.12, 5.13, ..., 5.1N, for the sake of simplicity, ignoring the difference between $W_0$ and $W_1$, the sum power $W_{N1}$, consumed by the N energetically inter-independently fed sources 5.11, 5.12, 5.13, ..., 5.1N, is equal to $W_{N1}=NW_1$. The mutual synchronization of the N sources 5.11, 5.12, 5.13, ..., 5.1N of waves 5.31, 5.32, 5.33, ..., 5.3N is implemented applying certain delays, for instance, using certain intervals 5.42 between the sources 5.11, 5.12, 5.13, ..., 5.1N, thereby providing for that, when propagating within waveguide 5.30, the waves 5.31, 5.32, 5.33, ..., 5.3N become in-phase superposed thereby resulting in constructive interference. The constructive interference is the resulting extra-high power wave 5.40 characterized by the increased amplitude (for instance, the amplitude of oscillating electric field), wherein the amplitude increase is specified by the factor N that corresponds to the resulting wave power $W_{N2}$ equal to $W_{N2}=N^2W_1=NW_{N1}$.

The inventor points out to the power difference between $W_{N2}$ and $W_{N1}$, namely, $(WN_{Z2}-W_{N1})=N(N-1)W_1$. In the case of acoustic waves, the power difference is acquired at the expense of the molecular fluid warmth, and in the case of electromagnetic waves, the power difference is acquired at the expense of the universe background energy (at least at the expense of the latent electromagnetic energy stored in the electromagnetic gas). Without loss of generality, the generalized power converter 5.20 is implemented as an antenna, exposed to the extra-high power wave 5.40. Generalized power converter 5.20 is capable of conversion of the extra-high power $W_{N2}$ of wave 5.40 into the electric power released from feeder output 5.43 of generalized detector 5.20.

The generalized generator is an open system from the point of view of thermodynamics interacting with the ambient matter and warmth. One of the primary features of the generalized generator is that it interacts with the ambient matter and warmth multi-stage repeatedly using a set of a big number N of generalized elemental feeders being energetically inter-independently powered and a set of the big number N of generalized elemental sources launching usable power portions.

The inventor points out that, in contrast to the resonance electrical scheme of Tesla coil applied to induced oscillating electrical current to enable a radiation of super-impressive lightning impulses, the proposed superposition of N in-phase electromagnetic waves (wherein N is a specified number), to provide for the desired constructive interference bringing usable wave power, is easily controllable.

Gravity-Jet Engine

Figure 5N:
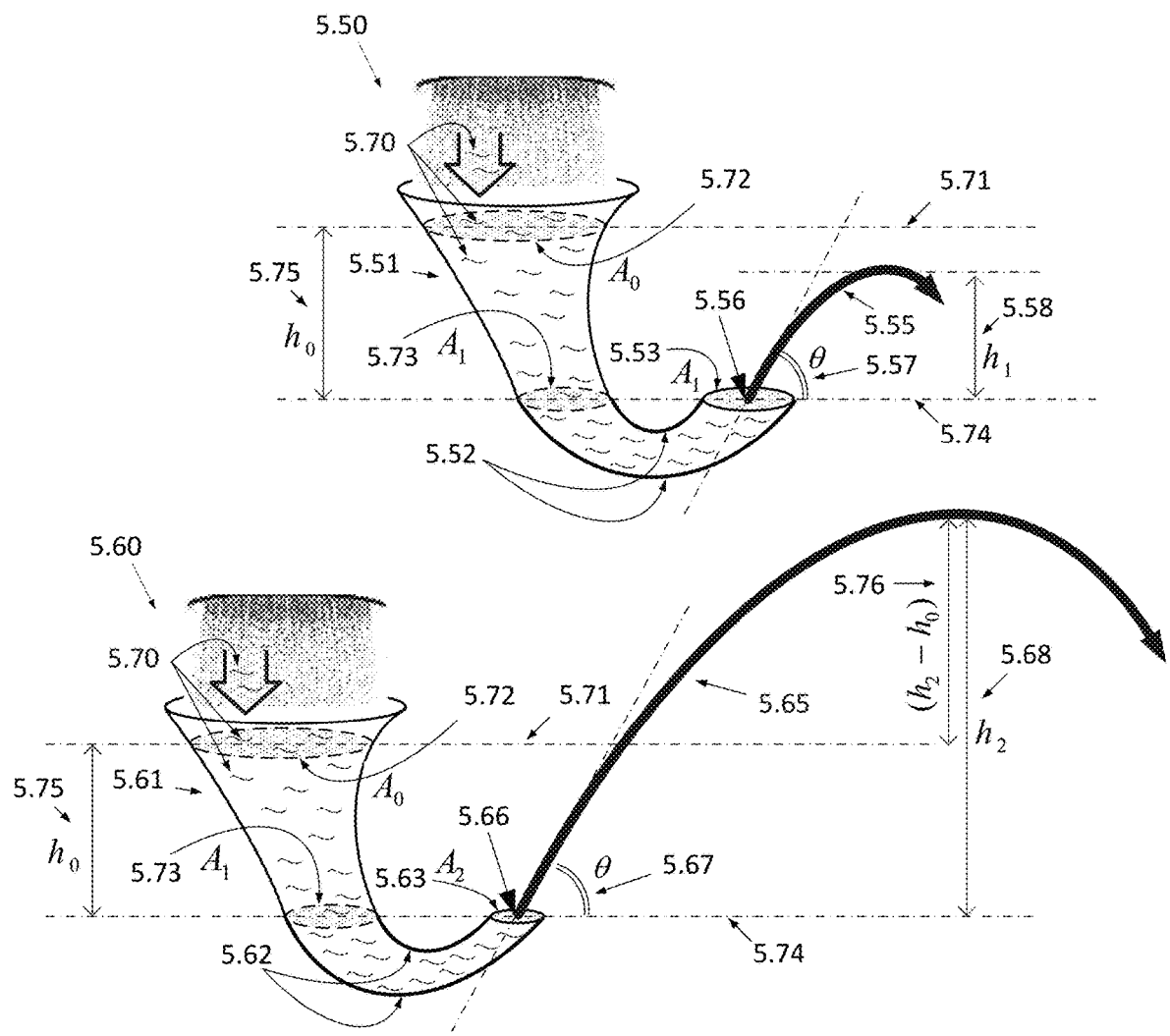
FIG. 5n is a schematic illustration of a motionless gravity-jet engine.

FIG. 5n is a schematic illustration of motionless gravity-jet engines: 5.50 and 5.60, each comprising an elaborated airfoil shaped container: gauge 5.51 and primary 5.61, correspondingly, being permanently filled with liquid (for instance, water) 5.70 characterized by the density, substantially higher than the density of ambient gas (for instance, air). The upper surface of water in each of containers: 5.51 and 5.61, is on level 5.71 and has a cross-sectional area $A_0$ 5.72. The inner side of the container walls is hydrophobic (to reduce the walls resistance) and the elaborated airfoil shape of each of containers: 5.51 and 5.61, provides the condition of a cross-sectional area decrease in the vertical direction from the value $A_0$ 5.72 to the value $A_1$ 5.73 that (the decrease) corresponds to the cross-sectional area decrease for water, which is freely falling in the gravitational field.

The inventor points out that the freely falling of fluid occurs with an acceleration, which differs from the gravitational acceleration of a material point (or sold body) by an additionally acquired acceleration, because of two accompanying effects, namely:
- a part of potential energy goes for a work for deformation of the falling fluid portions, which (the deformation) results in elongation of water portions in the vertical direction, i.e. results in the acquired acceleration by definition, and, in turn,
- the fluid portions deformation in combination with the fluid motion is inevitably accompanied by the Venturi effect having the jet-effect nature, thereby providing for the additionally acquired acceleration at the expense of the internal heat of the fluid.

The gauge container 5.51 is supplied with gauge curved convergent-divergent nozzle 5.52 and the primary container 5.61 is supplied with primary curved converging nozzle 5.62, wherein the volume of the container (5.51 or 5.61) is much bigger than the volume of nozzle (5.52 or 5.62, correspondingly) to ignore of the moving water pulse change when considering the water stream changing the velocity vector within the curved nozzle (5.52 or 5.62, correspondingly). Wherein:

The gauge convergent-divergent nozzle 5.52 is beginning from cross-section 5.73 and leading to gauge-ending cross-section 5.53, wherein the beginning and ending cross-sections: 5.73 and 5.53, correspondingly, both have an identical area equal to $A_1$ and both are located at the same level 5.74, which is lower than level 5.71 on height $h_0$ 5.75; and moreover, the varying cross-section of the convergent part is adapted to freely descending water and the divergent part is aligned inversely to the convergent part (i.e. adapted to freely ascending and retarding water); and The primary converging nozzle 5.62 having an elaborated airfoil cross-section beginning from cross-section 5.73 and leading to primary-ending cross-section 5.63, wherein the both cross-sections are at the same level 5.74 such that the distance between levels 5.71 and 5.74 equals $h_0$ 5.75; and wherein the area $A_1$ of beginning cross-section 5.73 is greater than the area $A_2$ of primary-ending cross-section 5.63 by the factor F of constriction, i.e. $A_1=F\times A_2$. Looking ahead, the equations (6.13) and (6.14), described hereinbelow in sub-paragraph "Convergent-Divergent Jet-Nozzle" with reference to FIG. 6a, when applied to a fluid flowing through an elaborated actually-airfoil convergent-divergent jet-nozzle with extremely low M-velocities, is applicable to proper design of the mentioned elaborated airfoil converging nozzle 5.62 to provide for the water stream laminarity when the water stream is subjected to the Venturi effect. This means that to implement the constriction factor, for instance, F=2, and, at the same time, to provide for the laminarity of fluid flowing through the converging nozzle, one has to apply equation (6.14) to provide for the desired linear (or at least substantially gradual) change of the fluid static pressure.

The water, which is located in each of elaborated airfoil shaped containers 5.51 and 5.61 above level 5.74, performs a gravity compressor (with respect to nozzles 5.52 and 5.62, correspondingly) operating in the gravitational field having force-lines in the vertical direction.

The gauge nozzle 5.52 and the primary nozzle 5.62, both provide for an outflowing water jetstream, moving through the ambient air in the gravitational field and associated with trajectory: gauge 5.55 and primary 5.65, correspondingly.

Ignoring the dragging effects acting by ambient air on a water jetstream as well as ignoring the mentioned additionally acquired acceleration due to the accompanying Venturi effect, the trajectory of water jetstream: either gauge 5.52 or primary 5.62, is described by parabola expressed with respect to butt-end point: either 5.56 or 5.66, correspondingly, as:

$$y = tg(\theta) \times x - \frac{g}{2u^2\cos^2\theta}x^2, \qquad \text{Eq. (5.11a)}$$

where x and y are coordinates in the horizontal and vertical directions, correspondingly, θ is angle (either 5.57 or 5.67) between the vector velocity of jetstream associated with trajectory (either 5.55 or 5.65, correspondingly) at butt-end point (either 5.56 or 5.66, correspondingly) and a horizontal axis, g is gravitational acceleration, and u is the absolute velocity: either $u_1$ or $u_2$, of headway motion of the outflowing jetstream associated with trajectory: either 5.55 or 5.65, correspondingly, at the butt-end point: either 5.56 or 5.66, correspondingly.

The absolute velocity u is determined by the height $h_0$ 5.75 and expressed by:

$$\sqrt{u=(1-\psi)\Psi 2gh_0} \qquad \text{Eq. (5.11b),}$$

according to Torricelli's law, where the factors $\Psi$ and $\psi$ are introduced, wherein:

the introduced factor of effective acceleration increase $\Psi$ characterizes the mentioned interrelated effects: the accompanying Venturi effect and a change in internal heat of the unbrokenly and laminarly moving water with respect to the heat of a water portion in container (5.51 or 5.61) near the surface 5.72, wherein the effective acceleration increase $\Psi$ is averaged over the height $h_0$ when the water motion is steady-state. The deformation of the moving water portions shape results in a change in the water portions thermodynamic state. In particular, when the shape of a water potion becomes conic, the absolute velocity u has two orthogonal components: of a headway motion $u_H$ and of a cross-sectional collapsing $u_C$, wherein the condition $u = \sqrt{u_H^2 + u_C^2}$ is satisfied. The headway motion component $u_H$ characterizes the water flow $\Phi = \rho u_H$, where $\rho$ is the density of substantially incompressible water, while the cross-sectional collapsing component $u_C$ characterizes a water portion acquired acceleration, wherein the acquired acceleration occurs at the expense of either potential energy stored in the gravitational field and/or internal heat energy stored in the Brownian motion of fluid molecules. The cross-sectional collapsing component $u_C$ of freely falling water, defined as $u_C = 0.5 \times dD/dt$, where D is the effective linear size of cross-section (for instance, the diameter of a circle cross-section), is approximately estimated by:

$$u_c \approx \frac{g\sqrt{Au_H}}{4\sqrt{\pi} \sqrt[4]{u_H^2 + 2gh}} \approx \frac{g\sqrt{Au_H}}{4\sqrt{\pi} \sqrt[4]{2gh(\Psi+1)}}, \qquad \text{Eq. (5.11c)}$$

where A is the cross-sectional area at the height level h. The condition $\Psi=1$ is applicable, for instance, to a falling small drop or to water in a container having a uniform cross-section, where, hypothetically, the water descends laminarly and forcibly without the cross-sectional collapsing and so without acceleration. The condition $u_C>0$ inevitably interrelates with the condition $\Psi>1$. The value of the effective acceleration increase factor $\Psi$ is quantified hereinbelow in equations (5.11i) and (5.11k); and the introduced factor of velocity reduction $\psi$ ($0 \leq \psi \leq 1$) characterizes loss of the water stream headway motion kinetic energy due to the dragging effects and turbulence within the container (5.51 or 5.61) and nozzle (5.52 or 5.62). A not-optimized shape of the container and nozzle results in the turbulence, which, in turn, results in dividing the kinetic energy of the water stream between the kinetic energy of headway motion and the kinetic energy of turbulent motion. The skin-friction between the moving water and nozzle, on the one hand, results in a decrease of the kinetic energy of water stream within the container and nozzle, and on the other hand, contributes to the turbulence. When the accelerated motion of water within the container is turbulent and the nozzle is resistive for the water motion, the factor of velocity reduction $\psi$ becomes significant. Hypothetically ignoring the dragging effects and the turbulence within the container and nozzle, the factor of velocity reduction $\psi$ equals zero.

The mentioned elaborated airfoil shape of the container (5.51 or 5.61) and the inner surface of walls being hydrophobic, altogether provide that the condition $\psi=0$ is satisfied between levels 5.71 and 5.74. On the other hand, to define the effective acceleration increase factor $\Psi$, two fundamental laws: the equation of continuity and the Bernoulli theorem (the energy conservation law), are applied to the unbrokenly falling water. Namely, the velocity values $u_{0H}$ and $u_{1H}$, where $u_{0H}$ and $u_{1H}$ are the components of water headway (in the case, dominantly vertical) motion velocities at cross-sections 5.72 and 5.73, correspondingly, are interrelated by the equation of continuity, namely:

$$A_1 u_{1H} = A_0 u_{0H} \qquad \text{Eq. (5.11d).}$$

The absolute velocities $u_0$ and $u_1$, both comprising also corresponding cross-sectional collapsing components, are interrelated by the Bernoulli theorem, for instance, written in the form of equation (5.10b), namely, $$\frac{u_0^2}{2} + gh_0 = \frac{u_1^2}{2} + R\Delta T, \qquad \text{Eq. (5.11e)}$$

where R is specific fluid constant, and $\Delta T$ is the change in the absolute temperature of moving water that is determined by the cross-sectional collapsing component of the moving water velocity. Therefore, $$\begin{cases} \dfrac{u_{0C}^2}{2} = \dfrac{u_{1C}^2}{2} + R\Delta T & \text{Eq. (5.11f)} \\ \dfrac{u_{0H}^2}{2} + gh_0 = \dfrac{u_{1H}^2}{2} & \text{Eq. (5.11g)} \end{cases}$$

Combining equations (5.11d) and (5.11g), one obtains:

$$u_{1H}^2 = 2gh_0 \frac{A_0^2}{A_0^2 - A_1^2}. \qquad \text{Eq. (5.11h)}$$

Comparing (5.11h) and Torricelli's law, written in the form of equation (5.11b), the effective acceleration increase factor $\Psi$ on the height $h_0$ is expressed by:

$$\Psi = \left( \frac{A_0^2}{A_0^2 - A_1^2} \right). \qquad \text{Eq. (5.11i)}$$

The equation (5.11i) makes it evident that the effective acceleration increase factor $\Psi$ is greater than 1 for the case. The area $A_1$ of the cross-section 5.73, specified for freely falling water, related to the height $h_0$ and velocity $u_{0H}$ at cross-section 5.72, is expressed by:

$$A_1 = \frac{A_0 u_{0H}}{\sqrt{u_{0H}^2 + 2\Psi gh_0}}. \qquad \text{Eq. (5.11j)}$$

Using again the equation of continuity Eq. (5.11d) and the Bernoulli theorem Eq. (5.11g), and taking into account equation (511j) for the area $A_1$ in equation (5.11i), the effective acceleration increase factor $\Psi$ is expressed via $u_{0H}$ and $h_0$, namely, $$\Psi = \frac{1}{2} + \sqrt{\frac{1}{4} + \frac{u_{0H}^2}{2gh_0}} \quad \text{Eq. (5.11k)}$$

Thereby, the effective acceleration increase factor $\Psi$ is estimated as:

$$\Psi = \begin{cases} \Psi > 1, & \text{if } gh_0 > 0, \text{ i.e.falling} \\ \Psi = 1, & \text{if } gh_0 = 0, \text{ i.e.} u_{0H} = 0 \\ 0 < \Psi < 1, & \text{if } gh_0 < 0, \text{ i.e.upping} \end{cases}$$

The inventor points out that, based on two fundamental laws: the equation of continuity and the energy conservation (the Bernoulli theorem), both applied to the unbrokenly falling water, the summary that the water stream free falling with an acceleration higher than the gravitational acceleration g is one of the primary teachings of the present invention.

The absolute velocity of water moving through cross-section 5.73 is estimated as:

$$u_1 = \sqrt{u_{1H}^2 + u_{1C}^2}, \quad \text{Eq.(5.11l)}$$

where $$u_{1H}^2 = 2\Psi gh_0 \text{ and } u_{1C}^2 \approx \frac{1}{16\pi} \frac{g^2 A_0 u_{0H}}{\sqrt{2gh_0(\Psi+1)}} \approx \frac{1}{16\pi} \frac{g^2 A_0 u_{0H}}{\sqrt{u_H^2 + 2gh}}.$$

The shape of nozzle 5.52 has the varying cross-sectional area adapted to freely descending and freely ascending water such that thermodynamic states of water in positions 5.73 and 5.53 are identical. Thereby, the velocity of water portion at position 5.56 is equal to $u_1$ specified by equation (5.111). The maximal height $h_1$ 5.58 of the water jetstream associated with trajectory 5.55 is equal to $h_1=(u_{1H} \sin\theta)^2/(2\Psi g)$, wherein when $\theta=60°$, $\Psi\approx 1$, and $\psi=0$, then $h_1=0.75h_0$. The condition $h_1<h_0$ is satisfied.

In contrast to nozzle 5.52, nozzle 5.62 is asymmetrical, having the area $A_1$ of cross-section 5.73 bigger than the area $A_2$ of primary-ending cross-section 5.63 by the factor F of constriction, i.e. $A_1=F\times A_2$. Nozzle 5.62 provides for the Venture effect (having the jet-effect nature) and so providing for a convective acceleration of the portion moving through the nozzle such that velocity $u_2$ at point 5.66 becomes higher than the velocity $u_1$ at position 5.73 by the factor F, i.e. $u_2=F\times u_1$, in accordance with the equation of continuity, wherein the velocity increase occurs at the expense of the water warmth.

The mentioned condition that the volume of container 5.61 is much bigger than the volume of nozzle 5.62, justifies the assumption that the velocity $u_1$ of water motion at the position 5.73 of both containers 5.51 and 5.61 is the same.

Further, in accordance with the Bernoulli theorem applied to the water streaming through nozzle 5.62, the values $u_1$ and $u_2$ are interrelated as:

$$\frac{u_1^2}{2} = \frac{u_2^2}{2} + R\Delta T$$

where the negative value of the water absolute temperature change $\Delta T$ provides for the contribution to the kinetic energy of the outflowing water jet-stream.

The increased velocity $u_2=F\times u_1$ corresponds to another parabolic trajectory of the water jetstream 5.62. If, hypothetically, $\psi=0$ and, for example, angle 5.66 equals $\theta_2=60°$ and the factor of constriction equals F=2, then the maximal height $h_2$ 5.68 of water jetstream 5.62 equals $h_2=F^2 h_1=3h_0$.

The inventor points out that the condition $h_2>h_0$ becomes reachable when the Venturi effect is triggered keeping the water motion laminar. Therefore, use of the height $h_2$ 5.68 of a waterfall for producing the electric power using a hydro-turbine [not shown here] is more efficient than a use of the original height $h_0$ 5.75. Furthermore, the height difference $(h_2-h_0)$ 5.76 allows for the electricity harvesting and wherein reverting a falling water portion back into container 5.61 [not shown here] and thereby avoiding consumption of the water from container 5.61. For such a permanent use of the water portion, the water must permanently be consuming caloric, for instance, from ambient warmth. The inventor points out that this is not a so-called "Perpetuum mobile", but the use of water heat and the heat of ambient air to produce useful power, strictly according to the Energy Conservation Law.

The inventor points out that the described technique allowing for the transformation of water warmth into useful energy is composed of two obvious transformations:
- a gravitational acceleration of water stream in the Earth gravitational field; and
- a convective acceleration of water jetstream using an elaborated airfoil nozzle;

wherein the combination of the two obvious transformations provides for a new quality of motionless gravity-jet engine 5.60. Namely, this allows for the harvesting of useful power from the heat of water. The combination of a gravity compressor and an elaborated airfoil converging (or convergent-divergent) nozzle is one of the primary teachings of the present invention. Further, it will be evident for a person studied the present invention that:

- motionless gravity-jet engine 5.60 launching water jetstream 5.65, as a waterfall, is applicable to a hydro-turbine; wherein, the motionless gravity-jet engine, when operating in a mode reverting water portions back into container 5.62 and if the falling water is further powers the hydro-turbine (which, in the final analysis, producing electric power at the expense of the water warmth), at the same time, allows for cooling the water almost reaching the freezing point;
- motionless gravity jet engine 5.60 can be cascaded multi-stage repeatedly (implementing a hydro-gateway) to increase the cumulative height of waterfall; and, looking ahead,
- the equation (6.14), mentioned hereinabove and described hereinbelow in subparagraph "Convergent-Divergent Jet-Nozzle" with reference to FIG. 6a, in particular, assuming Venturi M-velocities (where the term "Venturi M-velocity" will be introduced), is applicable to design an elaborated shape of airfoil container 5.61, to provide an additionally acquired acceleration and laminarity of water motion.

Enhanced Transformer

Figure 5O:
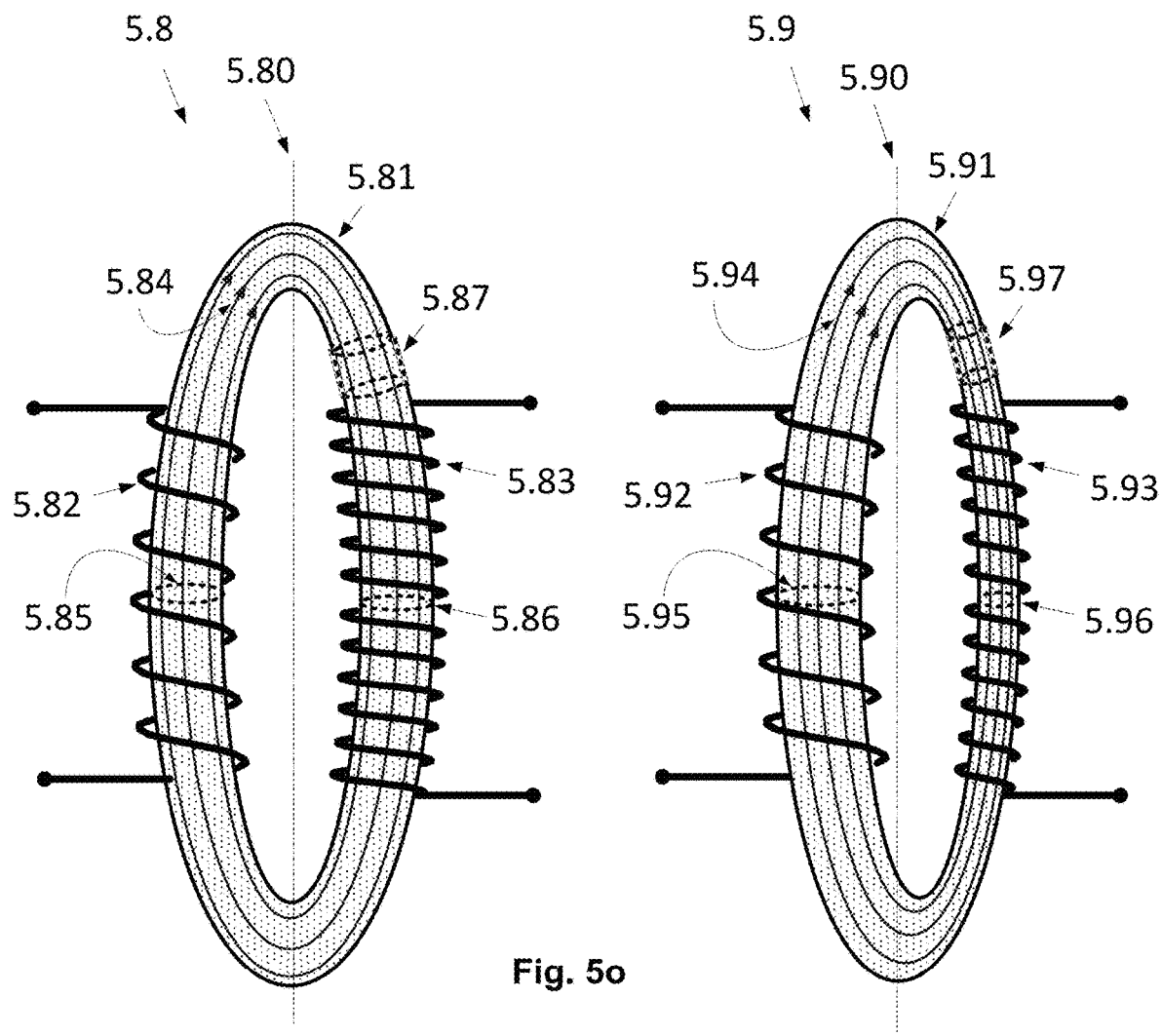
FIG. 5o is a schematic illustration of two transformers of alternating electrical voltage and current.

FIG. 5o is a schematic illustration of two transformers of alternating electrical voltage and current, namely, of:

gauge transformer 5.8, comprising:
- an equi-cross-sectional electro-conductive and magneto-boosting core 5.81, being made from a material characterized by a high magnetic permeability (for instance, made from a ferromagnetic or ferrimagnetic material) and having a ring-like closed toroidal-like shape, symmetrical with respect to axis 5.80, and
- a pair of inter-isolated electro-conductive-coils: primary winding 5.82 and secondary winding 5.83, each coiling around the toroidal-like core 5.81, thereby, the gauge transformer, essentially, is an ordinary transformer of alternating electrical voltage and current, wherein the primary winding 5.82, when subjected to the alternating electrical voltage, is an input and the secondary winding 5.83, when electrically loaded, is an output of electric power;

and enhanced transformer 5.9, comprising:
- a convergent-divergent electro-conductive and magneto-boosting core 5.91, being made from the ferromagnetic or ferrimagnetic material and having a varying-cross-sectional ring-like closed toroidal-like shape, asymmetrical with respect to axis 5.90, and
- a pair of inter-isolated electro-conductive-coils: primary winding 5.92 and secondary winding 5.93, each coiling around the asymmetrical toroidal-like electro-conductive and magneto-boosting core 5.91, constructed according to an exemplary embodiment of the present invention.

Each of the primary electro-conductive-coil windings: 5.82 and 5.92, comprising electron gas composed of free electrons, is subjected to an applied alternating external voltage, called primary voltage, accompanied by an alternating primary current, in turn, originating alternating magnetic flux marked by force-lines of the magnetic field strength: 5.84 and 5.94, correspondingly. Although the magnetic field strength force-lines: either 5.84 or 5.94, is shown in one direction (clockwise), it actually alternates the direction with the alternating current in the primary electro-conductive-coil winding: either 5.82 or 5.92, correspondingly.

Each of the closed toroidal-like cores: symmetrical equi-cross-sectional 5.81 and asymmetrical convergent-divergent 5.91, performs a closed "tunnel-corridor", characterized by the high magnetic permeability and by low coercivity and destined for conveying the magnetic field power along the closed tunnel-corridor, in particular, from the location of primary electro-conductive-coil winding: ether 5.82 or 5.92, to the location of secondary electro-conductive-coil winding: either 5.83 or 5.93, correspondingly, wherein the shape of the closed tunnel-corridor, being either:
- ring-like symmetrical equi-cross-sectional 5.81, i.e. having identical cross-sections 5.85 and 5.86; or
- ring-like asymmetrical convergent-divergent 5.91, i.e. having relatively thick and thin portions with cross-sections 5.95 and 5.96, correspondingly, differing in area;

is sufficiently airfoil to assume that the originated alternating magnetic flux: either 5.84 or 5.94, correspondingly, is laminar along the closed tunnel-corridor: either 5.81 or 5.91, correspondingly, having no substantial vortices.

The principal difference between the two transformers: gauge 5.8 and enhanced 5.9, is in symmetry and in cross-sectional area varying of the closed cores: ring-like symmetrical equi-cross-sectional 5.81 and asymmetrical convergent-divergent 5.91, correspondingly. The asymmetrical convergent-divergent core 5.91 has a gradually-varying cross-sectional area, indicted by A and interrelated with gradually-varying relative concentration of the magnetic field strength force-lines, providing the enhanced Venturi-like jet-effect applied to the alternating magnetic flux 5.94, magnetic field strength current value of which, appearing at the gradually varying cross-sectional area A, is indicted by H.

Further, for the sake of relevant simplicity, omit the mentioning about the electromagnetic parameters alternation as well as omit the effects of electromagnetic power dissipation due to resistance to the magnetizing hysteresis because of the non-zero coercivity, due to turbulence of eddy currents within the toroidal-like cores as well as due to electrical resistance of the primary and secondary electro-conductive-coils.

The inventor points out that the magnetic flux, indicated by $\Phi$, of the magnetic field 5.94 is constant along the closed asymmetrical convergent-divergent tunnel-corridor 9.91, wherein the gradually-varying cross-sectional area A determines the gradual variation of the magnetic field 9.94's strength H, according to the equation of continuity applied to the magnetic flux, namely: $\Phi = A \times H = $ Const. I.e. the narrowed cross-section 5.96 comprises an increased magnetic field strength H characterized by an increased relative concentration of the magnetic field strength force-lines and the widened cross-section 5.95 comprises a decreased magnetic field strength H characterized by a decreased relative concentration of the magnetic field strength force-lines. Furthermore, the constant magnetic flux having the varying cross-sectional area is characterized by gradually-varying energy along the closed convergent-divergent tunnel-corridor, analogously to the property of the convergent-divergent electric flux described hereinabove in sub-paragraph "Venturi effect" with reference to prior art FIG. 1b, wherein the increased magnetic energy near the secondary electro-conductive-coil winding 5.93 is acquired from the electromagnetic gas temperature, hidden within the molecular ferromagnetic or ferrimagnetic material of the toroidal-like electro-conductive and magneto-boosting core 5.91.

In contrast to the gauge transformer 5.8, where the current, induced in the secondary electro-conductive-coil winding 5.83, brings the electric power, equal to the electric power of the current flowing within the primary electro-conductive-coil winding 5.82, in the final analysis of the enhanced transformer 5.9, as an alternating magnetic flux of higher magnetic power induces a current bringing higher electric power, the current, induced in the secondary electro-conductive-coil winding 5.93, brings the electric power higher than the electric power of the current flowing within the primary electro-conductive-coil winding 5.92, wherein the added electric power is acquired at the expense of the electromagnetic gas temperature. The enhanced transformer 5.9 is interpreted as a motionless magnet-jet engine, allowing for a new beneficial capability of acquiring a useful electric energy from the electron gas temperature interrelated with the electromagnetic gas temperature, wherein:
- the primary (input) winding electro-conductive-coil 5.92 encircling the widened cross-section 5.95 plays the role of a magnetizing compressor, the vector angular-velocity, called also the angular-velocity-vector, of eddy currents (i.e. of circulating free electrons) plays the role of a molecular fluid flow velocity-vector, wherein streamlines of the induced eddy current are defined as curves aligned with the varying angular-velocity-vectors of the induced eddy current (or of the circular motion of the free electrons), being varying along the magnetic field strength force-lines 5.94 within and along the convergent-divergent electro-conductive and magneto-boosting core 5.91, and, looking ahead, the equation (6.13) described hereinbelow in subparagraph "Convergent-Divergent Jet-Nozzle" with reference to FIG. 6a, in particular, assuming Venturi M-velocities (where the term "Venturi M-velocity" will be introduced), is applicable to design an elaborated shape of actually-airfoil convergent-divergent tunnel-corridor of toroidal-like electro-conductive and magneto-boosting core 5.91, to provide:

the required laminarity of magnetic flux 5.94 interrelated with eddy currents, and the desired gradual increase of the vector angular-velocity of the eddy currents.

In view of the foregoing description of the subparagraph "Enhanced Transformer" referring to FIG. 5o, it will be evident for a person studied the present invention that one can use a multi-stage repeating cascade of a set of N enhanced transformers 5.9, wherein the primary (input) winding of each next enhanced transformer is electrically connected to the secondary (output) winding of the previous enhanced transformer. When each of the N enhanced transformers provides an increase in electric power due to the acquiring a useful electric energy from the ambient warmth by the factor F, the cumulative increase in the electric power becomes by the factor $F^N$ (for instance, F=1.1, N=10, and $F^N \approx 2.6$).

Permanent Electro-Magnet

Referring again to FIG. 5o, the inventor further notes that considering the case:

when the primary electro-conductive-coil windings: 5.82 and 5.92, each carrying a certain constant (not-alternating) current; and when the fragments: 5.87 and 5.97, are withdrawn, i.e. when the former closed toroidal-like cores: symmetrical equi-cross-sectional 5.81 and asymmetrical convergent-divergent 5.91, correspondingly, thereby become broken;

the transformers: 5.8 and 5.9, having the broken cores: 5.81 and 5.91, correspondingly, become functioning as permanent electro-magnets. It is expected that the magnetic field strength $H_{5.87}$ in the gap 5.87 is weaker than the magnetic field strength $H_{5.97}$ in the gap 5.97, because the cross-section of gap 5.87 is wider than the cross-section of gap 5.97; this follows from the equation of continuity applied to the magnetic flux. In other words, the identical primary electro-conductive-coil windings: 5.82 and 5.92, encircling identical cross-sections and thereby playing the role of identical magnetizing compressors, result in different magnetic properties of the permanent electro-magnets, called magnet-jet engines: 5.8 and 5.9, wherein the difference in magnetic properties between the magnet-jet engines: 5.8 and 5.9, is determined by the difference in cross-sectional varying of the broken cores: 5.81 and 5.91. The magnetic strength difference ($H_{5.97}-H_{5.87}$), accompanied by the magnetic field energy difference, is acquired at the expense of the electron gas temperature, i.e., at the final analysis, at the expense of the ambient temperature.

Convergent-Divergent Jet-Nozzle

FIG. 6a is a schematic illustration of a convergent-divergent jet-nozzle 610, pipe-section in a sagittal plane. Convergent-divergent jet-nozzle 610 is applied to accelerate a compressed and hot air stream, or more generally, a laminarly flowing compressed and hot compressible-expandable fluid 611. Convergent-divergent jet-nozzle 610 has the inner tunnel opposite walls shaped, for simplicity, axis-symmetrically around an imaginary sagittal x-axis 615, as a convergent funnel 612 having open inlet, narrow throat 613 comprising point 618 of the narrowest cross-section, and divergent exhaust tailpipe 614 having open outlet, constructed according to an exemplary embodiment of the present invention providing the improved de Laval jet-effect. For simplicity, compressed and hot fluid stream 611 has a uniform front at the inlet.

For the purposes of the present patent application, the de Laval effect should be understood in a wide sense as comprising both: the de Laval jet-effect, defined as an effect of flow extra-acceleration, and the de Laval retarding-effect, defined as an effect of flow extra-slowing. Thus, the de Laval jet-effect is a particular case of the de Laval effect.

The specifically shaped tunnel, comprising the three major successive constituents: convergent funnel 612 having an open inlet, narrow throat 613, and divergent exhaust tailpipe 614 having an open outlet, has no real separation features between the constituents. For the purposes of the present patent application, first, narrow throat 613 is specified as a fragment of the inner tunnel located between imaginary inlet 6131 and outlet 6132; and second, the term "principal interval" of the x-axis is introduced as corresponding to the interval occupied by the specifically shaped tunnel, called an adapted convergent-divergent tunnel, i.e. at least comprising narrow throat 613.

Fluid stream 611 is subjected to the Coanda-effect, observed as aligning of fluid stream 611 with the curvature of specifically shaped walls of the inner tunnel. The Coanda-effect is defined by a non-zero partial pressure-c $P_c$ arising when the shape of a fluid portion is varying as the fluid portion moves along the shaped inner tunnel of convergent-divergent jet-nozzle 610. Looking ahead, point out that the specific shape of tunnel, constructed according to the principles of the present invention, prevents disturbances of the fluid motion. This stipulation corresponds to the case when the cumulative-inner-static-pressure P of streaming fluid 611 is varying gradually and the velocity of streaming fluid 611 is varying linearly as the fluid 611 moves within the shaped tunnel along imaginary sagittal x-axis 615.

For simplicity, imaginary sagittal x-axis 615 is horizontal, i.e. moving fluid 611 does not change its effective height above the Earth's ocean surface level. Thus, equations (5.6) and (5.7) for a stationary laminar flow can be written as (6.1) and (6.2) correspondingly:

$$udu+dQ=0 \qquad \text{Eq. (6.1),}$$

$$upA=C=\text{Const} \qquad \text{Eq. (6.2),}$$

where C is a constant associated with the considered fluid portion, and values A, u, and ρ are associated with the flow cross-section: A is the flow cross-section area, u is the flow velocity, and ρ is the fluid density. Introduce value of volume of unit mass v, defined as v=1/ρ.

The fluid characteristic heat portion per unit mass is defined as Q=P/ρ=Pv, so dQ=vdP+Pdv, where $P=P_{in}=P_s+P_{drag}+P_{viscous}$. Therefore, equation (6.1) can be represented as $$udu+vdP+pdv=0 \qquad \text{Eq. (6.3a).}$$

Dividing (6.3a) by Pv, one obtains:

$$\frac{udu}{Pv} + \frac{dP}{P} + \frac{dv}{v} = 0, \quad \text{Eq.(6.3b)}$$

and so, $$\frac{dv}{v} = -\frac{udu}{Pv} - \frac{dP}{P}. \quad \text{Eq.(6.3)}$$

Rewrite equation (6.2) as:

$$uA = Cv \quad \text{Eq. (6.4a)}.$$

and further in differential form as:

$$Adu + udA = Cdv \quad \text{Eq. (6.4b)}.$$

Divide the left and right sides of (6.4b) by the left and right sides of (6.4a) correspondingly:

$$\frac{du}{u} + \frac{dA}{A} = \frac{dv}{v}. \quad \text{Eq.(6.4)}$$

Referring to equation (5.8a) for a real molecular fluid undergoing a reversible adiabatic process, one can write: $Pv^\gamma = \text{Const}$, or in differential form:

$$v^\gamma dP + \gamma P v^{\gamma-1} dv = 0 \quad \text{Eq. (6.5a)}.$$

Dividing (6.5a) by $\gamma P v^\gamma$, one obtains:

$$\frac{dv}{v} = -\frac{dP}{\gamma P}. \quad \text{Eq.(6.5)}$$

Comparing (6.5) and (6.3), one can write:

$$-\frac{udu}{Pv} - \frac{dP}{P} = -\frac{dP}{\gamma P}, \quad \text{Eq.(6.6a)}$$

i.e.

$$-\frac{udu}{Pv}\frac{\gamma u}{\gamma u} = -\frac{dP}{\gamma P} + \frac{\gamma}{\gamma}\frac{dP}{P}. \quad \text{Eq.(6.6b)}$$

The denominator of the left side of (6.6b) comprises value ($\gamma Pv$) that defines velocity of sound via equation $u_{sound} = \sqrt{\gamma Pv}$, so (6.6b) can be rewritten as:

$$-\frac{\gamma u^2}{u_{sound}^2}\frac{du}{u} = \frac{\gamma - 1}{\gamma}\frac{dP}{P}. \quad \text{Eq.(6.6c)}$$

Introducing the value $M = u/u_{sound}$ having the meaning of the fluid portion velocity measured in Mach numbers, i.e. M-velocity, (6.6c) can be written as:

$$-\gamma M^2 \frac{du}{u} = \frac{(\gamma - 1)}{\gamma}\frac{dP}{P}. \quad \text{Eq.(6.6)}$$

Now comparing (6.5) and (6.4), one gets:

$$\frac{dP}{\gamma P} = -\frac{dA}{A} - \frac{du}{u}. \quad \text{Eq.(6.7)}$$

Substituting the expression for $dP/\gamma P$ from (6.7) into (6.6), one obtains:

$$-\gamma M^2 \frac{du}{u} = (\gamma - 1)\left(-\frac{dA}{A} - \frac{du}{u}\right)$$

and after simple algebraic transformations one formulates:

$$\frac{dA}{A} = \left(\frac{\gamma}{\gamma - 1}M^2 - 1\right)\frac{du}{u}. \quad \text{Eq.(6.8)}$$

Equation (6.8) comprises the term $M^2\gamma/(\gamma-1)$ characterizing the effect of the gas compressibility and expandability. Equation (6.8) differs from classical equation (1b) derived from the Euler equations applied to an ideal fluid defined in frames of the continuum mechanics. In particular, equation (6.8) says that: if the horizontally moving flow is relatively slow (i.e. $M < \sqrt{(\gamma-1)/\gamma}$), then the narrowing of the flow cross-section (i.e. negative dA) corresponds to acceleration of the flow (i.e. positive du); and if the flow is relatively fast (i.e. $M > \sqrt{(\gamma-1)/\gamma}$), then just the widening of the flow cross-section (i.e. positive dA) corresponds to acceleration of the flow (i.e. positive du). This means, in particular, that at so-called "critical condition" point 680 defined for the narrowest throat of the de Laval nozzle, the flow specific M-velocity equals $$M_* = \sqrt{(\gamma-1)/\gamma} \quad \text{Eq. (6.9)}.$$

For the purposes of the present patent application, here and further, the lower index "*" is applied to an M-velocity, geometrical and thermodynamic parameters in a critical condition point.

For air as a diatomic molecular gas, the generalized adiabatic compressibility parameter $\gamma$ equals $\gamma = 7/5 = 1.4$, and $M_* = \sqrt{(\gamma-1)/\gamma} \approx 0.5345$ Mach, but not 1 Mach as follows from classical equation (1b). For a gas composed of multi-atomic molecules, the generalized adiabatic compressibility parameter $\gamma$ is closer to 1, and so the de Laval jet-effect is expected at lower M-velocities. In a particular case of an almost incompressible liquid, the generalized adiabatic compressibility parameter $\gamma$ is extremely great and equation (6.8) comes close to classical equation (1 b), for which $M_* = 1$ Mach.

In many actual and imaginary applications the phenomenon of shock sound-wave emission, that arises at M-velocities near 1 Mach, is undesirable or unacceptable. Therefore, the conclusion of resulting equation (6.8), that the de Laval jet-effect begins from the velocity being substantially lower than the speed of sound, becomes important to provide for a utilization of this useful effect avoiding the phenomenon of shock sound-wave emission.

Now consider the case where a compressed and/or heated gas, defined by the stagnation parameters: pressure $P_0$, density $\rho_0$, and temperature $T_0$, is launching into a convergent-divergent jet-nozzle. Let the stagnation pressure $P_0$, temperature $T_0$, and density $\rho_0$ be much high to provide the specific M-velocity $M_* = \sqrt{(\gamma-1)/\gamma}$ at the narrowest cross-section of the throat. The gas characteristic heat portion per unit mass, expressed in terms of the gas temperature, is: Q=RT. Substitution of this expression into (6.1) gives:

$$T_0 = T + \frac{u^2}{2R} = T\left(1 + M^2 \frac{\gamma}{2}\right) \qquad \text{Eq.(6.10)}$$

where $T_0$ is the stagnation temperature; T is the gas portion current temperature; $u_{sound}=\sqrt{\gamma Pv}=\sqrt{\gamma RT}$, and $M=u/u_{sound}=u/\sqrt{\gamma RT}$. Though the normalized value M depends on temperature, one retains the form of equation (6.10) expressed via M, because the value of M=1 Mach has the physical sense of the shock sound-wave emission condition. Taking into account relations between thermodynamic parameters in an adiabatic process, equation (6.10) can be rewritten as:

$$\frac{T_0}{T} = \left(\frac{P_0}{P}\right)^{\frac{\gamma-1}{\gamma}} = \left(\frac{\rho_0}{\rho}\right)^{\gamma-1} = 1 + M^2\frac{\gamma}{2} \qquad \text{Eq.(6.11)}$$

where P and ρ are the current static pressure and density correspondingly.

It is important to introduce the ratio $A/A_*$, where $A_*$ is the narrowest cross-sectional area of the nozzle throat, i.e. is the critical condition area corresponding to the critical condition point, and A is the current cross-sectional area. It follows from (6.2) that $$\frac{A}{A_*} = \frac{\rho_* u_*}{\rho u} \qquad \text{Eq.(6.12)}$$

Taking into account (6.11) and that the specific M-velocity equals $M_*=\sqrt{(\gamma-1)/\gamma}$, the ratio $A/A_*$ can be expressed via M-velocity:

$$\frac{A}{A_*} = \frac{1}{M}\left(\frac{\gamma-1}{\gamma}\right)^{\frac{1}{2}}\left(\frac{2+\gamma M^2}{\gamma+1}\right)^{\frac{\gamma+1}{2(\gamma-1)}} \qquad \text{Eq.(6.13)}$$

Equation (6.13) derived from the equation of continuity for an adiabatic process is the equation of M-velocity, bonding the generalized adiabatic compressibility parameter γ, M-velocity M, and ratio $A/A_*$ of the molecular fluid, fast and laminarly flowing through the de Laval nozzle, oriented horizontally. Equation (6.13) differs from classical equation (1) derived basing on the Euler equations applied to an ideal fluid defined in frames of the continuum mechanics. Equation (6.13), as one of the primary teachings of the present invention, says that to accelerate a warmed and compressed air portion up to 1 Mach, one must apply a convergent-divergent jet-nozzle and provide the nozzle inner tunnel divergent part expansion up to the ratio of $A/A_* \approx 1.5197$. Considering an essential M-velocity range, specified as an M-velocity range comprising M-velocities corresponding to the flow passing through the principal interval, equation (6.13) can be applied to make an ideal shape of the nozzle to provide for a laminar motion and thereby optimize the acceleration of the streaming fluid at least in the essential M-velocity range, i.e. at least within the specifically shaped tunnel. In contrast to the prior art concept of rapid expansion and acceleration of the gas, described hereinbefore with reference to FIGS. 1c and 1d, that causes the arising of undesired Mach waves, the substantially gradual (or linear) increase of the M-velocity downstream along the gas motion accompanied by the interrelated gradual (or linear) change of fluid thermodynamic parameters, is a criterion of the nozzle inner tunnel shape optimization preventing turbulences and, in particular, providing suppression of the undesired Mach waves, according to an exemplary embodiment of the present invention.

Further, for the purposes of the present patent application, use of the equation of M-velocity (6.13) assumes an inherent condition of a gradual change of the fluid thermodynamic parameters. So, axis-symmetrical convergent-divergent jet-nozzle 610, comprising specifically shaped convergent funnel 612 having an open inlet, narrow throat 613, and divergent exhaust tailpipe 614 having an open outlet, is designed according to equation (6.13), where the value M corresponds to x-coordinates along imaginary x-axis 615 as a smooth function M(x). In particular, a linear function $\overline{M}(x)$ was chosen as a desired for M(x), i.e. $M(x)=\overline{M}(x)=M_*+\alpha_M(x-x_*)$, where x is the x-coordinate at x-axis 615, and $\alpha_M$ is a positive constant defining a scale factor and having a sense of constant gradient of M-velocity spatial distribution, i.e. $\alpha_M=\partial\overline{M}(x)/\partial x$. Such a relationship enables a substantially smoothed increase of M-velocity as the fluid moves through the specifically shaped tunnel of convergent-divergent jet-nozzle 610. The linear increase of M-velocity prevents substantially the arising of streaming fluid 611 motion disturbances, accompanied by shock waves.

In contrast to a jump-like sharp slope, the gradual change of the M-velocity and so of all the interrelated thermodynamic parameters is one of the primary features of the de Laval jet-effect improvement.

For the purposes of the present patent application, the term "de Laval enhanced jet-effect" or briefly: "enhanced jet-effect" is introduced as relating to the modified de Laval jet-effect, occurring in a convergent-divergent tunnel having a specifically revised shape according to the principles of the present invention, such that the modified de Laval jet-effect becomes improved by smoothing of the fluid thermodynamic parameters spatial distribution, providing the following beneficial features:

smoothing of the flowing fluid M-velocity, providing suppression of the undesired flow disturbances accompanied by shock waves;
 smoothing of the flowing fluid static pressure, providing suppression of the undesired Mach waves and, thereby, suppression of nearby body vibrations;
 smoothing of the flowing fluid temperature, providing suppression of adjacent surface tensions; and
 smoothing of the flowing fluid density, providing suppression of shock waves.

Also, the term "de Laval-like jet-effect" should be understood in a wider, sense including a case when an enhanced jet-effect occurs in an open space imaginably bordered by the flow streamlines, wherein the imaginary borders constitute a convergent-divergent shape, i.e. similar to a de Laval nozzle.

If the exhaust tailpipe 614's outlet area is $A_e$, the ratio $A_e/A_*$ defines the nozzle expansion ratio that can be optimized in accordance with the estimations described hereinbelow with reference to FIGS. 7a, 7b, 7c. Thereby, a convergent-divergent jet-nozzle, constructed applying equation (6.13) according to an exemplary embodiment of the present invention, allows a use of the de Laval enhanced jet-effect to accelerate incoming compressed and hot airstream 611 moving with low M-velocities to obtain outflowing accelerated and cooled jetstream 616, reaching high M-velocities [i.e. M-velocities, higher than the specific M-velocity $M_*=\sqrt{(\gamma-1)/\gamma}$], in particular, high-subsonic velocities.

Figure 6B:
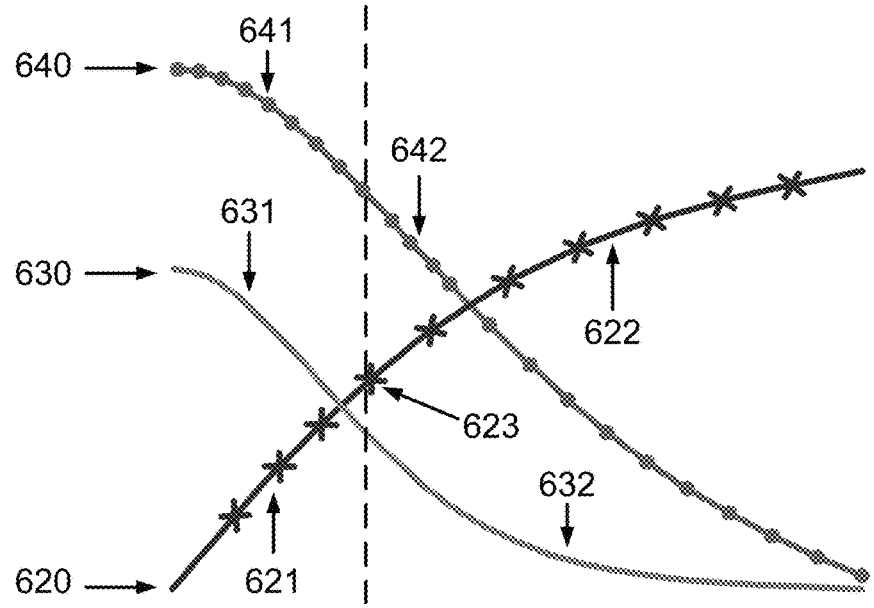
FIG. 6b is a graphical representation of air velocity, static pressure, and temperature distributions along an optimized convergent-divergent jet-nozzle, constructed according to the principles of the present invention.

FIG. 6b, in conjunction with FIG. 6a, is a schematic graphic illustration of the distribution of the flowing fluid 611's three parameters: velocity 620, static pressure 630, and temperature 640 along the length of nozzle 610, constructed according to the principles of a preferred embodiment of the present invention. The narrowest cross-section of the throat 613 (FIG. 6a) provides the "critical condition" point 618. Compressed and hot fluid 611 flows through throat 613, where the velocity picks up 621 such that M-velocity reaches the specific M-velocity $M_*=\sqrt{(\gamma-1)/\gamma}$ 623 at the critical condition point 618. Ahead of the critical condition point 618, the pressure and temperature fall, correspondingly 631 and 641. Hot flowing fluid 611 crosses the critical condition point 618 and enters the widening stage of throat 613 and further divergent exhaust tailpipe 614 having an open outlet. Flowing fluid 611 expands there, and this expansion is optimized such that the extra-increase of M-velocity 622 is substantially smoothed; and the pressure and temperature extra-decrease, 632 and 642, correspondingly, are substantially smoothed as well, in contrast to that at the critical condition point 180 with reference to the classic prior art rocket nozzle 100 of FIGS. 1c, 1d. The smoothed change of static pressure 630 provides a suppression of unwanted Mach waves. In practice, the suppression of Mach waves provides a suppression of undesired vibrations that, in particular, especially important for fast accelerating vehicles.

In view of the foregoing description referring to FIG. 6a, it will be evident to a person skilled in the art that one can use different criteria of gradualness of M(x) for different preferred optimizations of the convergent-divergent shape of a tunnel. Namely, the conditions, providing laminarity of the airstream motion, are:

- if suppression of Mach waves and of body vibrations are the most preferable, then M(x) should be given as the function $M(x)=\sqrt{2\{[P_0/\overline{P}(x)]^{(\gamma-1)/\gamma}-1\}/\gamma}$, where $\overline{P}(x)$ is a linear function of the static pressure vs. x-coordinate: $\overline{P}(x)=P_*+\alpha_P(x-x_*)$, $P_*$ is the static pressure of the flowing fluid at the critical condition point $x_*$, and $\alpha_P=\partial\overline{P}(x)/\partial x$ is a constant gradient of the static pressure distributed along the x-axis within a specially shaped tunnel; and FIG. 6c is a schematic illustration of an exemplary profile of an optimized specifically shaped tunnel providing a linear change of the flowing fluid static pressure corresponding to the essential M-velocity range comprising M-velocities from 0.02 up to 2 Mach;
- if the suppression of temperature jumps is the most preferable, then M(x) should be given as the function $M(x)=\sqrt{2\{[T_0/\overline{T}(x)]-1\}/\gamma}$, where $\overline{T}(x)$ is a linear function of the fluid temperature vs. x-coordinate: $\overline{T}(x)=T_*+\alpha_T(x-x_*)$, $T_*$ is the temperature of the flowing fluid at the critical condition point $x_*$, and $\alpha_T=\partial\overline{T}(x)/\partial x$ is a constant gradient of the fluid temperature distributed along the x-axis within a specially shaped tunnel; and FIG. 6d is a schematic illustration of an exemplary profile of an optimized specifically shaped tunnel providing a linear change of the flowing fluid temperature corresponding to the essential M-velocity range comprising M-velocities from 0.02 up to 2 Mach; and
- if a trade-off between suppressions of Mach waves and temperature jumps is preferable, then M(x) should be given as the function $M(x)=\sqrt{2\{[\rho_0/\overline{\rho}(x)]^{(\gamma-1)}-1\}/\gamma}$, where $\overline{\rho}(x)$ is a linear function of the fluid density vs. x-coordinate: $\overline{\rho}(x)=\rho_*+\alpha_\rho(x-x_*)$, $\rho_*$ is the density of said flowing fluid at the critical condition point $x_*$, and $\alpha_\rho=\partial\overline{\rho}(x)/\partial x$ is a constant gradient of the fluid density distributed along the x-axis within a specially shaped tunnel; and FIG. 6e is a schematic illustration of an exemplary profile of an optimized specifically shaped tunnel providing a linear change of the flowing fluid density corresponding to the essential M-velocity range comprising M-velocities from 0.02 up to 2 Mach.

Further, for the purposes of the present invention, the term "airfoil" or "actually-airfoil" should be understood as related to a wall shape and as specifying a convergent-divergent shape of a flow portion's streamlines aligned to the airfoil wall, wherein, in contrast to a seemingly-airfoil shape, the convergent-divergent shape calls for the differential equation of motion (6.8), equation of M-velocity (6.13), and at least one of the aforementioned conditions for the function M(x), thereby providing laminarity of the flow portion motion.

Furthermore, it will be evident to a person skilled in the art that:

- One can optimize the specifically shaped tunnel of convergent-divergent jet-nozzle 610 providing such conformity of the cross-sectional area of the open inlet with the M-velocity of flowing fluid crossing the open inlet, that the flowing fluid M-velocity is substantially smooth at the entering the open inlet. Moreover, one can control the cross-sectional area of the open inlet, according to the equation of M-velocity, providing conformity of the open inlet cross-sectional area with the variable M-velocity of the entering flowing fluid afore-and-nearby the open inlet. This may become important, for example, to suppress vibrations of a fast accelerating vehicle; and
- As soon as the de Laval effect occurs in an adiabatic process, the condition of fluid stream 611 motion through the narrowest cross-section of throat 613 at critical condition point 618 with the specific M-velocity $M_*=\sqrt{(\gamma-1)/\gamma}$ 623, accompanied by thermodynamic parameters: static pressure $P_*$, temperature $T_*$, and fluid density $\rho_*$, interrelates with a condition of fluid stream 611 motion with an M-velocity and accompanied thermodynamic parameters static pressure P, temperature T, and fluid density p at any cross-section of convergent-divergent jet-nozzle 610's inner tunnel, wherein the conditions interrelation depends on the tunnel geometry only. In other words, if a hypothetical ideal propeller pushing a hypothetic inviscid fluid provides the inviscid fluid laminar flow with the specific M-velocity $M_*=\sqrt{(\gamma-1)/\gamma}$ at the critical condition point of a de Laval nozzle, then the de Laval effect becomes triggered in the de Laval nozzle of a fanjet engine, wherein the thermodynamic parameters of the moving inviscid fluid portions are interrelated as in an adiabatic process. In this case, the hypothetical propeller triggering the de Laval effect expends power for the launching of accompanying shock and/or Mach waves only.

In view of the foregoing description referring to FIG. 6a, it will be also evident to a person skilled in the art that:

- In a more general case, when imaginary sagittal axis 615 is oriented at least partially in the vertical direction in the Earth's gravitational field, the equation of M-velocity should be corrected becoming different from equation (6.13) by a component depending on the gravitational acceleration g, namely:

$$\frac{A}{A_*} = \frac{M_*}{M} \left( \frac{1 + \frac{\gamma}{2}M^2 + \frac{g\Delta h}{RT}}{1 + \frac{\gamma}{2}M_*^2} \right)^{\frac{\gamma+1}{2(\gamma-1)}}, \qquad \text{Eq.(6.14)}$$

where Δh is a change of the flow effective height with respect to the critical condition point. It will be further evident to a person skilled in the art that, when the considered temperatures and M-velocities are sufficiently high to provide for the conditions: gΔh/RT<<1 and gΔh/RT<<γM²/2 to be satisfied, a use of the equation of M-velocity in the form of equation (6.13) becomes justified;

Taking into account molecular interactions for flowing liquid or plasma, for which changes of the partial deep-stagnation pressure-a δP_a become at least noticeably distributed in space, the generalized adiabatic compressibility parameter y in the equation of M-velocity (6.13) is not a constant, but varies with the changes of the partial deep-stagnation pressure-a δP_a, in a conformance with equations (5.8b) and (5.8c);

If the flowing molecular fluid is an ionized gas, i.e. plasma, controlled by an external magnetic field, then the specifically shaped walls of tunnel can be imaginary, formed by streamlines of the flowing plasma subjected to and controlled by an action of the magnetic field; and According to the kinetic theory of matter, a substantial incompressible molecular fluid, characterized by almost not changeable thermodynamic parameters: density, temperature, and inner-static-pressure and characterized by the infinitely great generalized adiabatic compressibility parameter γ→∞, cannot change its cross-sectional area substantially, and so, according to equation of M-velocity (6.13), cannot flow laminarly through a horizontal tunnel having a varying cross-sectional area; and furthermore, strictly speaking, a hypothetical absolutely-incompressible molecular fluid cannot flow through a converging tunnel at all. This is a theoretically important teaching of the present invention.

De Laval Retarding-Effect

Figure 6F:
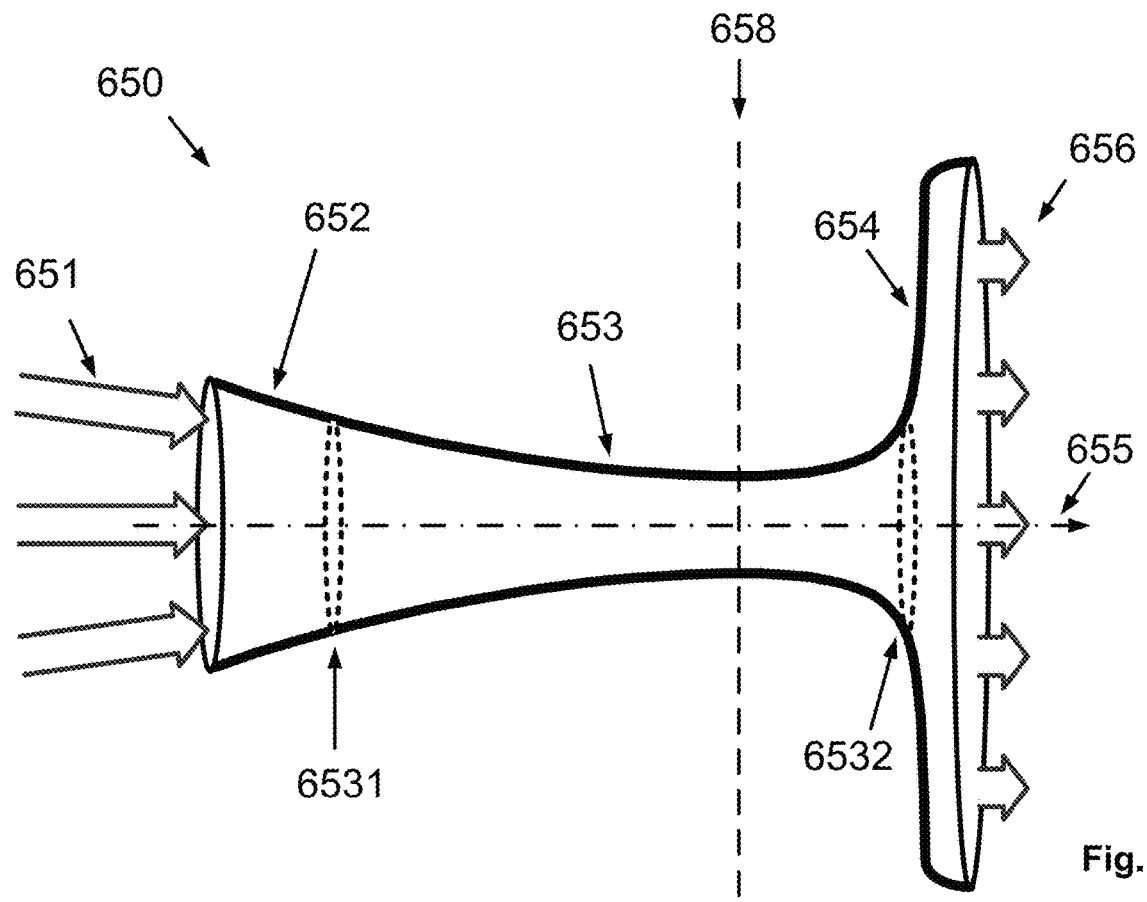
FIG. 6f is a schematic illustration of an optimized inverse convergent-divergent jet-nozzle, constructed according to the principles of the present invention.

FIG. 6f is a schematic illustration of an inverse convergent-divergent jet-nozzle 650, pipe-section in a sagittal plane. Convergent-divergent jet-nozzle 650, constructed according to the principles of a preferred embodiment of the present invention, as inverse de Laval nozzle, applied to retard a fast fluid-flow 651, streaming with a high M-velocity$_{M651}$, higher than the specific M-velocity $M_*=\sqrt{(\gamma-1)/\gamma}$. Convergent-divergent jet-nozzle 650 has the sectional shape mirror-symmetrically congruent to the sectional shape of convergent-divergent jet-nozzle 610, shown in FIG. 6a, and oriented to oncoming fluid-flow 651 in the back direction. Namely, the shape is axis-symmetrical around an imaginary sagittal axis 655; convergent funnel 652 having open inlet is as inverse divergent exhaust tailpipe 614; narrow throat 653 comprises point 658 of the narrowest cross-section; and divergent exhaust tailpipe 654 is as inverse convergent funnel 612. Convergent funnel 652, narrow throat 653, and divergent exhaust tailpipe 654 have not real separation features between them. For the purpose of the present patent application narrow throat 653 is specified as a fragment of the inner tunnel having imaginary inlet 6531 and outlet 6532, wherein the term "principal interval" of x-axis has a sense as corresponding to the interval occupied by the specifically shaped tunnel, i.e. at least comprising narrow throat 653.

Figure 6G:
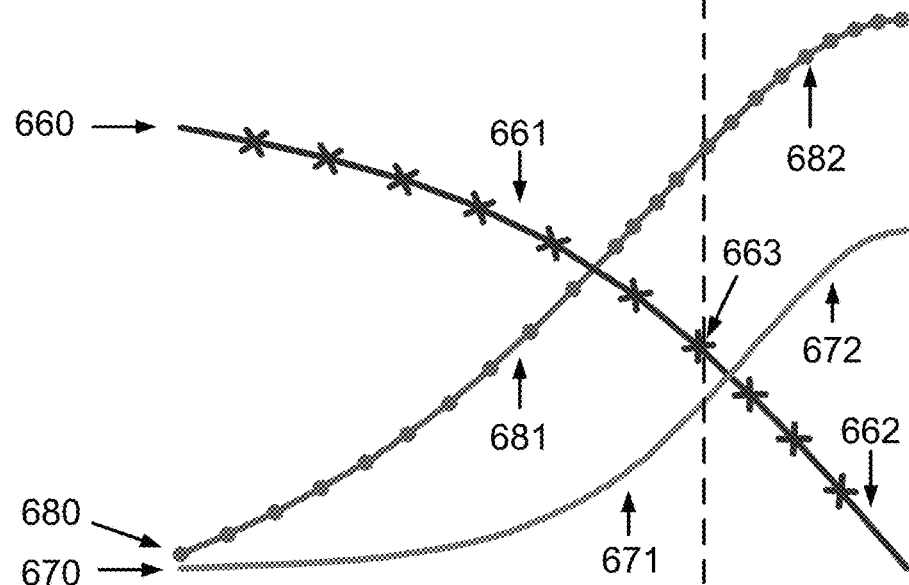
FIG. 6g is a graphical representation of air velocity, static pressure, and temperature distributions along an optimized inverse convergent-divergent jet-nozzle, constructed according to the principles of the present invention.

FIG. 6g, in conjunction with FIG. 6f, is a schematic graphic illustration of the distribution of the fluid 651's three parameters: velocity 660, static pressure 670, and temperature 680 along the length of nozzle 650 calculated according to equations (6.11) and (6.13).

The narrowest cross-section of the throat 653 (FIG. 6f) provides the "critical condition" point 658, triggering the inverse de Laval jet-effect, according to equation (6.13), that is observed as an effect of flow slowing, when the flow moves along convergent funnel 652, and further slowing, when the flow moves through the divergent stage of convergent-divergent jet-nozzle 650 downstream-behind the critical condition point 658. For the purposes of the present patent application, the term "de Laval retarding-effect" is introduced as relating to the inverse de Laval jet-effect. Fast fluid-flow 651 moves along convergent funnel 652, where, ahead of the critical condition point 658 of narrow throat 653, the velocity falls 661, and the pressure and temperature pick up, correspondingly 671 and 681. The velocity falls 661 such that M-velocity $M_{663}$, corresponding to marker 663, reaches the specific M-velocity $M_*=\sqrt{(\gamma-1)/\gamma}$ at the critical condition point 658. Fluid-flow 651 exits throat 653 and enters the widening divergent exhaust tailpipe 654, where fluid-flow 651 is subjected to increase of cross-sectional area, and this action is optimized such that the decrease of M-velocity 662 is accompanied by a substantially smoothed increase of the pressure and temperature, 672 and 682, correspondingly. Slow hot and compressed fluid at position 656 outflows from wide exhaust tailpipe 654. Again, the smoothed change of static pressure 670 provides a suppression of unwanted Mach waves. In practice, the suppression of Mach waves provides a suppression of undesired vibrations that, in particular, especially important for a fast decelerating flying vehicle.

In view of the foregoing description referring to FIGS. 6f and 6g, it will be evident to a person skilled in the art that, on the one hand, to trigger the de Laval retarding-effect the high M-velocity $M_{651}$ must be low sufficient to reach the specific M-velocity $M_*$ while slowing in convergent funnel 652 and the convergent stage of throat 653. On the other hand, taking into account that, in practice, for the case wherein fluid-flow 651 is an airflow, the M-velocity is distributed in the direction normal to an adjacent surface such that decreases almost down to zero at the surfaces of convergent-divergent jet-nozzle 650's walls. Thus, a certain portion of fast fluid-flow 651 at the critical condition point 658 moves with the effective M-velocity equal to the specific M-velocity $M_*$ and is subjected to a convergent-divergent reshaping in throat 653, thereby, the conditions for the de Laval retarding-effect triggering is satisfied for any high M-velocity $M_{651}$, higher than the specific M-velocity $M_*$.

In view of the foregoing description referring to FIGS. 6a, 6b, 6f and 6g and derivation of equations (6.8) and (6.9), the de Laval jet-effect and the de Laval retarding-effect, both observed in the case of a converging flow, are specified as the following. The de Laval jet-effect is specified as an effect of a convergent flow portion convective acceleration, occurring, when the convergent flow portion moves with M-velocities lower than the specific M-velocity upstream-afore the critical condition point, reaches the specific M-velocity at the critical condition point, and moves with M-velocities higher than the specific M-velocity downstream-behind the critical condition point; and the de Laval retarding-effect is specified as an effect of a convergent flow portion warming and slowing, occurring, when the convergent flow portion moves with M-velocities higher than the specific M-velocity upstream-afore the critical condition point, reaches the specific M-velocity at the critical condition point, and moves with M-velocities lower than the specific M-velocity downstream-behind the critical condition point.

For the purposes of the present patent application, the terms "Venturi M-velocity", "de Laval M-velocity", "de Laval low M-velocity", and "de Laval high M-velocity" should be understood as the following:

- a Venturi M-velocity is defined as an M-velocity, lower than the specific M-velocity $M_*$ and low sufficient to cross a narrow throat with said M-velocity, lower than the specific M-velocity $M_*$;
- a de Laval low M-velocity is defined as an M-velocity lower than the specific M-velocity $M_*$ and high sufficient to reach the specific M-velocity $M_*$ at the critical condition point $x_*$;
- a de Laval high M-velocity is defined as an M-velocity higher than the specific M-velocity $M_*$ and low sufficient to reach the specific M-velocity $M_*$ at the critical condition point $x_*$; and
- a de Laval M-velocity is at least one of the de Laval low M-velocity and the de Laval high M-velocity.

In view of the foregoing description referring to FIGS. 6f and 6g, it will be evident to a person skilled in the art that one can optimize the specifically shaped tunnel of convergent-divergent jet-nozzle 650 providing such a conformity of the cross-sectional area of the open inlet with the de Laval high M-velocity of flowing fluid crossing the open inlet, that the flowing fluid M-velocity is substantially smooth at the entering the open inlet. Furthermore, one can control the cross-sectional area of open inlet, according to the equation of M-velocity, providing conformity of the open inlet cross-sectional area with the variable M-velocity of the entering flowing fluid. This may become important, for example, to suppress vibrations of a fast slowing vehicle.

Two-Stage Convergent-Divergent Jet-Nozzle

Figure 6H:
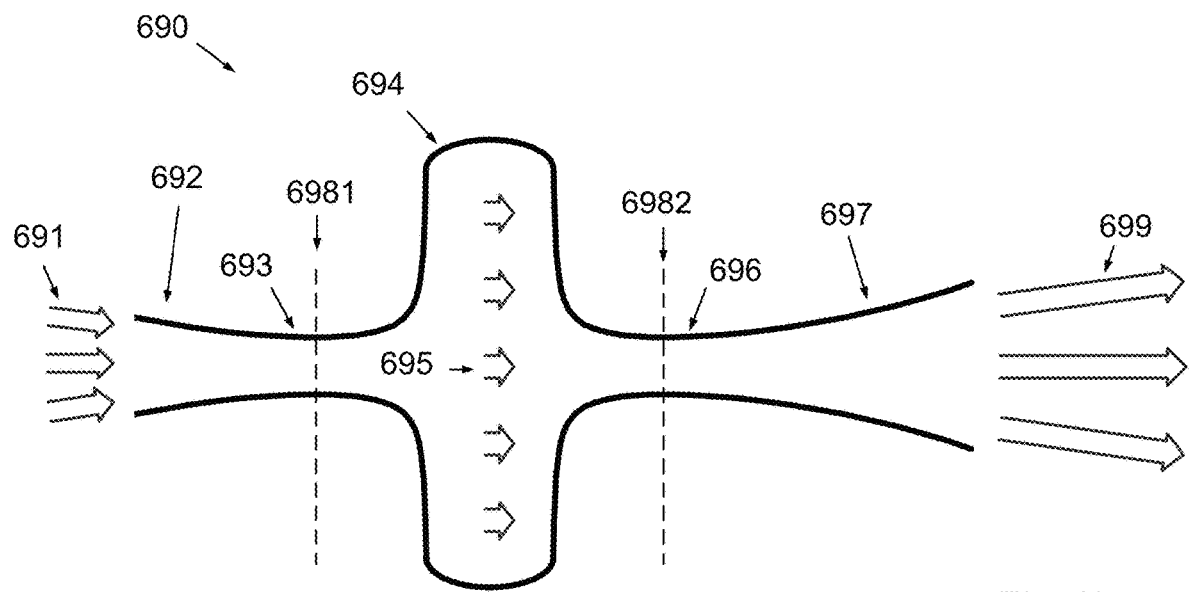
FIG. 6h is a schematic illustration of a two-stage convergent-divergent jet-nozzle, constructed according to the principles of the present invention.

FIG. 6h is a schematic illustration of a two-stage convergent-divergent jet-nozzle 690 exposed to an incoming fast fluid-flow 691, streaming with a high M-velocity $M_{691}$, higher than the specific M-velocity $M_*=\sqrt{(\gamma-1)/\gamma}$, i.e. with a de Laval high M-velocity. Two-stage convergent-divergent jet-nozzle 690, constructed according to the principles of a preferred embodiment of the present invention, has an inner tunnel comprising the first and second convergent-divergent stages, separated by widened reservoir 694. The first convergent-divergent stage performs the first-stage convergent inlet-funnel 692 gradually turning into the first-stage narrow convergent-divergent throat 693 having a local narrowest cross-section providing the first critical condition point 6981 and having an inverse-funnel shaped pipe leading to widened reservoir 694. The second convergent-divergent stage comprises the second-stage narrow throat 696, having a local narrowest cross-section providing the second critical condition point 6982, and the second-stage divergent exhaust tailpipe 697.

Incoming fast fluid-flow 691 is gradually slowing down, becoming warmer and more thickened and compressed as moving along the first convergent-divergent stage to widened reservoir 694 as described hereinbefore with reference to FIGS. 6f and 6g. Slow, hot and compressed fluid 695 further movies through the second convergent-divergent stage. The fluid flow is accelerating as moving through throat 696, where exceeds the specific M-velocity $M_*=\sqrt{(\gamma-1)/\gamma}$ downstream-behind the second critical condition point 6982. Jetstream 699 outflowing through divergent exhaust tailpipe 697, is faster and colder than slow, hot and compressed fluid 695, yet to be entered into the second convergent-divergent stage, as described hereinbefore tracing after incoming compressed and hot airstream 611 with reference to FIGS. 6a and 6b. Fast outflowing jetstream 699 has a cross-section wider than incoming fast fluid-flow 691 at the input of convergent inlet-funnel 692. So, the M-velocity $M_{699}$ of fast outflowing jetstream 699 is higher than the M-velocity $M_{691}$ of fast fluid-flow 691, according to equation (6.13).

Thereby, two-stage convergent-divergent jet-nozzle 690 operates as a jet-booster based on the de Laval enhanced jet-effect launching outflowing jetstream 699, which is faster than fast fluid-flow 691 incoming with the de Laval high M-velocity $M_{691}$, i.e. higher than the specific M-velocity $M_*=\sqrt{(\gamma-1)/\gamma}$. This is one more teaching of the present invention.

Figure 7A:
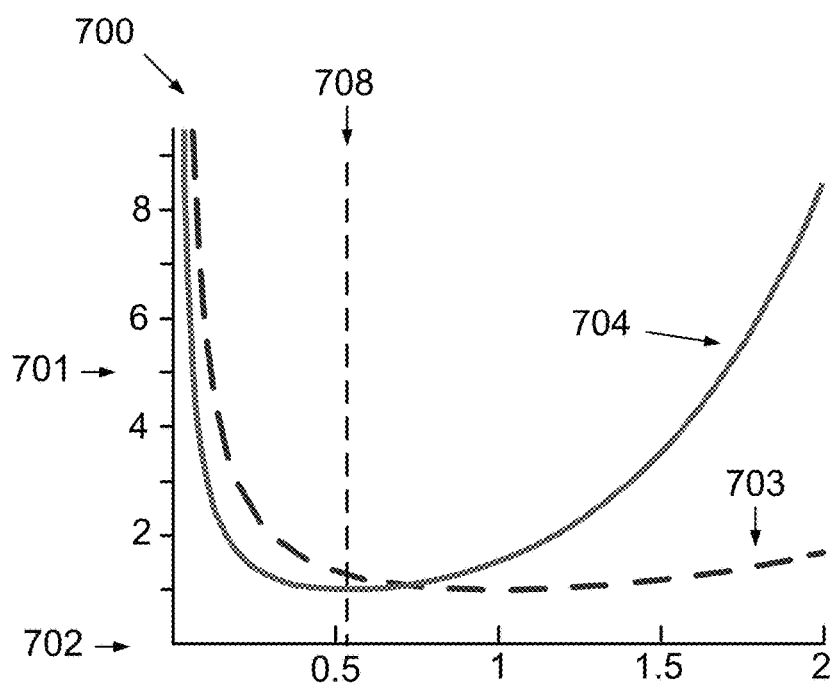
FIG. 7a shows comparative graphs of the dependencies of the nozzle extension ratio vs. the airflow M-velocity, calculated by the classical and suggested models.

Optimal Implementation of Convergent-Divergent Jet-Nozzle FIG. 7a shows comparative graphs 700 for the dependencies of the nozzle tunnel extension ratio vs. the airflow M-velocity, calculated by the classical and suggested models, namely, curves 703 and 704 correspondingly; wherein the vertical axis 701 is the ratio $A/A_*$ and the horizontal axis 702 is the airflow M-velocity measured in temperature dependent Mach numbers. The dashed curve 703 is the convergent-divergent cross-sectional area ratio $A/A_*$ profile vs. the airflow M-velocity, calculated using equation (1) derived from the Euler equations of fluid motion. The solid curve 704 is the convergent-divergent cross-sectional area ratio $A/A_*$ profile vs. the airflow M-velocity, calculated using the suggested equation (6.13) derived from the generalized equations of fluid motion. The critical condition point 708 corresponds to the specific M-velocity $M_*=\sqrt{(\gamma-1)/\gamma}\approx 0.5345$. Comparative graphs 700 show that one needs in a substantially extra-widened nozzle tunnel 704 to reach the airflow M-velocities substantially higher than 1 Mach.

Therefore, a convergent-divergent jet-nozzle, constructed according to an exemplary embodiment of the present invention, allows increased efficiency of the jet-effect for use at high-subsonic, transonic, supersonic, and hypersonic velocities that can be applied to rocket nozzle design.

Taking into account relation (6.11), one can derive equations bonding the exhaust-nozzle outlet M-velocity $M_e$ with the ratios $P_0/P_e$ and $T_0/T_e$, where $P_e$ and $T_e$ are correspondingly the static pressure and temperature at the exhaust-nozzle tunnel outlet:

$$M_e = \sqrt{\frac{2}{\gamma}} \sqrt{\left(\frac{P_0}{P_e}\right)^{\frac{\gamma-1}{\gamma}} - 1} \quad \text{Eq.(7.1a)}$$

$$\frac{P_0}{P_e} = \left(\frac{2+\gamma M_e^2}{2}\right)^{\frac{\gamma}{\gamma-1}} \quad \text{Eq.(7.1b)}$$

$$\frac{T_0}{T_e} = \left(\frac{2+\gamma M_e^2}{2}\right) \quad \text{Eq.(7.1c)}$$

$$\frac{\rho_0}{\rho_e} = \left(\frac{2+\gamma M_e^2}{2}\right)^{\frac{1}{\gamma-1}} \quad \text{Eq.(7.1d)}$$

In contrast to the classical theory, saying that both: the de Laval jet-effect and the velocity of sound are reachable when the ratio $P_0/P_e$ is of 1.893, equation (7.1b) shows that, on the one hand, to obtain the de Laval jet-effect [i.e. condition $M_e \geq M_*$] for air using a nozzle tunnel having an optimal convergent-divergent shape, one must provide the ratio $P_0/P_*$ at least of 1.893, and, on the other hand, to accelerate an air portion up to the velocity of sound [i.e. $M_e=1$], one must provide the ratio $P_0/P_e$ at least of 6.406. Equation (7.1c) says that, on the one hand, to obtain the de Laval jet-effect for air utilizing a nozzle tunnel having optimal convergent-divergent shape, one must provide the ratio $T_0/T_*$ at least of 1.2; and, on the other hand, to accelerate an air portion up to the velocity of sound, one must provide the ratio $T_0/T_e$ at least of 1.7. So, the principle condition either $1.893 < P_0/P_e < 6.406$ or/and $1.2 < T_0/T_e < 1.7$ may provide the de Laval jet-effect occurring without the phenomenon of shock sound-wave emission that is one of the primary principles of the present invention.

Thus, a convergent-divergent jet-nozzle tunnel, constructed according to an exemplary embodiment of the present invention and exploited in accordance with the principle conditions, allows an optimal implementation and efficient use of an enhanced jet-effect at de Laval M-velocities.

Vortex Tube as Convergent-Divergent Jet-Nozzle

Reference is now made again to prior art FIG. 11, showing vortex-tube 190, and FIG. 6a, showing convergent-divergent jet-nozzle 610 constructed according to an exemplary embodiment of the present invention.

Point out that the vortex tube 190's exhaust tunnels to outlets 317 and 318 can be considered as converging and convergent-divergent jet-nozzles correspondingly at heating and cooling ends. Consider, for simplicity, the nozzle effect only at outlet 19.8. Apply estimations (7.1a,b,c) to an ideal construction of vortex tube 190 and take into account the aforementioned conditions of exploitation.

Namely, entering air 310 has the pressure of $P_0=6.9$ bar, while the value $P_e$ is about 1 bar such that $P_0/P_e$ is substantially higher than 1.893 that provides M-velocity of $M_*=\sqrt{(\gamma-1)/\gamma}$ into the "throat" 19.9. Moreover, the estimated ratio $P_0/P_e\approx6.4$ says that if the widening exhaust tunnel, having outlet 19.8 diameter greater than inner diameter 19.9 would be constructed in accordance with an exemplary embodiment of the present invention similar to convergent-divergent jet-nozzle 610 (FIG. 6a) such that $A_e/A_*\approx1.5197$, then outlet 19.8 M-velocity is expected to be approximately of $M_e\approx1$. In this case, it follows from (7.1c) that the reachable temperature ratio is $T_0/T_e=1.7$. I.e., if $T_0=21°$ C.$=294.14°$ K, then $T_e\approx173°$ K$\approx-100°$ C. This estimation shows that:

first, the novel explanation of the well-known vortex-tube effect by the dominant phenomenon occurred in the de Laval convergent-divergent jet-nozzle is confirmed by calculations based on equations (7.1a,b,c); and second, a cooling temperature, substantially lower than the aforementioned "$-34°$ C.", is reachable by optimizing the mentioned outlet convergent-divergent tunnel shape.

Thus, a convergent-divergent jet-nozzle, constructed and exploited according to an exemplary embodiment of the present invention, allows optimizing the efficiency of an enhanced jet-effect use to launch an extra-cooled gas outflow.

Compressor Supplied by Convergent-Divergent Jet-Nozzle

Figure 7B:
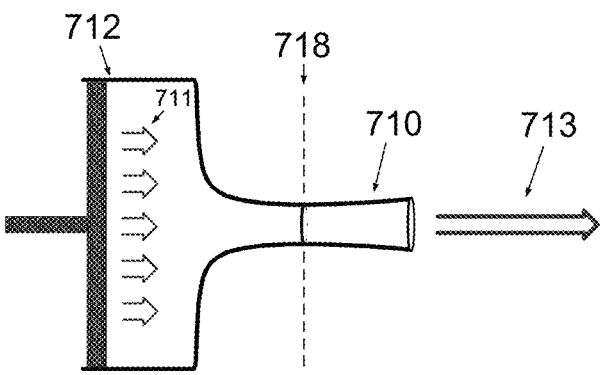
FIG. 7b is a schematic illustration of a compressor supplied by an optimized convergent-divergent jet-nozzle, constructed according to the principles of the present invention.

FIG. 7b is a schematic illustration of a hypothetically optimal convergent-divergent jet-nozzle 710 with the critical condition point 718 applied to accelerate air portion 711, constructed according to the principles of the present invention. Air portion 711 is compressed and heated in a reservoir 712. To compress air portion 711 up to pressure $P_0=6.4$ bar one needs to consume the energy $E_0$ estimated as $(P_0-P_e)V_0$, where $V_0$ is the volume of the gas reservoir 712. For $V_0=1$ m$^3$, the energy $E_0$ is estimated as $E_0\approx5.4\times10^5$ J=540 kJ. The volume $V_0$ is composed of approximately n $(P_0/P_e)\times1000/22.4=286$ moles of gas. When air portion 711 is accelerated and expanded in de Laval-like nozzle 710, it acquires kinetic energy at the expense of thermodynamically related pressure and temperature decrease; wherein the pressure decreases from $P_0$ to $P_e$ and the temperature decreases from $T_0$ to $T_e$. Let air portion 711 accelerate in hypothetically optimal convergent-divergent jet-nozzle 710 such that the velocity of the outflowing stream 713 is almost as the speed of sound, i.e. the exhaust M-velocity is of $M_e\approx1$. Then $T_0/T_e=1.7$ and $(T_0-T_e)=T_0(1-1/1.7)=0.412T_0$. In this case, the acquired kinetic energy equals $K=n\times(T_0-T_e)R$ that is estimated as:

$$K=n\times0.412T_0R\approx286\times0.412\times298\times278\approx9{,}761{,}674 \text{ J}=9{,}762 \text{ kJ}.$$

This estimation shows that the triggered acquired kinetic energy K may exceed the triggering consumed energy $E_0$ at least at subsonic velocities by the factor of 18 times. The acquired kinetic energy can be applied to a vehicle motion or to an engine for electricity generation with positive net-efficiency. On the other hand, the acquiring of kinetic energy is accompanied by the air temperature decrease, therefore, such a convergent-divergent jet-nozzle can be applied to cooling of a vehicle engine as well as be used either for electricity harvesting by means of a Peltier element operating as thermoelectric generator and/or as an effective condenser of vapor to water.

Flying Capsule as Dragging-Jet Engine

Figure 7C:
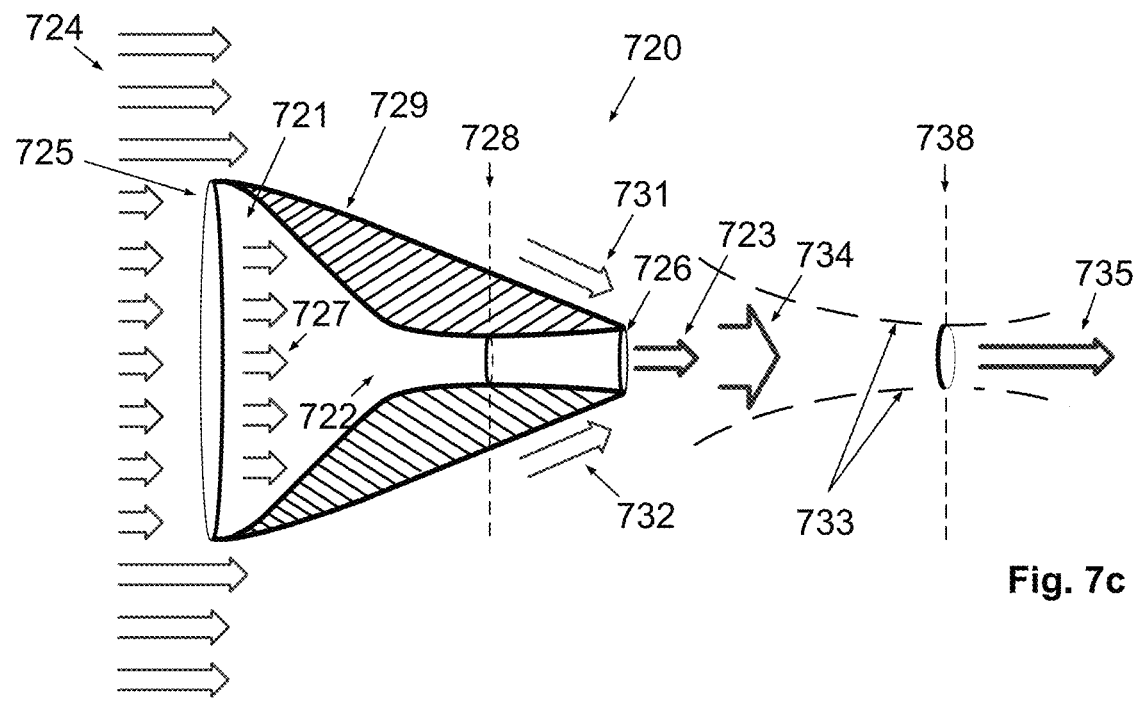
FIG. 7c is a schematic sectional view of a flying capsule, constructed according to the principles of the present invention.

FIG. 7c is a schematic sectional view of a flying capsule corpus 720 in a sagittal plane. Capsule corpus 720, constructed according to the principles of the present invention, has outer airfoil side 729 and comprises an inner converging reservoir 721 as a dragging compressor having an open inlet 725 exposed to ambient wind 724 and further having a hypothetically optimal convergent-divergent tunnel 722 with a narrow throat comprising a critical condition point 728 and divergent exhaust tailpipe having an open outlet 726 of area $A_e$. The velocity of ambient air 724 relative to capsule 720 is $u_a$ which is substantially lower than the critical condition velocity $u_*$, corresponded to the specific M-velocity $M_*=\sqrt{(\gamma-1)/\gamma}$. The wind portion 727 enters the inner converging reservoir 721 with the velocity equal to $u_{in}$. The area $A_{in}$ of inlet 725 is substantially wider than the area A. of the throat's cross-section at the critical condition point 728 such that air portion 727 crosses the area $A_*$ at the critical condition point 728 with the maximal reachable M-velocity equal to the specific M-velocity $M_*=\sqrt{(\gamma-1)/\gamma}$, and so the de Laval enhanced jet-effect is expected in the divergent exhaust tailpipe having outlet 726, where the velocity of outflowing jetstream 723 reaches a value $u_e$ higher than the velocity $u_*$ corresponding to the critical condition point 728. In an exemplary embodiment of the present invention, an optimal shape of tunnel 722 provides that the value $u_e$ is lower than the speed of sound $u_{sound}$. Outflowing jetstream 723 brings the kinetic power acquired at the expense of the flow warmth. The acquired kinetic power of outflowing jetstream 723 may be high as or even become higher than the power consumed to compensate drag, defined by a drag coefficient corresponding to a concave shape of the inner converging reservoir 721, and thereby to maintain the flying velocity $u_a$ of capsule 720. Capsule 720 is interpreted as a motionless dragging-jet engine.

Outer airfoil side 729 of capsule corpus 720 provides laminar-like flowing of wind outer sub-portions 731 and 732, moving adjacent to outer airfoil side 729 and being subjected to the Coanda-effect operation and, thereby, attracted to the nearby surfaces of outer airfoil side 729. Outflowing jetstream 723 having the decreased static pressure sucks outer sub-portions 731 and 732. The cumulative confluence of sub-portions 731, 732, and 723 constitutes cumulative jetstream 734, associated with the airfoil corpus of capsule 720. In general, the formed cumulative jetstream 734, composed of sub-portions 731, 732, and 723, is turbulent; however, in an optimal case, the turbulence can be suppressed substantially. For simplicity, consider a case of a laminar-like cumulative jetstream 734, "bordered" by streamlines 733. On the one hand, the velocities of outer sub-portions 731 and 732, being lower than the critical condition velocity $u_*$, are increasing as the attracted outer sub-portions enter the space of cumulative jetstream 734, where the velocities increase is accompanied by a constriction of outer sub-portions 731 and 732, in accordance with equation (6.13). On the other hand, at outlet 726, the velocity of inner sub-portion 723 is of value $u_e$ higher than the critical condition velocity $u_*$. According to equation (6.13), the velocity of inner sub-portion 723 is decreasing as the sub-portion enters the space of cumulative jetstream 734, where inner sub-portion 723 is constricting as well. If the case is optimized such that the both constrictions are identical, cumulative jetstream 734 is expected to be laminar-like indeed. Bordering streamlines 733 constitute an imaginary convergent-divergent jet-nozzle comprising a narrow throat having the minimal cross-sectional area at the outer critical condition point 738, where the effective M-velocity of cumulative jetstream 734 reaches the specific value $M_* = \sqrt{(\gamma-1)/\gamma}$. If, upstream-afore the outer critical condition point 738, the effective M-velocity of cumulative jetstream 734 is lower than the specific M-velocity $M_*$, then the M-velocity of cumulative jetstream 734 is increasing as cumulative jetstream 734 moves such that outflowing divergent portion 735 has M-velocity higher than $M_*$ downstream-behind the outer critical condition point 738; and vice versa, if, upstream-afore the outer critical condition point 738, the effective M-velocity of cumulative jetstream 734 is higher than the specific M-velocity $M_*$, then the M-velocity of cumulative jetstream 734 is decreasing as cumulative jetstream 734 moves such that outflowing divergent portion 735 has the M-velocity lower than the specific M-velocity $M_*$.

In view of the foregoing description referring to FIG. 7c, it will be evident to a person skilled in the art that:

The shape of tunnel 722 can be optimized to provide that the velocity value $u_e$ of outflowing jetstream 723 becomes higher than the speed of sound $u_{sound}$. As well, it will be evident to a person skilled in the art that the shape of tunnel 722 and outer airfoil side 729 of capsule 720 can be optimized to provide that outflowing divergent portion 735 has increasing M-velocity reaching values higher than the specific M-velocity $M_*$;

Supplying a flying vehicle or helicopter's propeller blades by nozzles similar to capsule 720 operating as jet-booster, one could save fuel consumption substantially and even provide a stable motion against a drag and skin-friction resistance entirely with no fuel burning at all. As well, it will be evident to a person skilled in the art that this is not a so-called "Perpetuum mobile", but the use of ambient fluid heat to produce useful motion, strictly according to the Energy Conservation Law.

Furthermore, looking ahead referring to FIGS. 9d, 9e, and 9f described hereinafter, point out that an even number of such jet-boosters, attached to the even number of blades of a helicopters propeller, result in stabilization of the effective velocities of incoming and outflowing jetstreams associated with the jet-boosters. The predictably equalized velocities enable easier controllable lift-forces when the helicopter is flying speedily;

The described airfoil capsule can be stationary exposed to oncoming wind (either natural or artificial) and thereby become applicable to efficient harvesting of electricity providing a positive net-efficiency; and One can further aggregate the open outlet of a specifically shaped convergent-divergent tunnel with an engine using the enhanced jet-effect providing an extra-accelerated and extra-cooled jetstream outflowing through the open outlet; wherein the engine is either a jet-engine, and/or a turbo-jet engine, and/or a motor applied to a vehicle, and/or a generator of electricity, and/or a cooler, and/or a Peltier element operating as thermoelectric generator, and/or vapor-into-water condenser.

Figure 7D:
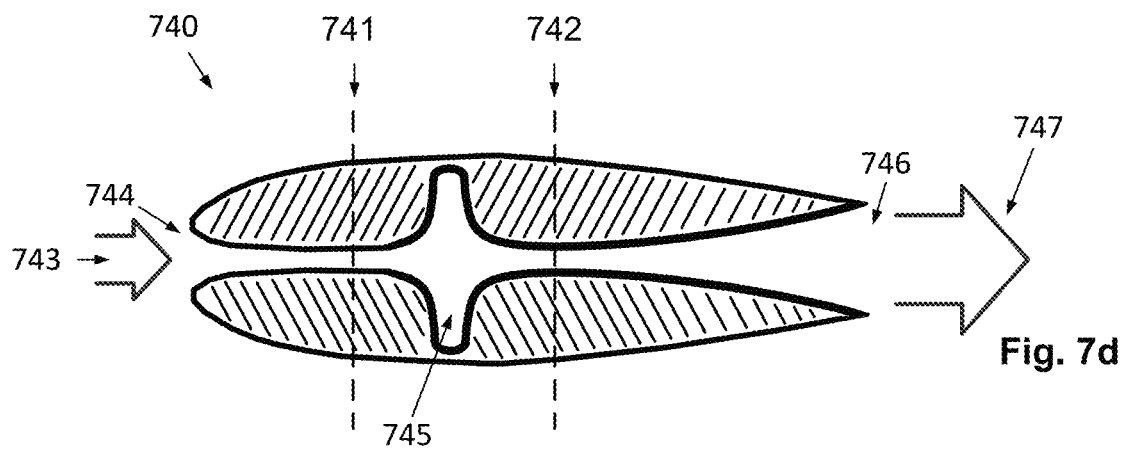
FIG. 7d is a schematic sectional view of a flying capsule, constructed according to the principles of the present invention.

FIG. 7d is a schematic sectional view of a flying capsule 740, constructed according to the principles of the present invention. Flying capsule 740's profile in a sagittal plane has an airfoil outer contour and a contour of a specifically shaped two-stage inner tunnel. In contrast to flying capsule 720 illustrated hereinbefore referring to FIG. 7c, capsule 740 flies with a de Laval high M-velocity, i.e. higher than the specific M-velocity $M_* = \sqrt{(\gamma-1)/\gamma}$, and the two-stage inner tunnel is shaped similar to the tunnel of two-stage convergent-divergent jet-nozzle 690, described above with reference to FIG. 6h. Namely, the two-stage inner tunnel comprises two narrow throats providing for two associated critical condition points 741 and 742. The oncoming fast flow 743 enters the open inlet 744 of the inner tunnel with a de Laval high M-velocity, higher than the specific M-velocity $M_*$. Then flow 743 is gradually slowing down, becoming warmer and more compressed as moving to critical condition point 741 where reaching the specific M-velocity $M_*$, further, is gradually extra-slowing, extra-warming and extra-compressing as moving to reservoir 745, according to equation (6.13), further, is gradually accelerating, cooling, and becoming decompressed as moving to critical condition point 742 where again reaching the specific M-velocity $M_*$, and further, is gradually extra-accelerating, extra-cooling, and extra-decompressing as moving to outlet 746, as described hereinbefore with references to FIGS. 6a, 6b, 6f, 6g, and 6h.

The cross-section of outlet 746 is wider than the cross-section of inlet 744, thereby providing for that capsule 740 operates as a jet-booster launching a widened and cooled outflowing jetstream 747 with a high M-velocity, higher than the de Laval high M-velocity of oncoming fast flow 743.

Improved Propeller and Ventilator

Figure 7E:
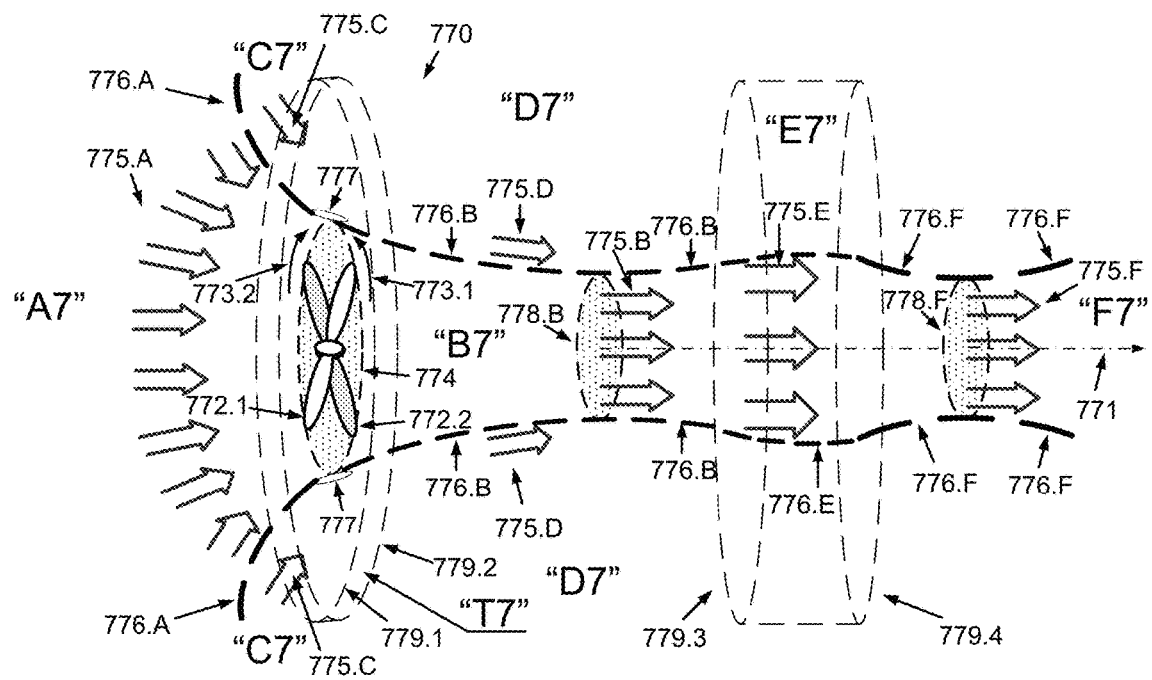
FIG. 7e is a schematic drawing of an improved blowing propeller, constructed according to the principles of the present invention.

FIG. 7e is a schematic drawing of improved blowing propeller or ventilator 770, constructed according to the principles of the present invention, to operate in fluid surroundings. For simplicity and without loss of the description generality, consider improved blowing ventilator 770 operating in an open air space. Improved blowing ventilator 770, defined by the main functionality to launch a jetstream characterized by the flow headway-motion kinetic-power, has an inherent engine, which is not shown here, consuming either a power of burned fuel or an electric power and operating in a steady-state mode. Improved blowing ventilator 770 comprises airfoil blades: first-airfoil-blades 772.1 and second-airfoil-blades 772.2, shown here schematically, each, when compounded with imaginary sagittal axis 771, having a chiral asymmetrical shape, wherein, preferably, the shape of first-airfoil-blades 772.1 is substantially mirror-symmetrical relative to the shape of second-airfoil-blades 772.2.

First-airfoil-blades 772.1 and second-airfoil-blades 772.2 are forcedly rotating in transitional space 77", marked schematically as a cylindrical space portion between frontal planes 779.1 and 779.2. Mutually complemental first-airfoil-blades 772.1 and second-airfoil-blades 772.2 are forcedly rotating in mutually-opposite directions, indicated by curved arrows marked by reference numerals 773.1 and 773.2, correspondingly. Forcedly mutually-opposite rotating first-airfoil-blades 772.1 and second-airfoil-blades 772.2 cover effective cross-section 774, and, thereby, entrap and suck air portions 775.A from space "A1", which is located upstream-afore effective cross-section 774, and convert flowing air portions 775.A into accelerated jetstream 775.6 entering space "B7", which is located downstream-behind effective cross-section 774. Space "A7", comprising airflow portions 775.A subjected to the sucking and motion through effective cross-section 774, is bordered by streamlines of airflow 775.A, forming imaginable contours 776.A. The imaginary contours 776.A separate space "A7" from space "C7", comprising air portions 775.C, drawn by airflow 775.A and flowing toward transitional space "T7" out of effective cross-section 774. Space "B7", comprising jetstream 775.6, is bordered by streamlines, forming imaginable contours 776.6. The imaginary contours 776.6 separate space "67" from space "D7", comprising air portions 775.D, drawn by jetstream 775.6 and flowing downstream-behind transitional space "T7". In contrast to the general case, when a complicated motion of air portions 775.A, 775.6, 775.C, and 775.D comprises both: a headway-motion, i.e. a laminar component of motion aligned with the imaginary contours 776.A and 776.6 having a prevalent direction along imaginary sagittal axis 771, and a whirling-motion, i.e. a turbulent component of motion, dominantly, whirling around imaginary sagittal axis 771; the forcedly mutually-opposite rotating first-airfoil-blades 772.1 and second-airfoil-blades 772.2 are optimized to prevent the power-consuming whirling motion and provide the desired dominant headway-motion of air portions 775.A, 775.6, 775.C, and 775.D, as one of the primary features of improved blowing ventilator 770. For simplicity, further describing the optimized case, minor effects caused by the whirling turbulence will be ignored. In the optimized case, the power, consumed by the inherent engine of improved blowing ventilator 770, dominantly, is expended for:

the headway-motion of air portions 775.A, which then are transformed into jetstream 775.6;
the directional motion of air portions 775.C, which then are transformed into moving air portions 775.D;
the overcoming of air viscous-resistance; and
the compensation of inner resistance of the inherent engine.

Wherein the part of the power consumption, expended on the overcoming of air viscous-resistance and compensation of inner resistance of the inherent engine, dissipates in the acquired warmth of outflowing air portions 775.6 and 775.D.

Mutually-opposite rotating first-airfoil-blades 772.1 and second-airfoil-blades 772.2 have optimized shapes, in addition providing a certain focusing of jetstream 775.6, such that streamlines 776.A and 776.6 constitute an imaginary convergent-divergent tunnel. Furthermore, the speeds of first-airfoil-blades 772.1 and second-airfoil-blades 772.2 mutually-opposite rotations are optimized such that jetstream 775.6 moves through cross-section 778.6 of the minimal area with the specific M-velocity $M_*=\sqrt{(\gamma-1)/\gamma}$, thereby making the imaginary convergent-divergent tunnel, constituted by streamlines 776.A and 776.6, in principle, similar to the specifically shaped tunnel of convergent-divergent jet-nozzle 610 shown in FIG. 6a, wherein imaginary sagittal axis 771 and imaginary sagittal x-axis 615 (FIG. 6a) are collinear, effective cross-section 774 takes the place of imaginary inlet 6131 (FIG. 6a), and cross-section 778.6 of the minimal area provides the critical condition for the de Laval effect triggering. Thus, the imaginary convergent-divergent tunnel, constituted by streamlines 776.A and 776.6, performs a de Laval-like nozzle. A de Laval-like jet-effect, which is similar to the classical de Laval jet-effect but arising in the de Laval-like nozzle having imaginary walls formed by streamlines 776.A and 776.6 of the flowing air, is triggered, as described hereinbefore referring to FIGS. 6a, 6b, 6c, 6d, and 6e, thereby resulting in an extra-acceleration and extra-cooling of jetstream 775.6 immediately downstream-behind cross-section 778.6. This provides one of the primary features of improved blowing ventilator 770.

The de Laval-like nozzle, having imaginary convergent-divergent tunnel formed by streamlines 776.A and 776.6 of the flowing air, geometrically, is not identical with an optimized de Laval nozzle having solid walls, described hereinbefore referring to FIGS. 6a, 6b, 6c, 6d, and 6e, at least because of the osmotic-like effect inherently occurring on imaginary contours 776.A and 776.6, as described above with references to FIGS. 4 and 5b. The osmotic-like effect is defined as an effect of exchange of molecular matter and heat between moving air portions. The osmotic-like effect includes a mutually-directed effect of diffusion, occurring because of both: the Brownian random motion of the fluid's molecules, and the effect of molecules motion in a cross-sectional plane, caused by the gradients of fluid density $\Delta\rho$ and temperature $\Delta T$ in the cross-sectional plane, which are interrelated with the jetstream 775.6 convergent-divergent motion. The osmotic-like effect, reducing the gradients, is accumulative, making equation (6.13) applicable qualitatively to a local neighborhood of a coordinate at sagittal axis 771 only.

Since a certain distance downstream-behind cross-section 778.6 of minimal area, namely, in transitional space "E7", marked schematically as a cylindrical space portion between frontal planes 779.3 and 779.4, the extra-accelerated jetstream 775.6, subjected to a diffusion of molecules of air portions 775.D as the airflow moving along sagittal axis 771, becomes transformed into transitional jetstream 775.E, characterized by a local maximum of cross-sectional area, where the density and temperature of transitional jetstream 775.E are already not reducing and a high M-velocity of transitional jetstream 775.E, being higher than the specific M-velocity $M_*=\sqrt{(\gamma-1)/\gamma}$, is not increasing more.

Farther, in space "F7" located downstream-behind transitional space "E7", transitional jetstream 775.E is transformed into slowing jetstream 775.F, which, according to equation (6.13) qualitatively applicable to a local neighborhood, is characterized by an increase of airflow density and temperature. Slowing jetstream 775.F, bordered by convergent-divergent streamlines 776.F, reaches cross-section 778.F of minimal area, where the M-velocity of jetstream 775.F reverts to the specific M-velocity $M_*=\sqrt{(\gamma-1)/\gamma}$ and the de Laval-like retarding-effect is triggered resulting in an extra-slowing and extra-warming of jetstream 775.F downstream behind cross-section 778.F of minimal area, as described hereinabove referring to FIGS. 6f and 6g, relating to jet-nozzle 650, having solid walls.

Gradual variations of the air thermodynamic parameters are expected in the open space, thereby providing optimized shapes of imaginary contours 776.A, 776.6, 776.E, and 776.F. These optimizations result in that improved blowing ventilator 770:
on the one hand, powered by the inherent engine, expends the power for:
the headway-motion of air portions 775.A, further transformed into directional jetstreams 775.6, 775.E, and 775.F,
the directional motion 775.C, further transformed into directional motion 775.D,
the overcoming of air viscous-resistance, and
the compensation of inner resistance of the inherent engine; and
on the other hand, triggering the de Laval-like jet-effect in an adiabatic process, saves the power for the jetstream 775.6 acceleration and extra-acceleration, correspondingly, upstream-afore and downstream-behind cross-section 778.6, providing one of the primary features of improved blowing ventilator 770.

The resulting functionality net-efficiency of improved blowing ventilator 770 is defined by the ratio of the kinetic-power of launched jetstream 775.E to the power, consumed by the inherent engine of improved blowing ventilator 770.

In view of the foregoing description referring to FIG. 7e, it will be evident to a person skilled in the art that improved blowing ventilator 770 provides for jetstream 775.6 launching and further acceleration and extra-acceleration at the expense of both: the power of inherent engine and the warmth of ambient air, so the resulting functionality net-efficiency of improved blowing ventilator 770 may exceed 100%. Furthermore, improved blowing propeller 770, having the resulting functionality net-efficiency higher than 100% and pushing a vehicle, in the final analysis, can operate at the expense of ambient warmth only.

In view of the foregoing description referring to FIG. 7e, it will be evident to a person skilled in the art that, to implement an improved blowing ventilator, having real corpus 777 occupying a certain space, comprising a part of transitional space "T7", one should implement real corpus 777 as a fragment of a convergent-divergent tunnel for air portions 775.A and jetstream 775.6, applying principles of the present invention to an optimization of the tunnel shape, in order to suppress undesired power-consuming shock and Mach waves, as described hereinabove referring to FIGS. 6a, 6b, 6c, 6d, and 6e. As well, it will be evident to a person skilled in the art that real corpus 777 of an improved blowing ventilator may have real walls, occupying also substantial portions of spaces "A7" and "137", implementing optimized contours 776.A and 776.6 now becoming actual, such that the improved blowing ventilator comprises a real specifically shaped convergent-divergent tunnel having a narrow throat with the critical condition point, as described hereinabove referring to FIG. 6a. As well, it will be evident to a person skilled in the art that an improved blowing ventilator can be used to accelerate and focus an ionized gas, i.e. plasma, controlled by an external magnetic field, wherein the geometry of the imaginary walls, formed by streamlines 776.A and 776.6, can be controlled by the magnetic field, such that the imaginary walls, occupying substantial portions of spaces "A7" and "137", form a specifically shaped convergent-divergent tunnel having narrow throat with the critical condition point, as described hereinabove referring to FIG. 6a.

In view of the foregoing description referring to FIG. 7e, it will be evident to a person skilled in the art that one can implement transitional space "T7" of an improved propeller, characterized by the primary features of improved blowing ventilator 770, using a pair of rotating airfoil Archimedes screws having helically coiled airfoil-profiled walls, similar to walls of spirals 592 and 593, described hereinbefore referring to FIG. 5i, instead of the use of rotating first-airfoil-blades 772.1 and second-airfoil-blades 772.2. As well, transitional space "T7" can be implemented using a combination of many rotating airfoil blades and stationary or rotating airfoil screws of Archimedes.

Figure 7F:
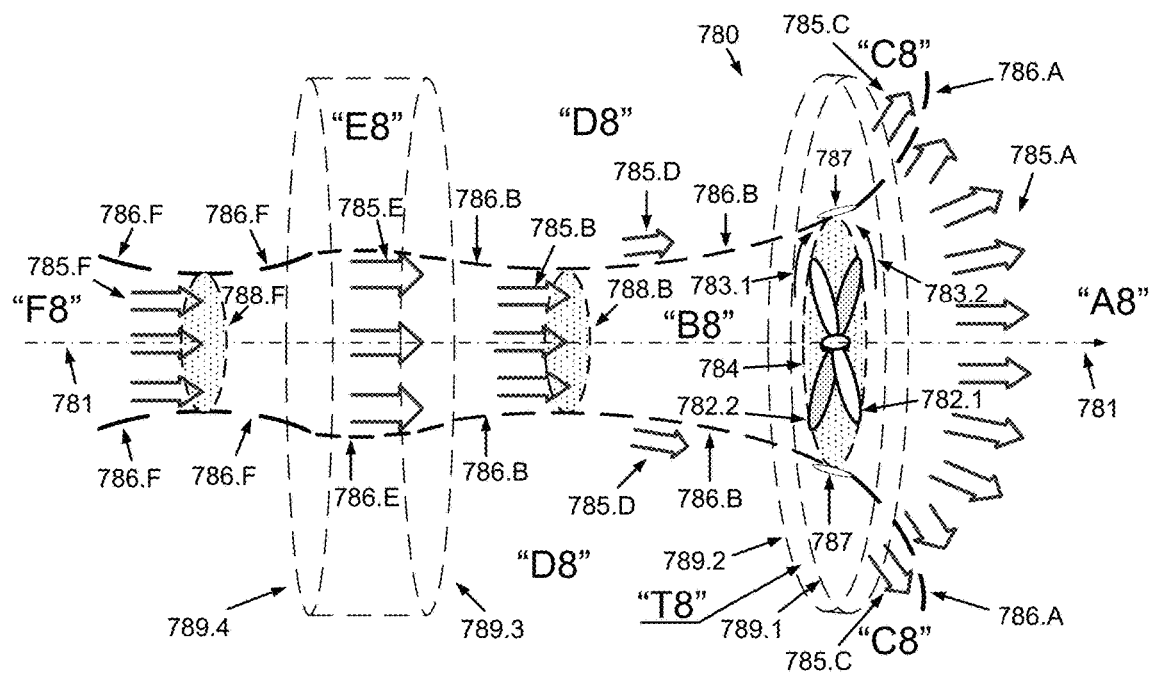
FIG. 7f is a schematic drawing of an improved sucking propeller, constructed according to the principles of the present invention.

FIG. 7f is a schematic drawing of improved sucking propeller or ventilator 780, constructed according to the principles of the present invention to operate in fluid surroundings. For simplicity and without loss of the description generality, consider improved sucking ventilator 780 operating in an open air space. Improved sucking ventilator 780 is defined by the main functionality, being inverse to the main functionality of improved blowing ventilator 770, described above with the reference to FIG. 7e, namely, to make an incoming jetstream, characterized by the flow headway-motion kinetic-power.

Looking ahead, point out that improved sucking ventilator 780, constructed according to the principles of the present invention, is as inverse improved blowing ventilator 770. Improved sucking ventilator 780 has an inherent engine, which is not shown here, consuming either a power of burned fuel or an electric power and operating in a steady-state mode. Improved sucking ventilator 780 comprises airfoil blades: first-airfoil-blades 782.1 and second-airfoil-blades 782.2, which are shown schematically, each having an asymmetrical and chiral geometrical configuration, wherein, preferably, the geometrical configuration of first-airfoil-blades 782.1 is mirror-symmetrical relative to the geometrical configuration of second-airfoil-blades 782.2. Mutually complemental first-airfoil-blades 782.1 and second-airfoil-blades 782.2 are forcedly rotating in transitional space "T8", marked schematically as a cylindrical space portion between frontal planes 789.1 and 789.2. First-airfoil-blades 782.1 and second-airfoil-blades 782.2 are forcedly rotating in mutually-opposite directions, indicated by curved arrows marked by reference numerals 783.1 and 783.2, correspondingly. First-airfoil-blades 782.1 and second-airfoil-blades 782.2 have geometrical configurations such that, when forcedly mutually-opposite rotating and covering effective cross-section 784, entrap and suck incoming jetstream 785.6 from space "138", which is located upstream-afore effective cross-section 784, convert incoming jetstream 785.6 into defocusing airflow 785.A, divergently entering space "A8", which is located downstream-behind effective cross-section 784.

Incoming jetstream 785.6, subjected to the sucking, is bordered by streamlines forming imaginary contours 786.6. The imaginary contours 786.6 separate space "138" from space "D8", comprising air portions 785.D, drawn by incoming jetstream 785.6 and flowing toward transitional space "T8" out of effective cross-section 784. Space "A8", comprising divergent airflow 785.A, is bordered by streamlines forming imaginary contours 786.A. The imaginary contours 786.A separate space "A8" from space "C8", comprising air portions 785.C, drawn by divergent airflow 785.A and flowing downstream-behind transitional space "T8". Forcedly mutually-opposite rotating first-airfoil-blades 782.1 and second-airfoil-blades 782.2 are optimized to prevent the power-consuming whirling motion and provide the desired dominant headway-motion of air portions 785.A, 785.6, 785.C, and 785.D, as one of the primary features of improved sucking ventilator 780.

Mutually-opposite rotating first-airfoil-blades 782.1 and second-airfoil-blades 782.2 have optimized shapes, in addition providing a certain defocusing of incoming jetstream 775.6, such that streamlines 786.6 and 776.A constitute an imaginary convergent-divergent tunnel. Furthermore, the mutually-opposite rotations speeds are optimized such that incoming jetstream 785.6 moves through cross-section 788.6 of the minimal area with the specific M-velocity $M_* = \sqrt{(\gamma-1)/\gamma}$, thereby making the imaginary convergent-divergent tunnel, constituted by streamlines 786.6 and 786.A, similar to the specifically shaped tunnel of convergent-divergent jet-nozzle 650 shown in FIG. 6f, wherein imaginary sagittal axis 781 and imaginary sagittal x-axis 655 (FIG. 6f) are collinear, effective cross-section 784 takes the place of imaginary outlet 6532 (FIG. 6f), and cross-section 788.6 of the minimal area provides the critical condition for the de Laval effect triggering. Thus, the imaginary convergent-divergent tunnel, constituted by streamlines 786.6 and 786.A, performs an inverse de Laval-like nozzle. A de Laval-like retarding-effect, which is similar to the classical de Laval retarding-effect described hereinbefore referring to FIG. 6f but occurring in the inverse de Laval-like nozzle having imaginary walls formed by streamlines 786.6 and 786.A of the flowing air, is triggered, thereby resulting in an extra-slowing and extra-warming of incoming jetstream 785.6 immediately downstream-behind cross-section 788.6. Furthermore, the condition of incoming jetstream 785.6 moving through cross-section 788.6 of the minimal area with the specific M-velocity $M_* = \sqrt{(\gamma-1)/\gamma}$ interrelates with the condition of extra-pre-acceleration of incoming jetstream 785.6 just upstream-afore cross-section 788.6, according to equation (6.13) qualitatively applicable to a local neighborhood. Thus, the M-velocity of incoming jetstream 785.6 just upstream-afore cross-section 788.6 is higher than the specific M-velocity $M_* = \sqrt{(\gamma-1)/\gamma}$. This provides one of the primary features of improved sucking ventilator 780.

Furthermore, again, according to equation (6.13) qualitatively applicable to a local neighborhood, the high M-velocity, higher than the specific M-velocity $M_* = \sqrt{(\gamma-1)/\gamma}$, can be reached due to the direct de Laval-like jet-effect in an earlier pre-history of incoming jetstream 785.6, namely, in space "F8" comprising pre-incoming jetstream 785.F moving through imaginary convergent-divergent tunnel constituted by streamlines 786.F and having cross-section 788.F of a local minimum area providing the critical condition. Then the accumulative osmotic-like effect results in that since a certain distance downstream-behind cross-section 788.F of local minimum area, namely, in transitional space "E8", marked schematically as a cylindrical space portion between frontal planes 789.3 and 789.4, pre-incoming jetstream 785.F, subjected to a diffusion of air molecules as moving along sagittal axis 781, becomes transformed into transitional jetstream 785.E, characterized by a local maximum of cross-sectional area, where the density and temperature of transitional jetstream 785.E are already not reducing and the M-velocity of transitional jetstream 785.E, being higher than the specific M-velocity $M_* = \sqrt{(\gamma-1)/\gamma}$, is not increasing more. Transitional jetstream 785.E becomes transformed into incoming jetstream 785.6 subjected to the de Laval-like retarding-effect resulting in incoming jetstream 785.6 slowing and extra-slowing. Thus, relatively slow divergent airflow 785.A has an upstream pre-history, comprising the pre-accelerated and extra-pre-accelerated headway-motion of jetstream 785.6 downstream-behind and upstream-afore cross-section 788.6, correspondingly, wherein gradual variations of the air thermodynamic parameters are expected in the open space, thereby providing optimized shapes of imaginary contours 786.6 and 786.A. These optimizations result in that improved sucking ventilator 780:

on the one hand, powered by the inherent engine, expends the power for:
the headway-motion of pre-incoming jetstream 785.F, further transformed sequentially into directional motion of transitional jetstream 785.E, incoming jetstream 785.6, and divergent airflow 785.A,
the directional motion of outer portions 785.D, further transformed into directional motion of outer portions 785.C,
the overcoming of air viscous-resistance, and
the compensation of inner resistance of the inherent engine;
and
on the other hand, triggering the de Laval-like retarding-effect having pre-history comprising the de Laval-like jet-effect in an adiabatic process, saves the power for the incoming jetstream 785.6 motion, accelerated and pre-extra-accelerated, correspondingly, downstream-behind and upstream-afore cross-section 788, providing one of the primary features of improved sucking ventilator 780.

The resulting functionality net-efficiency of improved sucking ventilator 780 is defined by the ratio of the kinetic-power of sucked transitional jetstream 785.E to the power, consumed by the inherent engine of improved sucking ventilator 780.

In view of the foregoing description referring to FIG. 7f, it will be evident to a person skilled in the art that improved sucking ventilator 780 provides for pre-incoming jetstream 785.F sucking pre-acceleration and extra-pre-acceleration at the expense of both: the power of inherent engine and the warmth of ambient air, so the resulting functionality net-efficiency of improved sucking ventilator 780 may exceed 100%. Furthermore, improved sucking propeller 780, having the resulting functionality net-efficiency higher than 100% and pulling a vehicle, in the final analysis, can operate at the expense of ambient warmth only.

It will be further evident to a person skilled in the art that, to implement an improved sucking ventilator, having real corpus 787 occupying a certain space, comprising a part of transitional space "T8", one should implement real corpus 787 as a fragment of a convergent-divergent tunnel for incoming jetstream 785.6 and divergent airflow 785.A, applying principles of the present invention to an optimization of the tunnel shape, in order to suppress undesired power-consuming shock and Mach waves, as described hereinabove referring to FIGS. 6a, 6b, 6c, 6d, 6e, and 6f. As well, it will be evident to a person skilled in the art that real corpus 787 of an improved sucking ventilator may have real walls, occupying also substantial portions of spaces "B8" and "A8", implementing optimized contours 786.6 and 786.A now becoming actual, such that the improved sucking ventilator comprises a real specifically shaped convergent-divergent tunnel having a narrow throat with the critical condition point, as described hereinabove referring to FIG. 6f.

In view of the foregoing description referring to FIGS. 7e and 7f, it will be evident to a person skilled in the art that one can:
implement the schematically shown mutually-opposite rotating and mutually complemental airfoil blades using many relatively small mutually-opposite rotating and mutually complemental airfoil blades, distributed spatially, altogether providing the mentioned primary features of an improved blowing and/or sucking propeller and/or ventilator;

cascade an improved sucking propeller and an improved blowing propeller such that imaginary sagittal axis 771 is as a continuation of imaginary sagittal axis 781, and space "A7" follows downstream behind space "A8", thereby creating a combined improved sucking-and-blowing propeller. A vehicle, supplied with such a combined improved sucking-and-blowing propeller, provides for an optimized motion with a reduced drag; and implement transitional space "T7" and/or "T8" of an improved propeller, characterized by the primary features of improved blowing ventilator 770 and/or improved sucking ventilator 780, correspondingly, as a not obligatorily connected transitional space, but comprising several separate sub-spaces, each defined by at least one smaller propeller.

In view of the foregoing description referring to FIGS. 7e and 7f, in combination with the foregoing description referring to FIGS. 5h, 5j, and 5k, it will be evident to a person skilled in the art that one can implement a device, similar to improved blowing and/or sucking propeller 770 and/or 780, correspondingly, but comprising first-airfoil-blades 772.1 and/or 782.1 and second-airfoil-blades 772.2 and/or 782.2, both remain stationary, wherein the device, having no moving parts, is submerged in water surroundings, and wherein at least some sides of the stationary airfoil blades are covered with a hydrophobic material, that provides creating of a launched and/or sucked water jetstream at the expense of the water warmth only. Furthermore, estimations, made referring to FIG. 5h, show that a big quantity of such small hydrophobic-propellers, in particular, comprising stationary but hydrophobic blades, altogether cumulatively functioning like an improved launching and/or sucking propeller, can provide a powerful water jetstream that can be used, in particular, for pushing a submarine at the expense of the water warmth.

Wing as a Convergent-Divergent Jet-Nozzle

Figure 8A:
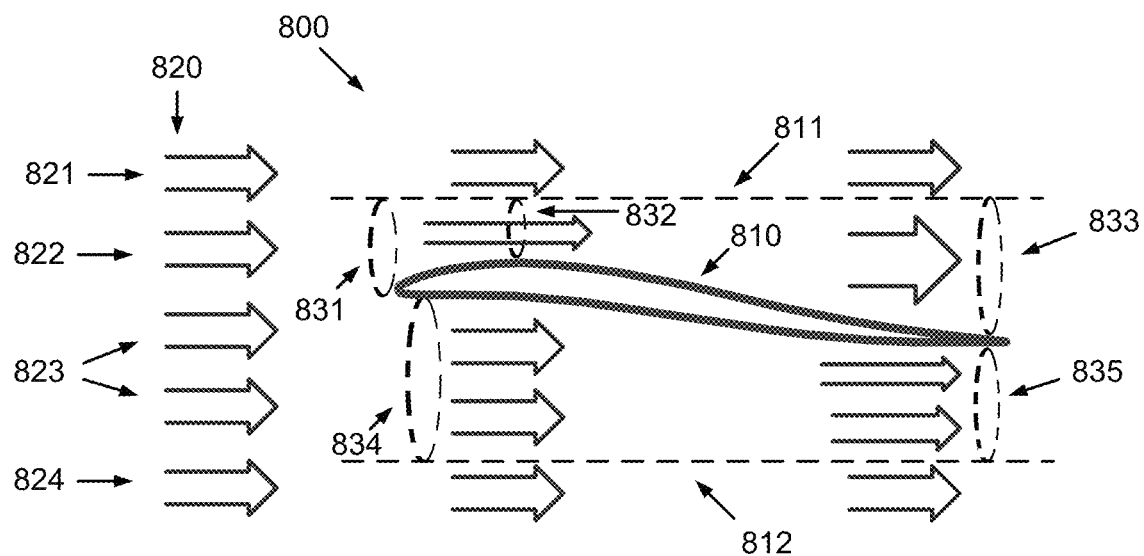
FIG. 8a is a schematic illustration of an actually-airfoil wing blown by wind.

FIG. 8a is a schematic visualization 800 of an oncoming wind portion 820, without loss of generality, moving horizontally. Oncoming wind portion 820 comprises airflow sub-portions 821, 822, 823, and 824 flowing around actually-airfoil wing 810, having a sectional profile, constructed according to the principles of the present invention. The upper side of actually-airfoil wing 810 comprises:

(a) a forward part meeting upper sub-portion 822 having imaginary cross-section 831;

(b) a withers defined as the highest point on the upper side of the airfoil profile convexity, where sliding sub-portion 822 has imaginary narrowed cross-section 832, and (c) a rearward part, attracting and, thereby, redirecting the mass-center of the upper sliding sub-portion 822 backward-downward, where sliding sub-portion 822 has imaginary widened cross-section 833.

When airflow sub-portions 821, 822, 823, and 824 are flowing around actually-airfoil wing 810, the streamlines [not shown here] of sub-portions 822 and 823, flowing near actually-airfoil wing 810, are curving in alignment with the airfoil-profile, the streamlines [not shown here] of portions 821 and 824, flowing farther from actually-airfoil wing 810, keep substantially straight trajectories aligned with imaginary horizontal lines 811 and 812 correspondingly above and under actually-airfoil wing 810. Actually-airfoil wing 810's surface material properties, porosity, and structure are elaborated according to the principles of the present invention such that air sub-portions 822 and 823 are subjected to the Coanda-effect, defined by the partial pressure-c $\delta P_c$, rather than to the skin-friction resistance, occurring in an imaginary boundary layer and being quantified by the difference $(a_w-a-\delta a)$.

Imaginary lines 811 and 812 can be considered as imaginary walls, thereby, together with the airfoil-profile forming imaginary nozzles. The upper imaginary nozzle comprises imaginary cross-sections 831, 832, and 833, and the lower imaginary nozzle comprises imaginary cross-sections 834 and 835. Cross-section 831 is wider than cross-section 832 and cross-section 832 is narrower than cross-section 833, thereby, the upper imaginary nozzle has a convergent-divergent shape and sliding sub-portion 822 represents a convergent-divergent jetstream while flowing through cross-sections 831, 832, and 833. Cross-section 834 is wider than cross-section 835, so the lower imaginary nozzle has a converging shape. Consider a case, when actually-airfoil wing 810 flies with a de Laval low M-velocity $M_{810}$ that is lower than the specific M-velocity $M_*=\sqrt{(\gamma-1)/\gamma}\approx 0.5345$ Mach≈664 km/h, but such that sliding sub-portion 822, moving through the upper imaginary nozzle, reaches the specific M-velocity $M_*$ when passes through the narrowest cross-section 832. So, the de Laval-like jet-effect arising is expected above actually-airfoil wing 810, i.e. within the upper imaginary convergent-divergent jet-nozzle. This is accompanied by the static pressure decrease and extra-decrease, as described hereinabove with the reference to FIG. 6b, and thereby results in the lift-effect, becoming stronger. In frames of the aerodynamics, one estimates the narrowest cross-section 832 linear size, i.e. thickness of a so-called "boundary layer", normalized to a so-called "characteristic size" of the considered wing, as proportional to so-called Reynolds Number. As well, the thickness of boundary layer can be specified experimentally for a kind of body corpuses. In view of the foregoing description referring to FIG. 6a and FIG. 8a, it will be evident to a person skilled in the art that, basing on the defined narrowest cross-section 832 linear size as the thickness of boundary layer, one can apply the equation of M-velocity (6.13) to design an improved profile of the wing.

In view of the foregoing description referring to FIG. 8a, it will be evident to a person skilled in the art that the described de Laval-like jet-effect is similar to the classical de Laval jet-effect, but arising in an optimized convergent-divergent tunnel having imaginary walls formed by streamlines of a flow. Namely, the specifically shaped convergent-divergent tunnel comprises two opposite walls; wherein one of the two opposite walls is constructed from a solid material and another of the two opposite walls is imaginary and formed by streamlines of the flowing fluid subjected to the Coanda-effect operation.

Thus, a method for a wing profile design, based on equation (6.13) according to an exemplary embodiment of the present invention, allows optimizing the wing airfoil shape to reach the best efficiency of the lift-effect as a result of the enhanced jet-effect occurring above the wing. The inventor notes that the profile of the actually-airfoil wing 810 designed and optimized using the equation (6.13) has a shape similar to a shape of a birdwing rather than to the shape of the classic wing of airplane.

Figure 8B:
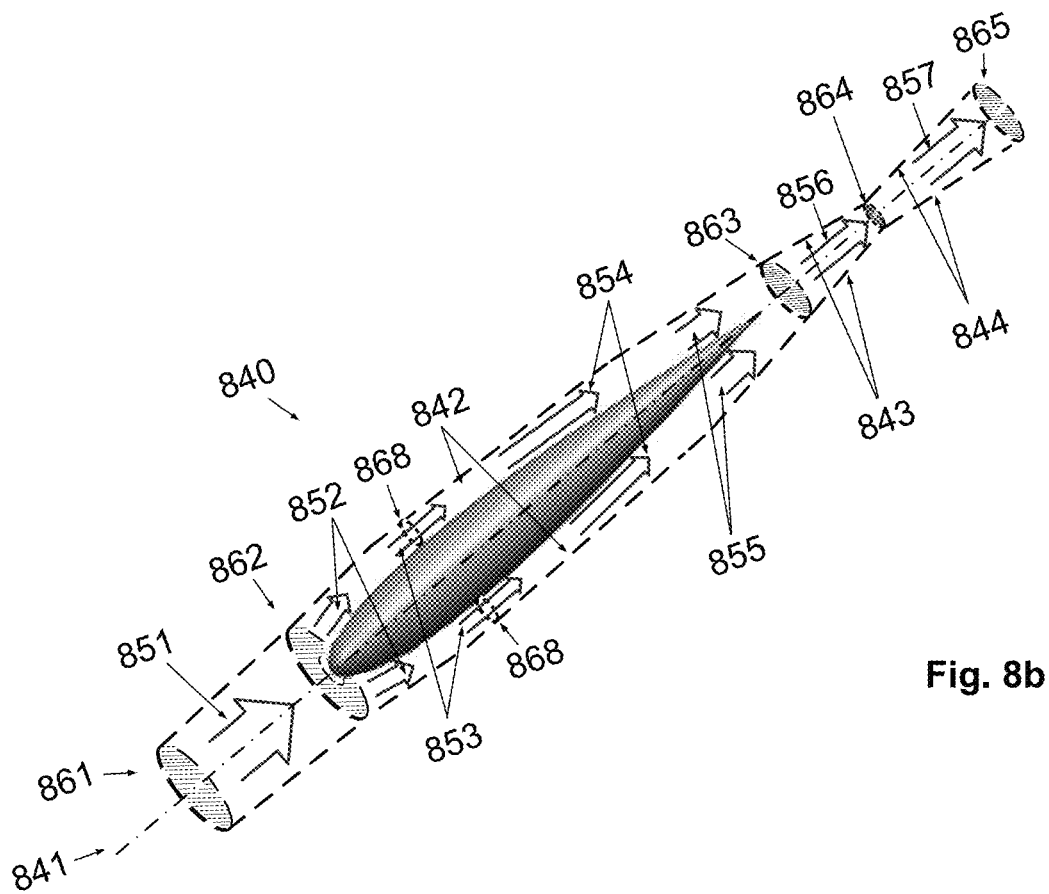
FIG. 8b is a schematic illustration of a flying airfoil body.

The Coanda-Effect Operation Providing an Imaginary Convergent-Divergent Nozzle FIG. 8b is a schematic illustration of a flying airfoil body 840 having the shape of an elongated drop. For simplicity and without loss of reasoning, the shape is axis-symmetrical around the longitudinal axis 841. The airfoil body 840 comprises:
- a forward part meeting oncoming flow portion 851;
- a "withers", defined as the highest point on the upper side of the airfoil profile, where sliding sub-portion 853 has an imaginary narrowed cross-section 868, and
- a rearward part.

When an oncoming air portion 851, originally having a cross-sectional area 861, is running at the forward part of flying body 840, it is subjected to the Coanda-effect operation resulting in air portion 851 reshaping, and thereby forming an ambient-adjoining convergent-divergent jetstream, comprising sliding sub-portions: 852 being convergent, 853 being narrow and having imaginary narrowed cross-section 868 of the minimal cross-sectional area, 854 being divergent, and 855 becoming convergent due to the Coanda-effect attraction. Body 840's surface material properties, porosity, and structure are implemented according to the principles of the present invention, thereby providing that air portion 851 is subjected to the Coanda-effect, defined by the partial pressure-c $\delta P_c$, rather than to the skin-friction resistance, occurring in an imaginary boundary layer and being quantified by the difference $(a_w - a - \delta a)$. Furthermore, sliding sub-portions 855, join together, forming the resulting cumulative air portion 856. Oncoming air portion 851 and all the mentioned derivative sub-potions move within space "bordered" by imaginary walls marked by dashed contours 842. The imaginary walls 842 together with the airfoil surface of body 840 constitute an imaginary tunnel. The tunnel's cross-section gradually constricts from the inlet cross-section 862 to the narrowest cross-section 868 and then gradually widens up to the outlet cross-section 863. I.e. sliding sub-portions 852 are shrinking while reaching the withers of airfoil body 840, where the cross-sections 868 of sub-portions 853 become minimal. Then, behind the withers, the cross-sections of sub-portions 854 and 855 are widening as moving.

Sliding sub-portions 855, being under the subjection of the Coanda-effect operation, turn aside in alignment with the slippery surfaces of airfoil body 840's rearward part and join together, forming the resulting air portion 856. It results in a convergence of resulting air portion 856, i.e. in that, cross-section 864, located farther downstream, becomes narrower than cross-section 863 located immediately behind airfoil body 840, and opposite streamline-fragments 843 form an imaginary convergent funnel. Furthermore, opposite streamline-fragments 844, which are bordering flow portion 857, constitute an imaginary divergent stage of a tunnel downstream-behind the narrowest cross-section 864. The converging opposite streamline-fragments 843 and divergent opposite streamline-fragments 844 together constitute the imaginary convergent-divergent tunnel, and, correspondingly, portions 856 and 857 together constitute an outilowing convergent-divergent jetstream.

Jet-Booster based on the Venturi Effect

First, consider a case, when airfoil body 840 flies with a Venturi M-velocity, i.e. with a low M-velocity, lower than the specific M-velocity $M_* = \sqrt{(\gamma-1)/\gamma} \approx 0.5345$ Mach, and low sufficient to provide that M-velocity $M_{868}$ of accelerated sliding sub-portions 853, passing cross-sections 868 over the withers, and M-velocity $M_{864}$ of accelerated sub-portions 856, passing through the narrowest cross-section 864, both remain lower than the specific M-velocity $M_*$, i.e. $M_{868} < M_*$ and $M_{864} < M_*$. In this case, the narrowest cross-section 864 of outflowing air portion 856 is narrower than the original cross-section 861 of oncoming air portion 851, and the M-velocities $M_{861}$, $M_{863}$, $M_{864}$, $M_{865}$, and $M_{868}$, where the indices correspond to markers of associated cross-sections, satisfy the following conditions:

$M_{861} < M_{868} < M_*$,
$M_{863} < M_{868} < M_*$,
$M_{863} < M_{864} < M_*$,
$M_{861} < M_{864} < M_*$, and
$M_{865} < M_{864} < M_*$.

Thus, body 840 operates as a jet-booster basing on the Venturi effect occurring in the imaginary tunnel adjacent to body 840's surfaces.

A practical application of the phenomenon that, under certain conditions, outflowing portion 856, moving through the narrowest cross-section 864, has a velocity higher than the velocity of oncoming portion 851 is one of the primary teachings of the present invention.

Jet-Boosters Based on the De Laval-Like Jet-Effect Secondly, consider a case, when airfoil body 840 flies relatively slowly, such that sliding sub-portions 853 pass cross-sectional areas 868 with an M-velocity that remains lower than the specific M-velocity, i.e. $M_{853} < M_*$, but high sufficient to provide that the increased M-velocity of portion 856 is higher than M-velocity of sub-portions 853 and reaches the specific M-velocity $M_* = \sqrt{(\gamma-1)/\gamma}$ at the critical condition point 864. In this case, M-velocity $M_{863}$ is the de Laval low velocity and the de Laval-like jet-effect is triggered, resulting in that the M-velocity of the divergent flow portion 857 exceeds the specific M-velocity $M_* = \sqrt{(\gamma-1)/\gamma}$. In this case, the M-velocities $M_{861}$, $M_{863}$, $M_{864}$, $M_{865}$, and $M_{868}$ satisfy the following conditions:

$M_{861} < M_{868} < M_*$,
$M_{863} < M_{868} < M_*$,
$M_{863} < M_{864} = M_*$,
$M_{861} < M_{864} = M_*$, and
$M_{865} > M_{864} = M_*$.

So, body 840 operates as a jet-booster basing on the de Laval-like jet-effect occurring in the imaginary tunnel downstream-behind airfoil body 840.

Thereby, the Coanda-jet-effect operation forcedly forms convergent-divergent laminar-like streamlines downstream-behind airfoil body 840, wherein the static pressure is distributed gradually along the convergent-divergent laminar-like streamlines that provides an optimized extension of air portion 857 resulting in the de Laval-like enhanced jet-effect accompanied by extra-cooling and extra-acceleration of air portion 857. This is one more teaching of the present invention.

A practical application of the phenomenon that, under certain conditions, outflowing portion 857 has an M-velocity higher than the specific M-velocity is one of the primary teachings of the present invention.

It will be evident to a person skilled in the art that the enhanced jet-effect results in an optimized reactive thrust-force applied to airfoil body 840.

Thirdly, consider a case, when airfoil body 840's shape is optimized using the equation of M-velocity (6.13), basing on an estimated linear size of cross-section 868, and when airfoil body 840 flies with a de Laval low M-velocity $M_{851}$, i.e. lower than the specific M-velocity $M_* = \sqrt{(\gamma-1)/\gamma} \approx 0.5345$ Mach, but high sufficient to provide that M-velocity of sliding sub-portions 853 reaches the value of the specific M-velocity, i.e. $M_{868} = M_*$ at the critical condition point 868. Thereby, the enhanced de Laval-like jet-effect occurs downstream-behind the withers, providing that $M_* < M_{854} < M_{855}$, where the indexes correspond to associated sliding air sub-portions. In this case, according to equation (6.13), shrinking portion 856, moving with a de Laval high M-velocity, is slowing down, becoming warmer and more compressed, as moving on the way to the critical condition point associated with cross-section 864. The de Laval-like retarding-effect occurs downstream-behind cross-section 864 resulting in portion 857 expanding and further slowing down, warming, and compressing while reaching cross-section 865. The M-velocities $M_{861}$, $M_{863}$, $M_{864}$, $M_{865}$, and $M_{868}$ satisfy the following conditions:

$M_{861} < M_{868} = M_*$,
$M_{863} > M_{868} = M_*$,
$M_{863} > M_{864} = M_*$,
$M_{861} < M_{864} = M_*$, and
$M_{865} < M_{864} = M_*$.

So, in the final analysis, body 840 operates as a jet-booster, triggering both the de Laval-like jet-effect and the de Laval-like retarding-effect.

Fourthly, consider a case, when airfoil body 840's shape is optimized using the equation of M-velocity (6.13), basing on an estimated linear size of cross-section 868, and when airfoil body 840 flies with a de Laval high M-velocity, i.e. higher than the specific M-velocity $M_* = \sqrt{(\gamma-1)/\gamma} \approx 0.5345$ Mach. According to equation (6.13), the de Laval-like retarding-effect occurs in the imaginary convergent-divergent tunnel formed by streamlines 842. Namely, shrinking air potions 852 are slowing down, becoming warmer and more compressed, as moving on the way to withers such that the M-velocity of the narrowest sliding sub-portions 853 reaches the specific M-velocity, i.e. $M_{868} = M_*$ at the critical condition point 868; and further, portions 854 continue to slow down while expanding downstream-behind the withers. Relatively slowly moving sliding sub-portions 855, now having a de Laval low M-velocity, join downstream-behind cross-section 863, thereby, providing for resulting shrinking portion 856 acceleration, accompanied by a decrease of temperature and static pressure, while reaching again the specific M-velocity $M_*$ at the narrowest cross-section 864. The de Laval-like jet-effect occurs downstream-behind cross-section 864 resulting in expanding portion 857 further acceleration accompanied by a deeper decrease of temperature and static pressure on the way to cross-section 865. So, the M-velocities $M_{861}$, $M_{863}$, $M_{864}$, $M_{865}$, and $M_{868}$ satisfy the following conditions:

$M_{861} > M_{868} = M_*$,
$M_{863} < M_{868} = M_*$,
$M_{863} < M_{864} = M_*$,
$M_{861} > M_{864} = M_*$, and
$M_{865} > M_{864} = M_*$.

Again, in the final analysis, body 840 operates as a jet-booster, triggering both the de Laval-like retarding-effect and the de Laval-like jet-effect.

In view of the foregoing description referring to FIGS. 6*a*, 7*a*, 7*b*, 7*c*, 8*a* and 8*b*, it will be evident to a person skilled in the art that:

- a method for an airfoil body shape design, based on equation (6.13) according to an exemplary embodiment of the present invention, allows, modifying the overall geometry of the body, to optimize the efficiency of the enhanced jet-effect occurring outside of the body;
- the described convergent-divergent jet-nozzles can be applicable to many apparatuses using mechanical and heat energy provided by either a flowing gas or liquid;
- triggering and controlling the desired de Laval-like jet-effect can be provided by manipulating by the oncoming wind de Laval M-velocity. As the M-velocity is temperature-dependent, one can heat or cool air portions flowing within a specifically shaped tunnel, in particular, in an imaginary tunnel around a flying body;
- reaching and controlling the desired de Laval-like jet-effect can be provided by manipulating by the value of specific M-velocity, depending on the generalized adiabatic compressibility parameter $\gamma$. For example, one can inject a gas composed of multi-atomic particles into a tunnel, in particular, into an imaginary tunnel around a flying body. As well, it will be evident to a person skilled in the art that, for example, micro-flakes-of-snow could play a role of such multi-atomic particles. Another technique to change the generalized adiabatic compressibility parameter $\gamma$ and thereby to control the specific M-velocity is to ionize the flow, moving through the tunnel; and
- the described convergent-divergent jet-nozzles can be applicable to many apparatuses using mechanical and heat energy, provided by flowing gas or liquid.

Two-Stage Operation of the Coanda-Jet-Effect

Figure 8C:
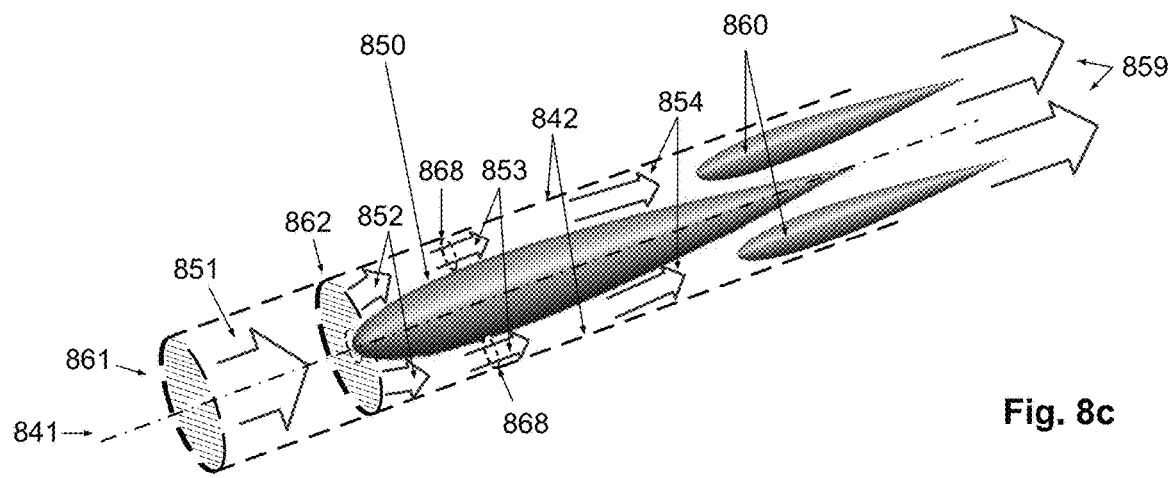
FIG. 8c is a schematic illustration of a flying airfoil body.

FIG. 8*c* is a schematic illustration of flying airfoil bodies 850 and 860, arranged such that the withers of airfoil bodies 860 follow downstream-behind the withers of body 850. For simplicity and without loss of reasoning, each airfoil body 850 and 860 has the shape of an elongated drop 840 described above with reference to FIG. 8*b*. All reference numerals 841, 861, 851, 862, 852, 868, 853, 842, and 854 are the same as described referring to FIG. 8*b*.

Consider a case, when flying airfoil bodies 850 and 860 meet oncoming portion 851 with a de Laval high M-velocity $M_{851}$, higher than the specific M-velocity $M_* = \sqrt{(\gamma-1)/\gamma} \approx 0.5345$ Mach. According to equation (6.13), air sub-potions 852 are slowing down as constricting on the way to the withers of body 850, such that M-velocity of the narrowest sliding sub-portions 853 reach the specific M-velocity, i.e. $M_{853} = M_*$ at the critical condition point 868. The de Laval-like retarding-effect occurs downstream-behind the withers. It provides the condition $M_* < M_{854}$, where index "854" corresponds to air sub-portions 854. So, airfoil bodies 860 meet oncoming sub-portions 854 flowing slower than with the specific M-velocity $M_* = \sqrt{(\gamma-1)/\gamma}$, but high sufficient to provide the critical condition near their [bodies 860's] withers. Again, according to equation (6.13), air sub-potions 859 have an M-velocity $M_{859}$ higher than the specific M-velocity $M_*$. Thus, flying airfoil bodies 850 and 860 meet the upstream air portions, and leave the downstream air portions, flowing faster than with the specific M-velocity $M_* = \sqrt{(\gamma-1)/\gamma}$. Furthermore, a cumulative cross-section of air sub-potions 859, wider than cross-section 861 of oncoming portion 851, means that the M-velocity $M_{859}$ is higher than the high M-velocity $M_{851}$ of oncoming portion 851. In this case, the Coanda-jet-effect two-stage operation accelerates a portion of ambient airflow that originally moves faster than with the specific M-velocity $M_*$. Thus, in contrast to the case when a body, having not-optimized shape, flies in air-environment with transonic, and/or supersonic, and/or hypersonic velocities, flying airfoil body 850, operating in tandem with each flying airfoil body 860, moving downstream behind the withers of airfoil body 850, results in a specific effect of acceleration and cooling air portion 851, oncoming faster than with the specific M-velocity $M_*$. This is one other primary teaching of the present invention.

Figure 8D:
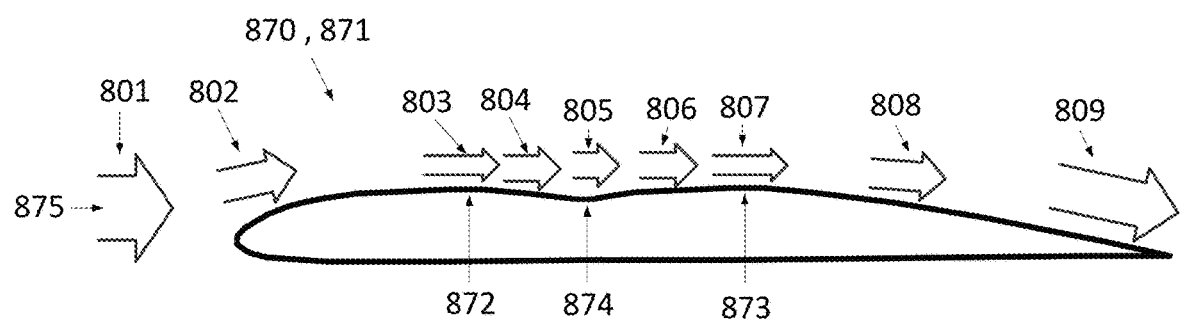
FIG. 8d is a schematic illustration of flying arranged airfoil bodies.

FIG. 8*d* is a schematic drawing of a flying wing 870 having a two-humped airfoil profile 871, constructed according to the principles of the present invention. The flying wing 870 comprises two withers: forward 872 and rear 873, separated by concavity 874. The flying M-velocity is higher than the specific M-velocity $M_*=\sqrt{(\gamma-1)/\gamma}\approx 0.5345$ Mach.

An oncoming flow portion 875 runs at wing 870 and passes positions: 801, 802, 803, 804, 805, 806, 807, 808, and 809 sequentially with associated M-velocities: $M_{801}$, $M_{802}$, $M_{803}$, $M_{804}$, $M_{805}$, $M_{806}$, $M_{807}$, $M_{808}$, and $M_{809}$, correspondingly. The two-humped airfoil profile 871 provides for the Coanda-jet-effect two-stage operation: upstream-afore and downstream-after concavity 874. At position 801, flow portion 875, having the de Laval high M-velocity $M_{801}$, is yet to be subjected to the Coanda-jet-effect operation over wing 870's profiled surfaces. The two-humped airfoil profile 871 causes that the cross-sectional area of portion 875 is varying as portion 875 moves over wing 870. So, portion 875 shrinks at position 802 while upping over the forward part, has the first local minimum of cross-section area at position 803 above the forward withers 872, expands at position 804 while downing into concavity 874, reaches the local maximum of cross-section area at position 805 when passing concavity 874, shrinks again at position 806 on the way to the rear withers 873, gets the second local minimal value of cross-section area at position 807 above the rear withers, and expands at positions 808 and 809. According to equation (6.13), portion 875 is subjected to the de Laval-like jet-effect and the de Laval-like retarding-effect such that:
- at position 802, the flow convergence is accompanied by the de Laval-like retarding-effect resulting in compressing and warming of flow portion 875 and a decrease of M-velocity, i.e. $M_{801}>M_{802}$
- at position 803, the first critical condition point, where the varying value of flow portion 875's cross-sectional area has the first local minimum, provides for that the M-velocity of flow portion 875 reaches the specific M-velocity $M_*$, so, $M_{801}>M_{802}>M_{803}=M_*$, i.e. the critical condition of the de Laval-like retarding-effect triggering is satisfied;
- at position 804, the flow divergence is accompanied by further compressing and warming of flow portion 875 and a decrease of M-velocity lower than the specific M-velocity $M_*$, i.e. $M_*>M_{804}$;
- at position 805 above concavity 874, the M-velocity $M_{805}$ is minimal, thereby, providing the condition: $M_{801}>M_{802}>M_{803}=M_*>M_{804}>M_{805}$;
- at position 806, the flow convergence is accompanied by cooling of flow portion 875, a decrease of static pressure, and an increase of M-velocity, i.e. $M_{805}M_{806}$;
- at position 807, the second critical condition point, where the varying value of the flow portion 875's cross-sectional area has the second local minimum, is designed to provide for that the M-velocity of flow portion 875 reaches the specific M-velocity $M_*$, i.e. the condition $M_{805}<M_{806}<M_{807}=M_*$ triggering the de Laval-like jet-effect is satisfied; and so,
- at positions 808 and 809, the flow divergence is accompanied by further cooling of flow portion 875, a decrease of static pressure, and an increase of M-velocity, i.e. $M_{805}<M_{806}<M_{807}=M_*<M_{808}<M_{809}$.

Depending on profile 871, the M-velocity $M_{809}$ of flow portion 875 at downstream position 809, may exceed the high M-velocity $M_{801}$ of flow portion 875 at upstream position 801, so, wing 870 may be used as a jet-booster based on the de Laval-like jet-effect, operating at high velocities. In general, a use of a two-humped airfoil profile of a wing flying with the de Laval high M-velocities, in order to provide for the desired jet-effect, is yet one of the teachings of the present invention.

In view of the foregoing description referring to FIG. 8d, it will be evident to a person skilled in the art that the effect of high M-velocity acceleration by the Coanda-jet-effect two-stage operation is applicable, for example, to high-speed aircraft design.

In view of the foregoing description referring to FIGS. 6h, 7d, 8c, and 8d, it will be evident to a person skilled in the art that, considering a body, flying in air-environment with transonic, and/or supersonic, and/or hypersonic velocities, i.e. with high M-velocities higher than the specific M-velocity $M_*=\sqrt{(\gamma-1)/\gamma}$,
- in contrast to a case, wherein a body having an arbitrary shape is decelerating when air-fluxes, which flow nearby around the body, become warmer and extra-warmed,
- a specifically-shaped body, having a two-humped airfoil profile providing for the two-stage operation of the Coanda-jet-effect, is accelerating, and air-fluxes, which flow nearby around the accelerating specifically-shaped body, become cooled and extra-cooled.

Cascaded Jet-Boosters

Figure 9A:
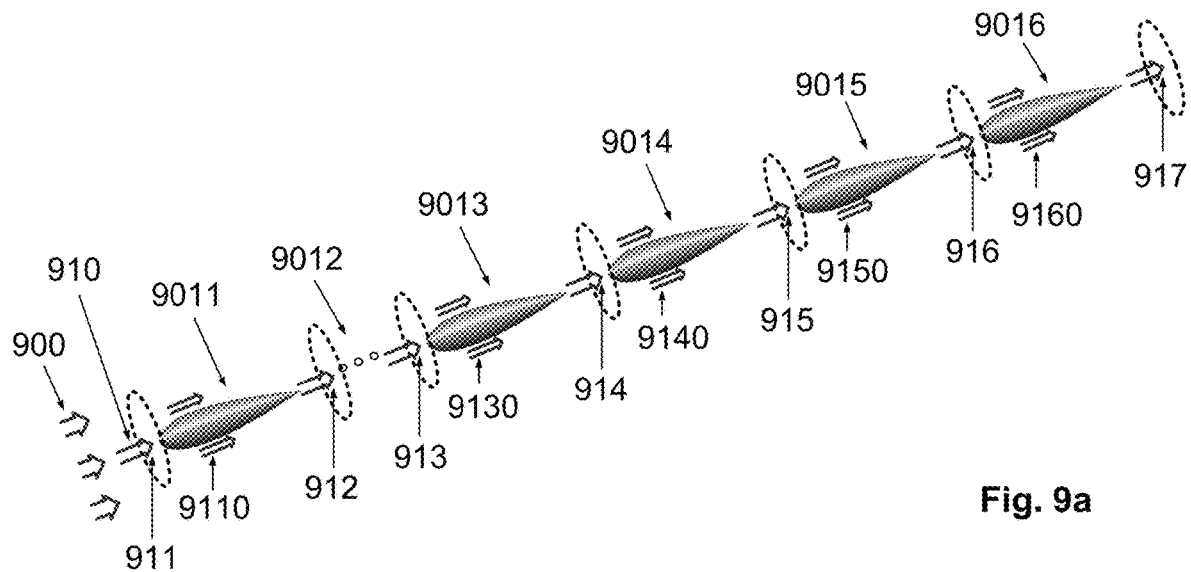
FIG. 9a is a schematic illustration of a sequential cascade of airfoil bodies.

FIG. 9a is a schematic illustration of a sequential cascade of in-line arranged airfoil bodies 9011, 9013, 9014, 9015, and 9016, each in the shape of an elongated drop, exposed to oncoming wind 900 having the ambient M-velocity substantially lower than the specific M-velocity $M_*=\sqrt{(\gamma-1)/\gamma}$. The shape of the elongated drops is optimized using the equation of M-velocity (6.13), basing on a specified thickness of a boundary layer over convex withers, as described hereinabove referring to FIGS. 8a and 8b. Points 9012 symbolize that the sequence of airfoil bodies may be much longer than shown. For simplicity, oncoming wind 900 is laminar. Trace a moving-small-portion 910 of ambient oncoming wind 900 passing positions 911, 9110, 912, 913, 9130, 914, 9140, 915, 9150, 916, 9160, and 917, considering a case when moving-small-portion 910 is subjected to the Coanda-jet-effect in an adiabatic process, defined by the partial pressure-c $\delta P_c$, rather than affected by the skin-friction resistance, quantified by the difference $(a_w-a-\delta a)$. Moving-small-portion 910 at position 911 is yet to be subjected to the Coanda-jet-effect operation. I.e. at least the forward airfoil body 9011 meets moving-small-portion 910 with M-velocity, lower than the specific M-velocity $M_*=\sqrt{(\gamma-1)/\gamma}$, and so body 9011 operates as a jet-booster based on the Venturi effect occurring in the adiabatic process in an imaginary tunnel adjacent to body 9011, as described above with reference to FIG. 8b. Further, moving-small-portion 910 is subjected to a cascaded operation of the Coanda-jet-effect in the adiabatic process by in-line arranged airfoil bodies 9011, 9013, 9014, 9015, and 9016, each of which operates as an elemental jet-booster, while meeting moving-small-portion 910 with M-velocity, lower than the specific M-velocity $M_*=\sqrt{(\gamma-1)/\gamma}$. The cascaded operation of the Coanda-jet-effect results in aligning of the Brownian random motion of moving-small-portion 910's molecules with the surfaces of in-line arranged airfoil bodies 9011, 9013, 9014, 9015, and 9016, that is observed as an increase of the effective velocity of moving-small-portion 910, accompanied by moving-small-portion 910 temperature decrease, as moving-small-portion 910 sequentially passes positions 9110, 9130, 9140, 9150, and 9160, where flowing as ambient-adjoining convergent-divergent jet-streams. Thus, this results in an increase of moving-small-portion 910's kinetic energy at the expense of moving-small-portion 910's internal heat energy. Consider certain identical cross-sectional areas at positions 911, 912, 913, 914, 915, 916, and 917, marked by dashed ellipses, such that the Coanda-jet-effect operation influence is still perceptible within the marked areas. Considering flow velocities much lower than the specific M-velocity $M_*=\sqrt{(\gamma-1)/\gamma}$, the effective velocity of flow crossing the marked areas at positions 911, 912, 913, 914, 915, 916, and 917 increases exponentially as the flow moves along the sequential cascade of in-line arranged airfoil bodies 9011-9016. For example, if the Coanda-jet-effect operation of each of airfoil bodies 9011-9016 in the adiabatic process provides an increase of the effective velocity of a flow portion, crossing the associated marked area, on 2%, then after 35 airfoil bodies 9011-9016 the effective velocity of the wind portion, crossing the marked area, is twice as high as the velocity of oncoming wind 900 yet to be subjected to the Coanda-jet-effect multi-stage cascaded operation. Consider a case, when the M-velocity $M_{9130}$ of moving-small-portion 910, flowing as an ambient-adjoining convergent-divergent jetstream nearby the withers of airfoil body 9013, reaches the specific M-velocity $M_*=\sqrt{(\gamma-1)/\gamma}$ at position 9130. Triggering of the de Laval-like jet-effect causes the M-velocity $M_{914}$ at position 914 to become higher than the specific M-velocity $M_*$. The moving-small-portion 910 becomes cooled between positions 913 and 9130 and becomes extra-cooled between positions 9130 and 914. Running at airfoil body 9014, moving-small-portion 910 is subjected to the de Laval-like retarding-effect, such that the portion's M-velocity decreases down to the specific M-velocity $M_*=\sqrt{(\gamma-1)/\gamma}$ at position 9140 nearby the withers of airfoil body 9014, and becomes lower than the specific M-velocity $M_*$ at position 915. The moving-small-portion 910 becomes warmer between positions 914 and 9140 and becomes extra-warmed between positions 9140 and 915. Then moving-small-portion 910 is subjected to the de Laval-like jet-effect and the M-velocity increases again. Thus, when the sequence of airfoil bodies 9011-9016 is sufficiently long, the effective M-velocity of moving-small-portion 910 reaches the value of the specific M-velocity $M_*=\sqrt{(\gamma-1)/\gamma}$ nearby the withers of airfoil bodies and varies around the value between the airfoil bodies. This is yet one more of the teachings of the present invention.

In view of the foregoing description referring to FIG. 9a, it will be evident to a person skilled in the art that:

- in a more general case, when oncoming wind 900 is turbulent, such that moving-small-portion 910 comprises whirling groups of molecules, the Coanda-jet-effect multi-stage cascaded operation results in aligning also of the turbulent motion of the whirling groups of molecules with the surfaces of in-line arranged airfoil bodies 9011, 9013, 9014, 9015, and 9016, that is observed as an increase of the effective velocity of moving-small-portion 910, accompanied by moving-small-portion 910's inner turbulence decrease, as moving-small-portion 910, flowing as ambient-adjoining convergent-divergent jetstreams nearby around the withers of airfoil bodies 9011, 9013, 9014, 9015, and 9016, sequentially passes positions 9110, 9130, 9140, 9150, and 9160, correspondingly. Thus, this results in an increase of moving-small-portion 910's kinetic energy also at the expense of moving-small-portion 910's inner turbulent energy;
- the effect of M-velocity acceleration and stabilization by a multi-stage cascaded operation of the Coanda-jet-effect thereby reinforced multi-repeatedly is applicable, for example, to a high-speed long-train design;
- the effect of M-velocity stabilization is applicable, for example, to a flying train-like object, in particular, supplied with wings, which are not shown here, providing for a lift-force;
- an arrangement of airfoil bodies 9011, 9013, 9014, 9015, and 9016 along a smoothly curved locus, instead of the in-line arrangement, can be implemented; and
- the stabilized temperature difference between the extra-cooled airflow portions subjected to the triggered de Laval-like jet-effect and the extra-warmed airflow portions subjected to the triggered de Laval-like retarding-effect may be used to power a Peltier-element operating as a thermoelectric generator producing electricity.

Reference is now made again to FIG. 9a, wherein now, all the in-line arranged airfoil bodies 9011, 9013, 9014, 9015, and 9016 are made from a conductive material, for simplicity, from a hypothetic super-conductor, wherein the sequence is exposed to electric flux 900. In view of the foregoing description referring to prior art FIG. 1f, the inventor points out that the effective electric flux crossing the marked areas at positions 911, 912, 913, 914, 915, 916, and 917 is self-increasing exponentially as flowing along the sequential cascade of in-line arranged airfoil conductive bodies 9011-9016 due to the electromagnetic jet-effect.

Figure 9B:
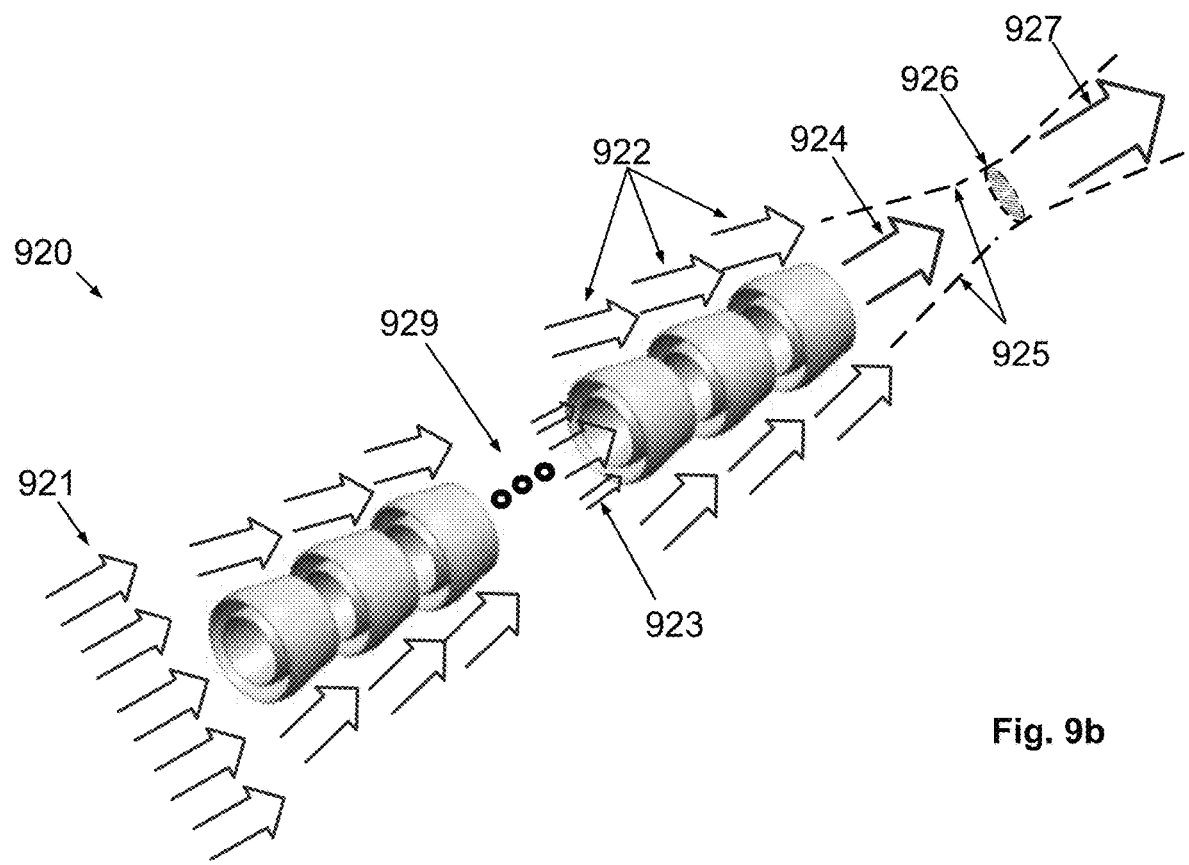
FIG. 9b is a schematic illustration of an in-line cascade of rings having airfoil walls.

FIG. 9b is a schematic illustration of a sequential multi-stage cascade of outer and nested airfoil rings 920, exposed to oncoming wind 921. Outer and nested airfoil rings 920 are formed by coiled-up walls having an actually-airfoil wing profile, similar, for example, to the profile of actually-airfoil wing 810, shown schematically in FIG. 8a. Thereby, outer and nested airfoil rings 920 have shapes of streamlined converging nozzles. The actually-airfoil wing profiles are optimized using the equation of M-velocity (6.13), basing on the specified thickness of a boundary layer over convex withers, as described hereinabove with the references to FIG. 8a. Points 929 symbolize that the sequence of outer and nested airfoil rings 920 may be much longer than shown. Airflow portions 922, flowing as ambient-adjoining convergent-divergent jetstreams, sliding outside of the sequential multi-stage cascade of outer rings 920, as well as wind portions 923, flowing and impacting inside of outer and nested airfoil rings 920, are subjected to the Coanda-jet-effect operation. Again, consider a case when airflow portions 922 and 923 are subjected to the Coanda-effect operation rather than to skin-friction resistance, thereby providing that each pair of outer and nested airfoil rings 920 operates as an elemental jet-booster. Airflow portions 922 and 923 join a cumulative outflow 924, wherein the Coanda-effect provides streamlines 925 forming an imaginary convergent-divergent nozzle downstream-behind the sequential multi-stage cascade of outer and nested airfoil rings 920. A sufficiently long multi-stage cascade of outer and nested airfoil rings 920 provides that the M-velocity of resulting cumulative outflow 924 reaches the specific M-velocity $M_*=\sqrt{(\gamma-1)/\gamma}$ at the minimal cross-section 926 of the imaginary convergent-divergent nozzle and the de Laval-like jet-effect is triggered downstream-behind the minimal cross-section 926. Airflow portion 927 is expanded adiabatically; therefore, it is extra-cooled and extra-accelerated.

A prolonged multi-stage cascade of outer and nested airfoil rings 920 may enable the M-velocity of airflow portions 922 to reach the specific M-velocity $M_*$ nearby the withers of airfoil outer rings 920. In this case, airflow portions 922 become subjected to the de Laval-like jet-effect, such that the effective M-velocity of airflow portions 922 is stabilized, as described hereinbefore with reference to FIG. 9a, considering a sequential multi-stage cascade of in-line arranged airfoil bodies, each having the shape of an elongated drop.

Figure 9C:
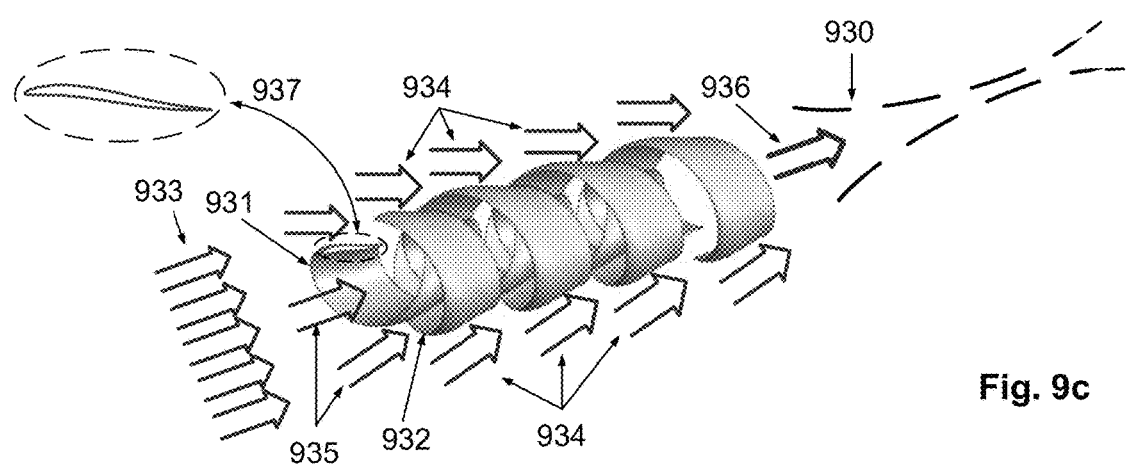
FIG. 9c is a schematic illustration of two Archimedean screws having airfoil walls.

FIG. 9c is a schematic illustration of a modified sequential multi-stage cascade of the outer and nested airfoil rings 920 of FIG. 9b into a pair of unbroken spirals shaped as the Archimedean screws 931 and 932 by helical coiling-up walls having airfoil profile 937, for example, similar to described above with reference to FIG. 8a. Airfoil profile 937, also shown separately above and to the left in an enlarged scale, is optimized using the equation of M-velocity (6.13), basing on the specified thickness of a boundary layer over convex withers, as described hereinabove with the reference to FIG. 8a, and taking into account an M-velocity range actually used for the spirals 931 and 932. Oncoming airflow portion 933 is yet to be subjected to the Coanda-jet-effect operation. Both: the sliding outside air sub-portions 934 flowing around and the inside impacting air sub-portions 935 flowing through the pair of spirals 931 and 932, are subjected to the Coanda-jet-effect operation, resulting in a converging flow when convergent flow sub-portions 934 and 935 laminarly join a resulting cumulative outflow 936. I.e. a fragment [for instance, one coil] of the pair of spirals 931 and 932 operates as an elemental jet-booster, and a longer fragment of converging spirals 931 and 932 provides higher acceleration of the airflow. Again, the Coanda-jet-effect provides streamlines 930 forming an imaginary convergent-divergent jet-nozzle downstream-behind the airfoil construction.

Moreover, the two spirals 931 and 932 have opposite helical screwing rotations, namely: clockwise and inverse-clockwise, thereby providing a spatially varying cross-sectional area of gaps between the walls of the two spirals 931 and 932. The spatially varying cross-sectional area of the gaps provides a Venturi effect for velocities lower than the specific M-velocity $M_*=\sqrt{(\gamma-1)/\gamma}$ and the de Laval-like jet-effect for velocities providing for reaching the specific M-velocity $M_*=\sqrt{(\gamma-1)/\gamma}$ at the critical condition point where the variable cross-sectional area of gaps becomes minimal. Sufficiently long converging spirals 931 and 932 provide acceleration of the airflow and stabilization of the effective velocity at the value of the specific M-velocity $M_*=\sqrt{(\gamma-1)/\gamma}$ analogous to the cases described above with references to FIGS. 9a and 9b.

In view of the foregoing description of FIGS. 9a, 9b, and 9c, it will be evident to a person skilled in the art that:

One can implement many alterations, re-combinations and modifications of elemental jet-boosters, taught herein, without departing from the spirit of the disclosure that can be generalized as the following. A sufficiently long aggregation of elemental jet-boosters provides acceleration of an airflow portion, reaching the specific M-velocity $M_*=\sqrt{(\gamma-1)/\gamma}$, thereby triggering alternating the de Laval-like jet-effect and the de Laval-like retarding-effect, resulting in a stable alternation of the airflow portion effective M-velocity above and below the specific M-velocity $M_*=\sqrt{(\gamma-1)/\gamma}$ between the elemental jet-boosters; and The cumulative useful kinetic-power, including both: the originally brought kinetic-power and the acquired kinetic-power, provided by a multiplicity of elemental jet-boosters, aggregated into an adiabatic converging system, depends on a quality and quantity of the elemental jet-boosters and how the elemental jet-boosters are arranged and exploited. Moreover, it will be evident to a person skilled in the art that a sequential in-line multi-stage cascading of the elemental jet-boosters has an especial sense.

For example, consider an aggregation comprising N elemental jet-boosters exposed to an ambient flow and oriented such that each elemental jet-booster provides an increase of the effective velocity of the flow portion moving through a certain effective cross-sectional area, by a factor F, wherein F>1, and for simplicity and without loss of the explanation generality, consider a case of sufficiently low velocity of the ambient flow and assume that it is the same factor, independently of the elemental jet-boosters arrangement and exploitation. As well, for simplicity, consider the case, when the M-velocities of accelerated flow remain lower than the specific M-velocity $M_*=\sqrt{(\gamma-1)/\gamma}$, thereby, justifying neglecting the flow density change in further approximate estimations. As the kinetic-power of a flow portion moving through a certain cross-sectional area is directly-proportional to the cross-sectional area and proportional to the third power of the flow portion velocity, each elemental jet-booster, when operating separately, launches a jetstream having the solitary useful kinetic-power, indicated by $W_1$, proportional to the third power of the factor F, expressed by $W_1=W_0 \times F^3$, where $W_0$ is the originally brought ambient useful kinetic-power associated with the effective cross-sectional area of one elemental jet-booster.

The solitary acquired kinetic-power $\Delta W_1$ is defined by the difference between the solitary useful kinetic-power $W_1$ and the originally brought ambient useful kinetic-power $W_0$, namely, $\Delta W_1=W_0 \times (F^3-1)$; and so the aggregation, comprising N such elemental jet-boosters and thereby accelerating the flow portions, moving through N effective cross-sectional areas, results in the cumulative useful kinetic-power:

indicated by $W_{parallel}$, equal to $W_{parallel}=N \times W_1=N \times W_0 \times F^3$, wherein the cumulatively acquired kinetic-power $\Delta W_{parallel}$ is defined as:

$$\Delta W_{parallel}=N \times \Delta W_1=N \times W_0 \times (F^3-1),$$

in the case, when the elemental jet-boosters operate independently, that occurs, if the elemental jet-boosters are arranged in parallel, or if the elemental jet-boosters are arranged sequentially, but operating in a not adiabatic process, allowing for the solitary useful kinetic-power $W_1$ to be consumed in parallel within or behind each elemental jet-booster and restored afore each next elemental jet-booster;

or, alternatively, indicated by $W_{sequential}$, equal to $W_{sequential}=W_0 \times (F^3)^N$, wherein the cumulatively acquired kinetic-power $\Delta W_{sequential}$ is defined as:

$$\Delta W_{sequential}=W_0 \times [(F^3)^N-N],$$

in the case, when the elemental jet-boosters are arranged sequentially operating in the adiabatic process, and the consumption of the cumulative useful kinetic-power is allowed behind the downstream-end of the last elemental jet-booster only.

In an exemplary practical case, the effective velocity increase factor equals F=1.097. Then the following conditions become satisfied:

the condition $W_{sequential}<W_{parallel}$ is satisfied for $N \leq 8$;
the condition $W_{sequential}>W_{parallel}$ is satisfied for $N \geq 9$;
the condition $W_{sequential}>^2 W_{parallel}$ is satisfied for $N \geq 13$;
the condition $W_{sequential}>^3 W_{parallel}$ is satisfied for $N \geq 15$; and
the condition $W_{sequential}>^4 W_{parallel}$ is satisfied for $N \geq 16$.

In view of the foregoing description of FIGS. 9a, 9b, and 9c, one of the primary teachings is that an artificial wind can be used for profitable harvesting of electricity. For example, one can:

- use a big-front ventilator [or group of ventilators], having 50%-net-efficiency, i.e. consuming electric-power $W_{consumed}$ and creating an originally incoming artificial airflow, bringing kinetic-power $W_{income}=0.5 \times W_{consumed}$, wherein the originally incoming artificial airflow has the front area $A_{income}$ of 4 times bigger than the effective cross-sectional area of an elemental jet-booster and has the effective velocity $u_{income}$;
- implement a sequential multi-stage cascade, comprising N=15 elemental jet-boosters, each of which is characterized by the effective velocity increase factor F=1.097, such that altogether making an outflowing artificial jetstream, having velocity $u_{jetsrteam}=U_{income} \times F^N [F^N=1.097^{15} \approx 4]$ and having the resulting effective front cross-sectional area $A_{jetsrteam}$, decreased approximately 4 times relative to the area $A_{income}$ of originally incoming airflow $[A_{income}/A_{jetsrteam}=F^N \approx 4]$. Thus, the outflowing artificial jetstream brings the resulting useful kinetic-power $W_{jetsrteam}$; estimated as: $W_{jetsrteam}=[(u_{jetsrteam}/u_{income})^3 \times (A_{jetsrteam}/A_{income})] \times W_{income}$; i.e. $W_{jetsrteam}=[4^3/4] \times W_{income}=[16] \times 0.5 \times W_{consumed}=8 \times W_{consumed}$; and
- use a wind-turbine, producing electricity with 50%-net-efficiency, thereby, harvesting the useful electric-power $W_{useful}$ of 4 times higher than the consumed electric-power $W_{consumed}$, namely, $W_{useful}=0.5 \times W_{jetstream}=0.5 \times (8 \times W_{consumed})=4 \times W_{consumed}$.

Wherein, the profit becomes greater than estimated, when the de Laval-like jet-effect is triggered. Thereby, in view of the foregoing description referring to FIGS. 9a, 9b, and 9c, it will be evident to a person skilled in the art that a profitable harvesting of electricity, using a jet-effect created by a multi-stage cascaded operation of the Coanda-jet-effect thereby reinforced multi-repeatedly, is feasible, for example, attaching sequentially arranged elemental jet-boosters to a sufficiently-long moving vehicle and using a wind-turbine, arranged behind the downstream-end of the last elemental jet-booster.

In view of the foregoing description referring to FIGS. 9a, 9b, and 9c, the inventor points out that, when reaching the stabilized effective velocity equal to the value of the specific M-velocity $M_*=\sqrt{(\gamma-1)/\gamma}$, the periodical local extra-acceleration and extra-retarding generate a forced extra-intensive elemental acoustic wave, wherein the distance between each two neighbor withers equals a half of wavelength of the forced extra-intensive elemental acoustic wave. Furthermore, the forced extra-intensive elemental acoustic waves are superposed in-phase thereby constituting the resulting extra-intensive acoustic wave as constructive interference. It will be evident to a person skilled in the art that the arrangement of airfoil bodies, either:

- 9011, 9013, 9014, 9015, and 9016 as shown in FIG. 9a; or
- a sequential multi-stage cascade of outer and nested airfoil rings 920 as shown in FIG. 9b; or
- a pair of unbroken spirals shaped as the Archimedean screws 931 and 932 by helical coiling-up walls having airfoil profile 937, as shown in FIG. 9c, subjected to the generalized jet-effect (namely, the Coanda-jet-effect, the de Laval-like jet-effect, the de Laval-like retarding effect, and the enhanced waving jet-effect) and supplied by an acoustic detector capable of detection of the resulting extra-intensive acoustic wave power, can play a role of an electricity generator that, in the final analysis, produces the electric power at the expense of the warmth of the air.

Kinetic Enemy Accumulation, Conservation, and Use

Figure 9D:
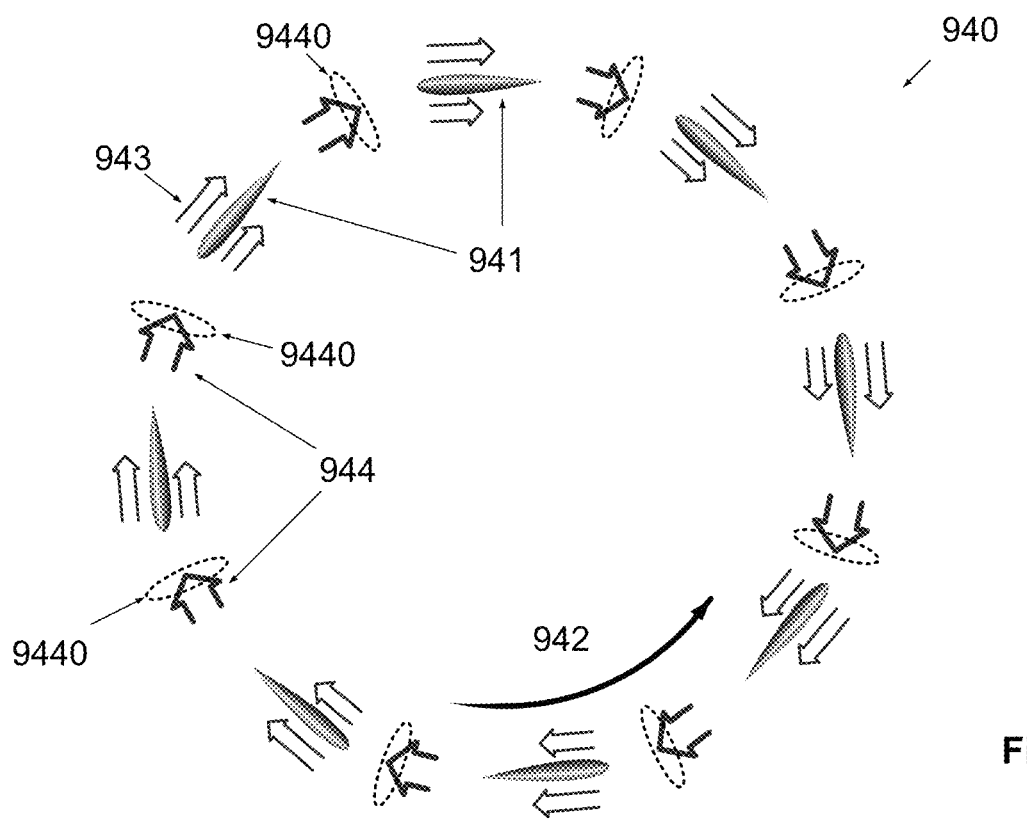
FIG. 9d is a schematic illustration of a circulating cascade of airfoil bodies.

FIG. 9d illustrates schematically a circulating system 940 comprising a multi-stage cascade of many [8 shown] airfoil bodies 941 submerged in a fluid and arranged circumferentially. The rotation is in the inverse-clockwise direction as indicated by curved arrow 942.

For simplicity, the shape and multi-stage cascading of airfoil bodies 941 are similar to the shape and multi-stage cascading of airfoil bodies 9011-9016 described above with reference to FIG. 9a, but now an asymmetry of shapes and attack angles of airfoil bodies 941 are such that the trajectories of flowing fluid portions 944 are aligned with the associated arc of circling.

The fluid sub-portions 943, flowing around airfoil bodies 941, are subjected to the Coanda-effect and skin-friction; wherein when flowing adjacent to the withers of airfoil bodies 941, fluid sub-portions 943 are subjected to a cross-sectional varying, performing ambient-adjoining convergent-divergent jetstreams. Consider a case, when flowing fluid sub-portions 943 are subjected to the Coanda-effect operation rather than affected by the skin-friction resistance, and are, thereby, accelerated in the clockwise direction, forming flowing fluid portions 944 between circulating airfoil bodies 941. I.e. airfoil bodies 941 operate as elemental jet-boosters, analogous to the operation of airfoil bodies 9011-9016 (FIG. 9a).

The sequential operation of the Coanda-jet-effect results in fluid portion 944's velocity distribution within cross-sections 9440, wherein the distribution occurs at the expense of fluid portion 944's temperature decrease. The term "local velocity" refers to the velocity of a flowing fluid sub-portion relative to the nearest flying body 941. The local velocity is directed substantially along a local sagittal axis, associated with the nearest flying body 941.

The circulation creates a positive feedback loop, providing a cycling operation of the Coanda-jet-effect within an imaginary toroidal space having cross-sections 9440. The cycling operation of the Coanda-jet-effect results in further aligning of the Brownian random motion of fluid sub-portions 943 molecules with the profiles of airfoil bodies 941 that is observed as a further increase of the effective local velocity of circulating fluid sub-portions 943, accompanied by the fluid sub-portions 943 temperature further decrease. This provides further distribution of portions 944 local velocity and further acceleration of flowing fluid sub-portions 943 up to reaching the specific M-velocity $M_*=\sqrt{(\gamma-1)/\gamma}$ in the narrowest cross-section near the withers. The reaching of the specific M-velocity $M_*=\sqrt{(\gamma-1)/\gamma}$ triggers alternating both the de Laval-like jet-effect and the de Laval-like retarding-effect, similar to that described hereinbefore with reference to FIG. 9a. Thus, the M-velocities of sub-portions 943 become stabilized at the specific M-velocity $M_*=\sqrt{(\gamma-1)/\gamma}$, and M-velocities of flowing portions 944 alternate above and below the specific M-velocity $M_*=\sqrt{(\gamma-1)/\gamma}$. Thus, the stabilized circulation of portions 944 within the imaginary toroidal space, having cross-sections 9440, may be interpreted as a conservation of the flowing portions 944 kinetic energy within the imaginary toroidal space. The accumulated and conserved kinetic energy of flow, indicated by $K_{acc}$, is equal to $K_{acc}=0.5\rho_{eff}V_{tor}u_{eff}^2$, where $\rho_{eff}$ is the effective density of circulating fluid, $V_{tor}$ is the volume of the imaginary toroidal space, and $u_{eff}$ is the effective local velocity of the circulating fluid, equal to $u_{\mathit{eff}} = M_* \times U_{sound}$, where $u_{sound}$ is the speed of sound in the fluid.

In view of the foregoing description of FIG. 9d, it will be evident to a person skilled in the art that:
- a part of the accumulated kinetic energy $K_{acc}$ of flow can be consumed, for instance, in the form of a jetstream, outflowing from the imaginary toroidal space, that is not shown here;
- an arisen lack of the consumed kinetic energy of flow can be accumulated again up to the value $K_{acc}$ by sucking fresh portions of the surrounding fluid into the imaginary toroidal space;
- circulating multi-stage cascade 940 operates similarly to a long in-line multi-stage cascade of many airfoil bodies 9011-9016 described hereinbefore with reference to FIGS. 9a, 9b, and 9c, but now fluid portions 944 move along a curved and closed trajectory. Such an implementation of inverse circulation of flow relative to the direction of bodies 941s' rotation is one of the teachings of the present invention as well;
- a fluid portion, circulating within the imaginary toroidal space and having the local velocity, static pressure, temperature, and density substantially distributed in cross-sections 9440, is subjected to inter-diffusion with the contacting fluid portion remained out of the imaginary toroidal space that results, in particular, in a caloric exchange between the fluid portions; and
- a circulating multi-stage cascade of elemental jet-boosters may function as a self-rotating warmth-to-motion engine.

Figure 9E:
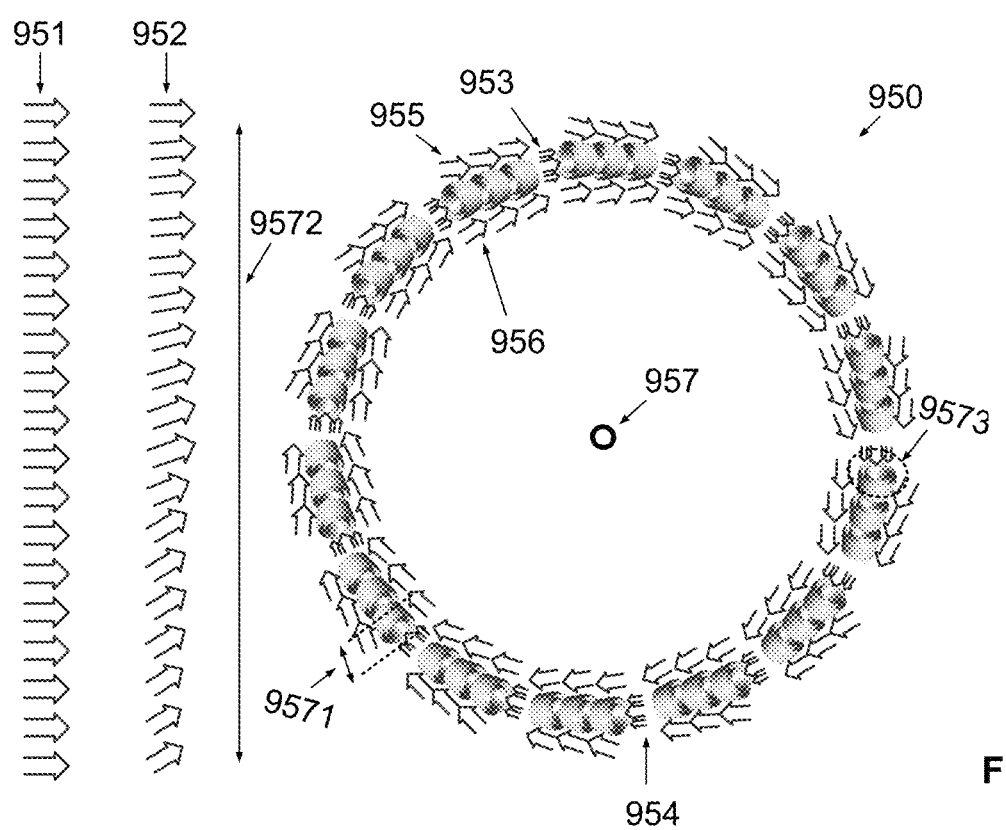
FIG. 9e is a schematic illustration of airfoil rings, arranged circumferentially.

FIG. 9e is a schematic top-view of a stationary circumferential arrangement of many [42 shown] elemental jet-boosters 950, thereby embodying a vortex-generator, constructed according to the principles of the present invention and exposed to natural ambient wind 951, bringing fresh air portions storing both:
- the kinetic energy of flow [i.e. the kinetic energy the directional laminar motion, or, in terms of the kinetic theory of gas, the kinetic energy of the air molecules headway motion];
- the kinetic energy of the Brownian random motion of air molecules [i.e. the inner heat]; and, in a more general case,
- the kinetic energy of whirling groups of air molecules [i.e. the turbulent energy].

The center of the circle is marked by point 957. The elemental jet-boosters 950 have an effective height 9571 and the circumferential arrangement occupies a circle having effective overall diameter 9572. So, the circumferential arrangement overall shape is an imaginary cylinder having a base of effective overall diameter 9572 and a side of height 9571.

For simplicity, the shown shape and multi-stage cascading of elemental jet-boosters 950 are similar to the shape and multi-stage cascading of airfoil outer and nested airfoil rings 920 described hereinbefore with reference to FIG. 9b. The airflow portions 953, flowing through the inner space of elemental jet-boosters 950, and portions 955 and 956 flowing as ambient-adjoining convergent-divergent jetstreams nearby around elemental jet-boosters 950, are subjected to the Coanda-jet-effect operation and, thereby converge. The circumferential arrangement provides that some elemental jet-boosters 950 are oriented to natural ambient wind 951, such that they operate as converging-nozzles;

and some other elemental jet-boosters 950 are oriented to natural ambient wind 951, such that they operate as divergent nozzles. This asymmetry of elemental jet-boosters 950 orientations causes the oncoming airflow front to be non-uniform in direction and therefore has a tendency to flow around a side of the arrangement, as schematically shown by arrows 952. Considering flow M-velocities much lower than the specific M-velocity $M_* = \sqrt{(\gamma-1)/\gamma}$, the multiplicity of elemental jet-boosters 950 causes accelerated wind sub-portions at position 954 to have local velocities, substantially higher than the velocity of natural ambient wind 951. This results in a circulation of airflow portions 953, 955, and 956 within an imaginary toroidal space, having effective overall diameter 9572 and a cross-section, marked by dashed ellipse 9573 having a diameter corresponding to effective height 9571. Circulating airflow portions 953, 955, and 956, become subjected to the Coanda-jet-effect circulating operation in a positive feedback loop, resulting in further aligning of the Brownian random motion of air molecules with the airfoil surfaces of elemental jet-boosters 950 that is observed as an increase of the effective local velocity of circulating airflow portions 953, 955, and 956, accompanied by the airflow portions temperature decrease. In a more general case, when airflow portions 953, 955, and 956 have inner turbulence, i.e. airflow portions 953, 955 and 956 comprise whirling groups of molecules, the Coanda-jet-effect multi-stage cascaded operation results in aligning also of the turbulent motion of the whirling groups of molecules with the airfoil surfaces of elemental jet-boosters 950, that is observed as an increase of the effective local velocity of airflow portions 953, 955, and 956, accompanied by the airflow portions inner turbulence decrease, as the airflow portions move within the imaginary toroid, sequentially passing elemental jet-boosters 950. Thus, this results in an increase of airflow portions 953, 955, and 956 kinetic energy also at the expense of airflow portions 953, 955, and 956 inner turbulent energy. The effective local velocity increase continues until reaching the specific M-velocity $M_* = \sqrt{(\gamma-1)/\gamma}$. Then the effective local velocity is stabilized triggering alternating both the de Laval-like jet-effect and the de Laval-like retarding-effect, as described hereinbefore with references to FIGS. 9a and 9d. In particular, an even number of jet-boosters 950 provides that the circulating airflow local velocities become steady-stately distributed in space. The circulating portions become cooled and extra-cooled, where the de Laval-like jet-effect is triggered, and become warmer and extra-warmed, where the de Laval-like retarding-effect is triggered.

In view of the foregoing description of FIG. 9e, and referring to the description of FIG. 4, it will be evident to a person skilled in the art that:
- Airflow portions 953, 955, and 956, circulating within the imaginary toroidal space and having the local velocity, static pressure, temperature, and density substantially distributed in cross-sections 9573, are subjected to inter-diffusion with the contacting airflow portions remained out of the imaginary toroidal space. This results, in particular, in the caloric exchange between the airflow portions;
- The circumferential arrangement of many elemental jet-boosters 950 exposed to the natural ambient wind may function as a warmth-to-vortex/tornado generator that can power a rotor of an electricity generator;
- The circumferential arrangement of many elemental jet-boosters 950 exposed to the natural ambient wind accumulates and conserves the kinetic energy of flow $K_{acc}$ independently of the direction of horizontal wind, as well as independently of any variation in the natural gusty wind direction, and furthermore, independently of any variation of the natural gusty wind non-zero velocity;

The stabilized temperature difference between the extra-cooled airflow portions, subjected to the triggered de Laval-like jet-effect, and the extra-warmed airflow portions, subjected to the triggered de Laval-like retarding-effect, may be used to power a Peltier-element operating as thermoelectric generator producing electricity, while the consumed heat power is restoring at the expense of the surrounding air caloric entering the imaginary toroidal space;

The circumferential arrangement of many converging airfoil bodies operating as elemental jet-boosters 950 exposed to natural ambient humid wind can be used, for example, as an air cooler triggering condensation of water-vapor into water-drops that can be applied to water harvesting from humid air. Furthermore, it will be evident to a person skilled in the art that the condensation of water-vapor into water-drops is an exothermic process resulting in that the stabilized circulation of airflow has the stabilized temperature defined by the so-called "dew-point temperature" corresponding to the humidity of ambient wind; thus, the area, bordered by the circumferentially arranged elemental jet-boosters, performs an oasis of a stably-eddying windiness and refreshing coolness; and In a more general case, the circumferential arrangement of many converging airfoil bodies, operating as elemental jet-boosters 950 exposed to natural ambient wind 951, can enable rotations around the vertical axis through point 957 and power a rotor of an electricity generator. Alternatively, different arrangements of wind-turbines can be adapted to use the fast rotations of wind portions, again, while the consumed heat-power is restoring at the expense of the surrounding air caloric entering the imaginary toroidal space.

In view of the foregoing description referring to FIGS. 9a, 9b, 9c, 9d, and 9e, it will be evident to a person skilled in the art that:

one can configure many modifications of airfoil bodies operating as elemental jet-boosters, providing flow acceleration due to a multi-stage cascaded operation of the Coanda-jet-effect to reach the specific M-velocity $M_* = \sqrt{(\gamma-1)/\gamma}$ and, thereby, to trigger the de Laval-like jet-effect arising; and one can configure many modifications of elemental jet-boosters arrangements along smoothly curved loci, instead of the circumferential arrangement. The arrangement locus can be at least one of a line, an arc, a spiral of Archimedes, an outer helical outline of the Archimedean screw, a rounded contour, an ellipse, and a circumference.

Figure 9F:
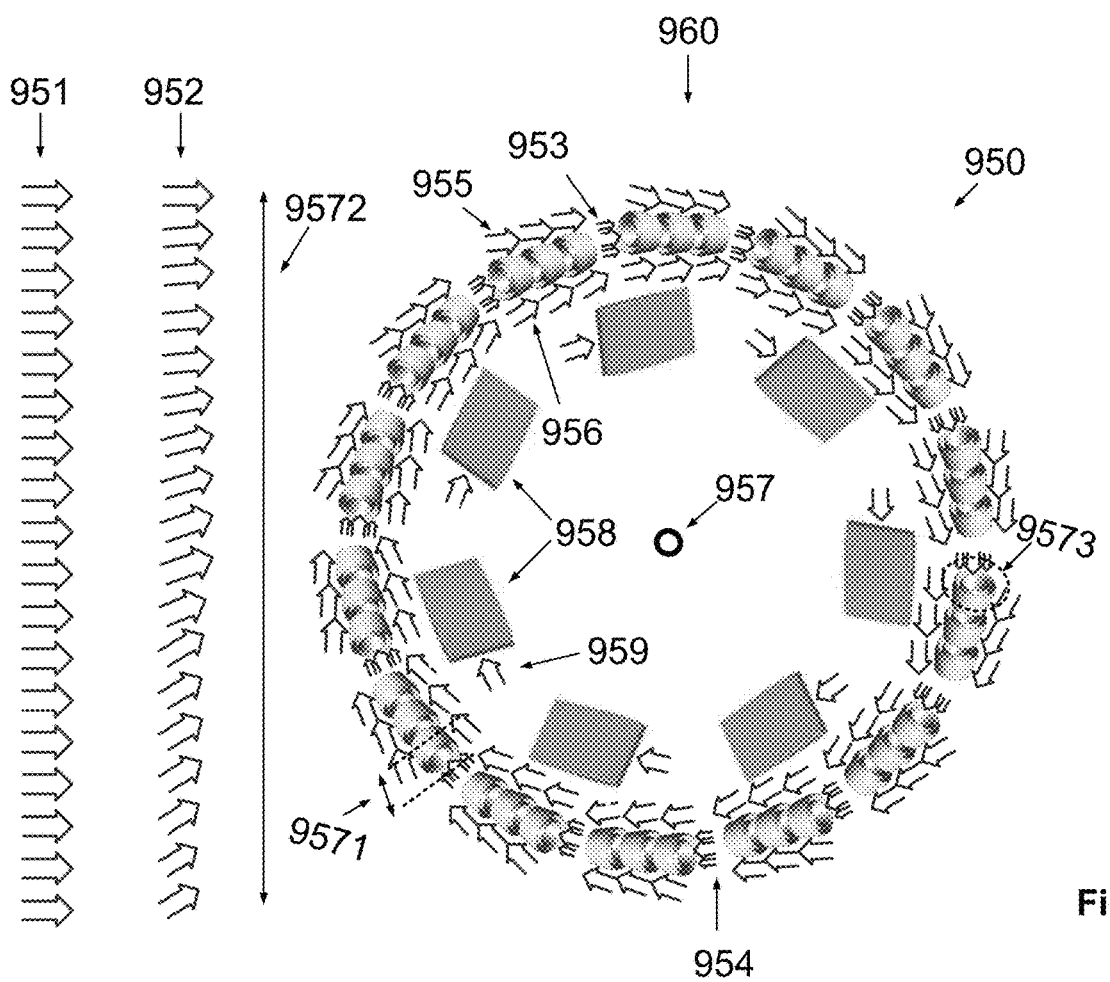
FIG. 9f is an adiabatic aerodynamic system comprising airfoil rings, arranged circumferentially, and wings, providing a lift-force.

FIG. 9f is a schematic top-view of an adiabatic aerodynamic system 960, constructed according to the principles of the present invention, comprising:

the stationary circumferential arrangement of many elemental jet-boosters 950, described above with reference to FIG. 9e having the same reference numerals 951, 952, 953, 954, 955, 956, 957, 9571, 9572, and 9573; and stationary airfoil wings 958, arranged within the mentioned imaginary cylinder having the basis of effective overall diameter 9572 and the side of height 9571.

Airflow portions 959 are entrapped and drawn by stably circulating adjacent airflow portions 956, and so are stable-circulating as well.

In one application, stationary airfoil wings 958 are configured and oriented to originate lift-forces under the influence of stable-circulating airflow portions 959.

Alternatively, the airfoil wings 958 have symmetrical airfoil shape relative to a horizontal plane, and thereby do not originate lift-forces, but result in reactive thrust-forces directed along local sagittal axes, associated with nearest airfoil wings 958, due to the jet-effect as described hereinbefore referring to FIG. 8b, thereby enabling airfoil wings 958 rotations around the vertical axis through point 957. Wherein, if airflow portions 959 are subjected to the Coanda-effect operation rather than affected by the skin-friction resistance, then airfoil wings 958 rotation is in the inverse-clockwise direction, i.e. against the direction of airflow portions 959 rotation. This phenomenon is one of the teachings of the present invention as well.

In view of the foregoing description referring to FIG. 9f, it will be evident to a person skilled in the art that:

The lift-force, acting on wings 958, is independent of the direction of horizontal natural ambient wind 951, as well as independent of any variation in the natural gusty wind direction, and furthermore, independent of any variation of the natural gusty wind non-zero velocity; and it will be evident to a person skilled in the art that the lift-force, acting on wings, can be controlled by the airfoil wings configuration, arrangement, and orientation. An implementation of an adiabatic aerodynamic system, having no moving parts and providing for a stable and predictable lift-force generated at the expense of ambient air heat energy, is also one of the teachings of the present invention;

Implementing an adiabatic aerodynamic system comprising a circumferential arrangement of many elemental jet-boosters, either a wide-front fluid flow or many fluid jetstreams, made artificially, can be used instead of the natural ambient wind;

The principles, applied to the construction of adiabatic aerodynamic system 960, allow for a design of a flying-saucer. Wherein, in contrast to a principle of helicopter, where rotating wing-like blades interact with stationary air, here, stationary wings 958 interact with rotating airflow portions 959.

As well, to provide a controlled maneuvering, adiabatic aerodynamic system 960 can be supplied with airfoil blades, similar to stationary wings 958, but having controllable degrees of freedom to be oriented asymmetrically relative to point 957, thereby, redirecting the stably circulating airflow portions out of the adiabatic aerodynamic system and allowing for a reactive push in any desired direction, as well as for stabilizing the flying-saucer position in atmosphere. Furthermore, the energy, conserved in the form of the stable-circulating airflow portions kinetic energy, allows for a fast maneuvering of the flying-saucer; and Adiabatic aerodynamic system 960, exposed to natural humid wind, can be adapted for the humidity condensation, and thereby, water harvesting from humid air. To estimate efficiency of the water condensation, consider a stationary circumferential arrangement of many elemental jet-boosters 950 exposed to natural ambient humid wind moving with velocity, indicated by $u_{951}$ $u_{951}$, and characterized by parameters of static pressure $P_{951}$, temperature $T_{951}$, density $\rho_{951}$, and relative humidity $h_{951}$, wherein in a normal exemplary case, the parameters are quantified as: $u_{951}=10$ m/sec, $P_{951}=100$ kPa, $T_{951}=298$ K, $\rho_{951}=1.2$ kg/m$^3$, and $h_{951}=60\%$. The values of $P_{951}$, $T_{951}$, $P_{951}$, and $h_{951}$, correspond to absolute humidity $H_{951}=14$ g/m$^3$ and so-called "dew-point temperature", equal to $T_{dew}$=289K for the case. Consider an exemplary implementable case, when the effective overall diameter 9572 is equal to $D_{9572}$=20.3 m, and the stabilized air motion with effective M-velocity, indicated by $M_{9573}$, equal to the specific M-velocity $M_*=\sqrt{(\gamma-1)/\gamma}$, is through cross-sections 9573, having the effective diameter, indicated by $d_{9573}$, equal to 0.5m. The volume of the imaginary toroidal space, having the effective overall diameter $D_{9572}$ and the cross-sectional diameter $d_{9573}$, is equal to $V_{tor}=\pi\times D_{9572}\times 0.25\pi\times d_{9573}\approx 12.5$ m³, and the imaginary toroidal space bordering area, indicated by $A_{tor}$, is equal to $A_{tor}=\pi D_{9572}\times \pi d_{9573}\approx 100$ m². The imaginary toroidal space volume $V_{tor}$ comprises potentially yet to be condensed water-vapor, having mass $M_V$, equal to $M_V=V_{tor}H_{951}\approx 175$ g. The acquired kinetic energy of the circulating airflow, $K_{acquired}$, is defined as $K_{acquired}=0.5\times V_{tor}[\rho_{eff}u_{eff}^2-\rho_{951}u_{951}^2]$, where the effective local velocity $u_{eff}$ of the airflow, circulating within the imaginary toroidal space, is quantified as $u_{eff}=M_{9573}\times u_{sound}\approx 184$ m/sec, and the effective density $\rho_{eff}$ interrelates with the stabilized dew-point temperature $T_{dew}$, according to the Clapeyron-Mendeleev gas state law for an adiabatic process. Namely, $$\rho_{eff}=\rho_{951}\left(\frac{T_{dew}}{T_{951}}\right)^{\frac{1}{\gamma-1}}\approx 1.2\times\left(\frac{289}{298}\right)^{2.5}\approx 1.1 \text{ kg/m}^3.$$

Thereby, the acquired kinetic energy $K_{acquired}$, is estimated approximately as $K_{acquired}=0.5\times V_{tor}[\rho_{eff}u_{eff}^2-\rho_{951}u_{951}^2]\approx 0.5\times 12.5\times[1.1\times 184^2-1.2\times 10^2]\approx 232$ kJ.

To reach the dew-point temperature making the air portion saturated with humidity, the circulating humid air portion of the volume $V_{tor}$ must lose the internal heat energy, indicated by $\Delta U$, estimated as: $\Delta U=\rho_{eff}V_{tor}R(T_{951}-T_{dew})\approx 1.1\times 125\times(8.31/0.0285)\approx 38$ kJ. The estimated value of the acquired kinetic energy $K_{acquired}$ is much greater than the value of internal heat energy loss $\Delta U$, so after reaching the dew-point temperature, the energy difference $(K_{acquired}-\Delta U)\approx 194$ kJ goes to trigger the water condensation process. Condensation of water at the dew-point temperature requires a reducing of the saturated humid air portion's heat energy per unit mass on the value $\Lambda_{water}$=2260 kJ/kg. Thereby, the estimated acquired kinetic energy of airflow $K_{acquired}$ potentially may be accompanied by the condensed water amount $M_{water}=(K_{acquired}-\Delta U)/\Lambda_{water}\approx 86$ g. The value $M_{water}$ is substantially lesser than the estimated above mass $M_V$ of water-vapor that potentially could be condensed, so the water mass amount $M_{water}\approx 86$ g is actually feasible for condensation.

Further, a part of the circulating airflow can be permanently withdrawn in the form of outflowing jetstreams, for instance, under the influence of wings 958, arranged adjacent to the elemental jet-boosters 950 to redirect circulating airflow portions 959, resulting in drawing out air portions 956, 954, and 955 from the imaginary toroidal space. The outflowing jetstreams take away the acquired kinetic energy of circulating airflow $K_{acquired}$. As the accumulated kinetic energy $K_{acc}$ of the airflow, circulating within the imaginary toroidal space, has a tendency to stabilization, so, an arisen lack of the accumulated kinetic energy of airflow $K_{acc}$, caused by the withdrawn of the acquired kinetic energy of airflow $K_{acquired}$, has a tendency to be reacquired again by sucking fresh portions of the surrounding air into the imaginary toroidal space and further, by an acceleration of the sucked fresh portions, increasing the sucked fresh portions local velocity up to the stabilized effective local velocity $u_{eff}=M_*\times u_{sound}$. The possible airflow discharge from and sucking into the imaginary toroidal space, indicated by $Q_{fresh}$, is defined by the condition $Q_{fresh}>A_{tor}u_{951}$, as the ambient velocity $u_{951}$ is substantially lower than the expected airflow local velocities at the borders of the imaginary toroidal space. Thus, the condition of the possible airflow discharge $Q_{fresh}$ is quantified as $Q_{fresh}>1000$ m³/sec. The possible airflow discharge $Q_{fresh}$ is much greater than the airflow $F_{9573}$ moving through cross-section 9573 of the imaginary toroidal space, estimated as $F_{9573}=0.25\pi\times d_{9573}^2\times u_{eff}$, and is sufficient to refresh the humid air in the imaginary toroidal space volume $V_{tor}$ several times per second, indicated by $N_{refresh}$, defined and estimated as $N_{refresh}=Q_{fresh}/V_{tor}>80$ sec⁻¹. The intensity of water condensate harvesting, indicated by $F_{condensation}$, is defined by the feasible condensed water amount $M_{water}\approx 86$ g multiplied on the $N_{refresh}$. Thus, the intensity of water condensate harvesting $F_{condensation}$ is estimated as:

$$F_{condensation}=N_{refresh}\times M_{water}>6.88\frac{\text{kg}}{\text{sec}}\approx 413 \text{ kg/min}.$$

The estimated intensity of water harvesting $F_{condensation}$ is at least of the same order of the value as a flux of water head discharging from a hose of a fire-extinguishing machine. Thereby, a stationary circumferential arrangement of many elemental jet-boosters 950 can be used for water harvesting from air for domestic and industrial needs, and, for example, attached to a helicopter, can be adapted for a fire-extinguishing.

In view of the foregoing description referring to FIG. 9f, it will be evident to a person skilled in the art that airfoil wings 958, exposed to stably-circulating airflow portions 959 and enabling rotations around the vertical axis through point 957, may power a rotor of an electricity generator. Alternatively, the stabilized temperature difference between the extra-cooled airflow portions, subjected to the triggered de Laval-like jet-effect, and the extra-warmed airflow portions, subjected to the triggered de Laval-like retarding-effect, may be used to power a Peltier-element operating as thermoelectric generator producing electricity, while the consumed heat power is restoring at the expense of the surrounding air caloric entering the imaginary toroidal space. Thus, the acquired kinetic energy of airflow $K_{required}$, refreshed $N_{refresh}$ times per second, may provide an acquired kinetic-power of airflow $W_{acquired}$, defined as $W_{acquired}=N_{refresh}\times K_{acquired}$. Taking into the account the estimations made hereinabove, the possible acquired kinetic-power of airflow $W_{acquired}$ is estimated as: $W_{acquired}>18.56$ MW. Thereby, a relatively compact stationary circumferential arrangement of many elemental jet-boosters 950 can be used for electric power producing for domestic and industrial needs.

In view of the foregoing description referring to FIGS. 9a, 9b, 9c, 9d, 9e, and 9f, it will be evident to a person skilled in the art that the circumferential arrangement of many elemental jet-boosters exposed to moving seawater can be adapted for electricity harvesting from the seawater motion.

In view of the foregoing description referring to FIGS. 9e and 9f, it will be evident to a person skilled in the art that the circumferential arrangement of many converging airfoil bodies operating as elemental jet-boosters 950 exposed to either natural or artificial wind can be used, for example, as a wind tunnel in an aerodynamic laboratory, providing a stable spatial distribution of the wind velocities.

In view of the foregoing description referring to FIGS. 9d, 9e, and 9f, the inventor points out that, when the circumferential arrangement is regularly equidistant and when portions 955 and 956 are reaching the stabilized effective M-velocity equal to the value of the specific M-velocity $M_* = \sqrt{(\gamma-1)/\gamma}$ near withers of the circumferentially arranged elemental jet-boosters 950, the periodical local extra-accelerations and extra-retarding generate a forced extra-intensive and in-phase superposed elemental acoustic waves, wherein the distance between each two neighbor withers equals a half of wavelength of the forced extra-intensive elemental acoustic wave.

The inventor points out that each of elemental jet-boosters 950 acts as a source of an extra-intensive peculiar shock-like acoustic wave characterized by the peculiar frequency and wavelength, while each pair of the neighbor elemental jet-boosters 950 acts as a source of the extra-intensive forced elemental acoustic wave characterized by the forced frequency and wavelength. The forced extra-intensive elemental acoustic waves are superposed in-phase thereby constituting the resulting extra-intensive acoustic wave as constructive interference with respect to the system of coordinates linked to the whirling flow portions.

It will be evident to a person studied the present invention that:
  The circumferential arrangement of elemental jet-boosters 950, subjected to the generalized jet-effect (namely, the Coanda-jet-effect, the de Laval-like jet-effect, the de Laval-like retarding effect, and the enhanced waving jet-effect) and supplied by an acoustic detector capable of detection of the resulting extra-intensive acoustic wave power, can play a role of an electricity generator that, in the final analysis, produces the electrical power at the expense of the warmth of the air; and
  The whirling of air portion with the effective M-velocity equal to the value of the specific M-velocity $M_* = \sqrt{(\gamma-1)/\gamma}$ once becoming stabilized, continues self-supporting even in the absence of the circumferential arrangement of elemental jet-boosters 950. For instance, the well-known Great Red Spot of Jupiter is such a stabilized tornado. Furthermore, constructive interference of extra-intensive peculiar shock-like acoustic waves, characterized by the peculiar wavelength, can be observed as a regular polygon built-in into the stabilized whirling, where the side of the polygon is equal to the peculiar wavelength. For instance, the well-known Saturn's Hexagon is such a stabilized and stably whirling interference map.

Improved Wind-Turbine

Figure 9G:
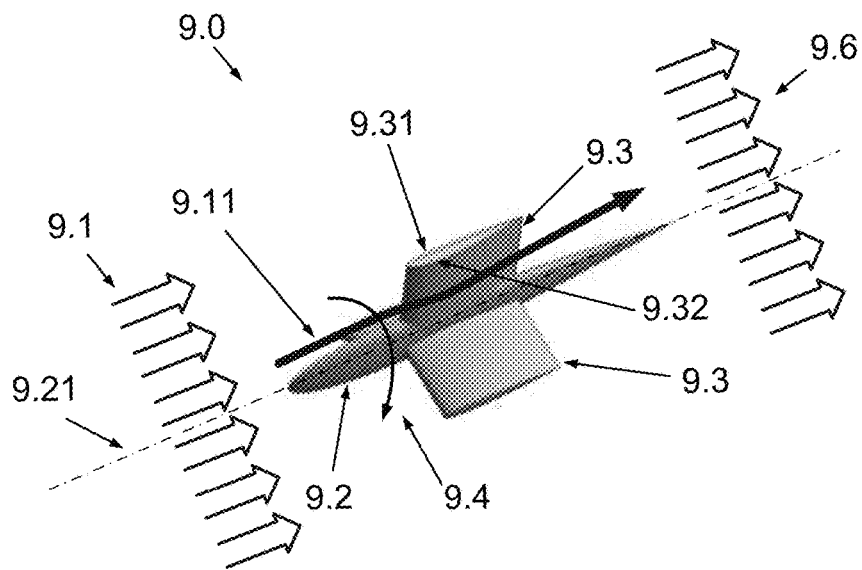
FIG. 9g is a schematic drawing of an improved wind-turbine, constructed according to the principles of the present invention.

FIG. 9g is a schematic drawing of modified improved wind-turbine 9.0, constructed according to the principles of the present invention to operate under relatively fast airflow 9.1 for producing the electric power at the expense of the warmth of relatively fast airflow 9.1.

Modified improved wind-turbine 9.0 comprises:
  axle 9.2 oriented along sagittal axis 9.21 codirected with fast airflow 9.1,
  identical asymmetrical biconvex actually-airfoil blades 9.3, attached to axle 9.2; and
  an engine [not shown here], capable of transforming the power of the forced mechanic rotational motion 9.4 of axle 9.2 into the electric power.

The primary feature, making the modified wind-turbine 9.0 practically implementable and extremely efficient, is the specifically configured and so specifically functioning biconvex actually-airfoil blades 9.3. Namely, in contrast to standard wind-turbines having standardly shaped blades configured to be subjected to impacting by an incoming airflow that, in particular, results in the airflow turbulence, retarding, and warming, the modified improved wind-turbine 9.0 has asymmetrical biconvex wing-like actually-airfoil blades 9.3:
  having opposite convex sides 9.31 and 9.32 with withers differing in convexity and
  being oriented along and so adapted to the incoming fast airflow jetstream 9.11 headway motion.

Thereby configured and oriented blades provide the so-called zero attack angle:
  to exclude or at least to minimize the impact by the incoming fast airflow jetstream 9.11, but
  to provide an interaction with the fast airflow jetstream 9.11 by the Coanda-jet-effect only, thereby resulting in an acceleration and cooling of outflowing jetstream 9.6 and resulting in lift-forces, acting on identical biconvex actually-airfoil blades 9.3 and being disbalanced because of the aligned asymmetry of the identical biconvex airfoil blades.

In this case, the axle 9.2 rotational motion, shown by the curved arrow having numeral 9.4, is caused by the cumulative resulting lift-force. Take note again, that the Coanda-jet-effect is triggered by the airflow kinetic-power and is actually powered at the expense of the airflow warmth but not at the expense of the incoming fast airflow jetstream 9.11 kinetic-power; contrariwise, the kinetic-power of outflowing jetstream 9.6 is increased or at least not decreased with respect to the oncoming fast airflow 9.1. Thus, in contrast to the standard wind-turbines, the proposed improved wind-turbine 9.0 is specifically characterized:
  by the mechanism of operation, that is the Coanda-jet-effect but not the impact; and
  by the power source of operation, that is the warmth but not the kinetic power of airflow.

Also, in contrast to a kind of the standard wind-turbines having wing-like blades moving around a vertical axis, the proposed improved wind-turbine 9.0 is specifically characterized by the excluding of varying poorly-streamlined positions of the wing-like blades.

As well, in contrast to the standard wind-turbines, a productivity of the proposed improved wind-turbine 9.0 is defined by the area of the biconvex airfoil blades rather than by a so-called "swept area", namely, the produced electric power due to the Coanda-effect is specified as proportional to the biconvex airfoil blades area, i.e. the productivity can be increased substantially for a given swept area.

In view of the foregoing description referring to FIG. 9g, it will be evident to a person skilled in the art that modified improved wind-turbine 9.0 comprising:
  the biconvex airfoil blades, having a wing-like sectional contour with a longer so-called chord of wing, and/or
  an increased quantity of the biconvex airfoil blades,
both circumstances provide for enforcing of the desired Coanda-jet-effect. As well, it is self-suggested a sequential in-line arrangement of a multiplicity of modified improved wind-turbines 9.0 one downstream after another (optionally, alternatingly differing in asymmetry to become forcedly rotated alternatingly clockwise and inverse-clockwise, correspondingly), each separately and all together efficiently operating within the given swept area.

Moreover, at least one of the profiles 9.31 and 9.32 is implemented to provide the de Laval enhanced jet-effect, when the incoming fast airflow jetstream 9.11 is flowing with a de Laval M-velocity and so a portion of jetstream 9.11 is reaching the specific M-velocity nearby the withers of the asymmetrical biconvex actually-airfoil blades 9.3. In this case, the extra-efficiency of the modified improved wind-turbine is expected.

Furthermore, optionally, sides 9.31 and 9.32 differ in shape such that one of the sides has one convex withers and the opposite side has a two-humped airfoil profile providing for the two-stage operation of the Coanda-jet-effect as described hereinabove with the reference to FIG. 8*d*. Such asymmetrical blades, when exposed to oncoming fast airflow 9.1 moving with a high M-velocity, higher than the specific M-velocity, become subjected, on the one hand, to the de Laval retarding effect, and on the other hand, to the de Laval enhanced jet-effect. This provides for extra-increased lift-forces rotating axle 9.2. In this case, the extra-efficiency of the modified improved wind-turbine is expected in a wide range of velocities.

Figure 9H:
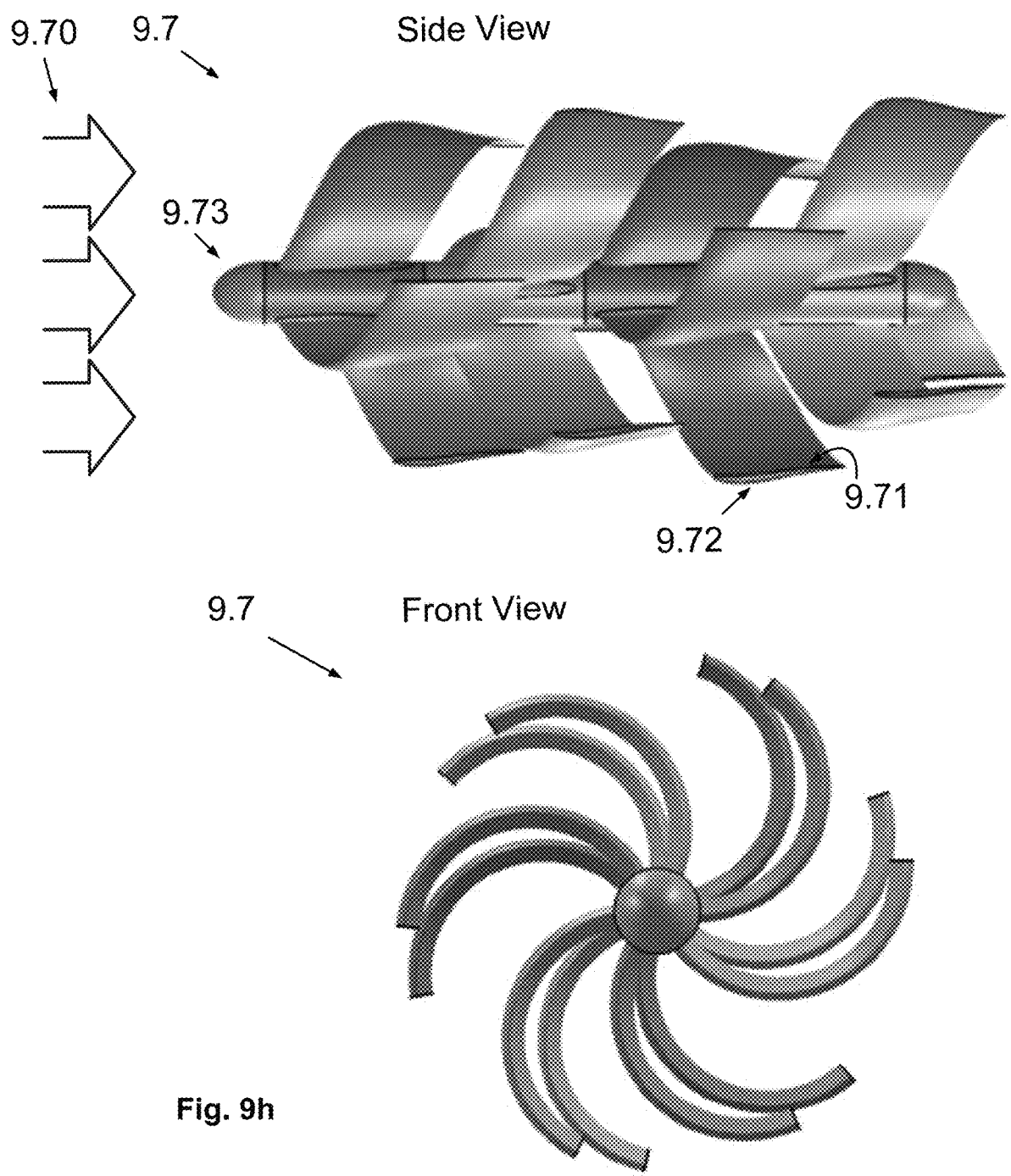
FIG. 9h is schematic side and front views of an improved wind-turbine.

FIG. 9*h* is a schematic drawing comprising the side view and front view of an improved wind-turbine 9.7, constructed according to the principles of the present invention to operate under relatively fast airflow 9.70 for producing the electric power at the expense of the warmth of relatively fast airflow 9.70. In relation to all the principal features, the improved wind-turbine 9.7 is similar to the improved wind-turbine 9.0, described hereinabove referring to FIG. 9*g*, but now, referring to the aforementioned optional diversity of the principal features implementation, the biconvex actually-airfoil blades, which having opposite at least partially convex sides 9.71 and 9.72 with withers differing in convexity, are further curved and screwed to optimize a suppression of turbulence as well as are cascaded one downstream after another to provide a multi-stage repeated operation of the Coanda-jet-effect thereby contributing to the desired cumulative lift-force to rotate axle 9.73.

In view of the foregoing description referring to FIGS. 9*g* and 9*h*, it will be evident to a person skilled in the art that modified improved wind-turbine 9.0 or 9.7, when attached to a flying aircraft, is capable for efficient harvesting of the electric power from the ambient air warmth.

Furthermore, in view of the description expound hereinabove with references to FIGS. 5*i*, 5*j*, 5*k*, 9*a*, 9*b*, 9*c*, 9*d*, 9*e*, and 9*f*, the inventor points out that the mentioned multiplicity of modified improved wind-turbines 9.0 or 9.7, arranged sequentially one downstream after another [not shown here], results in generation of acoustic waves accompanied by extraction of the internal heat energy of ambient air in favor for the wave power due to the enhanced waving jet-effect. Thus, a system, comprising the arrangement and a detector of the acquired wave power, has an additional degree of freedom to increase the efficacy of the producing of electricity.

In view of the foregoing description referring to FIGS. 9*g* and 9*h* in combination with the foregoing description of subparagraphs "Point of Sail" and "Flying Bird", both with the reference to prior art FIG. 1*i*, it will be evident to a person skilled in the art that the construction of modified improved wind-turbine 9.7, when having a controllable speed of the axle 9.73 rotation adapted to the velocity of oncoming airflow 9.70 to keep the airflow remaining laminar, provides a controllable net jet-thrust against the oncoming airflow 9.70 and so becomes applicable as a kind of jet-engine for a controllable and substantially noiseless flying.

A Jet-Transformer

Figure 9I:
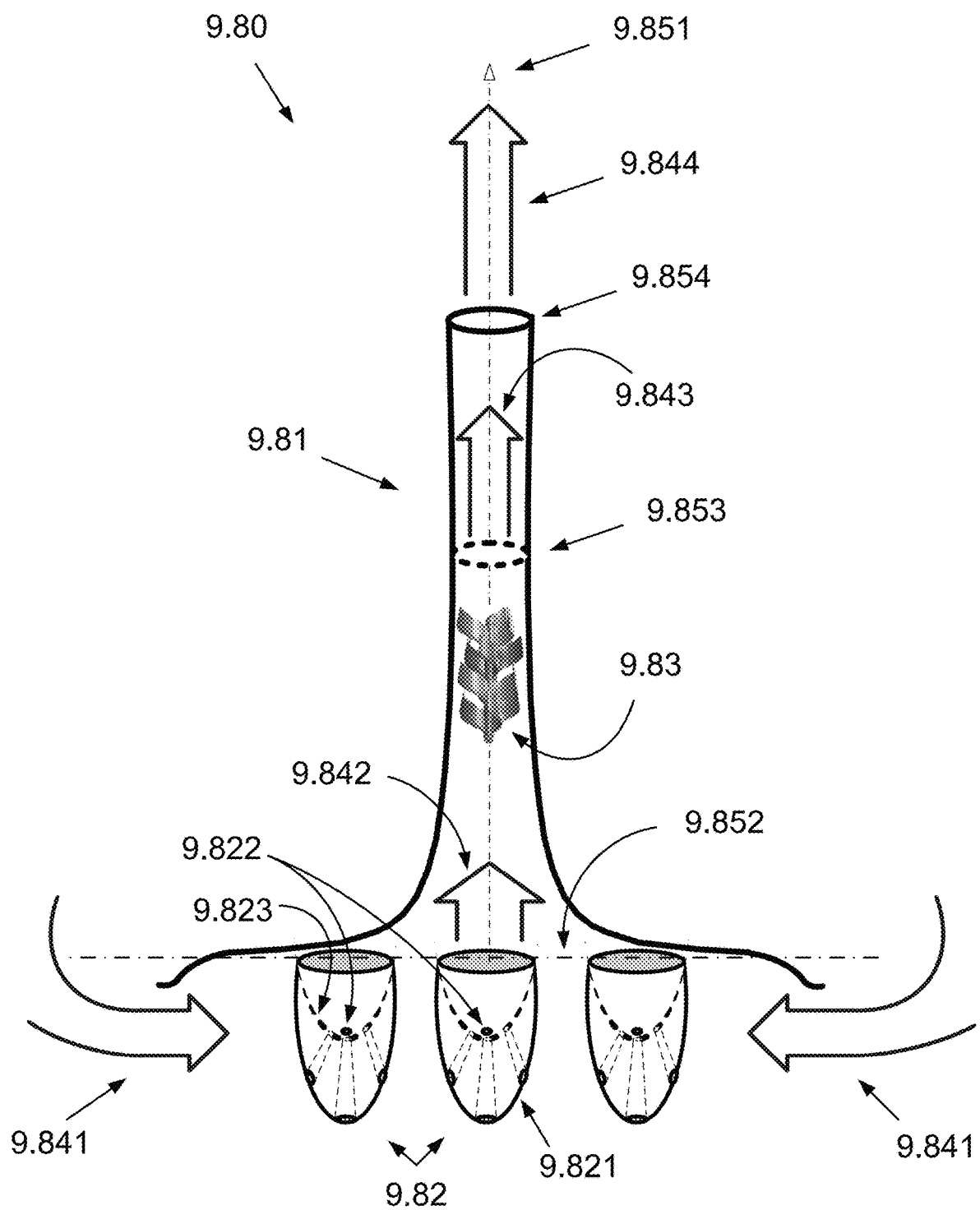
FIG. 9i is a schematic illustration of a jet-transformer, constructed according to the principles of the present invention.

FIG. 9*i* is a schematic illustration of a concept to transform the ambient warmth into electricity. The concept is embodied as a jet-transformer 9.80 comprising:

- a vertically oriented specifically shaped pipe 9.81 having the optimized convergent-divergent inner tunnel, described hereinabove in sub-paragraph "Convergent-Divergent Jet-Nozzle" with reference to FIG. 6*a*,
- at least one laminar flow maker 9.82, conceptually, having a geometry of convex-concave corpus 9.821 supplied by a heater 9.822, i.e. being designed as the convex-concave corpus 512 described hereinabove with reference to FIG. 5*e*, and
- at least one improved wind-turbine 9.83, designed as the improved wind-turbine 9.7 described hereinabove referring to FIG. 9*h*, the all, constructed according to the principles of the present invention.

The specifically shaped pipe 9.81 is elevated above the ground to allow for the ambient air 9.841 entering the optimized convergent-divergent inner tunnel from below. The heater 9.822 supplies the heat energy to a fluid portion adjacent the focus of the parabolically-concave surface 9.823 of the convex-concave corpus 9.821, thereby, on the one hand, to trigger the Archimedes upward-vectored buoyant force lifting the heated fluid potion and, on the other hand, to align the airflow 9.842 upward along the vertical axis 9.851. The upward airflow 9.842 is relatively slow and substantially-laminar. The optimized convergent-divergent inner tunnel is designed according to the equation of M-velocity (6.13) to provide for substantial suppression of jumps of the air thermodynamic parameters and, thereby, to provide for the substantial acceleration of the airflow 9.842, laminarly and so noseless streaming upward. So, the heating triggers the upward motion of air, and, in turn, the fluid motion itself triggers the convective acceleration as the airflow moves through the narrowing cross-section of the optimized convergent-divergent inner tunnel. Considering:

- the ambient temperature above the exhaust 9.854 equal $T_e$,
- the temperature near the level 9.852 equal $T_0$, and
- the temperature near the narrow throat 9.853 equal $T_*$, equation (7.1c), described hereinabove referring to FIG. 7*a*, says that:

- on the one hand, to obtain the de Laval jet-effect for air utilizing the optimized convergent-divergent inner, one must provide the ratio $T_0/T_*$ at least of 1.2; and
- on the other hand, to accelerate an air portion up to the velocity of sound, one must provide the ratio $T_0/T_e$ at least of 1.7.

Hence, providing the heating of air near the level 9.852 up to about the temperature 234° C. only, the condition of the enhanced de Laval jet-effect becomes satisfied, in turn, providing that the relatively low heat power, supplied by heaters 9.822, triggers the enhanced de Laval jet-effect transforming the warmth of the moving airflow into the acquired kinetic power of the airflow.

The energy $E_0$, necessary for warming 1 cube meter of air from the temperature 25° C. up to the temperature 234° C., is estimated as $E_0 = \rho V C_V (T_0 - T_e)$, where $V$ is the volume of 1 cube meter, $\rho$ is the air density, $\rho \approx 1.2$ kg/m$^3$, $C_V$ is the air heat capacity, $C_V \approx 0.72$ kJ/(kg·K), thereby, $E_0 \approx 1.2 \times 1 \times 0.72 \times (234-25) \approx 180$ kJ.

As the mentioned assumed condition allows to accelerate the airflow portion 9.854 up to the specific M-velocity $M_* = \sqrt{(\gamma-1)/\gamma}$ near the narrow throat 9.853 and to accelerate the airflow portion 9.854 up to almost the speed of sound (i.e. the exhaust M-velocity is of $M_* \approx 1$), then:

- the acquired kinetic energy, $K_e$, of the outflowing airflow portion 9.854, which (the acquired kinetic energy $K_e$) is specified as the difference between bringing heat energies, equals $K_e \approx n \times (T_0-T_e) \times R$, where n is number of moles in the considered 1 cube meter of air, n≈44.64, and R is the specific gas constant, approximated for the air by R=287 J/(kg·K), i.e. $K_e \approx 44.64 \times 209 \times 287 \approx 2,677$ kJ, that, in turn, says that the acquired kinetic energy $K_e$ may exceed the consumed energy $E_0$ at least at subsonic velocities by the factor of 15; and the acquired kinetic energy, $K_*$, of the airflow portion 9.854, when crossing the narrow throat, equals $K_* \approx n \times (T_0-T_*) \times R \approx 764$ kJ, thereby showing that the acquired kinetic energy $K_*$ may exceed the consumed energy $E_1$) by the factor of 4.24.

It will be evident to a commonly educated person that, if not to use the optimized convergent-divergent inner tunnel, designed according to the equation of M-velocity (6.13), the mentioned effective conversion of the airflow heat energy into the airflow kinetic energy is impossible because of originated turbulences and Mach waves, both accompanied by noise and energy dissipation back to the air warmth.

The improved wind-turbine 9.83 meets the upping laminar airflow and provides for the production of electricity neither retarding the upward airflow and nor distorting the upward airflow laminarity as described hereinabove referring to FIGS. 9g and 9h. The inventor points out again that the improved wind-turbine 9.83 harvests electric power at the expense of the airflow warmth but not from the airflow kinetic power, wherein the increased kinetic power of the airflow plays the role of an enforced trigger of the lift-force rotating the improved wind-turbine. Moreover, optionally, in-line arranged several improved wind-turbines 9.83 provide for a multi-stage repeatedly harvesting of electricity from the same airflow portion.

Method for Computational Analysis

FIG. 10 is a schematic block-diagram 1000 of a method for computational fluid dynamics numerical analysis, based on the principles of the present invention.

Block 1010 represents standard pre-processing comprising a defining the calculation space and mesh for the space quantization.

Block 1020 represents the processing itself, i.e. the algorithm calculating numerically the spatial distribution of the velocity-vector (three components), static pressure, temperature, and density (total six components), programmed according to the principles of the present invention, and applying a computational analysis basic principle, comprising a digital approximation of a space, comprising the flowing fluid, by a virtual spatial mesh partitioned into non-overlapping quantization cells bordered by imaginary boundaries.

The processing is such that the calculated spatially distributed values (i.e. the values calculated for the non-overlapping quantization cells) are satisfied, on the one hand, to suggested modified equations of fluid motion (5.6), (5.7), (5.9) having an exact solution, and, on the other hand, to the gravitational, thermodynamic, and kinetic theory laws represented by specified equations (5.2), (5.3), (5.4), (5.5), and (5.8), wherein the adequacy of the solution is confirmed by the Bernoulli theorem, equation (5.10).

Block 1030 represents the standard post-processing procedure for the solution filing and visualization.

Thereby, one can implement blocks 1010, 1020, and 1030 as a computer program product comprising a computer usable medium having computer readable code and instructions embodied and stored therein for execution on a general purpose computer. The code and instructions, when executed by the computer, cause the computer to perform the method for computational fluid dynamics.

FIG. 11 comprises Table-1 showing several equations:

On the one hand, classical, derived from the Euler theory in frames of the continuum mechanics and thermodynamics; and On the other hand, specified in the present invention, derived basing on the principles of the kinetic theory of matter.

The inventor points out that:

The difference between the expressions of the equations of fluid motion: classical and specified, is predetermined by the difference of definitions of the inner static pressure and density. Namely, in the continuum mechanics, the static pressure is defined as an integrated mechanical parameter characterizing the force acting on a wall, wherein the static pressure and mass density are inter-independent; and, in the present invention, the interrelated inner static pressure and mass density, both are defined from the point of view of the kinetic theory of matter applied to molecular fluid;

The generalized adiabatic compressibility parameter, indicated by γ, generalizes the adiabatic compressibility-constant, indicated by j, by taking into the consideration that the adiabatic compressibility properties are predetermined by both: the adiabatic compressibility-constant and the van der Waals constants;

The equation of M-velocity (6.13) differs from the classical equation (1) derived basing on the Euler equation defined in frames of the continuum mechanics; and The specific M-velocity $M_* = \sqrt{(\gamma-1)/\gamma}$ differs from the M-velocity of 1 Mach, which plays the role of the specific M-velocity in the classical aerodynamic theory of the de Laval nozzle.

The method, based on the kinetic theory of matter, provides the modified equations of fluid motion, thereby, reducing a sense of one of the Millennium Goals to solve the problem of the Navier-Stokes equation solution existence. The direct application of the disclosed method for computational analysis is the analysis of the flow motion, including a local oscillation motion of fluid, which is manifested as a wave propagating through a molecular fluid with the wave number interrelated with the velocity of sound in the molecular fluid.

Considering a fluid as a substance composed of randomly moving molecules, the method enables applications optimization, the physical essence of which is to bring in an asymmetrical influence into the molecular fluid, and, thereby, to originate a motion of molecules in a prevalent direction. For instance, such an asymmetry is provided by a structured and heated surface thereby repelling the molecular fluid in a prevalent direction, or by a structured naturally hydrophobic surface contacting with water, or by a structured and electrically charged surface interacting with an ionized fluid, or by an airfoil body moving relative to the molecular fluid and thereby acting on the molecular fluid by the Coanda-effect.

The method enables optimized designs of apparatuses for electricity harvesting from the molecular fluid heat energy, providing a positive net-efficiency. The method, accompanied by novel teachings, allows for optimized designs of engines having novel functionalities, for examples, such as:

Fluid-repellent jet-gears, described with references to FIGS. 5d, 5e, 5f, 5g, 5h, 5i, 5j, and 5k, which, when submerged in ambient fluid, originate a circulating and/or headway self-motion at the expense of the ambient fluid warmth; as well, creating a controllable omniphobic repellency using heating elements, one can originate a fluid-repellent jet-gear motion with a high net-efficiency, even higher than 100%, again, at the expense of the ambient fluid warmth;

An ice-maker comprising either hydrophobic jet-gears and comprising a generator, in the final analysis, transforming the heat into electricity, and thereby cooling and freezing water and so harvesting potable water (i.e. ice), as described with references to FIG. 5g;

A capillary tube having inner saw-like hydrophobic walls, described with reference to FIG. 5d, which, when filled with water, provides the water transportation;

Referring to FIG. 5i comprising a spiral, having a form of the Archimedean screw and having a hydrophobic surface, a mechanism, synthesizing a natural protein, or more fundamentally, of ribonucleic acid (RNA) molecules, hypothetically, can be specified and implemented artificially;

An electrically charged propeller-like jet-gear, described with references to FIG. 5h, which, when submerged in an ionized gas or liquid, provides a motion of the jet-gear at the expense of the ionized fluid's warmth;

A motionless gravity-jet engine, described with references to FIG. 5n, which, when operating in the gravitational field, is capable of a transformation of water heat energy into the kinetic energy of water jetstream moving upward, which, when becomes reincarnated into a waterfall, allows for the electricity harvesting and wherein reverting a falling water portion back into a container;

An enhanced transformer, described with references to FIG. 5o, which, when transforming an alternating voltage and current, is capable of a transformation of the electromagnetic gas hidden energy into the useful electric energy, i.e., in the final analysis, allows for the electricity harvesting from the ambient temperature;

A generalized generator for producing a useful-beneficial power, described with reference to FIG. 5m, which,
  when concretized as a fluid flow accelerator, provides for the useful-beneficial power harvesting from the fluid warmth in an adiabatic process due to the Coanda-jet-effect; and
  when concretized as a waves synchronizer, provides for the useful-beneficial power harvesting using constructive interference due to the waving jet-effect;

An optimized convergent-divergent tunnel, described with reference to FIG. 6a, which, when triggering the de Laval enhanced jet-effect, provides conditions to acquire a kinetic power and/or to harvest electricity from air warmth with a positive net-efficiency;

A two-stage convergent-divergent jet-nozzle described with reference to FIG. 6h, which, when exposed to transonic and/or supersonic and/or hypersonic flow, in contrast to the known phenomenon of the incoming flow warming and retarding, provides the incoming flow cooling and acceleration;

An airfoil flying capsule having an optimized single-stage or two-stage convergent-divergent tunnel, which, when moving in air, is capable of transforming the air warmness into a useful jet-thrust;

An improved propeller, preferably composed of many small propellers distributed in space, which focuses and/or defocuses sub-portions of air, thereby forming a cumulative blowing and/or sucking jetstream, correspondingly, wherein the jetstream has an optimally-variable cross-section providing for the critical condition, triggering the de Laval-like enhanced jet-effect;

An improved wind-turbine configured:
  to exclude or at least to minimize the impact by incoming airflow, but
  to trigger at least one of the Coanda-effect and the de Laval enhanced jet-effect, both having the jet-effect nature, and, in the final analysis,
  to produce the electric power at the expense of the airflow warmth but not at the expense of the airflow kinetic-power;
  and
An adiabatic aerodynamic system described with reference to FIGS. 9e and 9f, comprising a stationary circumferential arrangement of many elemental jet-boosters, that is capable of acquiring the kinetic energy of circulating airflow at the expense of the ambient air heat energy, further, to accumulate and conserve the airflow kinetic energy in a form of stably-circulating airflow. Wherein the adiabatic aerodynamic system, exposed to the natural ambient wind, accumulates and conserves the kinetic energy of the stably-circulating airflow independently of weather conditions, namely, independently of the direction of horizontal wind, as well as independently of any variation in the natural gusty wind direction, and furthermore, independently of any variation of the natural gusty wind non-zero velocity. This provides at least the following novel applications:
  The adiabatic aerodynamic system can operate as vortex-generator of an electro-station, providing for electric power harvesting from the warmth of natural air. Furthermore, it is found that the adiabatic aerodynamic system exposed to an artificial wind, made by consuming either a power of burned fuel or an electric power, under certain conditions, can convectively accelerate the wind at the expense of the airflow warmth thereby providing an acquired kinetic power of airflow being higher than the power consumed for the making of artificial wind;
  The adiabatic aerodynamic system can be used as an engine, powering a flying-saucer of high mobility, wherein, in contrast to a principle of helicopter where rotating wing-like blades interact with stationary air, here, just stationary wings of the flying-saucer interact with the stably-circulating airflow;
  The adiabatic aerodynamic system can be adapted for condensation of natural air humidity, wherein, considering a relatively compact adiabatic aerodynamic system, an estimated intensity of the water harvesting is at least of the same order of the value as a flux of water head discharging from a hose of a fire-extinguishing machine; and
  The adiabatic aerodynamic system, made in large-scale, can be used as a windbreak of an oasis of a stably-eddying windiness and refreshing coolness.

The method enables a technology to control the transformation of the ambient surroundings (for instance, air and/or water) warmth into a directional motion of the fluid providing for a renewable cycle, comprising:
  transformation of the flowing fluid heat-power into acquired kinetic-power of an originated jetstream;
  conversion of the jetstream kinetic-power into useful electric-power; and
  consumption of the electric-power, in the final analysis, inevitably dissipating back into the warmth of surrounding matter.

The method, accompanied by novel teachings, allows for a proper analysis of waves as a process of an interaction between an oscillator, supplying power to the ambient medium, and the ambient medium itself; wherein the process is accompanied by an adiabatic process of the waves propagation and interference.

The method enables optimized designs of controllable apparatuses having novel functionalities for a useful-beneficial power harvesting (for instance, harvesting of electricity from the molecular fluid heat energy using constructive interference of energetically inter-independent acoustic waves). Furthermore, applications, providing for a use of constructive interference of acoustic waves, are hypothetically translatable to applications, providing for a use of constructive interference of electromagnetic waves.

DRAWINGS

It should be understood that the sketched exemplary embodiments are merely for purposes of illustrating the teachings of the present invention and should in no way be used to unnecessarily narrow the interpretation of, or be construed as, being exclusively definitive of the scope of the claims which follow. It is anticipated that one of skill in the art will make many alterations, re-combinations, and modifications of the embodiments taught herein without departing from the spirit and scope of the claims.

I claim:

1. A generalized Jet-effect generator for producing a useful-beneficial power;
wherein a jet-effect is defined as a physical effect accompanied by transformation of the fluid internal heat power into the fluid motion kinetic power, namely, said jet-effect is at least one of:
the Coanda-effect, specified as a tendency of a fluid jetstream to be attracted to and aligned with a nearby actually-airfoil surface, such that said jetstream remaining laminar when flowing around and downstream behind the nearby actually-airfoil surface,
the Venturi effect, specified as a tendency of a fluid jetstream to be accelerated within a converging tunnel, shaped to provide laminar streaming of the fluid jetstream within and downstream behind the converging tunnel,
the de Laval effect, specified as a tendency of a fluid jetstream to be accelerated within a convergent-divergent tunnel, shaped to provide laminar streaming of the fluid jetstream within and downstream behind the convergent-divergent tunnel,
an effect of lift-force origination, specified as a tendency of a fluid jetstream to reduce static pressure above a convex side of an actually-airfoil wing, such that said jetstream remaining laminar when flowing around and downstream behind the actually-airfoil wing,
an effect of jet-thrust, specified as a tendency of a fluid jetstream to become accelerated downstream behind said actually-airfoil wing, such that said jetstream remaining laminar when flowing around and downstream behind the actually-airfoil wing,
a phobic-repulsing jet-effect, specified as a lack of attraction between inter-contacting fluid and a surface of a solid body, and
a waving jet-effect, specified as tendency of an oscillatory moving small portion of fluid to be attracted to and aligned with a curvature of a nearby fragment of an imaginary boundary of a neighbor portion of said fluid, wherein said fluid is at least one of a molecular fluid and electromagnetic gas;

said generalized jet-effect generator comprising Inherent components designated by numbering (n.1), (n.2), (n.3), (n.4), (n.5), and (n.6) as follows:
(n.1) a set of a certain big number N of energetically mutually-Independent sources of consumed power, where said certain big number N having the claimed sense is at least 10; each of said N energetically mutually-Independent sources being capable of providing a portion of power, indicated by $\delta W_{external}$;
(n.2) a stock of raw power, wherein said raw power is specified as a portion of internal heat power of fluid yet to be in a usable form when yet to be subjected to a jet-effect;
(n.3) a set of N elemental triggers of the jet-effect resulting in a transformation of said raw power into the power in said usable form;
said N elemental triggers of the jet-effect are specified as either:
N sequentially arranged convex withers on actually-airfoil surfaces exposed to a laminarly flowing fluid: each of said N convex withers, when exposed to said laminarly flowing fluid, is capable of triggering the Coanda-effect resulting in a transformation of a portion of said raw power into acquired kinetic power of said laminarly flowing fluid portion;
or
N sequentially arranged elemental tunnels shaped as at least one of:
Venturi pipes,
de Laval nozzles, and
two-stage convergent-divergent jet-nozzles, correspondingly, exposed to a laminarly flowing fluid;
each of said N elemental tunnels, when exposed to said laminarly flowing fluid, is capable of triggering at least one of the Venturi effect and the de Laval effect resulting in a transformation of a portion of said raw power into acquired kinetic power of said laminarly flowing fluid portion:
or
N mutually-synchronized elemental transmitting antennas of waves,
each of said N elemental transmitting antennas is capable of oscillating acceleration of a nearby portion of ambient fluid, thereby, triggering the oscillating acceleration of further portions of said ambient fluid that is manifested as launching an elemental wave;
(n.4) an aggregation of N elemental feeders capable of supplying said consumed power to said N elemental triggers of the jet-effect mutually-synchronously;
(n.5) a power converter capable of transforming the power, indicated by $W_N$, being in said usable form into said useful-beneficial power, indicated by W;
said Power converter being specified as either:
an actually-airfoil wing having a convexity capable of transforming a cumulatively acquired kinetic power $W_N$ of a resulting flow as power being in said usable form into said useful-beneficial power W being mechanical lift or thrust power;
or
a turbo-generator of electricity capable of transforming cumulatively acquired kinetic power $W_N$ of a resulting jetstream (as power being in said usable form) into said useful-beneficial power W being electrical power;

or a thermo-generator of electricity capable of transforming heat power associated with a temperature difference between a temperature of a resulting jetstream and a temperature of ambient fluid (as power being in said usable form) for producing said useful-beneficial power W being electric power;

or a detector of waves capable of transforming cumulatively acquired wave power $W_N$ of a resulting wave (as power being in said usable form) into said useful-beneficial power W being electric power;

and (n.6) a conductor capable of conveying the power being in said usable form to said power converter;

wherein said Inherent components being organized to provide that:

said N elemental triggers of the jet-effect, being powered mutually-synchronously by said aggregation of N elemental feeders supplying said consumed power from said N energetically mutually-independent sources of consumed power, correspondingly, result in transformation of both said consumed power and said raw power into the power being in said usable form;

said conductor conveys the power being in said usable form to said power converter, and said power converter transforms the power $W_N$ being in said usable form into said useful-beneficial power W;

said useful-beneficial power W is at least one of the internal heat power, the kinetic power of fluid motion, jet-thrust power of motion a body, and electric power, wherein the internal heat power, the jet-thrust power, and the electric power, all being useful and beneficial when used in industry.

2. A cascaded Coanda-effect generator comprising the generalized jet-effect generator of claim 1, wherein said jet-effect is the Coanda-effect and said inherent components are further specified as follows:

(n.1) said N energetically mutually-independent sources of consumed power are further specified as N portions of laminarly flowing fluid, moving in a prevalent direction; each of said N portions of laminarly flowing fluid, when yet to be subjected to the Coanda-effect, brings a portion of kinetic power $\delta W_{external}$;

(n.2) said raw power is further specified as a portion of internal heat power of said laminarly flowing fluid yet to be in a usable form when said N portions of laminarly flowing fluid yet to be subjected to the Coanda-effect; thereby, said stock of raw power is further specified as said laminarly flowing fluid bringing the internal heat power;

(n.3) said N elemental triggers of the jet-effect are further specified as N convex withers on said actually-airfoil surfaces exposed to said laminarly flowing fluid; each of said N convex withers, when exposed to said laminarly flowing fluid, is capable of triggering at least one of the Coanda-effect and the Coanda-effect in combination with the phobic-repulsing jet-effect resulting in transformation of a portion of said raw power into acquired kinetic power of said laminarly flowing fluid portion, thereby increasing said kinetic power of said laminarly flowing fluid portion by factor F as said laminarly flowing fluid portion passes beside each of said N convex withers;

wherein the power being in said usable form is the kinetic power of said laminarly flowing fluid;

(n.4) said aggregation of N elemental feeders being in-line arranged and co-oriented along said prevalent direction of motion of said laminarly flowing fluid;

said N elemental feeders are further specified as said N actually-airfoil surfaces attracting N said laminarly flowing fluid portions as a manifestation of the Coanda-effect, thereby, when:

said N laminarly flowing fluid portions as said N energetically mutually-independent sources of consumed power, said N convex withers as said N elemental triggers of the Coanda-effect, and said N actually-airfoil surfaces as said N elemental feeders, all being enumerated sequentially by integer numbers n from 1 to N from upstream to downstream, each n-th said elemental feeder being capable of supplying:

said kinetic power portion $\delta W_{external}$ and said acquired kinetic power portions, acquired by said n-th laminarly flowing fluid portion when past beside (n−1) upstream arranged elemental triggers of the Coanda-effect, namely, said kinetic power portion ($\delta W_{external} \times F^{n-1}$), for blowing said n-th of said N convex withers, correspondingly;

thus, a resulting jetstream comprising said N-th laminarly flowing fluid portion downstream behind said N-th convex withers is characterized by a cumulatively acquired kinetic power $W_N$ equal to ($\delta W_{external} \times F^N$) as the power being in said usable form;

(n.5) said power converter being further specified as capable of transforming the cumulatively acquired kinetic power $W_N$ into said useful-beneficial power W; and (n.6) said conductor being further specified as a conductor of said laminarly flowing fluid kinetic power to convey said resulting jetstream comprising said N portions of laminarly flowing fluid to said power converter; said conductor of said laminarly flowing fluid kinetic power is at least one of:

said laminarly flowing fluid in open space, and a corridor having walls specifically shaped to provide a condition for said resulting jetstream laminar motion and gradual acceleration due to the multi-stage repeatedly cascaded Coanda-effect;

wherein:

said power converter is capable of transforming said cumulatively acquired kinetic power $W_N$ into said useful-beneficial power W;

and said useful-beneficial power W being predetermined by a certain net-efficiency of said power converter, is at least one of:

mechanic power, when said resulting jetstream is used to produce at least one of:

a lift-force, acting on said N actually-airfoil surfaces, and a jet-thrust force, acting on said N convex withers, according to Newton's Third Law;

and
electric power, when said resulting jetstream is used to produce electricity.

3. A cascaded nozzles generator comprising the generalized jet-effect generator of claim 1,
wherein:
(a) a two-stage convergent-divergent jet-nozzle is defined as a pair of de Laval nozzles differing in a geometrical configuration such that, when said de Laval nozzles being:
arranged sequentially,
mutually oriented, and
being exposed to a flow, oncoming with a high M-velocity measured in Mach number higher than a specific M-velocity equal to $\sqrt{(\gamma-1)/\gamma}$, where $\gamma$ is adiabatic compressibility parameter of said fluid;
to provide that said two-stage convergent-divergent nozzle as a whole being characterized by an inlet area and an outlet area such that said outlet area being bigger than said inlet area, thereby, to provide an integral acceleration of said laminarly flowing fluid portion resulting in that said M-velocity of said laminarly flowing fluid portion at said outlet becoming higher than said M-velocity of said laminarly flowing fluid portion at said inlet;
(b) said jet-effect is at least one of the Venturi effect and the de Laval effect; and
(c) said inherent components are further specified as follows:
(n.1) said N energetically mutually-independent sources of consumed power are further specified as N portions of laminarly flowing fluid, moving in a prevalent direction; each of said N portions of laminarly flowing fluid, when yet to be subjected to at least one of the Venturi effect and the de Laval effect, brings a portion of kinetic power $\delta W_{external}$;
(n.2) said raw power is further specified as a portion of internal heat power of said laminarly flowing fluid yet to be in a usable form when said N portions of laminarly flowing fluid yet to be subjected to both the Venturi effect and the de Laval effect; thereby, said stock of raw power is further specified as said laminarly flowing fluid bringing the internal heat power;
(n.3) said N elemental triggers of the jet-effect are further specified as N elemental tunnels shaped as at least one of:
N Venturi pipes,
N sequential parts of a de Laval nozzle, and
N two-stage convergent-divergent jet-nozzles,
correspondingly, exposed to said laminarly flowing fluid;
each of said N elemental tunnels, when exposed to said laminarly flowing fluid, is capable of triggering at least one of the Venturi effect and the de Laval effect resulting in transformation of a portion of said raw power into acquired kinetic power of said laminarly flowing fluid portion, thereby increasing said kinetic power of said laminarly flowing fluid portion by factor F as said laminarly flowing fluid portion passes through each of said N elemental tunnels;
wherein the power being in said usable form is the kinetic power of said laminarly flowing fluid;
(n.4) said aggregation of N elemental feeders being in-line arranged and co-oriented along said prevalent direction of motion of said laminarly flowing fluid;
said N elemental feeders are further specified as said N actually-airfoil surfaces directing N said laminarly flowing fluid portions in said prevalent direction, thereby, when:
said N laminarly flowing fluid portions as said N energetically mutually-independent sources of consumed power,
said N elemental tunnels as said N elemental triggers of at least one of the Venturi effect and the de Laval effect, and
said N actually-airfoil surfaces as said N elemental feeders,
all being enumerated sequentially by integer numbers n from 1 to N from upstream to downstream,
each n-th said elemental feeder being capable of supplying:
said kinetic power portion $\delta W_{external}$ and said acquired kinetic power portions, acquired by said n-th laminarly flowing fluid portion when past beside (n−1) upstream arranged elemental triggers of at least one of the Venturi effect and the de Laval effect, namely,
said kinetic power portion ($\delta W_{external} \times F^{n-1}$),
for blowing said n-th of said N elemental tunnels, correspondingly;
thus, a resulting jetstream comprising said N-th laminarly flowing fluid portion downstream behind said N-th elemental tunnel is characterized by a cumulatively acquired kinetic power $W_N$ equal to ($\delta W_{external} \times F^N$) as the power being in said usable form;
(n.5) said power converter being further specified as capable of transforming the cumulatively acquired kinetic power $W_N$ into said useful-beneficial power W; and
(n.6) said conductor being further specified as a conductor of said laminarly flowing fluid kinetic power to convey said resulting jetstream comprising said N portions of laminarly flowing fluid to said power converter; said conductor of said laminarly flowing fluid kinetic power is at least one of:
said laminarly flowing fluid in open space, and
a corridor having walls specifically shaped to provide a condition for said resulting jetstream laminar motion and gradual acceleration due to the multi-stage repeatedly cascaded at least one of the Venturi effect and the de Laval effect;
wherein:
said power converter is capable of transforming said cumulatively acquired kinetic power $W_N$ into said useful-beneficial power W; and
said useful-beneficial power W being predetermined by a certain net-efficiency of said power converter, is at least one of:
mechanic power, when said resulting jetstream is used to produce at least one of:
a lift-force, acting on said N actually-airfoil surfaces, and
jet-thrust force, acting on said N convex withers, according to Newton's Third Law; and
electric power, when said resulting jetstream is used to produce electricity.

4. A jet-thrust generator comprising at least one of the cascaded Coanda-effect generator of claim 2 and the cascaded nozzles generator of claim 3;
   wherein said power converter is ambient fluid in open space, thereby, providing conditions to use the cumulatively acquired kinetic power $W_N$ of said resulting jetstream as the power being in said usable form for producing said jet-thrust power W, according to Newton's Third Law.

5. A turbo-generator comprising at least one of the cascaded Coanda-effect generator of claim 2 and the cascaded nozzles generator of claim 3;
   wherein said power converter is a wind-turbine, capable of use of the cumulatively acquired kinetic power $W_N$ of said resulting jetstream as the power being in said usable form for producing the electric power W.

6. A thermo-generator comprising at least one of the cascaded Coanda-effect generator of claim 2 and the cascaded nozzles generator of claim 3;
   wherein said power converter having a Peltier element, capable of use of a temperature difference between the temperature of said resulting jetstream and the temperature of the ambient fluid for producing the electric power W.

7. An interference generator comprising the generalized jet-effect generator of claim 1; wherein said jet-effect is the waving jet-effect and said inherent components are further specified as follows:
   (n.1) said N energetically mutually-independent sources of consumed power are further specified as N energetically mutually-independent power generators each of which provides a portion of power $\delta W_{external}$;
   (n.2) said raw power is further specified as a portion of internal heat power of ambient fluid yet to be in said usable form when N said portions of the internal heat power of ambient fluid yet to be subjected to a waving jet-effect; thereby, said stock of raw power is further specified as said ambient fluid characterized by the internal heat power;
   (n.3) said N elemental triggers of the jet-effect are further specified as N elemental transmitting antennas of waves, each of said N elemental transmitting antennas is capable of oscillating acceleration of a nearby portion of said ambient fluid, thereby, triggering the oscillating acceleration of further portions of said ambient fluid that is manifested as launching an elemental wave;
   (n.4) said aggregation of N elemental feeders being an aggregation of N mutually-synchronized elemental feeders,
      wherein each of said N elemental feeders is an engine being capable of supplying said consumed power portion $\delta W_{external}$ to one of said N elemental transmitting antennas, correspondingly, thereby providing for each of said N elemental transmitting antennas to launch one of N said elemental waves, correspondingly, such that each of said N launched elemental waves bringing an elemental wave power portion, indicated by $W_1$, and all said N launched elemental waves are characterized by mutually-synchronized phases;
   (n.5) said power converter is further specified as said detector of waves or a receiving antenna of waves; and
   (n.6) said conductor is further specified as a set of N waveguides to convey said N elemental waves launched by said N elemental transmitting antennas, correspondingly, to said receiving antenna to provide for said receiving antenna to superpose said N launched and conveyed elemental waves in-phase to result in origination of a cumulatively-resulting wave being characterized by a wave power $W_N$ being proportional to $N^2 \times W_1$ as a result of constructive interference of said N elemental waves each of which bringing said elemental wave power portion $W_1$, thereby, providing for a positive power difference between the wave power of said cumulatively-resulting wave $W_N$ and the sum power of said N elemental wave power portions $N \times W_1$; said positive difference being acquired at the expense of said raw power;
wherein:
   said receiving antenna is capable of detecting said cumulatively-resulting wave and transforming a portion of said wave power of said cumulatively-resulting wave $W_N$ into said useful-beneficial power W; and
   said useful-beneficial power W,
      being predetermined by a certain net-efficiency of said receiving antenna and quantified as proportional to the wave power of said cumulatively-resulting wave $W_N$,
      is at least one of:
      electric power, when the cumulatively-resulting wave is transformed into electrical signal;
      the internal heat power, when the useful-beneficial power W is used for heating a body; and
   a jet-thrust power used for pushing said body, when the cumulatively-resulting wave is subjected to reflection from said body and so the Umov-Poynting vector of the cumulative wave is subjected to redirection thereby resulting in said pushing.

8. The interference generator of claim 7;
   wherein:
      said N elemental feeders being further specified as at least one of:
         N internal combustion engines, each of which being powered by burning a separate portion of fuel;
         N wind-turbines, each of which being powered by a separate portion of the ambient wind; and
         N solar radiation collectors, each of which being at least one of a solar thermal collector and a photovoltaic cell; wherein each of the N solar radiation collectors being powered by a separate portion of the Sun radiation;
      the waves being further specified as the electromagnetic waves characterized by a carrier frequency and wavelength, phase, amplitude, polarization, time-delay, and direction of propagation;
      the waveguide being further specified as at least one of a single-arm converging waveguide and a multi-arm waveguide;
      said N elemental triggers of the jet-effect being further specified as N transmitting antennas launching corresponding N portions of the power being in said usable form being N wave power portions of the electromagnetic waves, correspondingly, wherein the N transmitting antennas being:
         specifically mutually synchronized,
         arranged with certain intervals between the N transmitting antennas, and
         oriented to enter said N elemental waves into the waveguide, wherein the certain intervals between the antennas being such that to provide for that, when the N elemental waves propagating within the waveguide, the N elemental waves become in-phase superposed thereby resulting in constructive interference forming a cumulatively-resulting wave; and said receiving antenna being further specified as a classic receiving antenna, receiving the cumulatively-resulting wave and being capable of use of the wave power of said cumulatively-resulting wave $W_N$ for producing the electric power W.

\* \* \* \* \*